US012666789B2

(12) United States Patent
Watabe et al.

(10) Patent No.: US 12,666,789 B2
(45) Date of Patent: Jun. 23, 2026

(54) LIGHT-EMITTING DEVICE

(71) Applicant: Semiconductor Energy Laboratory Co., Ltd., Kanagawa-ken (JP)

(72) Inventors: Takeyoshi Watabe, Atsugi (JP); Nobuharu Ohsawa, Zama (JP); Hiromi Seo, Sagamihara (JP); Satoshi Seo, Sagamihara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 122 days.

(21) Appl. No.: 18/521,096

(22) Filed: Nov. 28, 2023

(65) Prior Publication Data

US 2024/0196641 A1 Jun. 13, 2024

(30) Foreign Application Priority Data

Nov. 30, 2022 (JP) ................................. 2022-192078
Dec. 27, 2022 (JP) ................................. 2022-209462
(Continued)

(51) Int. Cl.
*H10K 50/19* (2023.01)
*H10K 50/11* (2023.01)
(Continued)

(52) U.S. Cl.
CPC ............. *H10K 50/19* (2023.02); *H10K 50/11* (2023.02); *H10K 85/211* (2023.02);
(Continued)

(58) Field of Classification Search
None
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2003-059663 A 2/2003
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Khaja Ahmad
(74) *Attorney, Agent, or Firm* — Husch Blackwell LLP

(57) ABSTRACT

The light-emitting device includes a first electrode, a second electrode, and an organic compound layer between the first electrode and the second electrode. The organic compound layer includes a first light-emitting unit, an intermediate layer, and a second light-emitting unit in this order from the first electrode side. The first light-emitting unit includes a first light-emitting layer, and the second light-emitting unit includes a second light-emitting layer. The intermediate layer includes a first layer, a second layer, and a third layer in this order from the first electrode side, with the second layer being in contact with the first layer and the third layer. The spin density of the first layer is lower than or equal to $1\times10^{17}$ spins/$cm^3$. The LUMO level of a material included in the second layer is greater than or equal to −4.30 eV and less than or equal to −3.00 eV.

20 Claims, 38 Drawing Sheets

(30) Foreign Application Priority Data

Apr. 27, 2023 (JP) ................................ 2023-073498
Jun. 9, 2023 (JP) ................................ 2023-095323

(51) Int. Cl.
*H10K 85/20* (2023.01)
*H10K 85/30* (2023.01)
*H10K 85/60* (2023.01)
*H10K 101/30* (2023.01)
*H10K 102/00* (2023.01)

(52) U.S. Cl.
CPC .......... *H10K 85/311* (2023.02); *H10K 85/342* (2023.02); *H10K 85/615* (2023.02); *H10K 85/624* (2023.02); *H10K 85/633* (2023.02); *H10K 85/636* (2023.02); *H10K 85/657* (2023.02); *H10K 85/6572* (2023.02); *H10K 85/6576* (2023.02); *H10K 2101/30* (2023.02); *H10K 2102/351* (2023.02)

(56) References Cited

U.S. PATENT DOCUMENTS

| | | | | |
|---|---|---|---|---|
| 2002/0072139 | A1 | 6/2002 | Kashiwabara | |
| 2010/0288362 | A1* | 11/2010 | Hatwar | H10K 50/131 257/E51.026 |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2014/0239287 | A1* | 8/2014 | Lee | H10K 50/81 438/46 |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0203662 | A1 | 6/2020 | Mollard et al. | |
| 2021/0104697 | A1* | 4/2021 | Ohsawa | H10K 50/11 |
| 2022/0271247 | A1* | 8/2022 | Gao | H10K 50/81 |
| 2022/0310937 | A1 | 9/2022 | Fukagawa et al. | |
| 2024/0196663 | A1 | 6/2024 | Yamane et al. | |
| 2024/0206217 | A1 | 6/2024 | Watabe et al. | |
| 2024/0206220 | A1 | 6/2024 | Watabe et al. | |
| 2024/0206225 | A1 | 6/2024 | Watabe et al. | |

FOREIGN PATENT DOCUMENTS

| | | | |
|---|---|---|---|
| JP | 2008-098106 | A | 4/2008 |
| JP | 2008-147072 | A | 6/2008 |
| JP | 2008-251270 | A | 10/2008 |
| JP | 2012-527089 | | 11/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-521459 | | 8/2018 |
| JP | 2019-179696 | A | 10/2019 |
| JP | 2020-160305 | A | 10/2020 |
| WO | WO-2021/045020 | | 3/2021 |
| WO | WO-2021/045178 | | 3/2021 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.
Sasaki.T et al., "Unravelling the electron injection/transport mechanism in organic light-emitting diodes", Nature Communications, May 11, 2021, vol. 12, pp. 2706-1-2706-8.
Fukagawa.H et al., "Universal Strategy for Efficient Electron Injection into Organic Semiconductors Utilizing Hydrogen Bonds", Adv. Mater. (Advanced Materials), Oct. 25, 2019, vol. 31, No. 43, pp. 1904201-1-1904201-8.

* cited by examiner

LIGHT-EMITTING DEVICE

BACKGROUND OF THE INVENTION

1. Field of the Invention

One embodiment of the present invention relates to a light-emitting device.

One embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), driving methods thereof, and manufacturing methods thereof.

2. Description of the Related Art

Display apparatuses are being developed into a variety of applications these days. For example, a television device for home use (also referred to as TV or television receiver), digital signage, and a public information display (PID) are being developed as large-sized display apparatuses, and a smartphone and a tablet terminal each provided with a touch panel are being developed as small-sized display apparatuses.

At the same time, an increase in the resolution of display apparatus is also required. For example, devices for virtual reality (VR), augmented reality (AR), substitutional reality (SR), or mixed reality (MR) are given as devices requiring high-resolution display apparatuses and are being developed actively.

Development is actively conducted on light-emitting devices (also referred to as light-emitting elements) as display elements used in display apparatuses. Light-emitting devices utilizing electroluminescence (hereinafter referred to as EL; such devices are also referred to as EL devices or EL elements), particularly organic EL devices that mainly use organic compounds, are suitable for display apparatuses because of having features such as ease of reduction in thickness and weight, high-speed response to input signals, and driving with a constant DC voltage power source.

In order to obtain a higher-resolution light-emitting apparatus using an organic EL device, patterning an organic layer by a photolithography technique using a photoresist or the like, instead of an evaporation method using a metal mask, has been studied. By using the photolithography technique, a high-resolution display apparatus in which the distance between EL layers is several micrometers can be obtained (see Patent Document 1, for example).

REFERENCES

Patent Documents

[Patent Document 1] Japanese Translation of PCT International Application No. 2018-521459

[Patent Document 2] PCT International Publication No. 2021/045178

SUMMARY OF THE INVENTION

It has been known that EL layers in an organic EL device exposed to atmospheric components such as water and oxygen have affected initial characteristics or reliability, and thus it has been common knowledge that the EL layers are treated in a near-vacuum atmosphere. In particular, an electron-injection layer or an intermediate layer of a tandem light-emitting device, which includes a material having a donor property typified by an alkali metal, an alkaline earth metal, or a compound thereof highly reactive with water or oxygen, rapidly deteriorates and loses the function as the intermediate layer when the surface of the EL layer is exposed to the atmosphere.

However, processing steps with the aforementioned photolithography technique inevitably expose the surface of the EL layer to the atmosphere. Favorable characteristics have been hard to obtain from light-emitting devices manufactured through processing with a photolithography technique.

In view of the above, an object of one embodiment of the present invention is to provide a novel light-emitting device having a tandem structure. An object of another embodiment of the present invention is to provide a highly efficient light-emitting device having a tandem structure. An object of another embodiment of the present invention is to provide a highly reliable light-emitting device having a tandem structure. An object of another embodiment of the present invention is to provide a highly efficient and highly reliable light-emitting device having a tandem structure.

An object of another embodiment of the present invention is to provide a novel light-emitting device having a tandem structure and manufactured through a photolithography process. An object of another embodiment of the present invention is to provide a highly efficient light-emitting device having a tandem structure and manufactured through a photolithography process. An object of another embodiment of the present invention is to provide a highly reliable light-emitting device having a tandem structure and manufactured through a photolithography process. An object of another embodiment of the present invention is to provide a high-emission-efficiency and highly reliable light-emitting device having a tandem structure and manufactured through a photolithography process.

An object of another embodiment of the present invention is to provide a novel light-emitting device that has a tandem structure and can be used in a high-resolution display apparatus. An object of another embodiment of the present invention is to provide a highly efficient light-emitting device that has a tandem structure and can be used in a high-resolution display apparatus. An object of another embodiment of the present invention is to provide a highly reliable light-emitting device that has a tandem structure and can be used in a high-resolution display apparatus. An object of another embodiment of the present invention is to provide a high-emission-efficiency and highly reliable light-emitting device that has a tandem structure and can be used in a high-resolution display apparatus.

An object of another embodiment of the present invention is to provide a highly reliable display apparatus. An object of another embodiment of the present invention is to provide a high-resolution display apparatus. An object of another embodiment of the present invention is to provide a highly reliable and high-resolution display apparatus.

Note that the description of these objects does not preclude the existence of other objects. One embodiment of the present invention does not necessarily achieve all of these objects. Other objects can be derived from the description of the specification, the drawings, the claims, and the like.

One embodiment of the present invention is a light-emitting device including a first electrode, a second electrode, and an organic compound layer between the first electrode and the second electrode. The organic compound layer includes a first light-emitting unit, an intermediate layer, and a second light-emitting unit in this order from the first electrode side. The first light-emitting unit includes a first light-emitting layer. The second light-emitting unit includes a second light-emitting layer. The intermediate layer includes a first layer, a second layer, and a third layer in this order from the first electrode side. The first layer and the second layer are in contact with each other and the second layer and the third layer are in contact with each other. A spin density of the first layer is lower than or equal to $1\times10^{17}$ spins/$cm^3$. A LUMO level of a material included in the second layer is greater than or equal to −4.30 eV and less than or equal to −3.00 eV.

Another embodiment of the present invention is a light-emitting device including a first electrode, a second electrode, and an organic compound layer between the first electrode and the second electrode. The organic compound layer includes a first light-emitting unit, an intermediate layer, and a second light-emitting unit in this order from the first electrode side. The first light-emitting unit includes a first light-emitting layer. The second light-emitting unit includes a second light-emitting layer. The intermediate layer includes a first layer, a second layer, and a third layer in this order from the first electrode side. The first layer and the second layer are in contact with each other and the second layer and the third layer are in contact with each other. A spin density of the first layer is lower than or equal to $1\times10^{17}$ spins/$cm^3$. A LUMO level of a material included in the second layer is greater than or equal to −4.30 eV and less than or equal to −3.00 eV. The third layer includes an organic compound having a hole-transport property and a material having an acceptor property.

Another embodiment of the present invention is the light-emitting device having the above-described structure, in which the spin density of the first layer is lower than $1\times10^{16}$ spins/$cm^3$.

Another embodiment of the present invention is the light-emitting device in which, in the above-described structure, the material included in the second layer, a material included in the first layer, and a material included in the third layer are different from one another.

Another embodiment of the present invention is the light-emitting device in which, in the above-described structure, a thickness of the second layer is greater than or equal to 1 nm and less than or equal to 10 nm, preferably greater than or equal to 2 nm and less than or equal to 5 nm.

Another embodiment of the present invention is the light-emitting device in which, in the above-described structure, the first layer includes a first substance and a second substance and the first substance has an acid dissociation constant $pK_a$ of 8 or more.

Another embodiment of the present invention is the light-emitting device in which, in the above-described structure, the first layer includes a first substance and a second substance and the first substance is an organic compound having any one of a pyrrolidine skeleton, a piperidine skeleton, and a hexahydropyrimidopyrimidine skeleton.

Another embodiment of the present invention is the light-emitting device in which, in the above-described structure, the first layer includes a first substance and a second substance and the first substance is an organic compound having a 1,3,4,6,7,8-hexahydro-2H-pyrimido[1,2-a]pyrimidine skeleton.

Another embodiment of the present invention is the light-emitting device in which, in the above-described structure, the first layer includes a first substance and a second substance and the first substance is an organic compound having one 1,3,4,6,7,8-hexahydro-2H-pyrimido[1,2-a]pyrimidine skeleton.

Another embodiment of the present invention is the light-emitting device in which, in the above-described structure, the second substance is an organic compound having an electron-transport property.

Another embodiment of the present invention is the light-emitting device in which, in the above-described structure, the first layer has a hole mobility lower than or equal to $1\times10^{-8}$ $cm^2$/Vs in the case where the square root of electric field strength [V/cm] is 600.

Alternatively, the first layer has a hole mobility lower than or equal to $1\times10^{-8}$ $cm^2$/Vs in the case where the square root of electric field strength [V/cm] is 600, and the first layer has an electron mobility higher than or equal to $1\times10^{-7}$ $cm^2$/Vs in the case where the square root of electric field strength [V/cm] is 600.

Another embodiment of the present invention is the light-emitting device in which, in the above-described structure, an electron mobility of the first layer is higher than or equal to 10000 times a hole mobility of the first layer in the case where the square root of electric field strength [V/cm] is 600.

Another embodiment of the present invention is the light-emitting device in which, in the above-described structure, the material included in the second layer is a metal complex.

Another embodiment of the present invention is the light-emitting device in which, in the above-described structure, the material included in the second layer is a phthalocyanine-based metal complex.

Another embodiment of the present invention is the light-emitting device in which, in the above-described structure, the material included in the second layer is copper phthalocyanine or zinc phthalocyanine.

Another embodiment of the present invention is the light-emitting device in which, in the above-described structure, the material included in the second layer is 2,3,8,9,14,15-hexafluorodiquinoxalino[2,3-a:2',3'-c]phenazine.

Another embodiment of the present invention is a display module including the above-described light-emitting device and at least one of a connector and an integrated circuit.

Another embodiment of the present invention is an electronic device including the above-described light-emitting device and at least one of a housing, a battery, a camera, a speaker, and a microphone.

With one embodiment of the present invention, a novel light-emitting device having a tandem structure can be provided. With another embodiment of the present invention, a highly efficient light-emitting device having a tandem structure can be provided. With another embodiment of the present invention, a highly reliable light-emitting device having a tandem structure can be provided. With another embodiment of the present invention, a highly efficient and highly reliable light-emitting device having a tandem structure can be provided.

With another embodiment of the present invention, a novel light-emitting device having a tandem structure and manufactured through a photolithography process can be provided. With another embodiment of the present invention, a highly efficient light-emitting device having a tandem structure and manufactured through a photolithography process can be provided. With another embodiment of the present invention, a highly reliable light-emitting device having a tandem structure and manufactured through a photolithography process can be provided. With another embodiment of the present invention, a high-emission-efficiency and highly reliable light-emitting device having a tandem structure and manufactured through a photolithography process can be provided.

With another embodiment of the present invention, a novel light-emitting device that has a tandem structure and can be used in a high-resolution display apparatus can be provided. With another embodiment of the present invention, a highly efficient light-emitting device that has a tandem structure and can be used in a high-resolution display apparatus can be provided. With another embodiment of the present invention, a highly reliable light-emitting device that has a tandem structure and can be used in a high-resolution display apparatus can be provided. With another embodiment of the present invention, a high-emission-efficiency and highly reliable light-emitting device that has a tandem structure and can be used in a high-resolution display apparatus can be provided.

With another embodiment of the present invention, a highly reliable display apparatus can be provided. With another embodiment of the present invention, a high-resolution display apparatus can be provided. With another embodiment of the present invention, a highly reliable and high-resolution display apparatus can be provided.

Note that the description of these effects does not preclude the existence of other effects. One embodiment of the present invention does not necessarily have all of these effects. Other effects can be derived from the description of the specification, the drawings, the claims, and the like.

DETAILED DESCRIPTION OF THE INVENTION

Figure 1A:
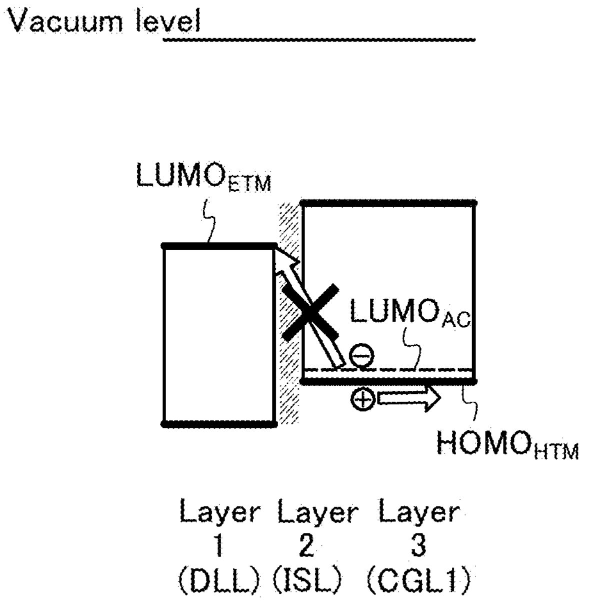
FIGS. 1A and 1B are band diagrams illustrating driving mechanism of a light-emitting device of the present invention.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure.

Embodiment 1

A tandem light-emitting device which includes a plurality of light-emitting units between a pair of electrodes and an intermediate layer that generates carriers between the plurality of light-emitting units can have higher current efficiency than a normal light-emitting device which includes only one light-emitting unit between electrodes.

The intermediate layer in the tandem light-emitting device includes a carrier-generation layer (CGL). The CGL refers to a layer where electrons and holes are generated by charge separation caused by application of voltage. Stacking and using, as the CGL, a layer including a material having a hole-transport property and a material having an acceptor property (CGL1) and a layer including a material having an electron-transport property and a material having a donor property (CGL2) facilitates injection of holes or electrons to each light-emitting unit and is preferable to lower drive voltage.

This is because injecting holes generated in the CGL1 to a hole-transport layer of the light-emitting unit on the cathode side through the material having a hole-transport property included in the CGL1 and injecting electrons generated in the CGL2 to an electron-transport layer of the light-emitting unit on the anode side through the material having an electron-transport property included in the CGL2 can lower a carrier injection barrier. The CGL2 may be a single film of a material having a donor property. In that case, charge separation occurs between the material having a donor property and the electron-transport material in the light-emitting unit on the anode side; therefore, electrons can be regarded as being injected to the light-emitting unit at the time of charge separation.

As a method for forming an organic compound film in a predetermined shape, a vacuum evaporation method with a metal mask (mask vapor deposition) is widely used. However, density and resolution have been recently increasing; thus, increasing resolution in the mask vapor deposition is reaching its limit due to problems typified by a problem of the degree of positioning precision and a problem of the arrangement interval of the substrate. An organic semiconductor device having a finer pattern is expected to be achieved by shape processing of an organic compound film by a photolithography technique. Moreover, since a photolithography technique achieves large-area processing more easily than mask vapor deposition, processing of an organic compound film by the photolithography technique is being researched.

It has been known that when EL layers in an organic EL device are exposed to atmospheric components such as water and oxygen, initial characteristics and reliability are affected, and thus it has been common knowledge that the EL layers are treated in a near-vacuum atmosphere.

In particular, an electron-injection layer in a light-emitting device or an intermediate layer (mainly the CGL2) used in a tandem light-emitting device, which often includes, as a donor for generating carriers, a material having a donor property such as an alkali metal, an alkaline earth metal, or a compound thereof (hereinafter also referred to as a Li compound or the like) highly reactive with water or oxygen, rapidly deteriorates and loses the function as the electron-injection layer or the intermediate layer when the Li compound is used as the intermediate layer and the surface of the EL layer is exposed to the atmosphere as well as when the Li compound is directly exposed to the atmosphere. Note that as the Li compound or the like, a material having a donor property such as tetrathianaphthacene (abbreviation: TTN), nickelocene, or decamethylnickelocene can be given as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)).

However, processing steps with the aforementioned photolithography technique inevitably expose the surface of the EL layer to the atmosphere and cause a substantial loss of the electron-injection property in the electron-injection layer or the intermediate layer including a Li compound or the like. The electron-transport layer can be formed after such processing. However, the intermediate layer is subjected to the processing; therefore, it has been difficult for the tandem light-emitting device that uses the intermediate layer including a Li compound or the like and is formed through processing by a photolithography technique to have favorable characteristics.

Here, the present inventors have confirmed that a light-emitting device that uses an organic compound having strong basicity such as 1-(9,9'-spirobi[9H-fluoren]-2-yl)-1,3,4,6,7,8-hexahydro-2H-pyrimido[1,2-a]pyrimidine (abbreviation: 2hppSF), instead of a Li compound or the like, operates as a tandem light-emitting device. Note that 2hppSF is a material that does not function as a donor with respect to a material having an electron-transport property, and a layer including 2hppSF instead of a Li compound or the like in a light-emitting device which includes 2hppSF instead of a Li compound or the like is a layer that does not generate carriers (since the layer that does not generate carriers is not a carrier-generation layer (CGL), a layer including an organic compound having strong basicity instead of a Li compound or the like, which is used instead of the CGL2, is referred to as a donor-less layer (DLL)). The layer that does not generate carriers specifically refers to a layer having a spin density lower than or equal to $1\times10^{17}$ spins/$cm^3$, preferably lower than $1\times10^{16}$ spins/$cm^3$. The spin density of a film formed by depositing 2,2'-(1,3-phenylene)bis(9-phenyl-1,10-phenanthroline) (abbreviation: mPPhen2P) and lithium oxide by co-evaporation at a weight ratio of 1:0.02, which is a film that can be used as the CGL2, is $4.8\times10^{17}$ spins/$cm^3$; a film having a spin density around this value can be used as the CGL2.

A light-emitting device that includes an alkali metal, an alkaline earth metal, or a compound thereof in the CGL2 deteriorates by exposure to the atmosphere. By using a layer that does not generate carriers (DLL) instead of the CGL2, a light-emitting device is unlikely to deteriorate by exposure to the atmosphere. This light-emitting device is unlikely to deteriorate by exposure to the atmosphere even when being formed through processing steps with a photolithography technique or the like involving exposure to the atmosphere. A light-emitting device of one embodiment of the present invention which uses a layer that does not generate carriers (DLL) instead of the CGL2 can have favorable characteristics.

However, in the tandem light-emitting device which includes the layer that does not generate carriers (DLL) instead of the CGL2, a contact between the CGL1 and the DLL causes a reduction in reliability, in some cases. The present inventors have found that formation of a layer that inhibits the interaction (ISL) in contact with the anode side of the CGL1 inhibits the reduction in reliability. Using a layer formed of a material whose LUMO level is greater than or equal to −4.30 eV and less than or equal to −3.00 eV, preferably greater than or equal to −4.30 eV and less than or equal to −3.30 eV, as the ISL is preferable to increase the electron-injection property, inhibit an increase in drive voltage, and inhibit a reduction in reliability. Since the interaction between the CGL1 and the DLL is a cause of the reliability reduction, the ISL is formed of a material that is different from a material included in the CGL1 and a material included in the DLL.

As the material of the ISL, diquinoxalino[2,3-a:2',3'-c]phenazine (abbreviation: HATNA), 2,3,8,9,14,15-hexafluorodiquinoxalino[2,3-a:2',3'-c]phenazine (abbreviation: HATNA-F6), a perylenetetracarboxylic acid derivative such as 3,4,9,10-perylenetetracarboxylicdiimide (abbreviation: PTCDI) or 3,4,9,10-perylenetetracarboxyl-bis-benzimidazole (abbreviation: PTCBI), (C60-Ih)[5,6]fullerene (abbreviation: C60), (C70-D5h)[5,6]fullerene (abbreviation: C70), or the like can be used. Among compounds having a cyclophane skeleton, a compound having a heterophane skeleton including a hetero ring can be suitably used. Examples of the compound include an organic compound having a phthalocyanine skeleton such as phthalocyanine (abbreviation: $H_2Pc$); metal phthalocyanine containing copper, zinc, cobalt, iron, chromium, nickel, vanadium, titanium, tin, or the like such as copper phthalocyanine (abbreviation: CuPc), zinc phthalocyanine (abbreviation: ZnPc), cobalt phthalocyanine (abbreviation: CoPc), iron phthalocyanine (abbreviation: FePc), tin phthalocyanine (abbreviation: SnPc), tin oxide phthalocyanine (abbreviation: SnOPc), titanium oxide phthalocyanine (abbreviation: TiOPc), or vanadium oxide phthalocyanine (abbreviation: VOPc); a derivative of such metal phthalocyanine. A phthalocyanine-based metal complex such as CuPc or ZnPc and 2,3,8,9,14,15-hexafluorodiquinoxalino[2,3-a:2',3'-c]phenazine are especially preferable. Among these, CuPc and ZnPc are further preferable for their inexpensiveness and favorable characteristics. Furthermore, ZnPc has a low diffusion coefficient with respect to silicon and lowers the possibility of adversely affecting semiconductor characteristics owing to metal diffusion to the semiconductor and thus is used particularly favorably in a display apparatus using a silicon semiconductor.

The thickness of the ISL is greater than or equal to 1 nm and less than or equal to 10 nm, preferably greater than or equal to 2 nm and less than or equal to 5 nm.

The CGL1 is preferably formed using a composite material containing a material having an electron-acceptor property and an organic compound having a hole-transport property.

Examples of the substance having an acceptor property include organic compounds having an electron-withdrawing group (a halogen group or a cyano group), such as 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group, a halogen group such as a fluoro group, or the like) has a significantly high electron-accepting property and thus is preferable. Specific examples include α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile]. As the substance having an acceptor property, a transition metal oxide such as molybdenum oxide, vanadium oxide, ruthenium oxide, tungsten oxide, or manganese oxide can be used, other than the above-described organic compounds.

As the organic compound having a hole-transport property used in the composite material, any of a variety of organic compounds such as aromatic amine compounds, heteroaromatic compounds, aromatic hydrocarbons, and high molecular compounds (e.g., oligomers, dendrimers, and polymers) can be used. Note that the organic compound having a hole-transport property used in the composite material preferably has a hole mobility higher than or equal to $1\times10^{-6}$ cm$^2$/Vs. The organic compound having a hole-transport property used in the composite material preferably has a condensed aromatic hydrocarbon ring or a π-electron rich heteroaromatic ring. As the condensed aromatic hydrocarbon ring, an anthracene ring, a naphthalene ring, or the like is preferable. As the π-electron rich heteroaromatic ring, a condensed aromatic ring having at least one of a pyrrole skeleton, a furan skeleton, and a thiophene skeleton is preferable; specifically, a carbazole ring, a dibenzothiophene ring, or a ring in which an aromatic ring or a heteroaromatic ring is further condensed to a carbazole ring or a dibenzothiophene ring is preferable.

Such an organic compound having a hole-transport property further preferably has any of a carbazole skeleton, a dibenzofuran skeleton, a dibenzothiophene skeleton, and an anthracene skeleton. In particular, an aromatic amine having a substituent that has a dibenzofuran ring or a dibenzothiophene ring, an aromatic monoamine that has a naphthalene ring, or an aromatic monoamine in which a 9-fluorenyl group is bonded to nitrogen of an amine through an arylene group may be used. Note that the organic compound having a hole-transport property preferably has an N,N-bis(4-biphenyl)amino group to enable fabricating a light-emitting device with a long lifetime.

Specific examples of the organic compound having a hole-transport property include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6; 1'-binaphthyl-2-yl)triphenylamine (abbreviation: BBAαNβNB), 4,4'-diphenyl-4"-(7; 1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6; 2'-binaphthyl-2-yl)triphenylamine (abbreviation: BBA(βN2)B), 4,4'-diphenyl-4"-(7; 2'-binaphthyl-2-yl)triphenylamine (abbreviation: BBA(βN2)B-03), 4,4'-diphenyl-4"-(4; 2'-binaphthyl-1-yl)triphenylamine (abbreviation: BBAβNαNB), 4,4'-diphenyl-4"-(5; 2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis(biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Examples of the aromatic amine compounds that can be used as the material having a hole-transport property include N,N-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), and 1,3,5-tris[N-(4-diphenylaminophenyl)-N-phenylamino]benzene (abbreviation: DPA3B).

The material having an electron-acceptor property in the CGL1 preferably has a property of accepting electrons. The material having an electron-acceptor property preferably has an electron-accepting property with respect to an organic compound having a hole-transport property. The CGL1 can function as a carrier-generation layer by including the material having an electron-acceptor property owing to charge separation in the CGL1 and thus can function as an intermediate layer of a tandem light-emitting device. Furthermore, it is preferable that a signal be observed by electron spin resonance spectroscopy on the CGL1. For example, the spin density attributed to a signal observed at a g-factor of approximately 2.00 is preferably higher than or equal to $1\times10^{16}$ spins/cm$^3$, further preferably higher than or equal to $1\times10^{17}$ spins/cm$^3$, still further preferably higher than or equal to $1\times10^{18}$ spins/cm$^3$, yet further preferably higher than or equal to $1\times10^{19}$ spins/cm$^3$.

It is preferable that a signal observed by electron spin resonance spectroscopy on the DLL be small or no signal be observed. For example, the spin density attributed to a signal observed at a g-factor of approximately 2.00 is preferably lower than or equal to $1\times10^{17}$ spins/cm$^3$, further preferably lower than $1\times10^{16}$ spins/cm$^3$.

Moreover, it is preferable that the DLL include a substance having strong basicity with an acid dissociation constant p$K_a$ of 8 or more and that the substance having strong basicity do not have a property of donating electrons to the material having an electron-transport property. In the case where the substance having strong basicity has an electron-donating property, the substance easily reacts with atmospheric components such as water and oxygen and is poor in stability.

Because the DLL can have a significantly lowered hole-transport property by including the substance having strong basicity and the material having an electron-transport property, a tandem light-emitting device including the DLL does not suffer a significant increase in drive voltage even when the substance having strong basicity does not have an electron-donating property. Accordingly, the intermediate layer and the tandem light-emitting device that are stable with respect to atmospheric components such as water and oxygen can be formed.

It is preferable that the substance having strong basicity do not have an electron-transport skeleton in order to lower the probability of recombination with electrons in the DLL.

Note that 2hppSF is a substance which has strong basicity with an acid dissociation constant $pK_a$ of 13.95, does not have an electron-donating property with respect to a material having an electron-transport property, and does not have an electron-transport skeleton.

A material with a large acid dissociation constant $pK_a$ blocks holes because the material with a large acid dissociation constant $pK_a$ has a large dipole moment. The dipole moment mutually interacts with holes, whereby the DLL including the material with a large acid dissociation constant $pK_a$ can block holes.

Another reason for hole blocking is high nucleophilicity of the material with a large acid dissociation constant $pK_a$. A material with high nucleophilicity reacts with a molecule that has become a cation radical by receiving a hole to generate a new molecule or intermediate state, in some cases. This reaction consumes holes and can significantly reduce the hole-transport property in the DLL.

As the acid dissociation constant $pK_a$ of the basic skeleton, the acid dissociation constant value of the organic compound formed by substituting hydrogen for part of the skeleton can be used. As an indicator of acidity of an organic compound having a basic skeleton, the acid dissociation constant $pK_a$ of the basic skeleton can be used. As for an organic compound having a plurality of basic skeletons, the acid dissociation constant $pK_a$ of the basic skeleton having the highest acid dissociation constant $pK_a$ can be used as the indicator of acidity of the organic compound. The acid dissociation constant $pK_a$ is preferably a value measured using water as a solvent.

Alternatively, the acid dissociation constant $pK_a$ of the organic compound may be calculated as follows.

First, as the initial molecular structure in each molecule that is a calculation model, the most stable structure (singlet ground state) obtained from the first-principles calculation is used.

For the first-principles calculation, Jaguar, which is the quantum chemical computational software produced by Schrodinger, Inc., was used, and the most stable structure in the singlet ground state was calculated by the density functional theory (DFT). As a basis function, 6-31G** was used, and as a functional, B3LYP-D3 was used. The structure subjected to quantum chemical calculation is sampled by conformational analysis in mixed torsional/low-mode sampling with Maestro GUI produced by Schrodinger, Inc.

In the calculation of $pK_a$, one or more atoms in each molecule are designated as basic sites, MacroModel is used to search for the stable structure of the protonated molecule in water, conformational search is performed with OPLS2005 force field, and a conformational isomer having the lowest energy is used. Jaguar's $pK_a$ calculation module is used. After structure optimization is performed by B3LYP/6-31G*, single point calculation is performed by cc-pVTZ(+) and the $pK_a$ value is calculated using empirical correction for functional group(s). For the molecule with one or more atoms designated as basic sites, the largest $pK_a$ value among the obtained results is employed.

The organic compound with a large acid dissociation constant $pK_a$ is preferably an organic compound having a pyrrolidine skeleton, a piperidine skeleton, or a hexahydropyrimidopyrimidine skeleton. Alternatively, an organic compound having a guanidine skeleton is preferably used. As specific examples, organic compounds having any of basic skeletons represented by Structural Formulae (120) to (123) below can be given.

[Chemical Formula 1]

(120)

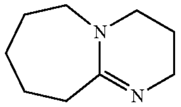

DBU (121)

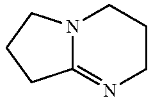

DBN (122)

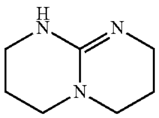

TBD (123)

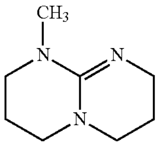

MTBD

It is preferable that the organic compound with an acid dissociation constant $pK_a$ of 8 or more be specifically an organic compound which has a bicyclo ring structure having 2 or more nitrogen atoms in the bicyclo ring and a heteroaromatic hydrocarbon ring having 2 to 30 carbon atoms in the ring or an aromatic hydrocarbon ring having 6 to 30 carbon atoms in the ring, and more specifically be an organic compound which has a 1,3,4,6,7,8-hexahydro-2H-pyrimido[1,2-a]pyrimidine skeleton and a heteroaromatic hydrocarbon ring having 2 to 30 carbon atoms in the ring or an aromatic hydrocarbon ring having 6 to 30 carbon atoms in the ring. An organic compound which has a bicyclo ring structure having 2 or more nitrogen atoms in the bicyclo ring and a heteroaromatic hydrocarbon ring having 2 to 30 carbon atoms in the ring, more specifically an organic compound which has a 1,3,4,6,7,8-hexahydro-2H-pyrimido[1,2-a]pyrimidine skeleton and a heteroaromatic hydrocarbon ring having 2 to 30 carbon atoms in the ring is further preferred.

Further specifically, the organic compound with an acid dissociation constant $pK_a$ of 8 or more is preferably an organic compound represented by General Formula (G1) below.

[Chemical Formula 2]

(G1)

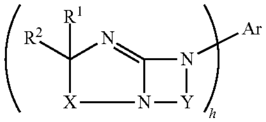

In the organic compound represented by General Formula (G1) above, X represents a group represented by General Formula (G1-1) below, and Y represents a group represented by General Formula (G1-2) below. $R^1$ and $R^2$ each independently represent hydrogen or deuterium, h represents an integer of 1 to 6, and Ar represents a substituted or unsubstituted heteroaromatic hydrocarbon ring having 2 to 30 carbon atoms in the ring or a substituted or unsubstituted aromatic hydrocarbon ring having 6 to 30 carbon atoms in the ring. Ar is preferably the substituted or unsubstituted heteroaromatic hydrocarbon ring having 2 to 30 carbon atoms in the ring.

[Chemical Formula 3]

(G1-1)

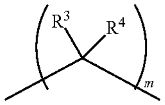

(G1-2)

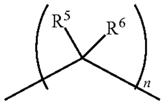

In General Formulae (G1-1) and (G1-2) above, $R^3$ to $R^6$ each independently represent hydrogen or deuterium, m represents an integer of 0 to 4, n represents an integer of 1 to 5, and $m+1 \geq n$ is satisfied. Note that in the case where m or n is 2 or more, $R^3$s may be the same or different, and the same applies to $R^4$s, $R^5$s, and $R^6$s.

The organic compound represented by General Formula (G1) above is preferably any one of compounds represented by General Formulae (G2-1) to (G2-6) below.

[Chemical Formula 4]

(G2-1)

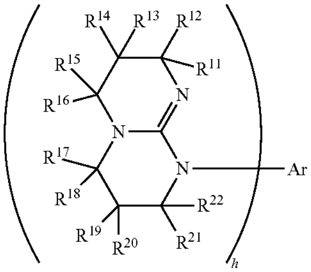

-continued (G2-2)

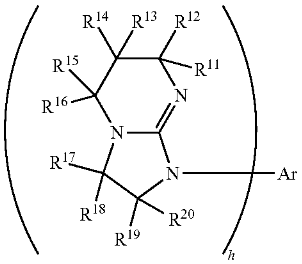

(G2-3)

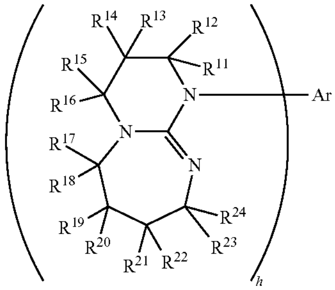

(G2-4)

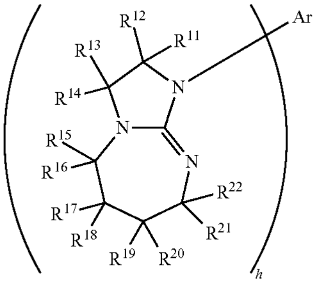

(G2-5)

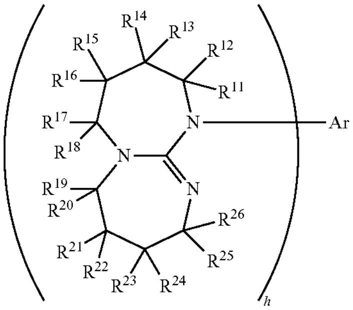

(G2-6)

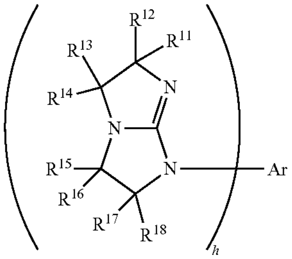

$R^{11}$ to $R^{26}$ each independently represent hydrogen or deuterium, h represents an integer of 1 to 6, and Ar represents a substituted or unsubstituted heteroaromatic hydrocarbon ring having 2 to 30 carbon atoms in the ring or a substituted or unsubstituted aromatic hydrocarbon ring having 6 to 30 carbon atoms in the ring. Ar is preferably the substituted or unsubstituted heteroaromatic hydrocarbon ring having 2 to 30 carbon atoms in the ring.

In General Formula (G1) and General Formulae (G2-1) to (G2-6) above, the substituted or unsubstituted heteroaromatic hydrocarbon ring having 2 to 30 carbon atoms in the ring or the substituted or unsubstituted aromatic hydrocarbon ring having 6 to 30 carbon atoms in the ring that is represented by Ar is specifically a pyridine ring, a bipyridine ring, a pyrimidine ring, a bipyrimidine ring, a pyrazine ring, a bipyrazine ring, a triazine ring, a quinoline ring, an isoquinoline ring, a benzoquinoline ring, a phenanthroline ring, a quinoxaline ring, a benzoquinoxaline ring, a dibenzoquinoxaline ring, an azofluorene ring, a diazofluorene ring, a carbazole ring, a benzocarbazole ring, a dibenzocarbazole ring, a dibenzofuran ring, a benzonaphthofuranyl ring, a dinaphthofuran ring, a dibenzothiophene ring, a benzonaphthothiophene ring, a dinaphthothiophene ring, a benzofuropyridine ring, a benzofuropyrimidine ring, a benzothiopyridine ring, a benzothiopyrimidine ring, a naphthofuropyridine ring, a naphthofuropyrimidine ring, a naphthothiopyridine ring, a naphthothiopyrimidine ring, an acridine ring, a xanthene ring, a phenothiazine ring, a phenoxazine ring, a phenazine ring, a triazole ring, an oxazole ring, an oxadiazole ring, a thiazole ring, a thiadiazole ring, an imidazole ring, a benzimidazole ring, a pyrazole ring, a pyrrole ring, or the like. In General Formula (G1) and General Formulae (G2-1) to (G2-6) above, the substituted or unsubstituted heteroaromatic hydrocarbon ring having 6 to 30 carbon atoms in the ring that is represented by Ar is specifically a benzene ring, a naphthalene ring, a fluorene ring, a dimethylfluorene ring, a diphenylfluorene ring, a spirofluorene ring, an anthracene ring, a phenanthrene ring, a triphenylene ring, a pyrene ring, a tetracene ring, a chrysene ring, a benzo[a]anthracene ring, or the like. Ar is especially preferably represented by any one of Structural Formulae (Ar-1) to (Ar-27) below.

[Chemical Formula 5]

(Ar-1)

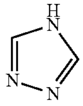

(Ar-2)

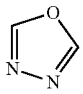

(Ar-3)

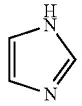

(Ar-4)

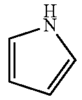

(Ar-5)

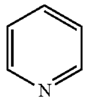

(Ar-6)

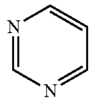

-continued (Ar-7)

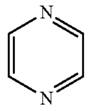

(Ar-8)

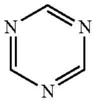

(Ar-9)

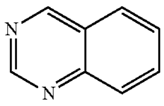

(Ar-10)

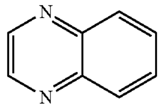

(Ar-11)

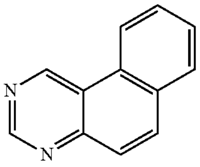

(Ar-12)

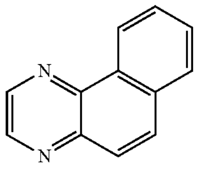

(Ar-13)

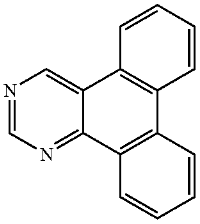

(Ar-14)

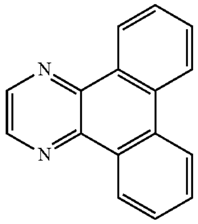

(Ar-15)

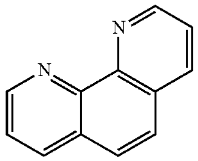

(Ar-16)

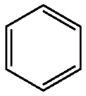

-continued (Ar-17)

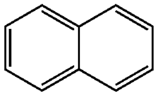

(Ar-18)

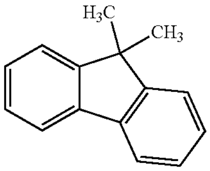

(Ar-19)

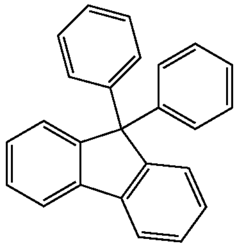

(Ar-20)

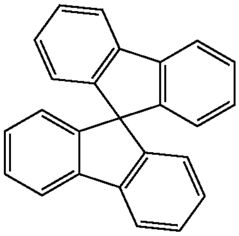

(Ar-21)

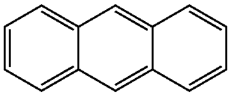

(Ar-22)

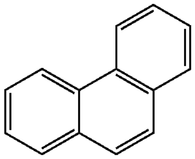

(Ar-23)

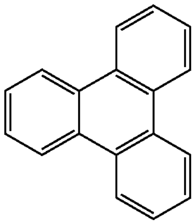

(Ar-24)

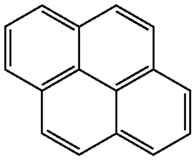

(Ar-25)

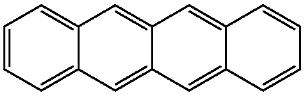

-continued (Ar-26)

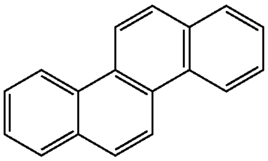

(Ar-27)

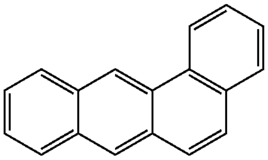

Note that Ar preferably has a nitrogen atom in its ring and is preferably bonded to the skeleton within parentheses in General Formula (G1) above by a bond of the nitrogen atom or a carbon atom adjacent to the nitrogen atom.

As specific examples of the organometallic compounds represented by General Formula (G1) and General Formulae (G2-1) to (G2-6) above, organic compounds represented by Structural Formulae (101) to (117) below, such as 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) (Structural Formula 108) and 1-(9,9'-spirobi[9H-fluoren]-2-yl)-1,3,4,6,7,8-hexahydro-2H-pyrimido[1,2-a]pyrimidine (abbreviation: 2hppSF) (Structural Formula 109), can be given.

[Chemical Formula 6]

(101)

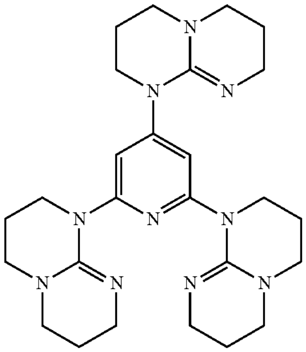

(102)

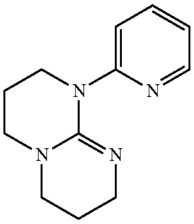

(103)

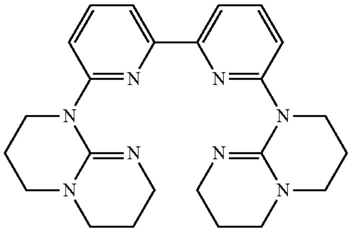

(104)
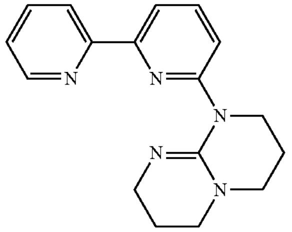
(105)
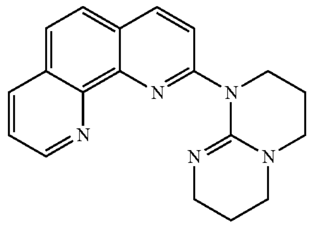
(106)
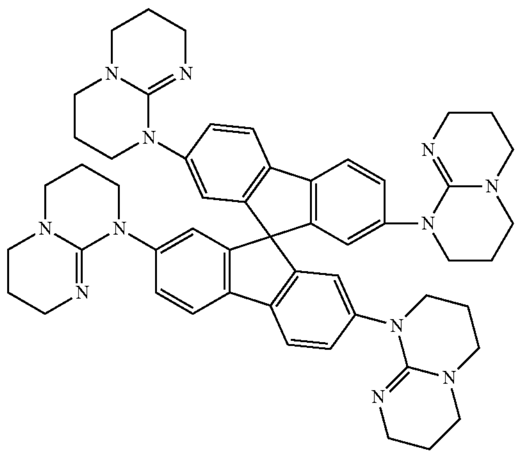
(107)
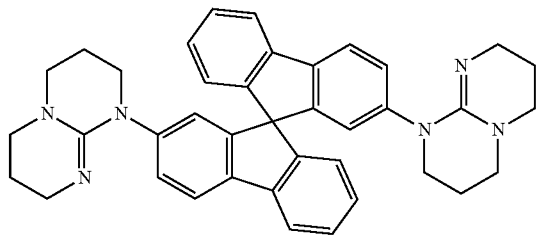
(108)
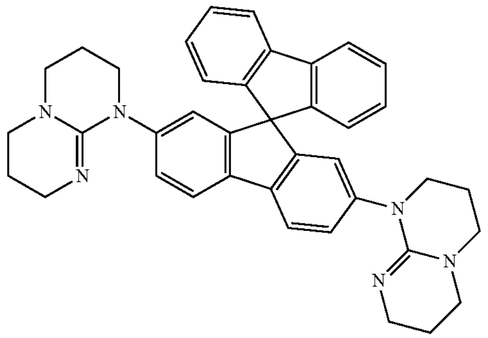
(109)
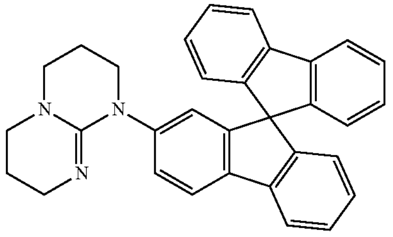
(110)
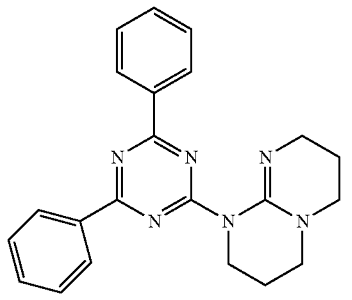
(111)
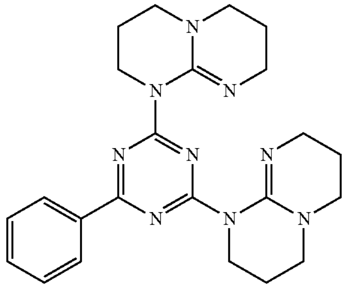
(112)
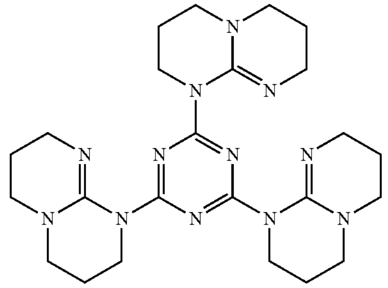
(113)
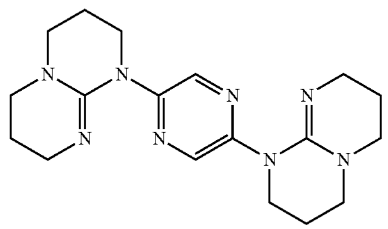

-continued (114)

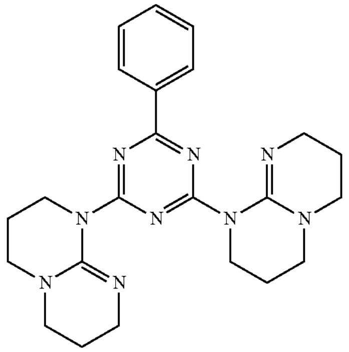

(115)

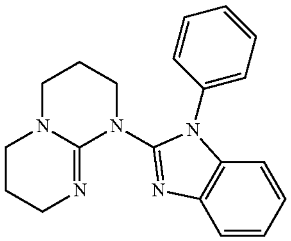

(116)

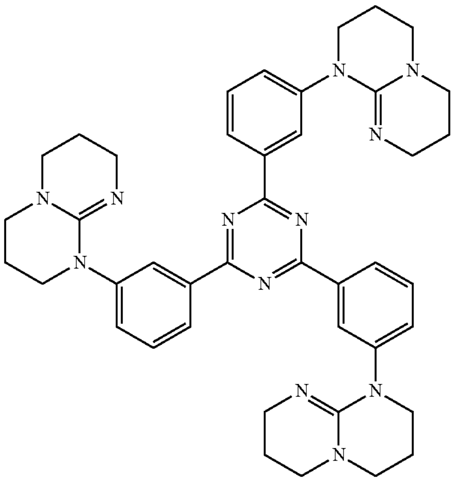

(117)

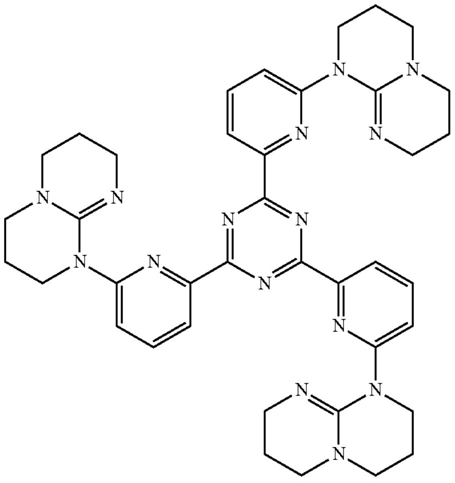

Note that it is preferable that the substance having strong basicity with a $pK_a$ of 8 or more do not have an electron-transport skeleton from the viewpoint of inhibiting recombination of the injected electrons and blocked holes in the substance having strong basicity with a $pK_a$ of 8 or more. As the substance having strong basicity with a $pK_a$ of 8 or more, an organic compound such as 1-(9,9'-spirobi[9H-fluoren]-2-yl)-1,3,4,6,7,8-hexahydro-2H-pyrimido[1,2-a]pyrimidine (abbreviation: 2hppSF), 2,9-bis(1,3,4,6,7,8-hexahydro-2H-pyrimido[1,2-a]pyrimidin-1-yl)-1,10-phenanthroline (abbreviation: 2,9hpp2Phen), 4,7-di-1-pyrrolidinyl-1,10-phenanthroline (abbreviation: Pyrrd-Phen), or 8,8'-pyridin-2,6-diyl-bis(5,6,7,8-tetrahydroimidazo[1,2-a]pyrimidine) (abbreviation: 2,6tip2Py) can specifically be used.

Furthermore, the DLL preferably includes a material having an electron-transport property in addition to the substance having strong basicity with a $pK_a$ of 8 or more. As the material having an electron-transport property, for example, a metal complex such as bis(10-hydroxybenzo[h]quinolinato)beryllium(II) (abbreviation: BeBq2), bis(2-methyl-8-quinolinolato)(4-phenylphenolato)aluminum(III) (abbreviation: BA1q), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a π-electron deficient heteroaromatic ring is preferably used. Examples of the organic compound having a π-electron deficient heteroaromatic ring skeleton include an organic compound that has a heteroaromatic ring having a polyazole skeleton, an organic compound that has a heteroaromatic ring having a pyridine skeleton, an organic compound that has a heteroaromatic ring having a diazine skeleton, and an organic compound that has a heteroaromatic ring having a triazine skeleton.

Among the above materials, the organic compound that has a heteroaromatic ring having a diazine skeleton (a pyrimidine skeleton, a pyrazine skeleton, or a pyridazine skeleton), the organic compound that has a heteroaromatic ring having a pyridine skeleton, and the organic compound that has a heteroaromatic ring having a triazine skeleton have high reliability and thus are preferable. In particular, the organic compound that has a heteroaromatic ring having a diazine (pyrimidine or pyrazine) skeleton and the organic compound that has a heteroaromatic ring having a triazine skeleton have a high electron-transport property to contribute to a reduction in drive voltage. A benzofuropyrimidine skeleton, a benzothienopyrimidine skeleton, a benzofuropyrazine skeleton, and a benzothienopyrazine skeleton are preferable because of their high reliability.

Examples of the organic compound having a π-electron deficient heteroaromatic ring skeleton include an organic compound having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOS); an organic compound having a heteroaromatic ring having a pyridine skeleton, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathophenanthroline (abbreviation: BPhen), bathocuproine (abbreviation: BCP), 2,9-di(naphthalene-2-yl)-4,7-diphenyl-1,10-phenanthroline (abbreviation: NBPhen), 2,2'-(1,3-phenylene)bis(9-phenyl-1,10-phenanthroline) (abbreviation: mPPhen2P), 2-[3-(2-triphenylenyl)phenyl]-1,10-phenanthroline (abbreviation: mTpPPhen), 2-phenyl-9-(2-triphenylenyl)-1,10-phenanthroline (abbreviation: Ph-TpPhen), 2-[4-(9-phenanthrenyl)-1-naphthalenyl]-1,10-phenanthroline (abbreviation: PnNPhen), or 2-[4-(2-triphenylenyl)phenyl]-1,10-phenanthroline (abbreviation: pTpPPhen); an organic compound having a diazine skeleton, such as 2-[3-(dibenzothiophen-4-yl)phenyl]dibenzo[f; h]quinoxaline (abbreviation: 2mDBTPDBq-II), 2-[3-(3'-dibenzothiophen-4-yl)biphenyl]dibenzo[f; h]quinoxaline (abbreviation: 2mDBTBPDBq-II), 2-[3'-(9H-carbazol-9-yl)biphenyl-3-yl]dibenzo[f; h]quinoxaline (abbreviation: 2mCzBPDBq), 2-[4'-(9-phenyl-9H-carbazol-3-yl)-3,1'-biphenyl-1-yl]dibenzo[f; h]quinoxaline (abbreviation: 2mpPCBPDBq), 2-[4-(3,6-diphenyl-9H-carbazol-9-yl)phenyl]dibenzo[f; h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[3'-(dibenzothiophen-4-yl)biphenyl-3-yl]naphtho[1',2':4,5]furo[2,3-b]pyrazine (abbreviation: 9mDBtBPNfpr), 9-[(3'-(dibenzothiophen-4-yl)biphenyl-4-yl]naphtho[1',2':4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3'-diyl)]bis(9H-carbazole) (abbreviation: 4,6mCzBP2Pm), 8-(biphenyl-4-yl)-4-[3-(dibenzothiophen-4-yl)phenyl]-[1]benzofuro[3,2-d]pyrimidine (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(biphenyl-3-yl)]naphtho[1',2':4,5]furo[3,2-d]pyrimidine (abbreviation: 8mDBtBPNfpm), 8-[(2,2'-binaphthalen)-6-yl]-4-[3-(dibenzothiophen-4-yl)phenyl]-[1]benzofuro[3,2-d]pyrimidine (abbreviation: 8(βN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine} (abbreviation: 2,6(NP-PPm)2Py), 6-(biphenyl-3-yl)-4-[3,5-bis(9H-carbazol-9-yl)phenyl]-2-phenylpyrimidine (abbreviation: 6mBP-4Cz2PPm), 2,6-bis(4-naphthalen-1-ylphenyl)-4-[4-(3-pyridyl)phenyl]pyrimidine (abbreviation: 2,4NP-6PyPPm), 4-[3,5-bis(9H-carbazol-9-yl)phenyl]-2-phenyl-6-(1,1'-biphenyl-4-yl)pyrimidine (abbreviation: 6BP-4Cz2PPm), or 7-[4-(9-phenyl-9H-carbazol-2-yl)quinazolin-2-yl]-7H-dibenzo[c,g]carbazole (abbreviation: PC-cgDBCzQz); and an organic compound having a heteroaromatic ring having a triazine skeleton, such as 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris(3'-(pyridin-3-yl)biphenyl-3-yl)-1,3,5-triazine (abbreviation: TmPPPyTz), 2-[3-(2,6-dimethyl-3-pyridinyl)-5-(9-phenanthrenyl)phenyl]-4,6-diphenyl-1,3,5-triazine (abbreviation: mPn-mDMePyPTzn), 11-[4-(biphenyl-4-yl)-6-phenyl-1,3,5-triazin-2-yl]-11,12-dihydro-12-phenylindolo[2,3-a]carbazole (abbreviation: BP-Icz(II)Tzn), 2-[3'-(triphenylen-2-yl)biphenyl-3-yl]-4,6-diphenyl-1,3,5-triazine (abbreviation: mTpBPTzn), 3-[9-(4,6-diphenyl-1,3,5-triazin-2-yl)-2-dibenzofuranyl]-9-phenyl-9H-carbazole (abbreviation: PCDBfTzn), or 2-(biphenyl-3-yl)-4-phenyl-6-{8-[(1,1':4',1"-terphenyl)-4-yl]-1-dibenzofuranyl}-1,3,5-triazine (abbreviation: mBP-TPDBfTzn). The organic compound that has a heteroaromatic ring having a diazine skeleton, the organic compound that has a heteroaromatic ring having a pyridine skeleton, and the organic compound that has a heteroaromatic ring having a triazine skeleton are preferable because of their high reliability.

The organic compound that has a heteroaromatic ring having a diazine skeleton, the organic compound that has a heteroaromatic ring having a pyridine skeleton, and the organic compound that has a heteroaromatic ring having a triazine skeleton are especially preferable because of having high reliability. In particular, the organic compound that has a heteroaromatic ring having a diazine (pyrimidine or pyrazine) skeleton and the organic compound that has a heteroaromatic ring having a triazine skeleton have a high electron-transport property to contribute to a reduction in drive voltage. An organic compound having a phenanthroline skeleton such as mTpPPhen, PnNPhen, or mPPhen2P is especially preferable, and an organic compound having a phenanthroline dimer structure such as mPPhen2P is further preferable because of its excellent stability. Furthermore, a material having a pyridine skeleton or a phenanthroline skeleton, which has a large $pK_a$ and thus has a high hole-blocking property, is particularly preferable as an electron-transport material used in the DLL of a light-emitting device of one embodiment of the present invention.

The LUMO level of the material having an electron-transport property in the DLL is preferably greater than or equal to −3.00 eV and less than or equal to −2.00 eV in order to lower a barrier to electron injection to the light-emitting layer.

The thickness of the DLL is preferably small; however, too large a thickness increases drive voltage and too small a thickness worsens characteristics, particularly reliability. Therefore, the thickness of the DLL is preferably greater than or equal to 2 nm and less than or equal to 13 nm, further preferably greater than or equal to 5 nm and less than or equal to 10 nm.

The DLL is preferably a layer having a function of blocking holes or a layer having an extremely low hole-transport property. The DLL needs to transport and inject, to the light-emitting unit on the anode side (first light-emitting unit), electrons injected from the CGL1 and thus is a layer having an electron-transport property.

Whether the DLL is a layer having a function of blocking holes or a layer having an extremely low hole-transport property can be judged by forming an electronic device that makes only holes flow (hereinafter referred to as a hole-only device) and measuring the relation between current density and voltage. For example, in the case where the current density of a hole-only device shown in Table 1, in which a target layer is sandwiched, is extremely low, specifically in the case where the current density of the measurement device shown in Table 1, in which the target layer is sandwiched, at a voltage of 10 V applied between electrodes is lower than or equal to 0.01 mA/$cm^2$, the target layer can be regarded as a layer that blocks holes.

TABLE 1

| | Film thickness (nm) | |
|---|---|---|
| Second electrode | 100 | Aluminum |
| Layer 5 | 5 | Molybdenum oxide |
| Layer 4 | 50 | PCBBiF |
| Layer 3 | 10 | Measurement target layer |
| Layer 2 | 50 | PCBBiF |
| Layer 1 | 10 | PCBBiF:OCHD003 (1:0.15) |
| First electrode | 70 | ITSO |

In the table, ITSO represents indium tin oxide containing silicon oxide, PCBBiF represents N-(biphenyl-4-yl)-N-[4-(9-phenyl-9H-carbazol-3-yl)phenyl]-9,9-dimethyl-9H-fluoren-2-amine, and OCHD-003 represents a fluorine-containing material having an electron-acceptor property with a molecular weight of 672.

The relation between current density and voltage is compared between such a measurement device in which the layer 3 is not formed and the measurement device with the 10-nm-thick target layer as the layer 3. In the case where measurement is performed with the 10-nm-thick target layer serving as the layer 3 sandwiched, the target layer offering a current density at 10 V of lower than or equal to 0.01 mA/$cm^2$ can be regarded as a layer that blocks holes.

Figure 20:
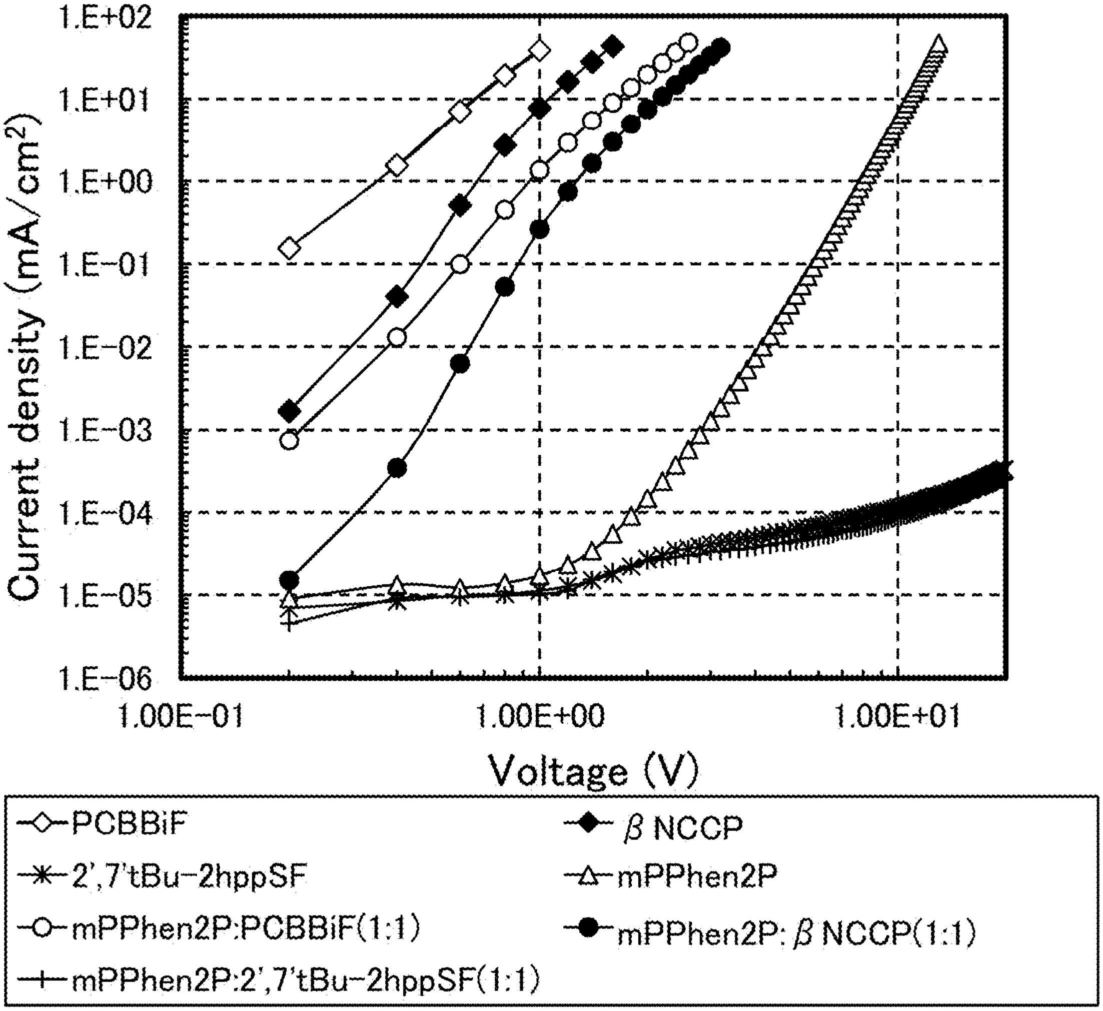
FIG. 20 shows current density—voltage characteristics.

FIG. 20 shows measurement results using examples of such a measurement device. FIG. 20 shows results of hole-only measurement devices with films serving as the layers 3 of N-(biphenyl-4-yl)-N-[4-(9-phenyl-9H-carbazol-3-yl)phenyl]-9,9-dimethyl-9H-fluoren-2-amine (abbreviation: PCBBiF), 9-(2-naphthyl)-9'-phenyl-9H,9'H-3,3'-bicarbazole (abbreviation: βNCCP), 1-(2',7'-di-tert-butyl-9,9'-spirobi[9H-fluoren]-2-yl)-1,3,4,6,7,8-hexahydro-2H-pyrimido[1,2-a]pyrimidine (abbreviation: 2',7'tBu-2hppSF), 2,2'-(1,3-phenylene)bis(9-phenyl-1,10-phenanthroline) (abbreviation: mPPhen2P), mPPhen2P:PCBBiF (1:1 by weight), mPPhen2P:βNCCP (1:1 by weight), and mPPhen2P:2',7'tBu-2hppSF (1:1 by weight).

From the graph, the layers formed of PCBBiF, βNCCP, mPPhen2P, mPPhen2P:PCBBiF (1:1 by weight), and mPPhen2P:NCCP (1:1 by weight) are layers that do not block holes, and the layers formed of mPPhen2P:2',7'tBu-2hppSF (1:1 by weight) and 2',7'tBu-2hppSF are layers that block holes.

In the case where the measurement target layer is a mixed layer of Material A and Material B, the hole-only device in which the mixed layer is provided as the measurement target layer (Device A) and the hole-only device in which a single layer of Material A or Material B, whichever has a deeper HOMO level, is provided as the measurement target layer (Device B) are fabricated. In the case where the voltage at 1 mA/$cm^2$ of Device A is higher than that of Device Y by 1 V or more, the mixed layer can be regarded as a layer that blocks holes.

The hole mobility in the DLL is preferably lower than or equal to $1\times10^{-8}$ $cm^2$/Vs under the conditions where the square root of electric field strength [V/cm] is 600. The electron mobility in the DLL is preferably higher than or equal to $1\times10^{-7}$ $cm^2$/Vs under the conditions where the square root of electric field strength [V/cm] is 600. The electron mobility is preferably higher than or equal to 1000 times, further preferably 10000 times the hole mobility under the conditions where the square root of electric field strength [V/cm] is 600.

The light-emitting device of one embodiment of the present invention and a mechanism of the tandem light-emitting device including the layer that does not generate carriers (DLL) instead of the CGL2 are described below with reference to FIGS. 1A and 1B.

In a normal tandem light-emitting device, a Li compound used in the CGL2 behaves as a donor and generates carriers by charge separation between the electron-transport material and the Li compound. However, the DLL (layer 1) is a layer that does not cause charge separation and does not generate carriers.

Even when the DLL does not generate carriers, carriers (holes and electrons) are generated in the CGL1 (layer 3) by voltage application. However, electrons generated in the CGL1 are difficult to inject to the DLL (FIG. 1A). This is because the difference between the lowest unoccupied molecular orbital (LUMO) level of the material having an electron-transport property ($LUMO_{ETM}$) and the LUMO level of the material having an acceptor property ($LUMO_{AC}$) is usually large and thus the potential gap in LUMO level between the material having an acceptor property of the CGL1 and the material having an electron-transport property of the DLL is large.

Therefore, in the case where the DLL does not generate carriers when the CGL1 generates electrons, the injection of electrons to the first electron-transport layer ($ETL_1$) of the first light-emitting unit is difficult and light emission from the first light-emitting layer of the first light-emitting unit is hard to obtain. Since the HOMO level of the material having a hole-transport property of the CGL1 ($HOMO_{HTM}$) can be the same as or close to the HOMO level of a material having a hole-transport property in a second hole-transport layer ($HTL_2$) of a second light-emitting unit, the situation is such that holes generated in the CGL1 can be injected to the second light-emitting unit without any problems.

Although the DLL does not function as a carrier-generation layer in the tandem light-emitting device which uses the DLL instead of the CGL2, the device which uses the DLL instead of the CGL2 functions as a tandem light-emitting device by the driving mechanism of the tandem light-emitting device that is generation of electric dipole due to accumulation of electrical charges and the accompanying shift of the vacuum level.

In the tandem light-emitting device that uses the DLL instead of the CGL2, application of voltage in the above-described manner does not make the DLL generate carriers because the DLL does not function as a CGL. Since an electron-transport layer usually blocks holes or has a low hole-transport property, holes injected to the first light-emitting unit from the anode are accumulated near the interface on the DLL side in the first light-emitting layer or the first electron-transport layer. In this case, the DLL is preferably a layer that blocks holes or a layer that has an extremely low hole mobility in order that the first light-emitting layer can efficiently emit light. In the case where the DLL includes an organic compound having strong basicity, holes are accumulated near the interface on the first electron-transport layer side in the DLL (400 in FIG. 1).

Although holes and electrons are induced from the CGL1 by the application of voltage and the hole accumulation, the electrons induced in the CGL1 are not injected to the DLL and accumulated near the interface on the DLL side in the CGL1 (401 in FIG. 1B) since the difference in LUMO level between the material having an acceptor property included in the CGL1 and the material having an electron-transport property included in the DLL is large in the initial state as described above (in the case where the DLL does not include a material having an electron-transport property, that is, where the DLL is a single film of the organic compound having strong basicity, electrons generated in the CGL1 are accumulated on the single film (the organic compound having strong basicity) side). The accumulated electrons and the holes accumulated in the first light-emitting layer, the first electron-transport layer, or the DLL form an electric double layer and generate electric dipole (402 in FIG. 1).

Figure 1B:
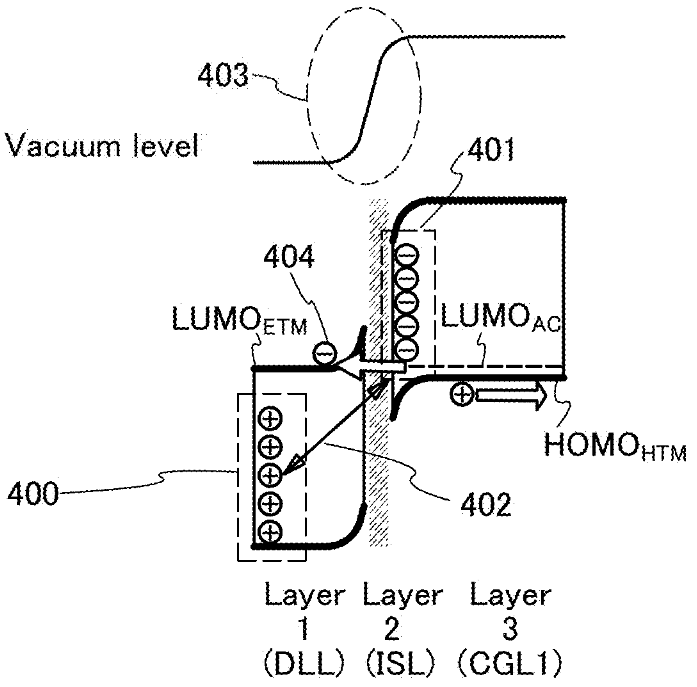

Consequently, the vacuum level shifts (403 in FIG. 1B) and the LUMO level of the material having an acceptor property included in the CGL1 and the LUMO level of the material having an electron-transport property in the DLL become closer to each other, so that the electrons generated in the CGL1 start to be injected to the DLL (404 in FIG. 1B). Then, the electrons injected to the DLL are further injected to the first light-emitting unit and reach a first light-emitting layer to cause recombination and light emission from the first light-emitting unit. Thus, the light-emitting device of one embodiment of the present invention in which the DLL is used instead of the CGL2 can function as a tandem light-emitting device.

The light-emitting device which uses the CGL2 including an alkali metal, an alkaline earth metal, or a compound thereof deteriorates by exposure to the atmosphere; in contrast, the light-emitting device which uses the layer that does not generate carriers (DLL) instead of the CGL2 is unlikely to deteriorate by exposure to the atmosphere. Therefore, even when such a light-emitting device is fabricated through processing steps with a photolithography technique involving exposure to the atmosphere, deterioration due to exposure to the atmosphere is unlikely to occur in the light-emitting device. Thus, the light-emitting device of one embodiment of the present invention which uses the layer that does not generate carriers (DLL) instead of the CGL2 can have favorable characteristics.

The light-emitting device of one embodiment of the present invention having the above-described structure can have high current efficiency, high reliability, and a suppressed increase in drive voltage.

The highly reliable light-emitting device can be provided by the existence of the layer 2 that is the ISL. Since the reliability reduction is caused by the interaction between the CGL1 (layer 3) and the DLL (layer 1), the material included in the layer 2 is a material included in neither CGL1 nor the DLL. The material of the ISL preferably has a LUMO level greater than or equal to −4.30 eV and less than or equal to −3.00 eV in order to inhibit an increase in drive voltage.

One embodiment of the present invention is particularly suitably used in a light-emitting device formed through a photolithography process and also contributes to cost reduction in manufacturing of light-emitting devices not formed through a photolithography process because high stability in the atmosphere of one embodiment of the present invention increases yield and eliminates the need for too strictly managing the atmosphere in the manufacturing process.

Embodiment 2

In this embodiment, light-emitting devices of one embodiment of the present invention will be described in detail.

Figure 2:
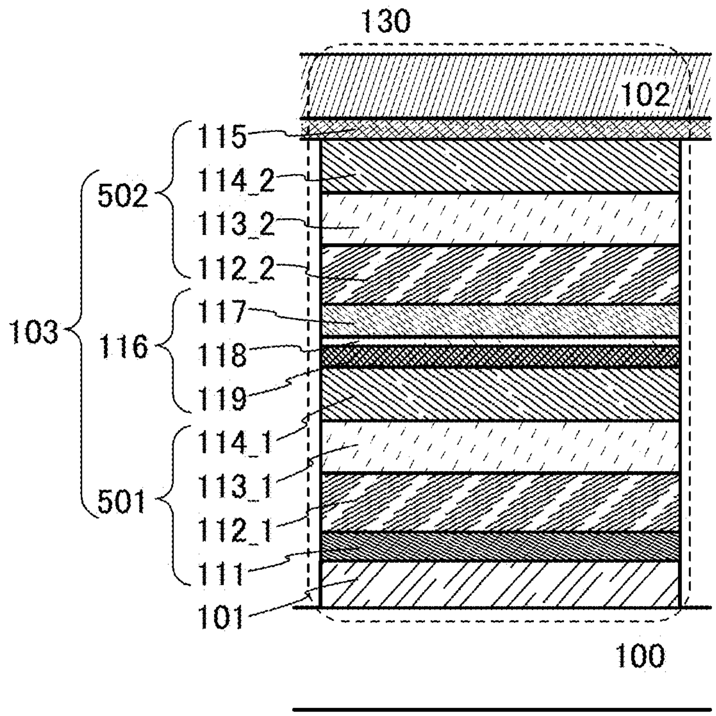
FIG. 2 illustrates a light-emitting device.

FIG. 2 is a schematic diagram of the light-emitting device of one embodiment of the present invention. The light-emitting device includes a first electrode 101 over an insulator 100, and an organic compound layer 103 between the first electrode 101 and a second electrode 102. As described in Embodiment 1, the organic compound layer 103 includes a plurality of light-emitting units (a first light-emitting unit 501 and a second light-emitting unit 502 in FIG. 2) and an intermediate layer 116.

The first light-emitting unit 501 includes at least a first light-emitting layer 113_1 and a first electron-transport layer 114_1, and the second light-emitting unit 502 includes at least a second light-emitting layer 113_2. The first light-emitting layer 113_1 and the second light-emitting layer 113_2 are each a layer containing a light-emitting substance and emit light when voltage is applied between the first electrode 101 and the second electrode 102.

The first light-emitting unit 501 preferably includes, in addition to the above-described layers, functional layers such as a hole-injection layer 111 and a first hole-transport layer 112_1 as illustrated in FIG. 2. The first light-emitting unit 501 may include functional layers other than the above-described functional layers, such as an electron-block layer and an exciton-block layer. Alternatively, any of the above-described layers may be omitted.

The second light-emitting unit 502 preferably includes, in addition to the above-described layers, functional layers such as a second hole-transport layer 1122, a second electron-transport layer 1142, and an electron-injection layer 115 as illustrated in FIG. 2. The second light-emitting unit 502 may include functional layers other than the above-described functional layers, such as a hole-block layer, an electron-block layer, and an exciton-block layer. Alternatively, any of the above-described layers may be omitted.

Furthermore, the intermediate layer 116 includes at least a first layer 119 (the DLL in Embodiment 1), a second layer 118 (the ISL in Embodiment 1), and a third layer 117 (the CGL1 in Embodiment 1) from the anode (the first electrode 101 in FIG. 2) side. The first layer 119 is a layer including an organic compound having strong basicity as described in Embodiment 1. The first layer 119 may further include an organic compound having an electron-transport property. The third layer 117 is a layer that generates carriers by voltage application. The third layer 117 is preferably a layer including an organic compound having a hole-transport property and a substance having an acceptor property with respect to the organic compound. The second layer 118 is a layer formed using a material having a LUMO level greater than or equal to −4.30 eV and less than or equal to −3.00 eV and can inhibit a reduction in reliability. Since the reliability reduction is caused by the interaction between the first layer 119 and the third layer 117, a material included in the second layer 118 is a material included in neither the first layer 119 nor the third layer 117.

Since the structures of the first layer 119, the second layer 118, and the third layer 117 have been specifically described in detail as the structures of the DLL, the CGL1, and the ISL in Embodiment 1, repetitive descriptions thereof are omitted.

The first electrode 101 includes an anode and the second electrode 102 includes a cathode in this embodiment. The first electrode 101 and the second electrode 102 may each have a single-layer structure or a stacked-layer structure. In the case of the stacked-layer structure, a layer in contact with the organic compound layer 103 serves as an anode or a cathode. In the case where the electrodes each have the stacked-layer structure, there is no limitation on work functions of materials for layers other than the layer in contact with the organic compound layer 103, and the materials can be selected in accordance with required properties such as a resistance value, processing easiness, reflectivity, light-transmitting property, and stability.

The anode is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide (ITSO: indium tin silicon oxide), indium oxide-zinc oxide, and indium oxide containing tungsten oxide and zinc oxide (IWZO). Films of such conductive metal oxides are usually formed by a sputtering method, but may be formed by application of a sol-gel method or the like. For example, a film of indium oxide-zinc oxide is formed by a sputtering method using a target in which 1 wt % to 20 wt % zinc oxide is added to indium oxide. Furthermore, a film of indium oxide containing tungsten oxide and zinc oxide (IWZO) can be formed by a sputtering method using a target in which 0.5 wt % to 5 wt % tungsten oxide and 0.1 wt % to 1 wt % zinc oxide are added to indium oxide. Alternatively, gold (Au), platinum (Pt), nickel (Ni), tungsten (W), chromium (Cr), molybdenum (Mo), iron (Fe), cobalt (Co), copper (Cu), palladium (Pd), titanium, (Ti), aluminum (Al), nitride of a metal material (e.g., titanium nitride), or the like can be used for the anode. The anode may be a stack of layers formed of any of these materials. For example, a film in which Al, Ti, and ITSO are stacked in this order over Ti is preferable because the film has high efficiency owing to high reflectivity and enables high resolution of several thousand ppi. Graphene can also be used for the anode. When a composite material that can be included in the hole-injection layer 111, which is described later, is used for a layer (typically, the hole-injection layer) in contact with the anode, an electrode material can be selected regardless of its work function.

The hole-injection layer 111 is provided in contact with the anode and has a function of facilitating injection of holes to the organic compound layer 103. The hole-injection layer 111 can be formed using a phthalocyanine-based compound or complex compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or 4,4'-bis(N-{4-[N'-(3-methylphenyl)-N-phenylamino]phenyl}-N-phenylamino)biphenyl (abbreviation: DNTPD), or a high molecular compound such as poly(3,4-ethylenedioxythiophene)/poly(styrenesulfonic acid) (abbreviation: PEDOT/PSS).

The hole-injection layer 111 may be formed using a substance having an electron-acceptor property. Examples of the substance having an acceptor property include organic compounds having an electron-withdrawing group (a halogen group or a cyano group), such as 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group, a halogen group such as a fluoro group, or the like) has a significantly high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, a transition metal oxide such as molybdenum oxide, vanadium oxide, ruthenium oxide, tungsten oxide, or manganese oxide can be used, other than the above-described organic compounds.

The hole-injection layer 111 is preferably formed using a composite material containing any of the aforementioned materials having an acceptor property and an organic compound having a hole-transport property.

As the organic compound having a hole-transport property used in the composite material, any of a variety of organic compounds such as aromatic amine compounds, heteroaromatic compounds, aromatic hydrocarbons, and high molecular compounds (e.g., oligomers, dendrimers, and polymers) can be used. Note that the organic compound having a hole-transport property used in the composite material preferably has a hole mobility higher than or equal to $1\times10^{-6}$ $cm^2/Vs$. The organic compound having a hole-transport property used in the composite material preferably has a condensed aromatic hydrocarbon ring or a π-electron rich heteroaromatic ring. As the condensed aromatic hydrocarbon ring, an anthracene ring, a naphthalene ring, or the like is preferable. As the π-electron rich heteroaromatic ring, a condensed aromatic ring having at least one of a pyrrole skeleton, a furan skeleton, and a thiophene skeleton in the ring is preferable; specifically, a carbazole ring, a dibenzothiophene ring, or a ring in which an aromatic ring or a heteroaromatic ring is further condensed to a carbazole ring or a dibenzothiophene ring is preferable.

Such an organic compound having a hole-transport property further preferably has any of a carbazole skeleton, a dibenzofuran skeleton, a dibenzothiophene skeleton, and an anthracene skeleton. In particular, an aromatic amine having a substituent that has a dibenzofuran ring or a dibenzothiophene ring, an aromatic monoamine that has a naphthalene ring, or an aromatic monoamine in which a 9-fluorenyl group is bonded to nitrogen of an amine through an arylene group may be used. Note that the organic compound having a hole-transport property preferably has an N,N-bis(4-biphenyl)amino group to enable fabricating a light-emitting device with a long lifetime.

Specific examples of the organic compound having a hole-transport property include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6; 1'-binaphthyl-2-yl)triphenylamine (abbreviation: BBAαNβNB), 4,4'-diphenyl-4"-(7; 1'-binaphthyl-2-yl)triphenylamine (abbreviation: BBAαNβNB-03), 4,4'-diphenyl-4"-(7-phenyl)naphthyl-2-yltriphenylamine (abbreviation: BBAP3NB-03), 4,4'-diphenyl-4"-(6; 2'-binaphthyl-2-yl)triphenylamine (abbreviation: BBA(βN2)B), 4,4'-diphenyl-4"-(7; 2'-binaphthyl-2-yl)triphenylamine (abbreviation: BBA(βN2)B-03), 4,4'-diphenyl-4"-(4; 2'-binaphthyl-1-yl)triphenylamine (abbreviation: BBAβNαNB), 4,4'-diphenyl-4"-(5; 2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl) amine (abbreviation: YGTBi1BP-02), 4-[4'-(carbazol-9-yl) biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis(biphenyl-4-yl)-9,9'-spirobi [9H-fluoren]-4-amine (abbreviation: BBASF(4)), N-(biphenyl-2-yl)-N-(9,9-dimethyl-9H-fluoren-2-yl)-9,9'-spirobi [9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl] triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Examples of the aromatic amine compounds that can be used as the material having a hole-transport property include N,N-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), and 1,3,5-tris[N-(4-diphenylaminophenyl)-N-phenylamino]benzene (abbreviation: DPA3B).

The formation of the hole-injection layer 111 can improve the hole-injection property, which allows the light-emitting device to be driven at a low voltage.

Among substances having an acceptor property, the organic compound having an acceptor property is easy to use because it is easily deposited by vapor deposition.

The first hole-transport layer 112_1 and the second hole-transport layer 112_2 are each formed using an organic compound having a hole-transport property. The organic compound having a hole-transport property preferably has a hole mobility of $1\times10^{-6}$ $cm^2/Vs$ or higher.

Examples of the material having a hole-transport property include compounds having an aromatic amine skeleton, such as 4,4'-bis[N-(1-naphthyl)-N-phenylamino]biphenyl (abbreviation: NPB), N,N-diphenyl-N,N-bis(3-methylphenyl)-4,4'-diaminobiphenyl (abbreviation: TPD), N,N-bis(9,9'-spirobi[9H-fluoren]-2-yl)-N,N-diphenyl-4,4'-diaminobiphenyl (abbreviation: BSPB), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 9,9'-diphenyl-9H,9'H-3,3'-bicarbazole (abbreviation: PCCP), 9,9'-bis(biphenyl-4-yl)-3,3'-bi-9H-carbazole (abbreviation: BisBPCz), 9,9'-bis(biphenyl-3-yl)-3,3'-bi-9H-carbazole (abbreviation: BismBPCz), 9-(biphenyl-3-yl)-9'-(biphenyl-4-yl)-9H,9'H-3,3'-bicarbazole (abbreviation: mBPCCBP), 9-(2-naphthyl)-9'-phenyl-9H,9'H-3,3'-bicarbazole (abbreviation: βNCCP), 9-(3-biphenyl)-9'-(2-naphthyl)-3,3'-bi-9H-carbazole (abbreviation: PNCCmBP), 9-(4-biphenyl)-9'-(2-naphthyl)-3,3'-bi-9H-carbazole (abbreviation: PNCCBP), 9,9'-di-2-naphthyl-3,3'-9H,9'H-bicarbazole (abbreviation: BisPNCz), 9-(2-naphthyl)-9'-[1,1':4',1"-terphenyl]-3-yl-3,3'-9H,9'H-bicarbazole, 9-(2-naphthyl)-9'-[1,1':3',1"-terphenyl]-3-yl-3,3'-9H,9'H-bicarbazole, 9-(2-naphthyl)-9'-[1,1':3',1"-terphenyl]-5'-yl-3,3'-9H,9'H-bicarbazole, 9-(2-naphthyl)-9'-[1,1':4',1"-terphenyl]-4-yl-3,3'-9H,9'H-bicarbazole, 9-(2-naphthyl)-9'-[1,1':3',1"-terphenyl]-4-yl-3,3'-9H,9'H-bicarbazole, 9-(2-naphthyl)-9'-(triphenylen-2-yl)-3,3'-9H,9'H-bicarbazole, 9-phenyl-9'-(triphenylen-2-yl)-3,3'-9H,9'H-bicarbazole (abbreviation: PCCzTp), 9,9'-bis(triphenylen-2-yl)-3,3'-9H,9'H-bicarbazole, 9-(4-biphenyl)-9'-(triphenylen-2-yl)-3,3'-9H,9'H-bicarbazole, 9-(triphenylen-2-yl)-9'-[1,1':3',1"-terphenyl]-4-yl-3,3'-9H,9'H-bicarbazole, and 9-[4-(9-phenyl-9H-carbazol-3-yl)-phenyl]phenanthrene (abbreviation: PCPPn); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl) phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. Note that any of the substances given as examples of the material having a hole-transport property used for the composite material for the hole-injection layer 111 can also be suitably used as the material contained in the hole-transport layer 112.

The light-emitting layer 113 is a layer including a light-emitting substance and preferably includes a light-emitting substance and a host material. The light-emitting layer 113 may additionally include other materials. Alternatively, the light-emitting layer 113 may be a stack of two layers with different compositions.

As the light-emitting substance, fluorescent substances, phosphorescent substances, substances exhibiting thermally activated delayed fluorescence (TADF), or other light-emitting substances may be used.

Examples of the material that can be used as a fluorescent substance in the light-emitting layer are as follows. Other fluorescent substances can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FLPAPrn), N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis(N,N,N-triphenyl-1,4-phenylenediamine) (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), N,N,N',N',N',N',N'',N''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(biphenyl-2-yl)-2-anthryl]-N,N,N-triphenyl-1,4-phenylenediamine (abbreviation: 2DPABPhA), 9,10-bis(biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N-diphenylquinacridone (abbreviation: DPQd), rubrene, 5,12-bis(biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N-diphenyl-N,N'-(1,6-pyrene-diyl)bis[(6-phenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b; 6,7-b']bisbenzofuran (abbreviation: 3,10PCA2Nbf(IV)-02), and 3,10-bis[N-(dibenzofuran-3-yl)-N-phenylamino]naphtho[2,3-b; 6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

A condensed heteroaromatic compound containing nitrogen and boron, especially a compound having a diazaboranaphtho-anthracene skeleton, exhibits a narrow emission spectrum, emits blue light with favorable color purity, and can thus be used suitably. Examples of the compound include 5,9-diphenyl-5,9-diaza-13b-boranaphtho[3,2,1-de]anthracene (abbreviation: DABNA1), 9-(biphenyl-3-yl)-N,N,5,11-tetraphenyl-5,9-dihydro-5,9-diaza-13b-boranaphtho[3,2,1-de]anthracene-3-amine (abbreviation: DABNA2), 2,12-di(tert-butyl)-5,9-di(4-tert-butylphenyl)-N,N-diphenyl-5H,9H-[1,4]benzazaborino[2,3,4-kl]phenazaborin-7-amine (abbreviation: DPhA-tBu4DABNA), 2,12-di(tert-butyl)-N,N,5,9-tetra(4-tert-butylphenyl)-5H,9H-[1,4]benzazaborino[2,3,4-kl]phenazaborin-7-amine (abbreviation: tBuDPhA-tBu4DABNA), 2,12-di(tert-butyl)-5,9-di(4-tert-butylphenyl)-7-methyl-5H,9H-[1,4]benzazaborino[2,3,4-kl]phenazaborine (abbreviation: Me-tBu4DABNA), $N^7$,$N^7$,$N^{13}$,$N^{13}$,5,9,11,15-octaphenyl-5H,9H,11H,15H-[1,4]benzazaborino[2,3,4-kl][1,4]benzazaborino[4',3',2':4,5][1,4]benzazaborino[3,2-b]phenazaborin-7,13-diamine (abbreviation: v-DABNA), and 2-(4-tert-butylphenyl)benz[5,6]indolo[3,2,1-jk]benzo[b]carbazole (abbreviation: tBuPBibc).

Besides the above compounds, 9,10,11-tris[3,6-bis(1,1-dimethylethyl)-9H-carbazol-9-yl]-2,5,15,18-tetrakis(1,1-dimethylethyl)indolo[3,2,1-de]indolo[3',2',1':8,1][1,4]benzazaborino[2,3,4-kl]phenazaborine (abbreviation: BBCz-G), 9,11-bis[3,6-bis(1,1-dimethylethyl)-9H-carbazol-9-yl]-2,5,15,18-tetrakis(1,1-dimethylethyl)indolo[3,2,1-de]indolo[3',2',1':8,1][1,4]benzazaborino[2,3,4-kl]phenazaborine (abbreviation: BBCz-Y), or the like can be suitably used.

Examples of the material that can be used when a phosphorescent substance is used as the light-emitting substance in the light-emitting layer are as follows.

The examples include an organometallic iridium complex having a 4H-triazole skeleton, such as tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), and tris(5-methyl-3,4-diphenyl-4H-1,2,4-triazolato)iridium(III) (abbreviation: [Ir(Mptz)$_3$]); an organometallic iridium complex having a 1H-triazole skeleton, such as tris[3-methyl-1-(2-methylphenyl)-5-phenyl-1H-1,2,4-triazolato]iridium(III) (abbreviation: $[Ir(Mptz1-mp)_3]$) and tris(1-methyl-5-phenyl-3-propyl-1H-1,2,4-triazolato)iridium(III) (abbreviation: $[Ir(Prptz1-Me)_3]$); an organometallic iridium complex having an imidazole skeleton, such as fac-tris[1-(2,6-diisopropylphenyl)-2-phenyl-1H-imidazole]iridium(III) (abbreviation: $[Ir(iPrpim)_3]$), tris[3-(2,6-dimethylphenyl)-7-methylimidazo[1,2-f]phenanthridinato]iridium(III) (abbreviation: $[Ir(dmpimpt-Me)_3]$), and tris(2-[1-{2,6-bis(1-methylethyl)phenyl}-1H-imidazol-2-yl-κ$N^3$]-4-cyanophenyl-κC) (abbreviation: CNImIr); an organometallic complex having a benzimizazolidene skeleton, such as tris[(6-tert-butyl-3-phenyl-2H-imidazo[4,5-b]pyrazin-1-yl-κ$C^2$)phenyl-κC]iridium(III) (abbreviation: $[Ir(cb)_3]$); and an organometallic iridium complex in which a phenylpyridine derivative including an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $[Ir(CF_3ppy)_2(pic)]$), and bis[2-(4',6'-difluorophenyl)pyridinato-N,$C^{2'}$]iridium(III) acetylacetonate (abbreviation: FIr(acac)). These compounds emit blue phosphorescent light and have an emission peak in the wavelength range of 450 nm to 520 nm.

Other examples include organometallic iridium complexes having a pyrimidine skeleton, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), and (acetylacetonato)bis(4,6-diphenylpyrimidinato)iridium(III) (abbreviation: $[Ir(dppm)_2(acac)]$); organometallic iridium complexes having a pyrazine skeleton, such as (acetylacetonato)bis(3,5-dimethyl-2-phenylpyrazinato)iridium(III) (abbreviation: $[Ir(mppr-Me)_2(acac)]$) and (acetylacetonato)bis(5-isopropyl-3-methyl-2-phenylpyrazinato)iridium(III) (abbreviation: $[Ir(mppr-iPr)_2(acac)]$); organometallic iridium complexes having a pyridine skeleton, such as tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetylacetonate (abbreviation: $[Ir(pq)_2(acac)]$); [2-$d_3$-methyl-8-(2-pyridinyl-κN)benzofuro[2,3-b]pyridine-C]bis[2-(5-$d_3$-methyl-2-pyridinyl-κN2)phenyl-κC]iridium(III) (abbreviation: $Ir(5mppy\text{-}d3)_2(mbfpypy\text{-}d3)$), [2-d3-methyl-(2-pyridinyl-κN)benzofuro[2,3-b]pyridine-κC]bis[2-(2-pyridinyl-κN)phenyl-κC]iridium(III) (abbreviation: $[Ir(ppy)_2(mbfpypy\text{-}d_3)]$), [2-(4-$d_3$-methyl-5-phenyl-2-pyridinyl-κ$N^2$)phenyl-κC]bis[2-(5-$d_3$-methyl-2-pyridinyl-κ$N^2$)phenyl-κC]iridium(III) (abbreviation: $[Ir(5mppy\text{-}d_3)_2(mdppy\text{-}d_3)]$), [2-methyl-(2-pyridinyl-κN)benzofuro[2,3-b]pyridine-κC]bis[2-(2-pyridinyl-κN)phenyl-κC]iridium(III) (abbreviation: $[Ir(ppy)_2(mbfpypy)]$), and [2-(4-methyl-5-phenyl-2-pyridinyl-κN)phenyl-κC]bis[2-(2-pyridinyl-κN)phenyl-κC]iridium(III) (abbreviation: $[Ir(ppy)_2(mdppy)]$); and a rare earth metal complex such as tris(acetylacetonato) (monophenanthroline)terbium(III) (abbreviation: $[Tb(acac)_3(Phen)]$). These compounds mainly emit green phosphorescent light and have an emission peak in the wavelength range of 500 nm to 600 nm. Note that organometallic iridium complexes including a pyrimidine skeleton have distinctively high reliability or emission efficiency and thus are particularly preferable.

Other examples include organometallic iridium complexes having a pyrimidine skeleton, such as (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato] (dipivaloylmethanato)iridium(III) (abbreviation: $[Ir(5mdppm)_2(dpm)]$), and bis[4,6-di(naphthalen-1-yl)pyrimidinato](dipivaloylmethanato)iridium(III) (abbreviation: $[Ir(d1npm)_2(dpm)]$); organometallic iridium complexes having a pyrazine skeleton, such as (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), and (acetylacetonato)bis[2,3-bis(4-fluorophenyl)quinoxalinato]iridium(III) (abbreviation: $[Ir(Fdpq)_2(acac)]$); organometallic iridium complexes having a pyridine skeleton, such as tris(1-phenylisoquinolinato-N,$C^{2'}$)iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), (3,7-diethyl-4,6-nonanedionato-κ$O^4$,κ$O^6$)bis[2,4-dimethyl-6-[7-(1-methylethyl)-1-isoquinolinyl-N]phenyl-κC]iridium(III), and (3,7-diethyl-4,6-nonanedionato-κ$O^4$,κ$O^6$)bis[2,4-dimethyl-6-[5-(1-methylethyl)-2-quinolinyl-κN]phenyl-κC]iridium(III); platinum complexes such as 2,3,7,8,12,13,17,18-octaethyl-21H,23H-porphyrinplatinum(II) (abbreviation: PtOEP); and rare earth metal complexes such as tris(1,3-diphenyl-1,3-propanedionato)(monophenanthroline)europium(III) (abbreviation: $[Eu(DBM)_3(Phen)]$) and tris[1-(2-thenoyl)-3,3,3-trifluoroacetonato](monophenanthroline)europium(III) (abbreviation: $[Eu(TTA)_3(Phen)]$). These compounds emit red phosphorescent light and have an emission peak in the wavelength range of 600 nm to 700 nm. Furthermore, the organometallic iridium complexes having a pyrazine skeleton can provide red light emission with favorable chromaticity.

Besides the above phosphorescent compounds, known phosphorescent compounds may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structural formulae.

[Chemical Formula 7]
-continued
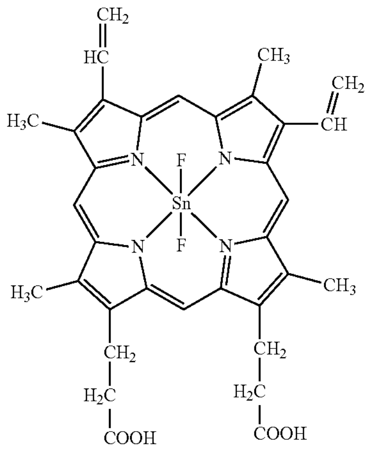
$SnF_2$(Proto IX)
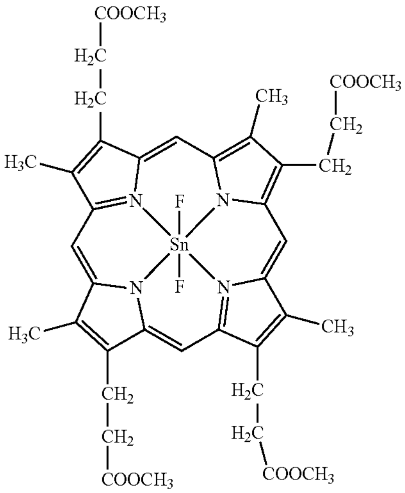
$SnF_2$(Copro III-4Me)
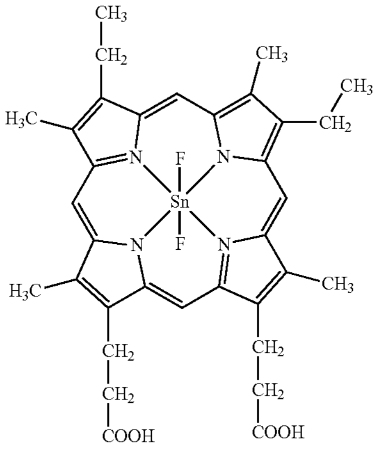
$SnF_2$(Meso IX)
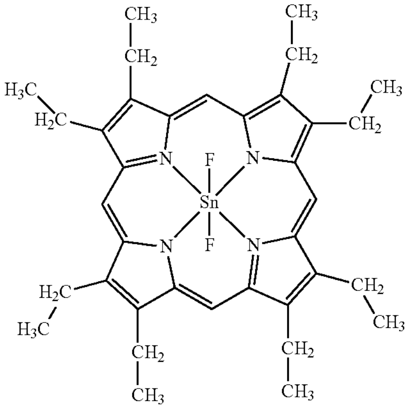
$SnF_2$(OEP)
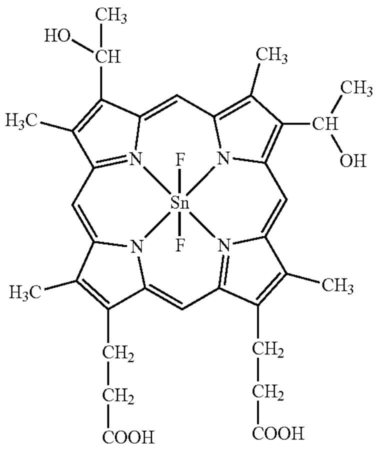
$SnF_2$(Hemato IX)
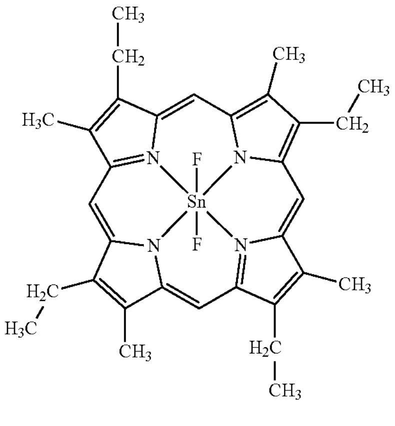
$SnF_2$(Etio I)

-continued

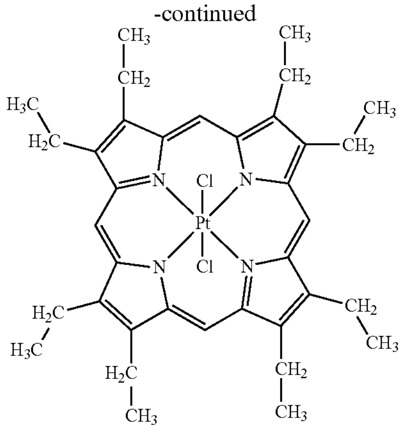

$PtCl_2OEP$

Alternatively, it is possible to use a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl) phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA). Such a heterocyclic compound is preferable because of having high electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor properties and high reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferable because the electron-donating property of the π-electron rich heteroaromatic ring and the electron-accepting property of the π-electron deficient heteroaromatic ring are both improved, the energy difference between the $S_1$ level and the $T_1$ level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 8]

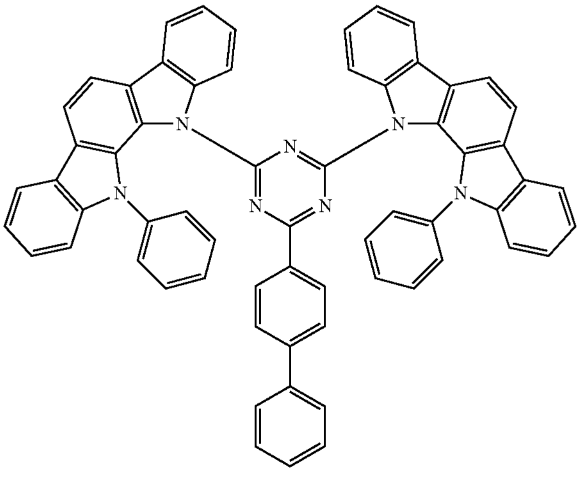

PIC-TRZ

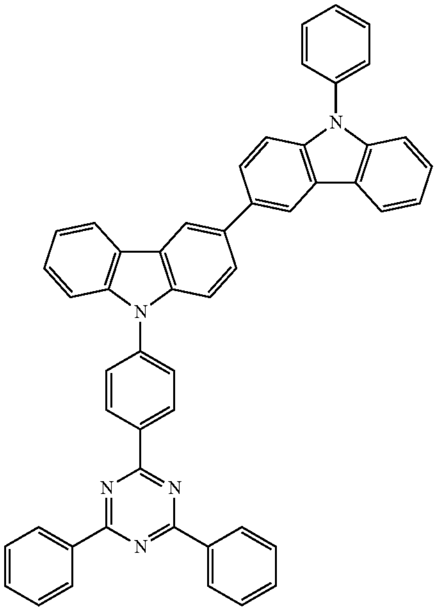

PCCzPTzn

-continued

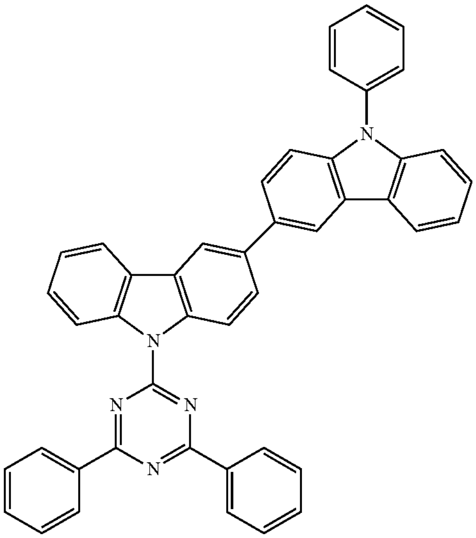

PCCzTzn

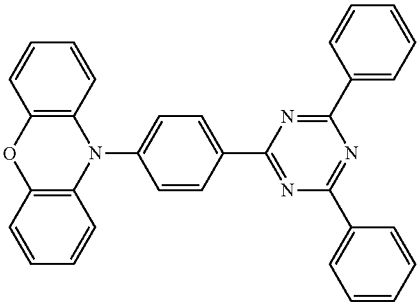

PXZ-TRZ

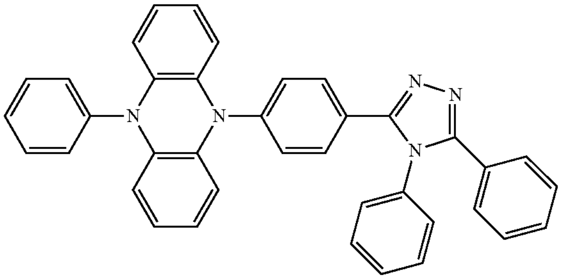

PPZ-3TPT

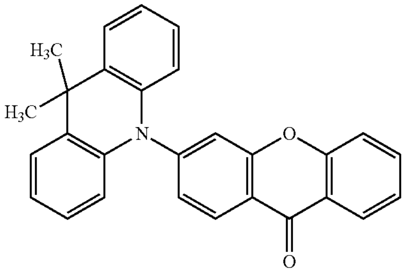

ACRXTN

-continued

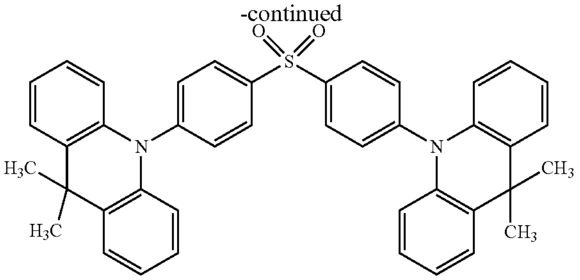

DMAC-DPS

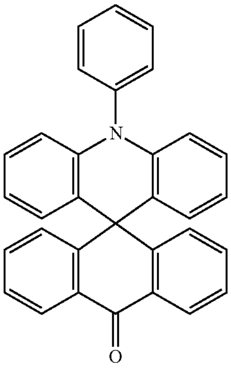

ACRSA

Note that a TADF material is a material having a small difference between the $S_1$ level and the $T_1$ level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into light emission.

An exciplex whose excited state is formed of two kinds of substances has an extremely small difference between the $S_1$ level and the $T_1$ level and functions as a TADF material capable of converting triplet excitation energy into singlet excitation energy.

A phosphorescent spectrum observed at a low temperature (e.g., 77 K to 10 K) is used for an index of the $T_1$ level. When the level of energy with a wavelength of the line obtained by extrapolating a tangent to the fluorescent spectrum at a tail on the short wavelength side is the $S_1$ level and the level of energy with a wavelength of the line obtained by extrapolating a tangent to the phosphorescent spectrum at a tail on the short wavelength side is the $T_1$ level, the difference between the $S_1$ level and the $T_1$ level of the TADF material is preferably smaller than or equal to 0.3 eV, further preferably smaller than or equal to 0.2 eV.

When a TADF material is used as the light-emitting substance, the $S_1$ level of the host material is preferably higher than that of the TADF material. In addition, the $T_1$ level of the host material is preferably higher than that of the TADF material.

As the host material in the light-emitting layer, various carrier-transport materials such as materials having an electron-transport property and/or materials having a hole-transport property, and the TADF materials can be used.

The material with a hole-transport property is preferably an organic compound having an amine skeleton or a π-electron rich heteroaromatic ring skeleton, for example. As the π-electron rich heteroaromatic ring, a condensed aromatic ring having at least one of an acridine skeleton, a phenoxazine skeleton, a phenothiazine skeleton, a furan skeleton, a thiophene skeleton, and a pyrrole skeleton is preferable; specifically, a carbazole ring, a dibenzothiophene ring, or a ring in which an aromatic ring or a heteroaromatic ring is further condensed to a carbazole ring or a dibenzothiophene ring is preferable.

Such an organic compound having a hole-transport property further preferably has any of a carbazole skeleton, a dibenzofuran skeleton, a dibenzothiophene skeleton, and an anthracene skeleton. In particular, an aromatic amine having a substituent that has a dibenzofuran ring or a dibenzothiophene ring, an aromatic monoamine that has a naphthalene ring, or an aromatic monoamine in which a 9-fluorenyl group is bonded to nitrogen of an amine through an arylene group may be used. Note that the organic compound having a hole-transport property preferably has an N,N-bis(4-biphenyl)amino group to enable fabricating a light-emitting device with a long lifetime.

Examples of such an organic compound include compounds having an aromatic amine skeleton, such as 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 9,9'-diphenyl-9H,9'H-3,3'-bicarbazole (abbreviation: PCCP); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the material having a hole-transport property that can be used for the hole-transport layer can also be used.

As the material having an electron-transport property, for example, a metal complex such as bis(10-hydroxybenzo[h]quinolinato)beryllium(II) (abbreviation: BeBq2), bis(2-methyl-8-quinolinolato)(4-phenylphenolato)aluminum(III) (abbreviation: BA1q), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a π-electron deficient heteroaromatic ring is preferably used. Examples of the organic compound having a π-electron deficient heteroaromatic ring skeleton include an organic compound that has a heteroaromatic ring having a polyazole skeleton, an organic compound that has a heteroaromatic ring having a pyridine skeleton, an organic compound that has a heteroaromatic ring having a diazine skeleton, and an organic compound that has a heteroaromatic ring having a triazine skeleton.

Among the above materials, the organic compound that has a heteroaromatic ring having a diazine skeleton (a pyrimidine skeleton, a pyrazine skeleton, or a pyridazine skeleton), the organic compound that has a heteroaromatic ring having a pyridine skeleton, and the organic compound that has a heteroaromatic ring having a triazine skeleton have high reliability and thus are preferable. In particular, the organic compound that has a heteroaromatic ring having a diazine (pyrimidine or pyrazine) skeleton and the organic compound that has a heteroaromatic ring having a triazine skeleton have a high electron-transport property to contribute to a reduction in drive voltage. A benzofuropyrimidine skeleton, a benzothienopyrimidine skeleton, a benzofuropyrazine skeleton, and a benzothienopyrazine skeleton are preferable because of their high acceptor property and high reliability.

Examples of the organic compound having a π-electron deficient heteroaromatic ring skeleton include an organic compound having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOS); an organic compound having a heteroaromatic ring having a pyridine skeleton, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), bathophenanthroline (abbreviation: BPhen), bathocuproine (abbreviation: BCP), 2,9-di(naphthalene-2-yl)-4,7-diphenyl-1,10-phenanthroline (abbreviation: NBPhen), 2,2'-(1,3-phenylene)bis(9-phenyl-1,10-phenanthroline) (abbreviation: mPPhen2P), 2-[3-(2-triphenylenyl)phenyl]-1,10-phenanthroline (abbreviation: mTpPPhen), 2-phenyl-9-(2-triphenylenyl)-1,10-phenanthroline (abbreviation: Ph-TpPhen), 2-[4-(9-phenanthrenyl)-1-naphthalenyl]-1,10-phenanthroline (abbreviation: PnNPhen), or 2-[4-(2-triphenylenyl)phenyl]-1,10-phenanthroline (abbreviation: pTpPPhen); an organic compound having a diazine skeleton, such as 2-[3-(dibenzothiophen-4-yl)phenyl]dibenzo[f; h]quinoxaline (abbreviation: 2mDBTPDBq-II), 2-[3-(3'-dibenzothiophen-4-yl)biphenyl]dibenzo[f; h]quinoxaline (abbreviation: 2mDBTBPDBq-II), 2-[3'-(9H-carbazol-9-yl)biphenyl-3-yl]dibenzo[f; h]quinoxaline (abbreviation: 2mCzBPDBq), 2-[4'-(9-phenyl-9H-carbazol-3-yl)-3,1'-biphenyl-1-yl]dibenzo[f; h]quinoxaline (abbreviation: 2mpPCBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[3'-(dibenzothiophen-4-yl)biphenyl-3-yl]naphtho[1',2':4,5]furo[2,3-b]pyrazine (abbreviation: 9mDBtBPNfpr), 9-[(3'-(dibenzothiophen-4-yl)biphenyl-4-yl]naphtho[1',2':4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3'-diyl)]bis(9H-carbazole) (abbreviation: 4,6mCzBP2Pm), 8-(biphenyl-4-yl)-4-[3-(dibenzothiophen-4-yl)phenyl]-[1]benzofuro[3,2-d]pyrimidine (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(biphenyl-3-yl)]naphtho[1',2':4,5]furo[3,2-d]pyrimidine (abbreviation: 8mDBtBPNfpm), 8-[(2,2'-binaphthalen)-6-yl]-4-[3-(dibenzothiophen-4-yl)phenyl]-[1]benzofuro[3,2-d]pyrimidine (abbreviation: 8(βN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine} (abbreviation: 2,6(NP-PPm)2Py), 6-(biphenyl-3-yl)-4-[3,5-bis(9H-carbazol-9-yl)phenyl]-2-phenylpyrimidine (abbreviation: 6mBP-4Cz2PPm), 2,6-bis(4-naphthalen-1-ylphenyl)-4-[4-(3-pyridyl)phenyl]pyrimidine (abbreviation: 2,4NP-6PyPPm), 4-[3,5-bis(9H-carbazol-9-yl)phenyl]-2-phenyl-6-(1,1'-biphenyl-4-yl)pyrimidine (abbreviation: 6BP-4Cz2PPm), or 7-[4-(9-phenyl-9H-carbazol-2-yl)quinazolin-2-yl]-7H-dibenzo[c,g]carbazole (abbreviation: PC-cgDBCzQz); and an organic compound having a heteroaromatic ring having a triazine skeleton, such as 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris(3'-(pyridin-3-yl)biphenyl-3-yl)-1,3,5-triazine (abbreviation: TmPPPyTz), 2-[3-(2,6-dimethyl-3-pyridinyl)-5-(9-phenanthrenyl)phenyl]-4,6-diphenyl-1,3,5-triazine (abbreviation: mPn-mDMePyPTzn), 11-[4-(biphenyl-4-yl)-6-phenyl-1,3,5-triazin-2-yl]-11,12-dihydro-12-phenylindolo[2,3-a]carbazole (abbreviation: BP-Icz(II)Tzn), 2-[3'-(triphenylen-2-yl)biphenyl-3-yl]-4,6-diphenyl-1,3,5-triazine (abbreviation: mTpBPTzn), 3-[9-(4,6-diphenyl-1,3,5-triazin-2-yl)-2-dibenzofuranyl]-9-phenyl-9H-carbazole (abbreviation: PCDBfTzn), or 2-(biphenyl-3-yl)-4-phenyl-6-{8-[(1,1':4',1"-terphenyl)-4-yl]-1-dibenzofuranyl}-1,3,5-triazine (abbreviation: mBP-TPDBfTzn). The organic compound that has a heteroaromatic ring having a diazine skeleton, the organic compound that has a heteroaromatic ring having a pyridine skeleton, and the organic compound that has a heteroaromatic ring having a triazine skeleton are preferable because of their high reliability. In particular, the organic compound that has a heteroaromatic ring having a diazine (pyrimidine or pyrazine) skeleton and the organic compound that has a heteroaromatic ring having a triazine skeleton have a high electron-transport property to contribute to a reduction in drive voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor.

This is very effective in the case where the light-emitting substance is a fluorescent substance. In that case, the $S_1$ level of the TADF material is preferably higher than that of the fluorescent substance in order that high emission efficiency can be achieved. Furthermore, the $T_1$ level of the TADF material is preferably higher than the $S_1$ level of the fluorescent substance. Therefore, the $T_1$ level of the TADF material is preferably higher than that of the fluorescent substance.

It is also preferable to use a TADF material that emits light whose wavelength overlaps with the wavelength on a lowest-energy-side absorption band of the fluorescent substance, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which brings about light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that brings about light emission in a fluorescent substance. The luminophore is preferably a skeleton having a π bond, further preferably includes an aromatic ring, and still further preferably includes a condensed aromatic ring or a condensed heteroaromatic ring. Examples of the luminophore include a phenanthrene skeleton, a stilbene skeleton, an acridone skeleton, a phenoxazine skeleton, a phenothiazine skeleton, a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to a carbazole skeleton because the HOMO level thereof is shallower than that of the host material having a carbazole skeleton by approximately 0.1 eV and thus holes enter the host material easily. In particular, the host material preferably has a dibenzocarbazole skeleton because the HOMO level thereof is shallower than that of the host material having a carbazole skeleton by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-[4-(9-phenyl-9H-fluoren-9-yl)biphenyl-4'-yl]anthracene (abbreviation: FLPPA), 9-(1-naphthyl)-10-[4-(2-naphthyl)phenyl]anthracene (abbreviation: α,N-βNPAnth), 9-(1-naphthyl)-10-(2-naphthyl)anthracene (abbreviation: α,βADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(2-naphthyl)-10-[3-(2-naphthyl)phenyl]anthracene (abbreviation: βN-mβNPAnth), and 1-{4-[10-(biphenyl-4-yl)-9-anthracenyl]phenyl}-2-ethyl-1H-benzimidazole (abbreviation: EtBImPBPhA). In particular, CzPA, cgDBCzPA, 2mBnfPPA, and PCzPA exhibit excellent properties and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of these mixed materials. These mixed materials are preferably selected so as to form an exciplex that exhibits light emission whose wavelength overlaps with the wavelength on a lowest-energy-side absorption band of the light-emitting substance, in which case energy can be transferred smoothly and light emission can be obtained efficiently. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

In order to form an exciplex efficiently, a material having an electron-transport property is preferably combined with a material having a hole-transport property and a HOMO level higher than or equal to that of the material having an electron-transport property. In addition, the LUMO level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectrum of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of transient PL of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

The first electron-transport layer 114_1 and the second electron-transport layer 114_2 each contain a material having an electron-transport property. The material having an electron-transport property preferably has an electron mobility higher than or equal to $1\times10^{-7}$ $cm^2/Vs$, further preferably higher than or equal to $1\times10^{-6}$ $cm^2/Vs$ in the case where the square root of the electric field strength [V/cm] is 600. Note that any other substance can also be used as long as the substance has an electron-transport property higher than a hole-transport property. An organic compound including a π-electron deficient heteroaromatic ring is preferable as the above organic compound. The organic compound including a π-electron deficient heteroaromatic ring is preferably one or more of an organic compound including a heteroaromatic ring having a polyazole skeleton, an organic compound including a heteroaromatic ring having a pyridine skeleton, an organic compound including a heteroaromatic ring having a diazine skeleton, and an organic compound including a heteroaromatic ring having a triazine skeleton As the organic compounds having an electron-transport property that can be used in the first electron-transport layer 114_1 and the second electron-transport layer 1142, any of the aforementioned organic compounds that can be used as the organic compound having an electron-transport property in the first light-emitting layer 113_1 and the second light-emitting layer 113_2 can be used. Among the above-described materials, the organic compound that has a heteroaromatic ring having a diazine skeleton, the organic compound that has a heteroaromatic ring having a pyridine skeleton, and the organic compound that has a heteroaromatic ring having a triazine skeleton are especially preferable because of having high reliability. In particular, the organic compound that has a heteroaromatic ring having a diazine (pyrimidine or pyrazine) skeleton and the organic compound that has a heteroaromatic ring having a triazine skeleton have a high electron-transport property to contribute to a reduction in drive voltage. An organic compound having a phenanthroline skeleton such as mTpPPhen, PnN-Phen, or mPPhen2P is especially preferable, and an organic compound having a phenanthroline dimer structure such as mPPhen2P is further preferable because of its excellent stability.

The first electron-transport layer 114_1 preferably has a bipolar property, that is, is preferably an electron-transport layer having a relatively high hole-transport property. Accordingly, the HOMO level of the organic compound included in the first electron-transport layer 114_1 is preferably greater than or equal to −5.90 eV and less than or equal to −5.00 eV, further preferably greater than or equal to −5.80 eV and less than or equal to −5.00 eV, still further preferably greater than or equal to −5.70 eV and less than or equal to −5.15 eV. Since the first electron-transport layer 114_1 also needs to have a high electron-transport property as a matter of course, the LUMO level of the organic compound included in the first electron-transport layer is preferably greater than or equal to −3.15 eV and less than or equal to −2.50 eV, further preferably greater than or equal to −3.00 eV and less than or equal to −2.70 eV.

The first electron-transport layer 114_1 may be a layer formed of a plurality of organic compounds. In the case where a plurality of organic compounds are included in the first electron-transport layer, the HOMO level of the organic compound having the highest HOMO level is preferably within the above-described range. In the case where a plurality of organic compounds are included in the first electron-transport layer, the LUMO level of the organic compound having the lowest LUMO level is preferably within the above-described range. In the case where the first electron-transport layer is formed of a plurality of organic compounds, at least one of the organic compounds is preferably an organic compound having an electron-transport property and at least one of the organic compounds is preferably an organic compound having a hole-transport property.

The organic compound having an electron-transport property and the organic compound having a hole-transport property are preferably a single organic compound. In other words, it is preferable that the first electron-transport layer include an organic compound having both an electron-transport property and a hole-transport property because of facilitating formation of a light-emitting device with favorable characteristics.

The organic compound having an electron-transport property or the organic compound having both an electron-transport property and a hole-transport property preferably includes a substance having an electron mobility higher than or equal to $1\times10^{-7}$ $cm^2/Vs$, preferably higher than or equal to $1\times10^{-6}$ $cm^2/Vs$ in the case where the square root of the electric field strength [V/cm] is 600. The organic compound having a hole-transport property or the organic compound having both an electron-transport property and a hole-transport property preferably includes a substance having a hole mobility higher than or equal to $1\times10^{-7}$ $cm^2/Vs$, preferably higher than or equal to $1\times10^{-6}$ $cm^2/Vs$ in the case where the square root of the electric field strength [V/cm] is 600.

The first electron-transport layer preferably includes an organic compound having an electron-transport property with an acid dissociation constant $pK_a$ of 4 or less.

The first electron-transport layer preferably includes an organic compound having an electron-transport skeleton and an organic compound having a hole-transport skeleton. The organic compound having an electron-transport skeleton and the organic compound having a hole-transport skeleton are preferably a single organic compound. In other words, it is preferable that the first electron-transport layer include an organic compound having both an electron-transport skeleton and a hole-transport skeleton because of facilitating formation of a light-emitting device with favorable characteristics.

The first electron-transport layer 114_1 and the second electron-transport layer 1142 may have a stacked-layer structure. In the case where the first electron-transport layer 1141 has a stacked-layer structure, all the stacked layers preferably have the structure as described in Embodiment 1. In the case where the second electron-transport layer 1142 has a stacked-layer structure, the layer in contact with the second light-emitting layer 113_2 may function as a hole-block layer. In the case where the electron-transport layer in contact with the light-emitting layer functions as a hole-block layer, the electron-transport layer is preferably formed using a material having a deeper HOMO level than a material included in the light-emitting layer by more than or equal to 0.5 eV.

A layer containing an alkali metal, an alkaline earth metal, or a compound thereof such as lithium oxide ($Li_2O$), lithium fluoride (LiF), cesium fluoride (CsF), calcium fluoride ($CaF_2$), or 8-hydroxyquinolinato-lithium (Liq) may be provided as the electron-injection layer 115 between the second electron-transport layer 114_2 and the second electrode 102. An electride or a layer that is formed using a substance having an electron-transport property and includes an alkali metal, an alkaline earth metal, or a compound thereof can be used as the electron-injection layer 115. Examples of the electride include a substance in which electrons are added at high concentration to calcium oxide-aluminum oxide. Any of the organic compounds given as examples of the organic compound having strong basicity in Embodiment 1 can be used.

The electron-injection layer 115 may be formed using any of the above substances alone, or any of the above substances contained in a layer including a substance having an electron-transport property.

Note that as the electron-injection layer 115, it is possible to use a layer including a substance having an electron-transport property (preferably an organic compound having a bipyridine skeleton) that contains a fluoride of the alkali metal or the alkaline earth metal at a concentration higher than or equal to that at which the electron-injection layer 115 becomes in a microcrystalline state (50 wt % or higher). Since the layer has a low refractive index, a light-emitting device including the layer can have favorable external quantum efficiency.

The second electrode 102 is an electrode including a cathode. The second electrode 102 may have a stacked-layer structure, in which case a layer in contact with the organic compound layer 103 functions as a cathode. For the cathode, a metal, an alloy, an electrically conductive compound, or a mixture thereof each having a low work function (specifically, lower than or equal to 3.8 eV) or the like can be used. Specific examples of such a cathode material include elements belonging to Group 1 or 2 of the periodic table, such as alkali metals (e.g., lithium (Li) or cesium (Cs)), magnesium (Mg), calcium (Ca), and strontium (Sr), alloys containing these elements (e.g., MgAg and AlLi), compounds containing these elements (e.g., lithium fluoride (LiF), cesium fluoride (CsF), and calcium fluoride ($CaF_2$)), rare earth metals such as europium (Eu) and ytterbium (Yb), and alloys containing these rare earth metals. However, when the electron-injection layer 115 or a thin film formed using any of the above materials having a low work function is provided between the second electrode 102 and the electron-transport layer, a variety of conductive materials such as Al, Ag, ITO, or indium oxide-tin oxide containing silicon or silicon oxide can be used for the cathode regardless of the work function.

When the second electrode 102 is formed using a material that transmits visible light, the light-emitting device can emit light from the second electrode 102 side. When the first electrode 101 is formed using a material that transmits visible light, the light-emitting device can emit light from the first electrode 101 side.

Films of these conductive materials can be deposited by a dry process such as a vacuum evaporation method or a sputtering method, an ink-jet method, a spin coating method, or the like. Alternatively, a wet process using a sol-gel method or a wet process using a paste of a metal material may be employed.

The organic compound layer 103 can be formed by any of a variety of methods, including a dry process and a wet process. For example, a vacuum evaporation method, a gravure printing method, an offset printing method, a screen printing method, an ink-jet method, a spin coating method, or the like may be used.

Different deposition methods may be used to form the electrodes or the layers described above.

The light-emitting device having two light-emitting units is described with reference to FIG. 2; however, one embodiment of the present invention can also be applied to a light-emitting device in which three or more light-emitting units are stacked. With a plurality of light-emitting units partitioned by the intermediate layer 116 between a pair of electrodes as in the light-emitting device of this embodiment, it is possible to provide a long-life element that can emit light with high luminance at a low current density. A light-emitting apparatus that can be driven at a low voltage and has low power consumption can also be provided.

When the emission colors of the light-emitting units are different, light emission of a desired color can be obtained from the light-emitting device as a whole. For example, in a light-emitting device having two light-emitting units, the emission colors of the first light-emitting unit may be red and green and the emission color of the second light-emitting unit may be blue, so that the light-emitting device can emit white light as the whole.

The organic compound layer 103, the first light-emitting unit 501, the second light-emitting unit 502, the layers such as the carrier-generation layer, and the electrodes that are described above can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the above components.

Figure 3:
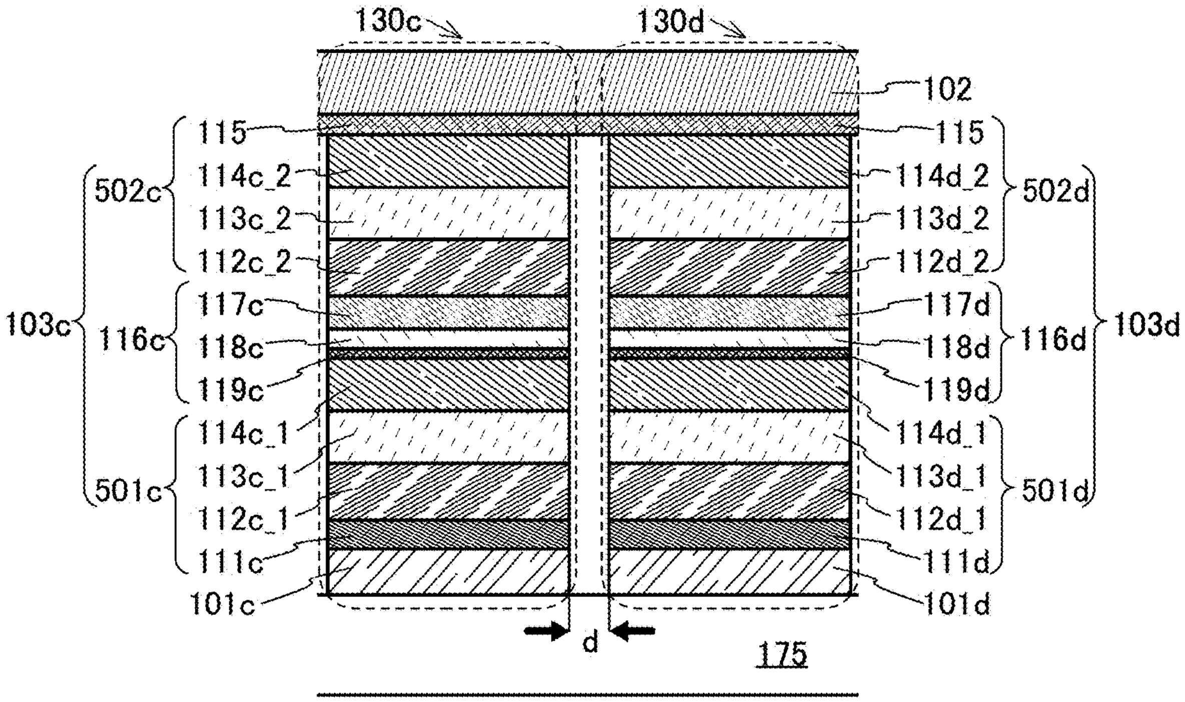
FIG. 3 illustrates light-emitting devices.

FIG. 3 illustrates two adjacent tandem light-emitting devices (a light-emitting device 130*c* and a light-emitting device 130*d*) fabricated by a photolithography technique.

The light-emitting device 130*c* includes an organic compound layer 103*c* between a first electrode 101*c* over the insulating layer 175 and the second electrode 102. The organic compound layer 103*c* has a structure in which a first light-emitting unit 501*c* and a second light-emitting unit 502*c* are stacked with an intermediate layer 116*c* therebetween. Although FIG. 3 illustrates an example in which the two light-emitting units are stacked, three or more light-emitting units may be stacked. The first light-emitting unit 501*c* includes a hole-injection layer 111*c*, a first hole-transport layer 112*c*_1, a first light-emitting layer 113*c*_1, and a first electron-transport layer 114*c*_1. The intermediate layer 116*c* includes a third layer 117*c*, a second layer 118*c*, and a first layer 119*c*. The second light-emitting unit 502*c* includes a second hole-transport layer 112*c*_2, a second light-emitting layer 113*c*_2, a second electron-transport layer 114*c*_2, and the electron-injection layer 115.

The light-emitting device 130*d* includes an organic compound layer 103*d* between a first electrode 101*d* over the insulating layer 175 and the second electrode 102. The organic compound layer 103*d* has a structure in which a first light-emitting unit 501*d* and a second light-emitting unit 502*d* are stacked with an intermediate layer 116*d* therebetween. Although FIG. 3 illustrates an example in which the two light-emitting units are stacked, three or more light-emitting units may be stacked. The first light-emitting unit 501*d* includes a hole-injection layer 111*d*, a first hole-transport layer 112*d*_1, a first light-emitting layer 113*d*_1, and a first electron-transport layer 114*d*_1. The intermediate layer 116*d* includes a third layer 117*d*, a second layer 118*d*, and a first layer 119*d*. The second light-emitting unit 502*d* includes a second hole-transport layer 112*d*_2, a second light-emitting layer 113*d*_2, a second electron-transport layer 114*d*_2, and the electron-injection layer 115.

In the light-emitting devices 130*c* and 130*d*, the intermediate layers 116*c* and 116*d* and the first electron-transport layers 114*c*_1 and 114*d*_1 preferably have the structures described in Embodiment 1.

Note that each of the electron-injection layer 115 and the second electrode 102 is preferably one continuous layer shared by the light-emitting device 130*c* and the light-emitting device 130*d*. The layers other than the electron-injection layer 115 included in the organic compound layer 103*c* are independent from the layers other than the electron-injection layer 115 included in the organic compound layer 103*d* because processing by a photolithography technique is performed after the second electron-transport layer 114*c*_2 is formed and after the second electron-transport layer 114*d*_2 is formed. End portions (contours) of the layers other than the electron-injection layer 115 in the organic compound layer 103*c* are processed by a photolithography technique and thus are substantially aligned in the direction perpendicular to the substrate. End portions (contours) of the layers other than the electron-injection layer 115 in the organic compound layer 103*d* are processed by a photolithography technique and thus are substantially aligned with each other in the direction perpendicular to the substrate.

The space d is present between the organic compound layer 103*c* and the organic compound layer 103*d* because of processing by a photolithography technique. Since the organic compound layers are processed by a photolithography technique, the distance between the first electrode 101*c* and the first electrode 101*d* can be made small, greater than or equal to 2 μm and less than or equal to 5 μm, compared with the case where mask vapor deposition is performed.

The light-emitting device of one embodiment of the present invention having the above-described structure can have high current efficiency, high reliability, and a suppressed increase in drive voltage.

The existence of the second layer 118 that is the ISL can inhibit a reduction in reliability and allows a highly reliable light-emitting device to be provided.

One embodiment of the present invention is particularly suitably used in a light-emitting device formed through a photolithography process and also contributes to cost reduction in manufacturing of light-emitting devices not formed through a photolithography process because high stability in the atmosphere of one embodiment of the present invention increases yield and eliminates the need for too strictly managing the atmosphere in the manufacturing process.

Embodiment 3

Described in this embodiment is a mode in which the light-emitting device of one embodiment of the present invention is used as a display element of a display apparatus.

Figure 4A:
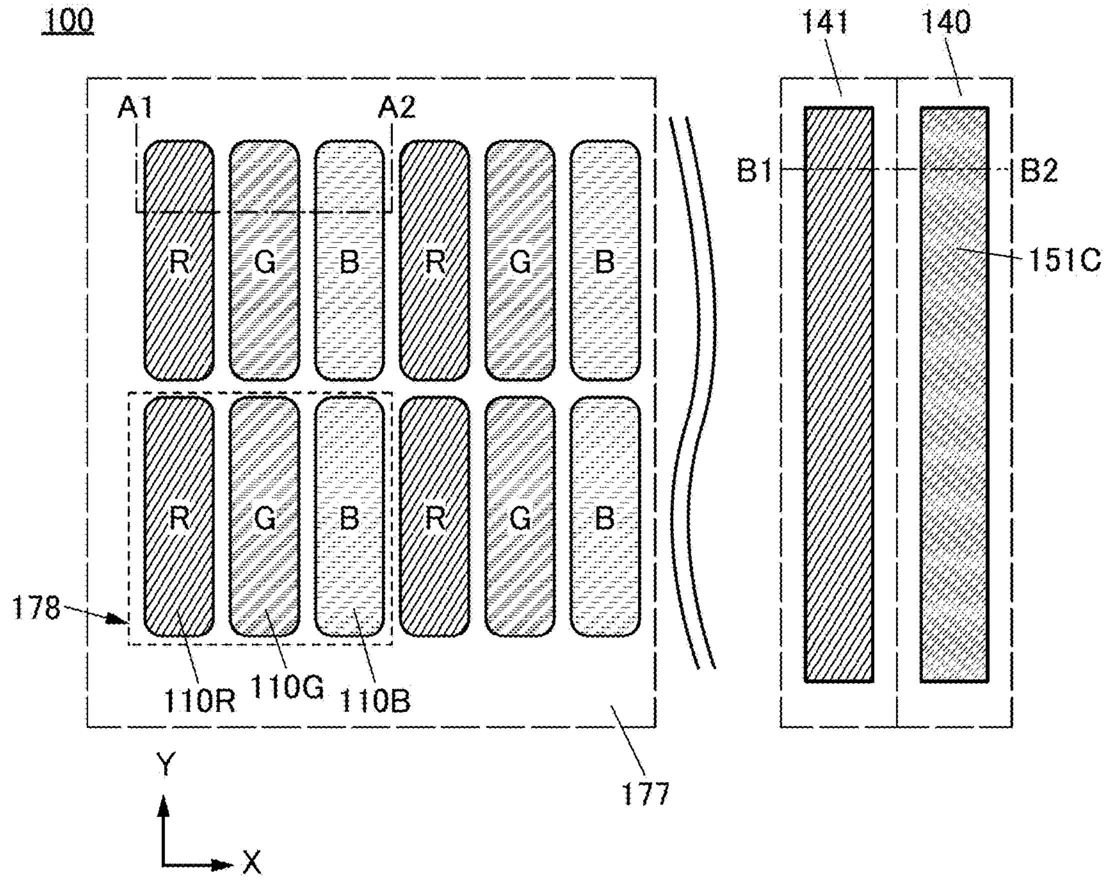
FIGS. 4A and 4B are a top view and a cross-sectional view, respectively, of a light-emitting apparatus.
Figure 4B:
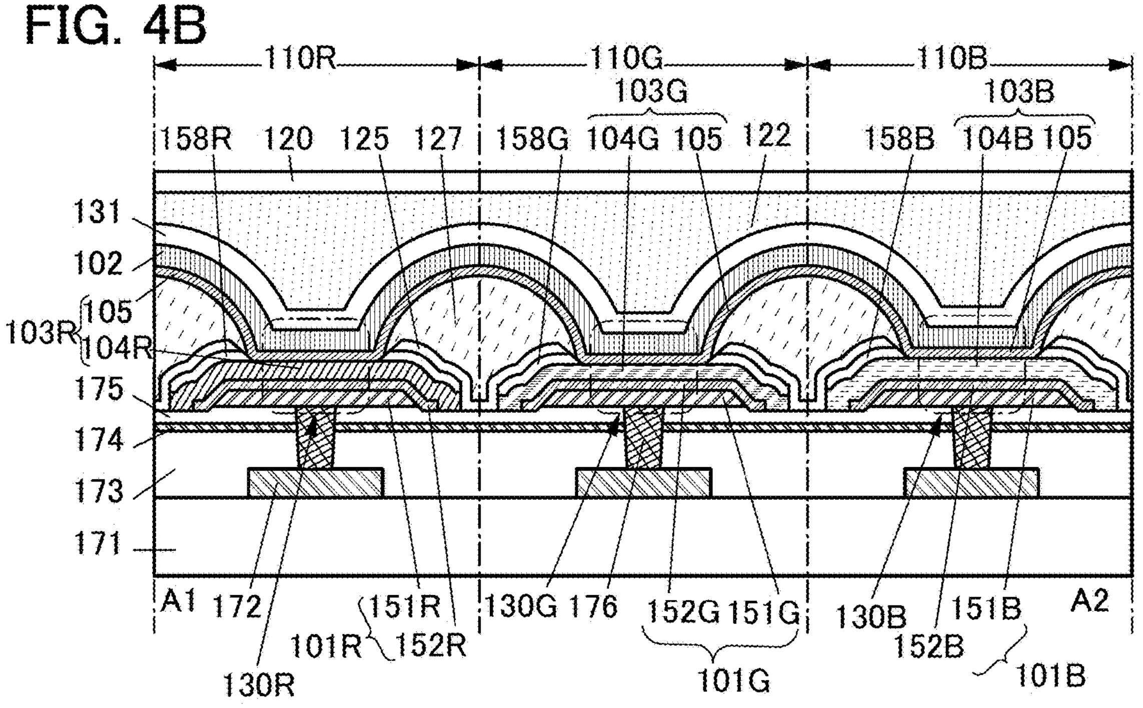

As illustrated in FIGS. 4A and 4B, a plurality of light-emitting devices 130 are formed over the insulating layer 175 to constitute a display apparatus.

A display apparatus includes a pixel portion 177 in which a plurality of pixels 178 are arranged in matrix. The pixel 178 includes a subpixel 110R, a subpixel 110G, and a subpixel 110B.

In this specification and the like, for example, description common to the subpixels 110R, 110G, and 110B is sometimes made using the collective term “subpixel 110”. As for other components that are distinguished from each other using letters of the alphabet, matters common to the components are sometimes described using reference numerals excluding the letters of the alphabet.

The subpixel 110R emits red light, the subpixel 110G emits green light, and the subpixel 110B emits blue light. Thus, an image can be displayed on the pixel portion 177. Note that in this embodiment, three colors of red (R), green (G), and blue (B) are given as examples of colors of light emitted by the subpixels; however, subpixels of a different combination of colors may be employed. The number of subpixels is not limited to three, and may be four or more. Examples of four subpixels include subpixels emitting light of four colors of R, G, B, and white (W), subpixels emitting light of four colors of R, G, B, and Y, and four subpixels emitting light of R, G, and B and infrared light (IR).

In this specification and the like, the row direction and the column direction are sometimes referred to as the X direction and the Y direction, respectively. The X direction and the Y direction intersect with each other and are perpendicular to each other, for example.

FIG. 4A illustrates an example where subpixels of different colors are arranged in the X direction and subpixels of the same color are arranged in the Y direction. Note that subpixels of different colors may be arranged in the Y direction, and subpixels of the same color may be arranged in the X direction.

Outside the pixel portion 177, a region 141 is provided and a connection portion 140 may also be provided. The region 141 is provided between the pixel portion 177 and the connection portion 140. The organic compound layer 103 is provided in the region 141. A conductive layer 151C is provided in the connection portion 140.

Although FIG. 4A illustrates an example where the region 141 and the connection portion 140 are positioned on the right side of the pixel portion 177, the positions of the region 141 and the connection portion 140 are not particularly limited. The number of regions 141 and the number of connection portions 140 can each be one or more.

FIG. 4B is an example of a cross-sectional view along the dashed-dotted line A1-A2 in FIG. 4A. As illustrated in FIG. 4B, the display apparatus includes an insulating layer 171, a conductive layer 172 over the insulating layer 171, an insulating layer 173 over the insulating layer 171 and the conductive layer 172, an insulating layer 174 over the insulating layer 173, and the insulating layer 175 over the insulating layer 174. The insulating layer 171 is provided over a substrate (not illustrated). An opening reaching the conductive layer 172 is provided in the insulating layers 175, 174, and 173, and a plug 176 is provided to fill the opening.

In the pixel portion 177, the light-emitting device 130 is provided over the insulating layer 175 and the plug 176. A protective layer 131 is provided to cover the light-emitting device 130. A substrate 120 is bonded to the protective layer 131 with a resin layer 122. An inorganic insulating layer 125 and an insulating layer 127 over the inorganic insulating layer 125 are preferably provided between the adjacent light-emitting devices 130.

Although FIG. 4B shows cross sections of a plurality of the inorganic insulating layers 125 and a plurality of the insulating layers 127, the inorganic insulating layers 125 are preferably connected to each other and the insulating layers 127 are preferably connected to each other when the display apparatus is seen from above. In other words, the insulating layer 127 preferably has an opening over a first electrode.

In FIG. 4B, a light-emitting device 130R, a light-emitting device 130G, and a light-emitting device 130B are shown as the light-emitting devices 130. The light-emitting devices 130R, 130G, and 130B emit light of the respective colors. For example, the light-emitting device 130R can emit red light, the light-emitting device 130G can emit green light, and the light-emitting device 130B can emit blue light. Alternatively, the light-emitting device 130R, 130G, or 130B may emit visible light of another color or infrared light.

The display apparatus of one embodiment of the present invention can be, for example, a top-emission display apparatus where light is emitted in the direction opposite to a substrate over which light-emitting devices are formed. Note that the display apparatus of one embodiment of the present invention may be of a bottom emission type.

The light-emitting device 130R has a structure as described in Embodiments 1 and 2. The light-emitting device 130R includes a first electrode 101R (pixel electrode) including a conductive layer 151R and a conductive layer 152R, an organic compound layer 103R (a first EL layer 104R and a second EL layer 105 over the first EL layer 104R) over the first electrode 101R, and the second electrode 102 (common electrode) over the organic compound layer 103R. The second EL layer 105 is preferably positioned closer to the second electrode 102 (common electrode) side than the light-emitting layer is, and is preferably a hole-block layer, a second electron-transport layer, an electron-injection layer, or stacked layers thereof. Such a structure can reduce damage to the light-emitting layer or an active layer during a photolithography process, which promises favorable film quality and electrical characteristics. Furthermore, a plurality of layers such as an electron-injection layer may be provided as common layers in contact with the second electrode 102 (common electrode).

The light-emitting device 130G has a structure as described in Embodiments 1 and 2. The light-emitting device 130G includes a first electrode 101G (pixel electrode) including a conductive layer 151G and a conductive layer 152G, an organic compound layer 103G (a first EL layer 104G and the second EL layer 105 over the first EL layer 104G) over the first electrode 101G, and the second electrode 102 (common electrode) over the organic compound layer 103G. The second EL layer 105 is preferably a hole-block layer, a second electron-transport layer, an electron-injection layer, or stacked layers thereof.

The light-emitting device 130B has a structure as described in Embodiments 1 and 2. The light-emitting device 130B includes a first electrode 101B (pixel electrode) including a conductive layer 151B and a conductive layer 152B, an organic compound layer 103B (a first EL layer 104B and the second EL layer 105 over the first EL layer 104B) over the first electrode 101B, and the second electrode 102 (common electrode) over the organic compound layer 103B. The second EL layer 105 is preferably a hole-block layer, a second electron-transport layer, an electron-injection layer, or stacked layers thereof.

In the light-emitting device, one of the pixel electrode (first electrode) and the common electrode (second electrode) functions as an anode and the other functions as a cathode. In this embodiment, description is made on the assumption that the pixel electrode functions as the anode and the common electrode functions as the cathode unless otherwise specified.

The first EL layers 104R, 104G, and 104B are island-shaped layers that are independent of each other for the respective colors. It is preferable that the first EL layers 104R, 104G, and 104B not overlap with one another. Providing the island-shaped first EL layer 104 in each of the light-emitting devices 130 can suppress leakage current between the adjacent light-emitting devices 130 even in a high-resolution display apparatus. This can prevent cross-talk, so that a display apparatus with extremely high contrast can be obtained. Specifically, a display apparatus having high current efficiency at low luminance can be obtained.

The island-shaped first EL layer 104 is formed by forming an EL film and processing the EL film by a photolithography technique.

The first EL layer 104 is preferably provided to cover the top surface and the side surface of the first electrode 101 (pixel electrode) of the light-emitting device 130. In this case, the aperture ratio of the display apparatus can be easily increased as compared to the structure where an end portion of the first EL layer 104 is positioned inward from an end portion of the pixel electrode. Covering the side surface of the pixel electrode of the light-emitting device 130 with the first EL layer 104 can inhibit the pixel electrode from being in contact with the second electrode 102; hence, a short circuit of the light-emitting device 130 can be inhibited.

In the display apparatus of one embodiment of the present invention, the first electrode 101 (pixel electrode) of the light-emitting device preferably has a stacked-layer structure. For example, in the example illustrated in FIG. 4B, the first electrode 101 of the light-emitting device 130 is a stack of the conductive layer 151 on the insulating layer 171 side and the conductive layer 152 on the organic compound layer side.

A metal material can be used for the conductive layer 151, for example. Specifically, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals, for example.

For the conductive layer 152, an oxide containing one or more selected from indium, tin, zinc, gallium, titanium, aluminum, and silicon can be used. For example, it is preferable to use a conductive oxide containing one or more of indium oxide, indium tin oxide, indium zinc oxide, zinc oxide, zinc oxide containing gallium, titanium oxide, indium zinc oxide containing gallium, indium zinc oxide containing aluminum, indium tin oxide containing silicon, indium zinc oxide containing silicon, and the like. In particular, indium tin oxide containing silicon can be suitably used for the conductive layer 152 because of having a high work function, for example, a work function higher than or equal to 4.0 eV.

The conductive layer 151 and the conductive layer 152 may each be a stack of a plurality of layers containing different materials. In that case, the conductive layer 151 may include a layer formed using a material that can be used for the conductive layer 152, such as a conductive oxide, and the conductive layer 152 may include a layer formed using a material that can be used for the conductive layer 151, such as a metal material. In the case where the conductive layer 151 is a stack of two or more layers, for example, a layer in contact with the conductive layer 152 can be formed using a material that can be used for the conductive layer 152.

The conductive layer 151 preferably has a tapered end portion. Specifically, the conductive layer 151 preferably has a tapered end portion with a taper angle of less than 90°. In that case, the conductive layer 152 provided along the side surface of the conductive layer 151 also has a tapered shape. When the side surface of the conductive layer 152 has a tapered shape, coverage with the first EL layer 104 provided along the side surface of the conductive layer 152 can be improved.

Since the light-emitting device 130 has the structure as described in Embodiments 1 and 2, the display apparatus of one embodiment of the present invention can have high reliability.

Next, an exemplary method for manufacturing the display apparatus having the structure illustrated in FIG. 4A is described with reference to FIGS. 5A to 10C.

Manufacturing Method Example 1

Thin films included in the display apparatus (e.g., insulating films, semiconductor films, and conductive films) can be formed by a sputtering method, a chemical vapor deposition (CVD) method, a vacuum evaporation method, a pulsed laser deposition (PLD) method, an atomic layer deposition (ALD) method, or the like.

Thin films included in the display apparatus (e.g., insulating films, semiconductor films, and conductive films) can also be formed by a wet process such as spin coating, dipping, spray coating, ink-jetting, dispensing, screen printing, offset printing, doctor blade coating, slit coating, roll coating, curtain coating, or knife coating.

Thin films included in the display apparatus can be processed by a photolithography technique, for example.

As light used for exposure in the photolithography technique, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet rays, KrF laser light, ArF laser light, or the like can be used. Exposure may be performed by liquid immersion exposure technique. As the light for exposure, extreme ultraviolet (EUV) light or X-rays may also be used. Furthermore, instead of the light used for exposure, an electron beam can be used.

For etching of thin films, a dry etching method, a wet etching method, a sandblast method, or the like can be used.

Figure 5A:
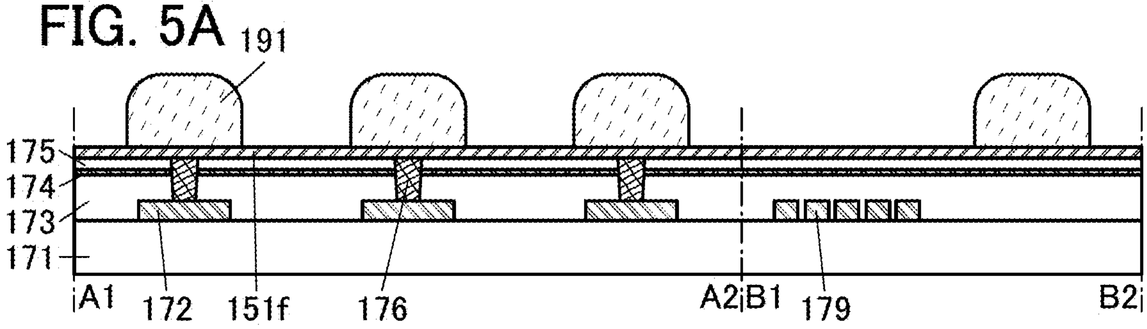
FIGS. 5A to 5E are cross-sectional views illustrating an example of a method for manufacturing the display apparatus.

First, as illustrated in FIG. 5A, the insulating layer 171 is formed over a substrate (not illustrated). Next, the conductive layer 172 and a conductive layer 179 are formed over the insulating layer 171, and the insulating layer 173 is formed over the insulating layer 171 so as to cover the conductive layer 172 and the conductive layer 179. Then, the insulating layer 174 is formed over the insulating layer 173, and the insulating layer 175 is formed over the insulating layer 174.

As the substrate, a substrate that has heat resistance high enough to withstand at least heat treatment performed later can be used. For example, it is possible to use a glass substrate; a quartz substrate; a sapphire substrate; a ceramic substrate; an organic resin substrate; or a semiconductor substrate such as a single crystal semiconductor substrate or a polycrystalline semiconductor substrate of silicon, silicon carbide, or the like, a compound semiconductor substrate of silicon germanium or the like, or an SOI substrate.

Next, as illustrated in FIG. 5A, openings reaching the conductive layer 172 are formed in the insulating layers 175, 174, and 173. Then, the plugs 176 are formed to fill the openings.

Next, as illustrated in FIG. 5A, a conductive film 151*f* to be the conductive layers 151R, 151G, 151B, and 151C is formed over the plugs 176 and the insulating layer 175. A metal material can be used for the conductive film 151*f*, for example.

Then, a resist mask 191 is formed over the conductive film 151*f* as illustrated in FIG. 5A. The resist mask 191 can be formed by application of a photosensitive material (photoresist), light exposure, and development.

Figure 5B:
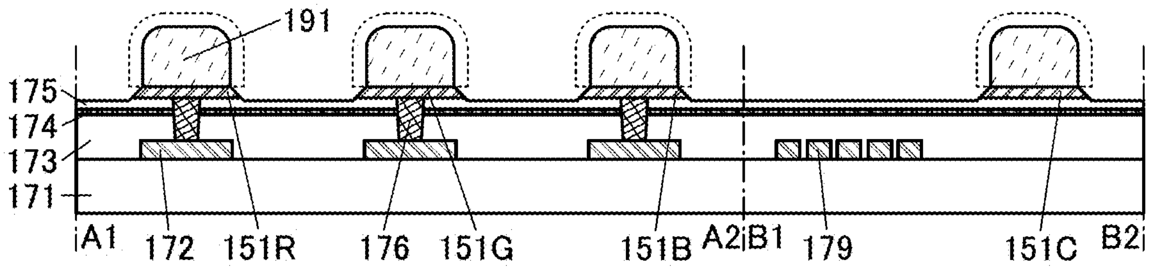

Subsequently, as illustrated in FIG. 5B, the conductive film 151*f* in a region not overlapping with the resist mask 191 is removed, for example. In this manner, the conductive layer 151 is formed.

Figure 5C:
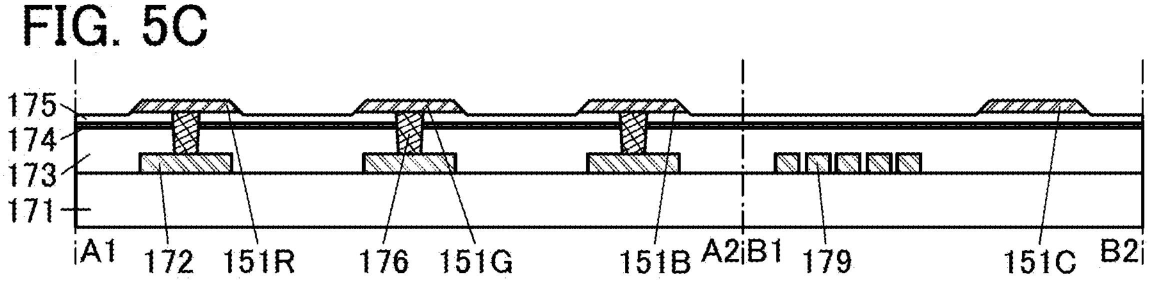

Next, the resist mask 191 is removed as illustrated in FIG. 5C. The resist mask 191 can be removed by ashing using oxygen plasma, for example.

Figure 5D:
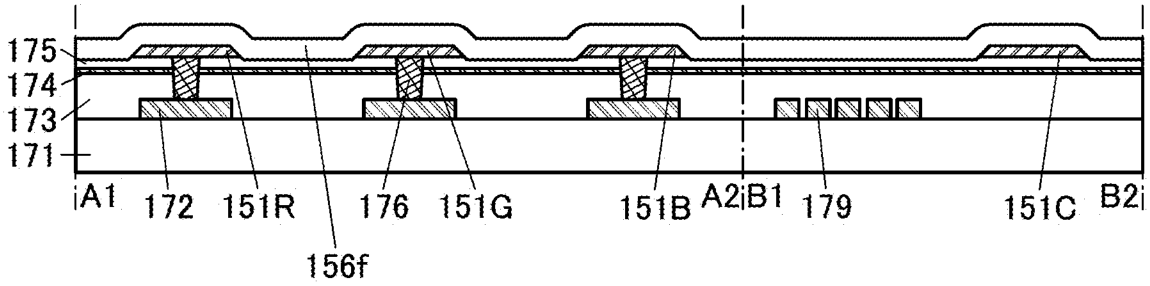

Then, as illustrated in FIG. 5D, an insulating film 156*f* to be an insulating layer 156R, an insulating layer 156G, an insulating layer 156B, and an insulating layer 156C is formed over the conductive layer 151R, the conductive layer 151G, the conductive layer 151B, the conductive layer 151C, and the insulating layer 175.

As the insulating film 156*f*, an inorganic insulating film such as an oxide insulating film, a nitride insulating film, an oxynitride insulating film, or a nitride oxide insulating film, e.g., silicon oxynitride, can be used.

Figure 5E:
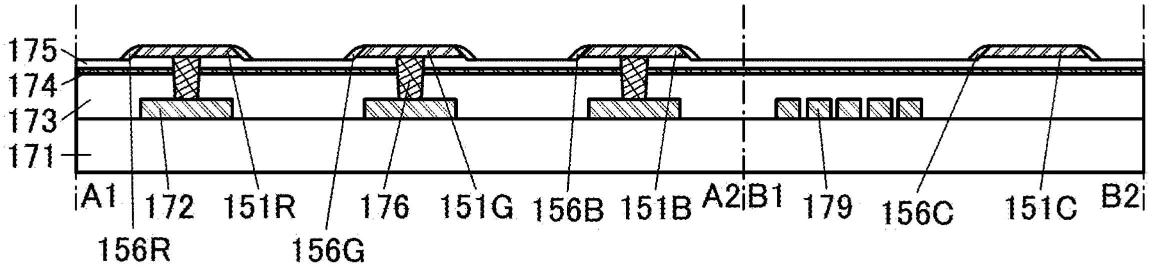

Subsequently, as illustrated in FIG. 5E, the insulating film 156*f* is processed to form the insulating layers 156R, 156G, 156B, and 156C.

Figure 6A:
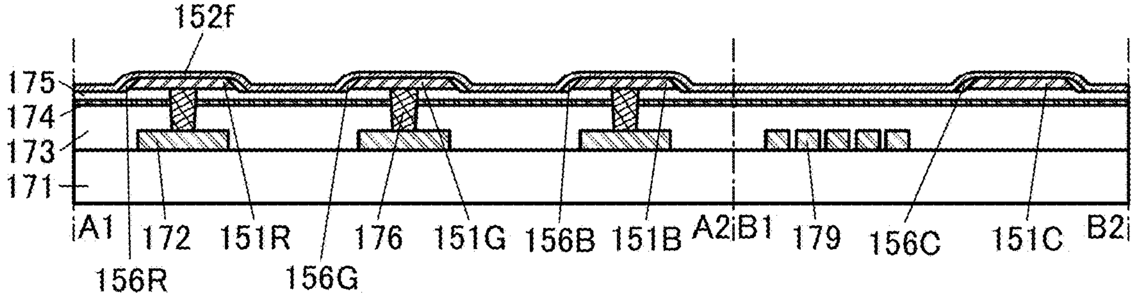
FIGS. 6A to 6D are cross-sectional views illustrating the example of the method for manufacturing the display apparatus.

Next, as illustrated in FIG. 6A, a conductive film 152*f* is formed over the conductive layers 151R, 151G, 151B, and 151C and the insulating layers 156R, 156G, 156B, 156C, and 175.

A conductive oxide can be used for the conductive film 152*f*, for example. The conductive film 152*f* may have a stacked-layer structure.

Figure 6B:
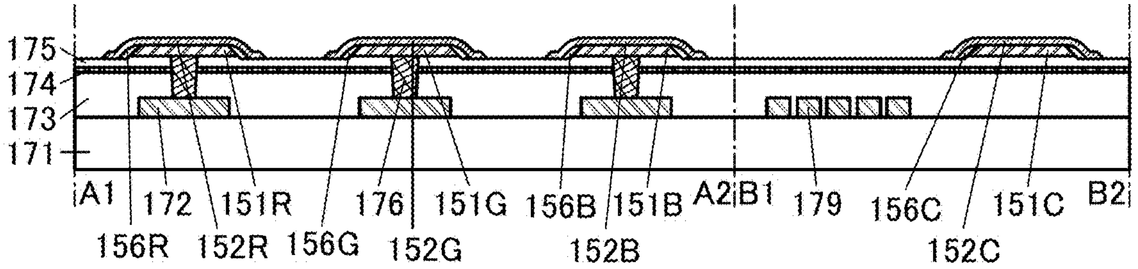

Then, as illustrated in FIG. 6B, the conductive film 152*f* is processed, so that the conductive layers 152R, 152G, 152B, and 152C are formed.

Figure 6C:
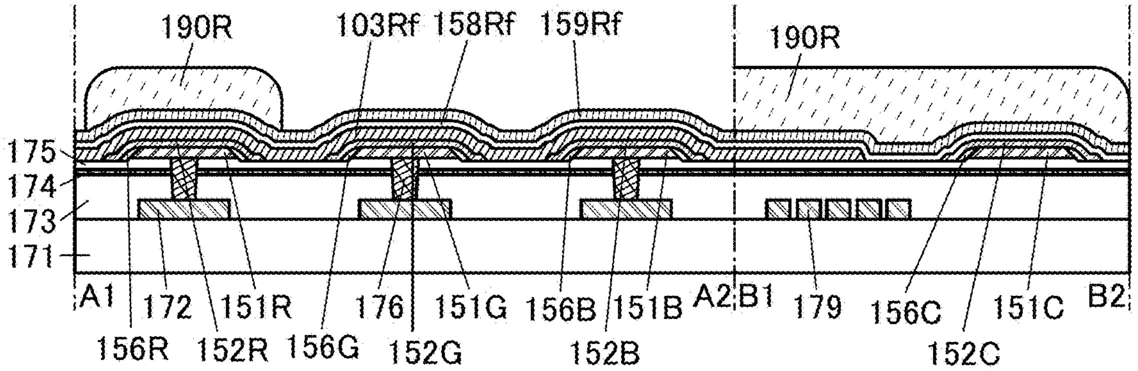

Next, as illustrated in FIG. 6C, an organic compound film 103Rf is formed over the conductive layers 152R, 152G, and 152B and the insulating layer 175. As illustrated in FIG. 6C, the organic compound film 103Rf is not formed over the conductive layer 152C.

Then, as illustrated in FIG. 6C, a sacrificial film 158Rf and a mask film 159Rf are formed.

Providing the sacrificial film 158Rf over the organic compound film 103Rf can reduce damage to the organic compound film 103Rf in the manufacturing process of the display apparatus, resulting in an increase in the reliability of the light-emitting device.

As the sacrificial film 158Rf, a film that is highly resistant to the process conditions for the organic compound film 103Rf, specifically, a film having high etching selectivity with respect to the organic compound film 103Rf is used. For the mask film 159Rf, a film having high etching selectivity with respect to the sacrificial film 158Rf is used.

The sacrificial film 158Rf and the mask film 159Rf are formed at a temperature lower than the upper temperature limit of the organic compound film 103Rf. The typical substrate temperatures in formation of the sacrificial film 158Rf and the mask film 159Rf are each higher than or equal to 100° C. and lower than or equal to 200° C., preferably higher than or equal to 100° C. and lower than or equal to 150° C., and further preferably higher than or equal to 100° C. and lower than or equal to 120° C.

The sacrificial film 158Rf and the mask film 159Rf are preferably films that can be removed by a wet etching method or a dry etching method.

Note that the sacrificial film 158Rf that is formed over and in contact with the organic compound film 103Rf is preferably formed by a formation method that is less likely to damage the organic compound film 103Rf than a formation method of the mask film 159Rf. For example, the sacrificial film 158Rf is preferably formed by an ALD method or a vacuum evaporation method rather than a sputtering method.

As each of the sacrificial film 158Rf and the mask film 159Rf, one or more of a metal film, an alloy film, a metal oxide film, a semiconductor film, an organic insulating film, and an inorganic insulating film, for example, can be used.

For each of the sacrificial film 158Rf and the mask film 159Rf, a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials can be used, for example. It is particularly preferable to use a low-melting-point material such as aluminum or silver. It is preferable to use a metal material that can block ultraviolet rays for one or both of the sacrificial film 158Rf and the mask film 159Rf, in which case the organic compound film 103Rf can be inhibited from being irradiated with ultraviolet rays in patterning light exposure, and deterioration of the organic compound film 103Rf can be suppressed.

The sacrificial film 158Rf and the mask film 159Rf can each be formed using a metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or indium tin oxide containing silicon.

In the above metal oxide, in place of gallium, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used.

The sacrificial film 158Rf and the mask film 159Rf are preferably formed using a semiconductor material such as silicon or germanium for excellent compatibility with a semiconductor manufacturing process. Alternatively, a compound containing the above semiconductor material can be used.

As each of the sacrificial film 158Rf and the mask film 159Rf, any of a variety of inorganic insulating films can be used. In particular, an oxide insulating film is preferable because its adhesion to the organic compound film 103Rf is higher than that of a nitride insulating film.

Subsequently, a resist mask 190R is formed as illustrated in FIG. 6C. The resist mask 190R can be formed by application of a photosensitive material (photoresist), light exposure, and development.

The resist mask 190R is provided at a position overlapping with the conductive layer 152R. The resist mask 190R is preferably provided also at a position overlapping with the conductive layer 152C. This can inhibit the conductive layer 152C from being damaged during the process of manufacturing the display apparatus.

Figure 6D:
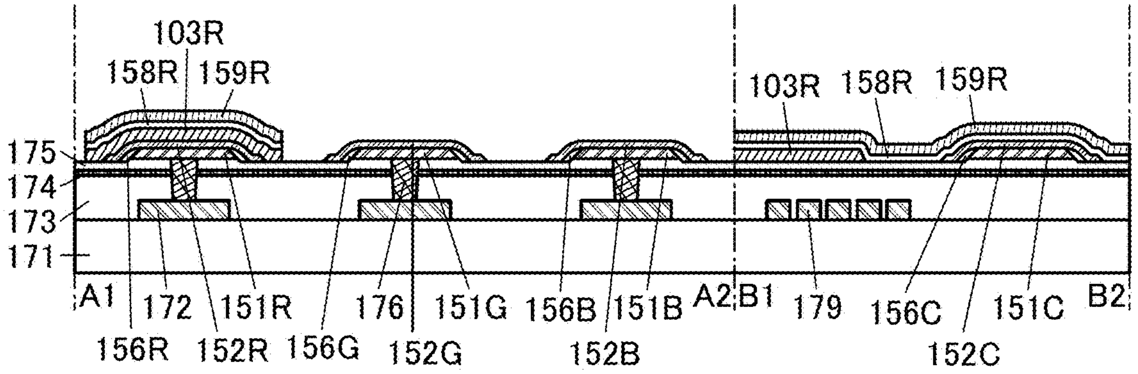

Next, as illustrated in FIG. 6D, part of the mask film 159Rf is removed using the resist mask 190R, so that a mask layer 159R is formed. The mask layer 159R remains over the conductive layers 152R and 152C. After that, the resist mask 190R is removed. Then, part of the sacrificial film 158Rf is removed using the mask layer 159R as a mask (also referred to as a hard mask), so that the sacrificial layer 158R is formed.

The use of a wet etching method can reduce damage to the organic compound film 103Rf in processing of the sacrificial film 158Rf and the mask film 159Rf, as compared to the case of using a dry etching method. In the case of using a wet etching method, it is preferable to use a developer, an alkaline aqueous solution such as a tetramethylammonium hydroxide (TMAH) aqueous solution, or an acid aqueous solution such as dilute hydrofluoric acid, oxalic acid, phosphoric acid, acetic acid, nitric acid, or a chemical solution containing a mixed solution of any of these acids, for example.

In the case of using a dry etching method to process the sacrificial film 158Rf, deterioration of the organic compound film 103Rf can be suppressed by not using a gas containing oxygen as the etching gas.

The resist mask 190R can be removed by a method similar to that for the resist mask 191.

Next, as illustrated in FIG. 6D, the organic compound film 103Rf is processed to form the organic compound layer 103R. For example, part of the organic compound film 103Rf is removed using the mask layer 159R and the sacrificial layer 158R as a hard mask, whereby the organic compound layer 103R is formed.

Accordingly, as illustrated in FIG. 6D, the stacked-layer structure of the organic compound layer 103R, the sacrificial layer 158R, and the mask layer 159R remains over the conductive layer 152R. The conductive layers 152G and 152B are exposed.

The organic compound film 103Rf is preferably processed by anisotropic etching. Anisotropic dry etching is particularly preferable. Alternatively, wet etching may be used.

In the case of using a dry etching method, deterioration of the organic compound film 103Rf can be suppressed by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Accordingly, damage to the organic compound film 103Rf can be reduced. Furthermore, a defect such as attachment of a reaction product generated during the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a Group 18 element such as He or Ar as the etching gas, for example. Alternatively, a gas containing oxygen and at least one of the above is preferably used as the etching gas. Alternatively, an oxygen gas may be used as the etching gas.

Figure 7A:
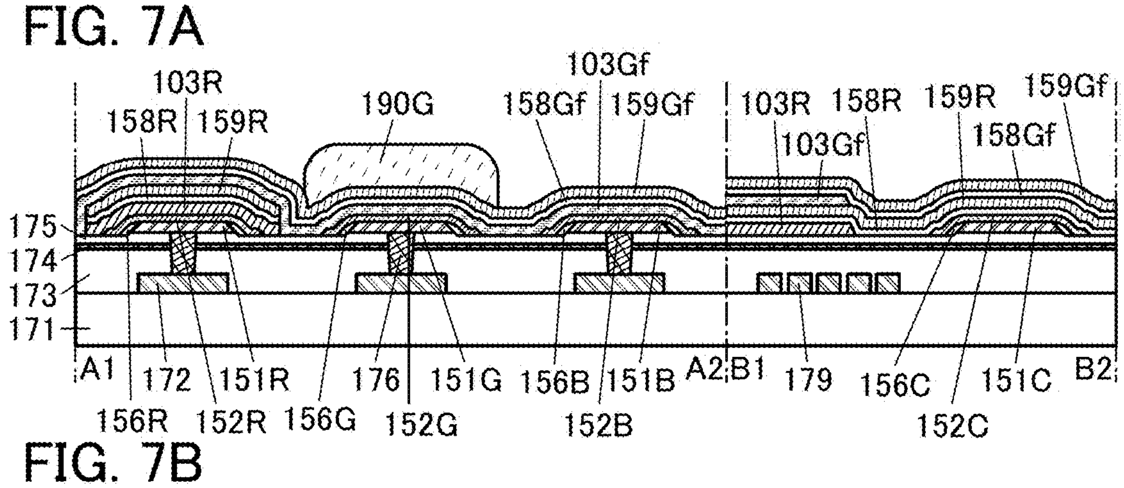
FIGS. 7A to 7D are cross-sectional views illustrating the example of the method for manufacturing the display apparatus.

Then, as illustrated in FIG. 7A, an organic compound film 103Gf to be the organic compound layer 103G is formed.

The organic compound film 103Gf can be formed by a method similar to that for forming the organic compound film 103Rf. The organic compound film 103Gf can have a structure similar to that of the organic compound film 103Rf.

Subsequently, as illustrated in FIG. 7A, a sacrificial film 158Gf and a mask film 159Gf are formed in this order. After that, a resist mask 190G is formed. The materials and the formation methods of the sacrificial film 158Gf and the mask film 159Gf are similar to those for the sacrificial film 158Rf and the mask film 159Rf. The material and the formation method of the resist mask 190G are similar to those for the resist mask 190R.

The resist mask 190G is provided at a position overlapping with the conductive layer 152G.

Figure 7B:
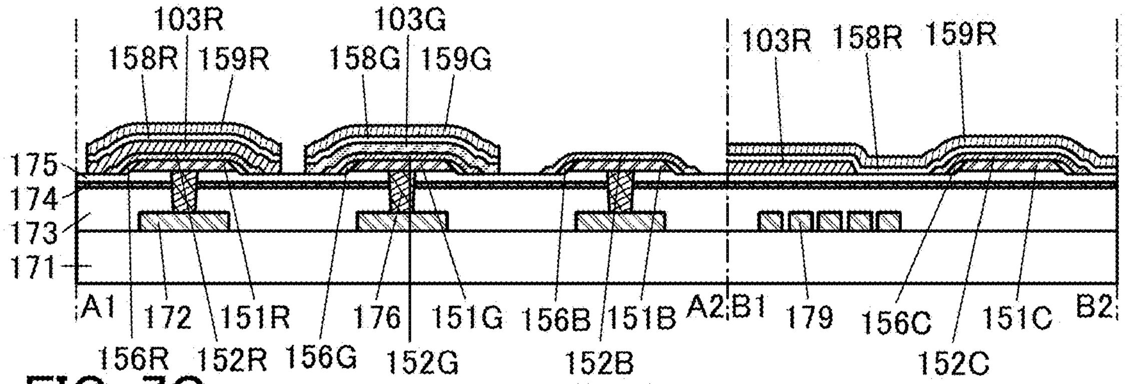

Subsequently, as illustrated in FIG. 7B, part of the mask film 159Gf is removed using the resist mask 190G, so that a mask layer 159G is formed. The mask layer 159G remains over the conductive layer 152G. After that, the resist mask 190G is removed. Then, part of the sacrificial film 158Gf is removed using the mask layer 159G as a mask, so that the sacrificial layer 158G is formed. Next, the organic compound film 103Gf is processed to form the organic compound layer 103G. Accordingly, as illustrated in FIG. 7B, the stacked-layer structure of the organic compound layer 103G, the sacrificial layer 158G, and the mask layer 159G remains over the conductive layer 152G. The mask layer 159R and the conductive layer 152B are exposed.

Figure 7C:
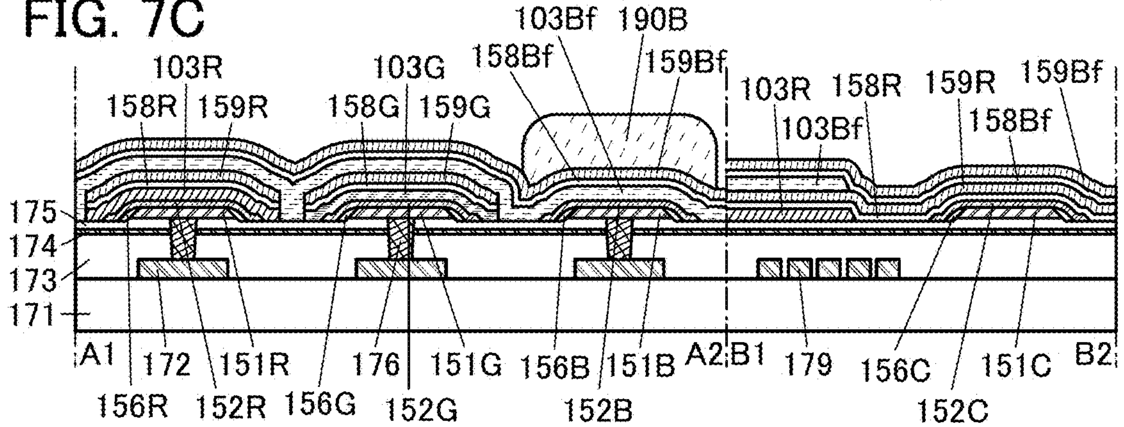

Then, an organic compound film 103Bf is formed as illustrated in FIG. 7C.

The organic compound film 103Bf can be formed by a method similar to that for forming the organic compound film 103Rf. The organic compound film 103Bf can have a structure similar to that of the organic compound film 103Rf.

Subsequently, a sacrificial film 158Bf and a mask film 159Bf are formed in this order as illustrated in FIG. 7C. After that, a resist mask 190B is formed. The materials and the formation methods of the sacrificial film 158Bf and the mask film 159Bf are similar to those for the sacrificial film 158Rf and the mask film 159Rf. The material and the formation method of the resist mask 190B are similar to those for the resist mask 190R.

The resist mask 190B is provided at a position overlapping with the conductive layer 152B.

Figure 7D:
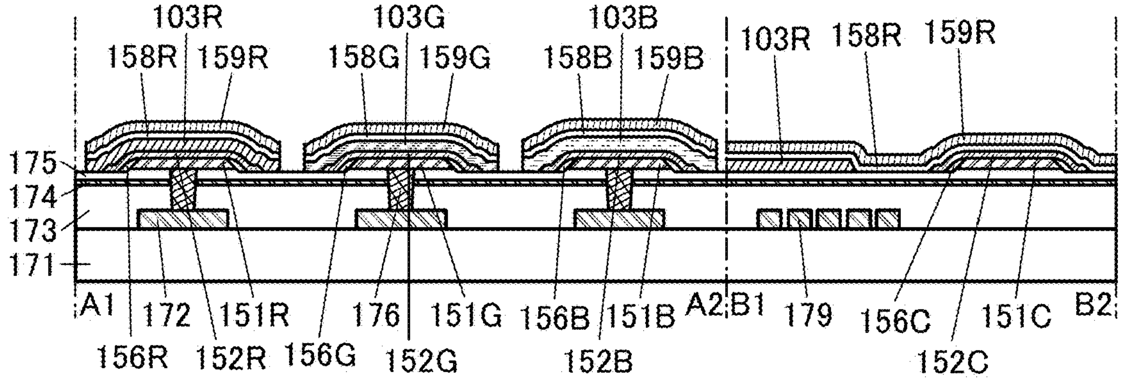

Subsequently, as illustrated in FIG. 7D, part of the mask film 159Bf is removed using the resist mask 190B, so that a mask layer 159B is formed. The mask layer 159B remains over the conductive layer 152B. After that, the resist mask 190B is removed. Then, part of the sacrificial film 158Bf is removed using the mask layer 159B as a mask, so that the sacrificial layer 158B is formed. Next, the organic compound film 103Bf is processed to form the organic compound layer 103B. For example, part of the organic compound film 103Bf is removed using the mask layer 159B and the sacrificial layer 158B as a hard mask, whereby the organic compound layer 103B is formed.

Accordingly, the stacked-layer structure of the organic compound layer 103B, the sacrificial layer 158B, and the mask layer 159B remains over the conductive layer 152B as illustrated in FIG. 7D. The mask layers 159R and 159G are exposed.

Note that the side surfaces of the organic compound layers 103R, 103G, and 103B are preferably perpendicular or substantially perpendicular to their formation surfaces. For example, the angle between the formation surfaces and these side surfaces is preferably greater than or equal to 60° and less than or equal to 90°.

The distance between two adjacent layers among the organic compound layers 103R, 103G, and 103B, which are formed by a photolithography technique as described above, can be reduced to less than or equal to 8 μm, less than or equal to 5 μm, less than or equal to 3 μm, less than or equal to 2 μm, or less than or equal to 1 μm. Here, the distance can be specified, for example, by the distance between opposite end portions of two adjacent layers among the organic compound layers 103R, 103G, and 103B. Reducing the distance between the island-shaped organic compound layers makes it possible to provide a display apparatus having high resolution and a high aperture ratio. In addition, the distance between the first electrodes of adjacent light-emitting devices can also be shortened to be, for example, less than or equal to 10 μm, less than or equal to 8 μm, less than or equal to 5 μm, less than or equal to 3 μm, or less than or equal to 2 μm. Note that the distance between the first electrodes of adjacent light-emitting devices is preferably greater than or equal to 2 μm and less than or equal to 5 μm.

Figure 8A:
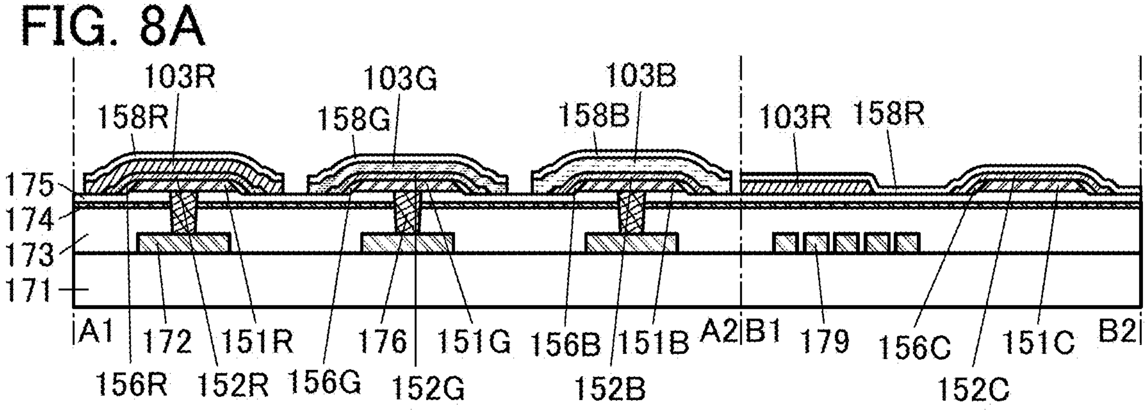
FIGS. 8A to 8C are cross-sectional views illustrating the example of the method for manufacturing the display apparatus.

Next, the mask layers 159R, 159G, and 159B are preferably removed as illustrated in FIG. 8A.

The step of removing the mask layers can be performed by a method similar to that for the step of processing the mask layers. Specifically, by using a wet etching method, damage caused to the organic compound layer 103 at the time of removing the mask layers can be reduced as compared to the case of using a dry etching method.

The mask layers may be removed by being dissolved in a polar solvent such as water or an alcohol. Examples of an alcohol include ethyl alcohol, methyl alcohol, isopropyl alcohol (IPA), and glycerin.

After the mask layers are removed, drying treatment may be performed in order to remove water adsorbed on surfaces. For example, heat treatment in an inert gas atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., and further preferably higher than or equal to 70° C. and lower than or equal to 120° C. The heat treatment is preferably performed in a reduced-pressure atmosphere, in which case drying at a lower temperature is possible.

Figure 8B:
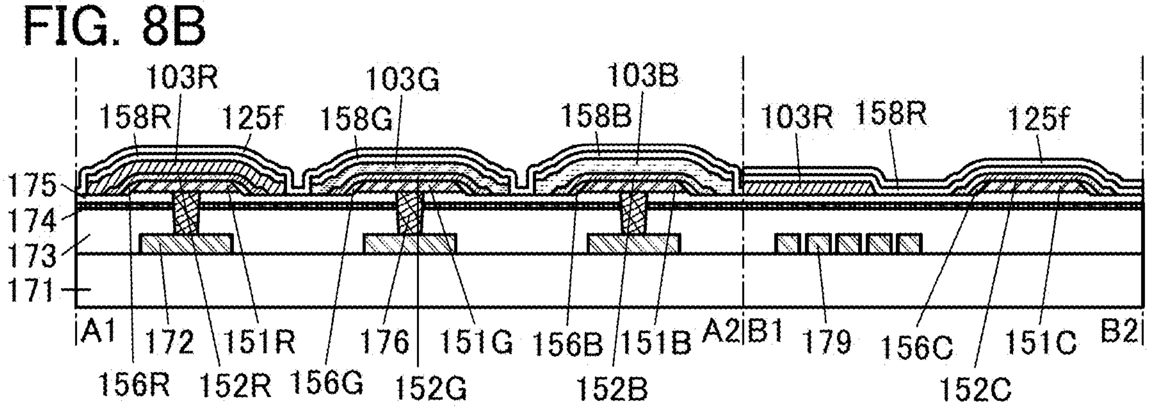

Next, an inorganic insulating film 125*f* is formed as illustrated in FIG. 8B.

Figure 8C:
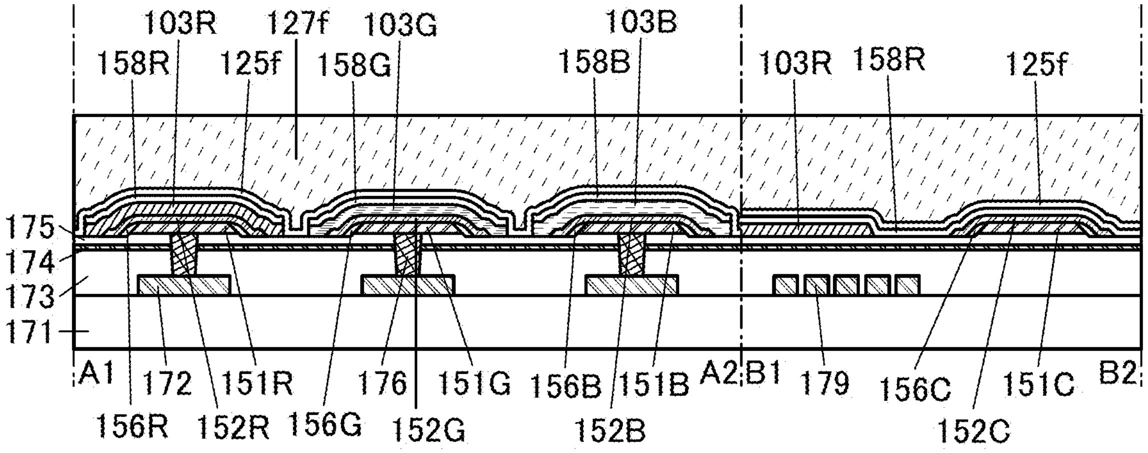

Then, as illustrated in FIG. 8C, an insulating film 127*f* to be the insulating layer 127 is formed over the inorganic insulating film 125*f*.

The substrate temperature at the time of forming the inorganic insulating film 125*f* and the insulating film 127*f* is preferably higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

As the inorganic insulating film 125*f*, an insulating film having a thickness of 3 nm or more, 5 nm or more, or 10 nm or more and 200 nm or less, 150 nm or less, 100 nm or less, or 50 nm or less is preferably formed at a substrate temperature in the above-described range.

The inorganic insulating film 125*f* is preferably formed by an ALD method, for example. An ALD method is preferably used, in which case deposition damage is reduced and a film with good coverage can be formed. As the inorganic insulating film 125*f*, an aluminum oxide film is preferably formed by an ALD method, for example.

The insulating film 127*f* is preferably formed by the aforementioned wet process. For example, the insulating film 127*f* is preferably formed by spin coating using a photosensitive material, and specifically preferably formed using a photosensitive resin composition containing an acrylic resin.

Then, part of the insulating film 127*f* is exposed to visible light or ultraviolet rays. The insulating layer 127 is formed in regions that are sandwiched between any two of the conductive layers 152R, 152G, and 152B and around the conductive layer 152C.

The width of the insulating layer 127 formed later can be controlled in accordance with the exposed region of the insulating film 127*f*. In this embodiment, processing is performed such that the insulating layer 127 includes a portion overlapping with the top surface of the conductive layer 151.

Light used for the exposure preferably includes the i-line (wavelength: 365 nm). Furthermore, light used for the exposure may include at least one of the g-line (wavelength: 436 nm) and the h-line (wavelength: 405 nm).

Figure 9A:
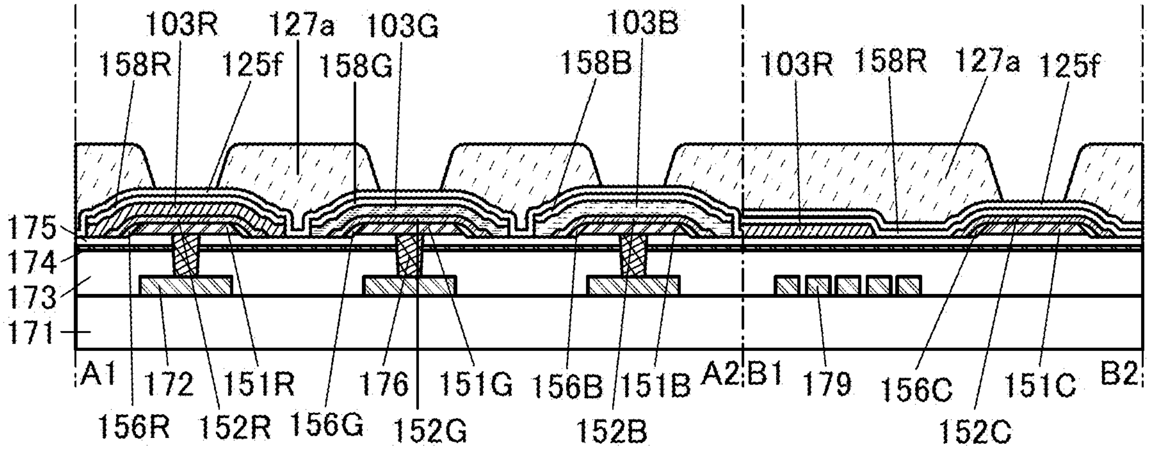
FIGS. 9A to 9C are cross-sectional views illustrating the example of the method for manufacturing the display apparatus.

Next, the region of the insulating film 127*f* exposed to light is removed by development as illustrated in FIG. 9A, so that an insulating layer 127*a* is formed.

Figure 9B:
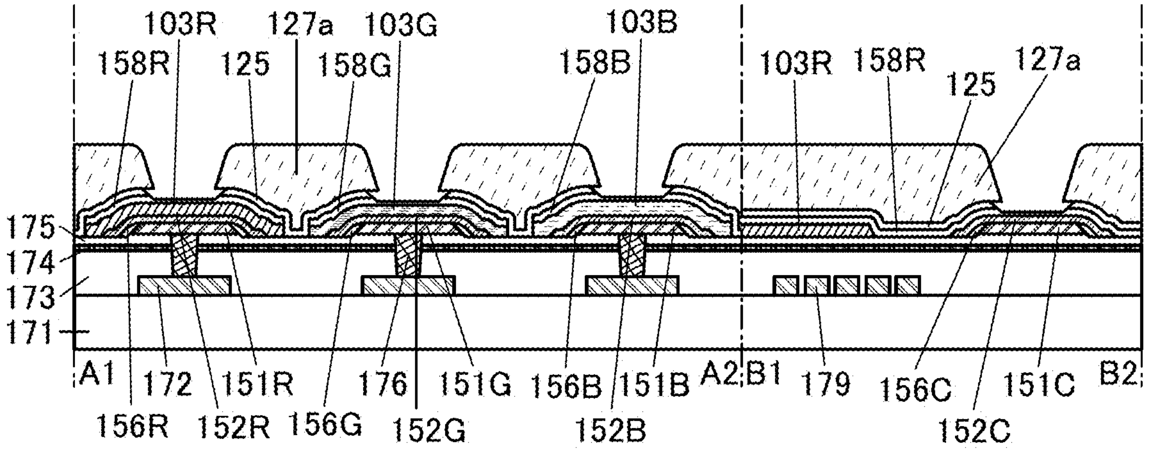

Next, as illustrated in FIG. 9B, etching treatment is performed with the insulating layer 127*a* as a mask to remove part of the inorganic insulating film 125*f* and reduce the thickness of part of the sacrificial layers 158R, 158G, and 158B. Thus, the inorganic insulating layer 125 is formed under the insulating layer 127*a*. Moreover, the surfaces of the thin portions in the sacrificial layers 158R, 158G, and 158B are exposed. Note that the etching treatment using the insulating layer 127*a* as a mask may be hereinafter referred to as first etching treatment.

The first etching treatment can be performed by dry etching or wet etching. Note that the inorganic insulating film 125*f* is preferably formed using a material similar to that of the sacrificial layers 158R, 158G, and 158B, in which case the first etching treatment can be performed concurrently.

In the case of performing dry etching, a chlorine-based gas is preferably used. As the chlorine-based gas, one of $Cl_2$, $BCl_3$, $SiCl_4$, $CCl_4$, and the like or a mixture of two or more of them can be used. Moreover, one of an oxygen gas, a hydrogen gas, a helium gas, an argon gas, and the like or a mixture of two or more of them can be added as appropriate to the chlorine-based gas. By the dry etching, the thin regions of the sacrificial layers 158R, 158G, and 158B can be formed with favorable in-plane uniformity.

As a dry etching apparatus, a dry etching apparatus including a high-density plasma source can be used. As the dry etching apparatus including a high-density plasma source, an inductively coupled plasma (ICP) etching apparatus can be used, for example. Alternatively, a capacitively coupled plasma (CCP) etching apparatus including parallel plate electrodes can be used.

The first etching treatment is preferably performed by wet etching. The use of a wet etching method can reduce damage to the organic compound layers 103R, 103G, and 103B, as compared to the case of using a dry etching method. Wet etching can be performed using an alkaline solution, for example. For instance, TMAH, which is an alkaline solution, can be used for the wet etching of an aluminum oxide film. Alternatively, an acid solution containing fluoride can also be used. In this case, puddle wet etching can be performed. Note that the inorganic insulating film 125*f* is preferably formed using a material similar to that of the sacrificial layers 158R, 158G, and 158B, in which case the above etching treatment can be performed concurrently.

The sacrificial layers 158R, 158G, and 158B are not completely removed by the first etching treatment, and the etching treatment is stopped when the thickness of the sacrificial layers 158R, 158G, and 158B is reduced. The corresponding sacrificial layers 158R, 158G, and 158B remain over the organic compound layers 103R, 103G, and 103B in this manner, whereby the organic compound layers 103R, 103G, and 103B can be prevented from being damaged by treatment in a later step.

Next, light exposure is preferably performed on the entire substrate so that the insulating layer 127*a* is irradiated with visible light or ultraviolet rays. The energy density for the light exposure is preferably greater than 0 $mJ/cm^2$ and less than or equal to 800 $mJ/cm^2$, further preferably greater than 0 $mJ/cm^2$ and less than or equal to 500 $mJ/cm^2$. Performing such light exposure after the development can sometimes increase the degree of transparency of the insulating layer 127*a*. In addition, it is sometimes possible to lower the substrate temperature required for subsequent heat treatment for changing the shape of the insulating layer 127*a* into a tapered shape.

Here, when a barrier insulating layer against oxygen (e.g., an aluminum oxide film) exists as each of the sacrificial layers 158R, 158G, and 158B, diffusion of oxygen into the organic compound layers 103R, 103G, and 103B can be suppressed.

Figure 9C:
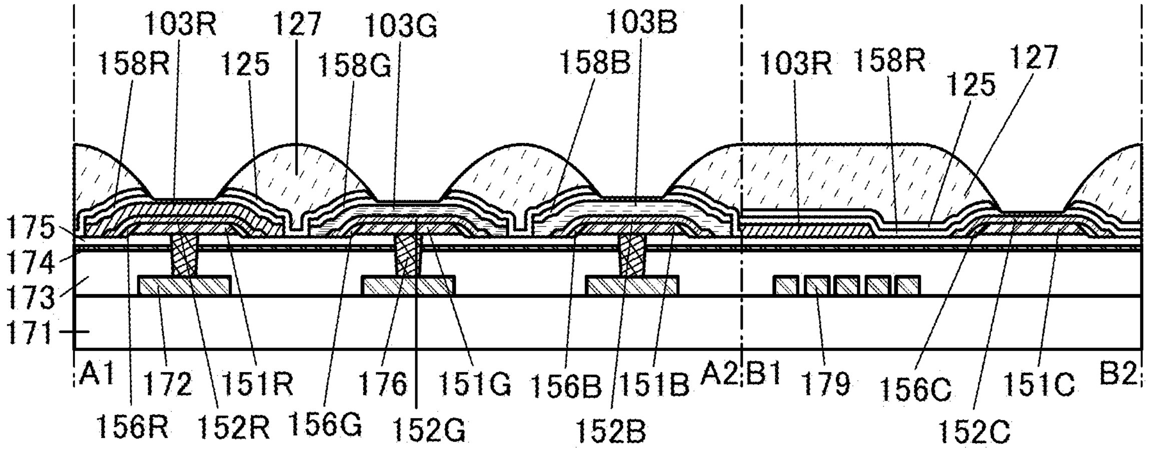

Then, heat treatment (also referred to as post-baking) is performed. The heat treatment can change the insulating layer 127*a* into the insulating layer 127 having a tapered side surface (FIG. 9C). The heat treatment is conducted at a temperature lower than the upper temperature limit of the organic compound layer. The heat treatment can be performed at a substrate temperature higher than or equal to 50° C. and lower than or equal to 200° C., preferably higher than or equal to 60° C. and lower than or equal to 150° C., and further preferably higher than or equal to 70° C. and lower than or equal to 130° C. The heating atmosphere may be an air atmosphere or an inert gas atmosphere. Moreover, the heating atmosphere may be an atmospheric-pressure atmosphere or a reduced-pressure atmosphere. Accordingly, adhesion between the insulating layer 127 and the inorganic insulating layer 125 can be improved, and corrosion resistance of the insulating layer 127 can be increased.

When the sacrificial layers 158R, 158G, and 158B are not completely removed by the first etching treatment and the thinned sacrificial layers 158R, 158G, and 158B are left, the organic compound layers 103R, 103G, and 103B can be prevented from being damaged and deteriorating in the heat treatment. This increases the reliability of the light-emitting device.

Figure 10A:
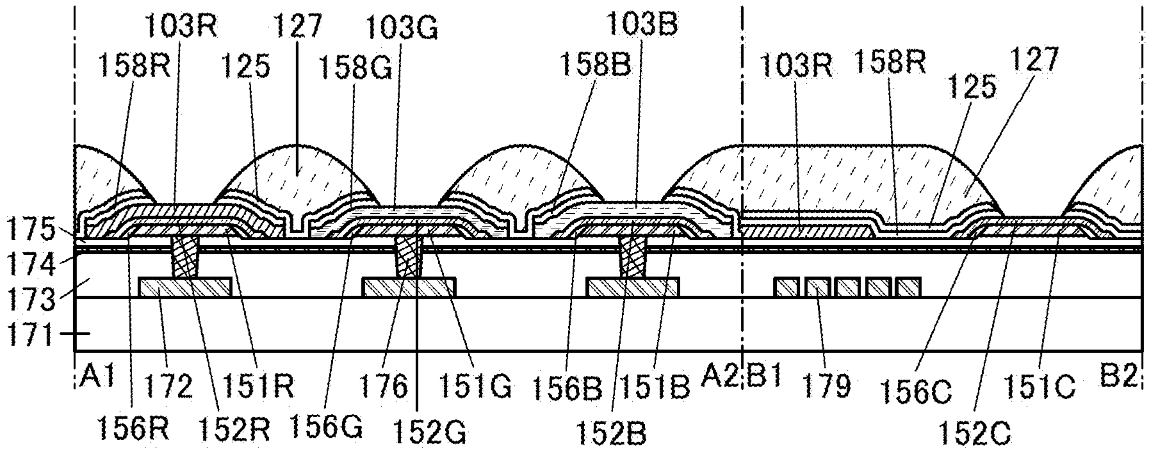
FIGS. 10A to 10C are cross-sectional views illustrating the example of the method for manufacturing the display apparatus.

Next, as illustrated in FIG. 10A, etching treatment is performed with the insulating layer 127 as a mask to remove part of the sacrificial layers 158R, 158G, and 158B. Thus, openings are formed in the sacrificial layers 158R, 158G, and 158B, and the top surfaces of the organic compound layers 103R, 103G, and 103B and the conductive layer 152C are exposed. Note that this etching treatment may be hereinafter referred to as second etching treatment.

An end portion of the inorganic insulating layer 125 is covered with the insulating layer 127. FIG. 10A illustrates an example in which part of an end portion of the sacrificial layer 158G (specifically, a tapered portion formed by the first etching treatment) is covered with the insulating layer 127 and a tapered portion formed by the second etching treatment is exposed.

The second etching treatment is performed by wet etching. The use of a wet etching method can reduce damage to the organic compound layers 103R, 103G, and 103B, as compared to the case of using a dry etching method. Wet etching can be performed using an alkaline solution or an acidic solution, for example. An aqueous solution is preferably used in order that the organic compound layer 103 is not dissolved.

Figure 10B:
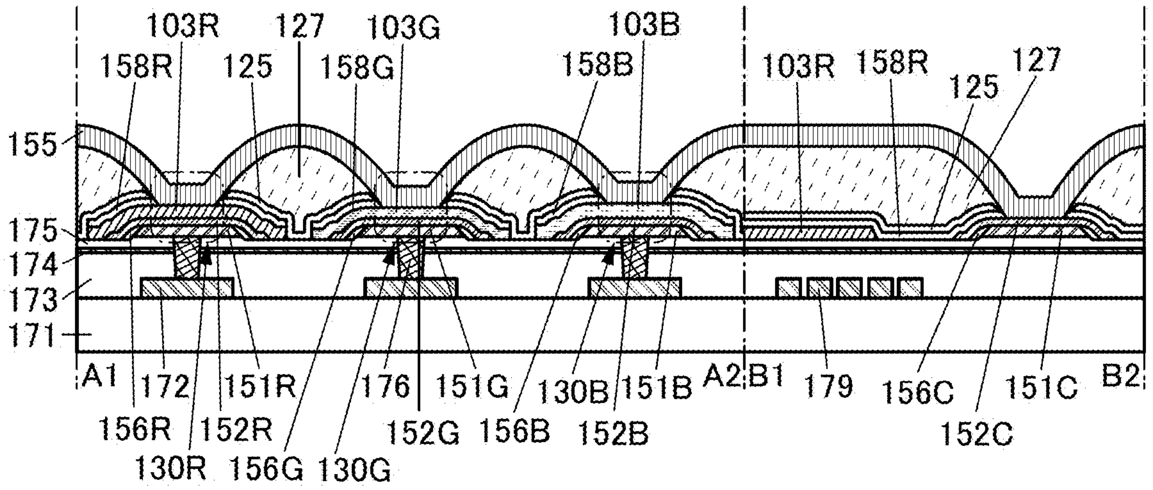

Next, as illustrated in FIG. 10B, a common electrode 155 is formed over the organic compound layers 103R, 103G, and 103B, the conductive layer 152C, and the insulating layer 127. The common electrode 155 can be formed by a sputtering method, a vacuum evaporation method, or the like. In this case, a stacked layer structure of the first EL layer 104 and the second EL layer 105 may be employed as the organic compound layer 103 as illustrated in FIG. 4B, and the common electrode 155 may be formed thereover.

Figure 10C:
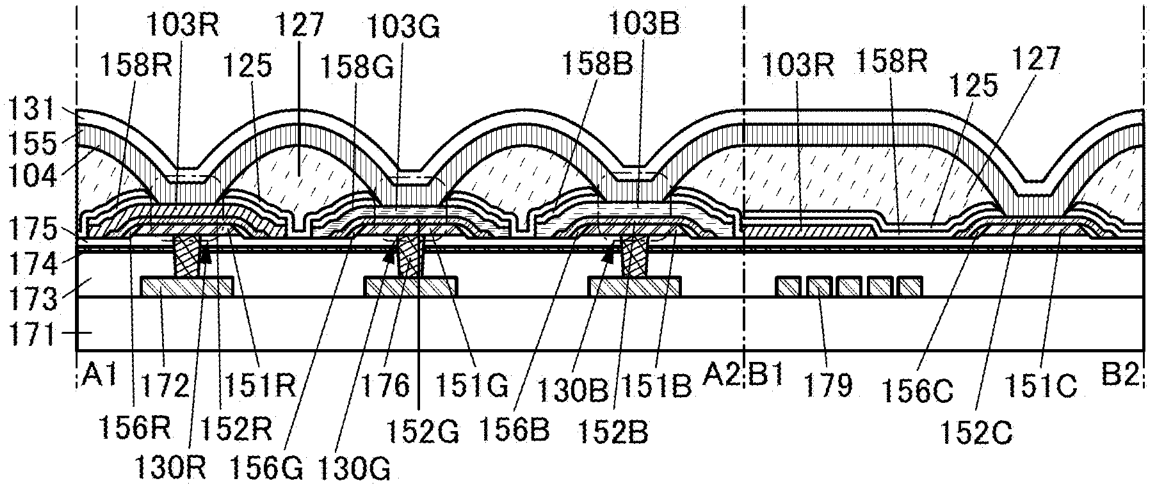

Next, as illustrated in FIG. 10C, the protective layer 131 is formed over the common electrode 155. The protective layer 131 can be formed by a vacuum evaporation method, a sputtering method, a CVD method, an ALD method, or the like.

Then, the substrate 120 is bonded over the protective layer 131 using the resin layer 122, so that the display apparatus can be manufactured. In the method for manufacturing the display apparatus of one embodiment of the present invention, the insulating layer 156 is formed to include a region overlapping with the side surface of the conductive layer 151 and the conductive layer 152 is formed to cover the conductive layer 151 and the insulating layer 156 as described above. This can increase the yield of the display apparatus and inhibit generation of defects.

As described above, in the method for manufacturing the display apparatus in one embodiment of the present invention, the island-shaped organic compound layers 103R, 103G, and 103B are formed not by using a fine metal mask but by processing a film formed on the entire surface; thus, the island-shaped layers can be formed to have a uniform thickness. Consequently, a high-resolution display apparatus or a display apparatus with a high aperture ratio can be obtained. Furthermore, even when the resolution or the aperture ratio is high and the distance between the subpixels is extremely short, the organic compound layers 103R, 103G, and 103B can be inhibited from being in contact with each other in the adjacent subpixels. As a result, generation of leakage current between the subpixels can be inhibited. This can prevent crosstalk, so that a display apparatus with extremely high contrast can be obtained. Moreover, even a display apparatus that includes tandem light-emitting devices formed by a photolithography technique can have favorable characteristics.

Embodiment 4

In this embodiment, a display apparatus of one embodiment of the present invention will be described.

The display apparatus in this embodiment can be a high-resolution display apparatus. Thus, the display apparatus in this embodiment can be used for display portions of information terminals (wearable devices) such as watch-type and bracelet-type information terminals and display portions of wearable devices capable of being worn on a head, such as a VR device like a head mounted display (HMD) and a glasses-type AR device.

The display apparatus in this embodiment can be a high-definition display apparatus or a large-sized display apparatus. Accordingly, the display apparatus in this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, desktop and notebook personal computers, a monitor of a computer and the like, digital signage, and a large game machine such as a pachinko machine.

[Display Module]

Figure 11A:
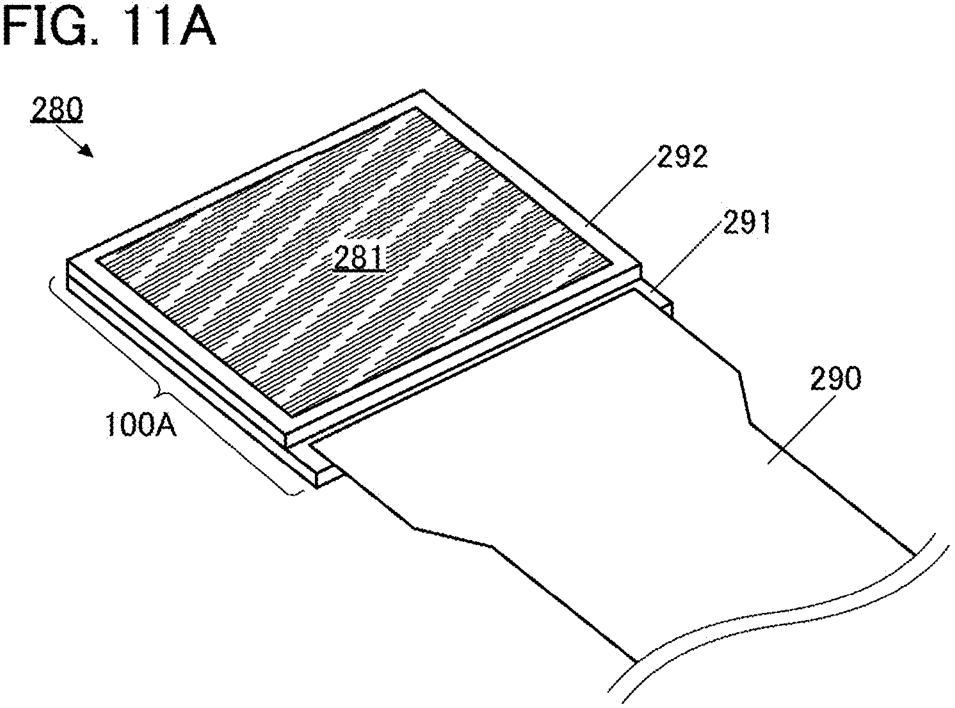
FIGS. 11A and 11B are perspective views illustrating a structure example of a display module.

FIG. 11A is a perspective view of a display module 280. The display module 280 includes a display apparatus 100A and an FPC 290. Note that the display apparatus included in the display module 280 is not limited to the display apparatus 100A and may be any of display apparatuses 100B to 100E described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 11B:
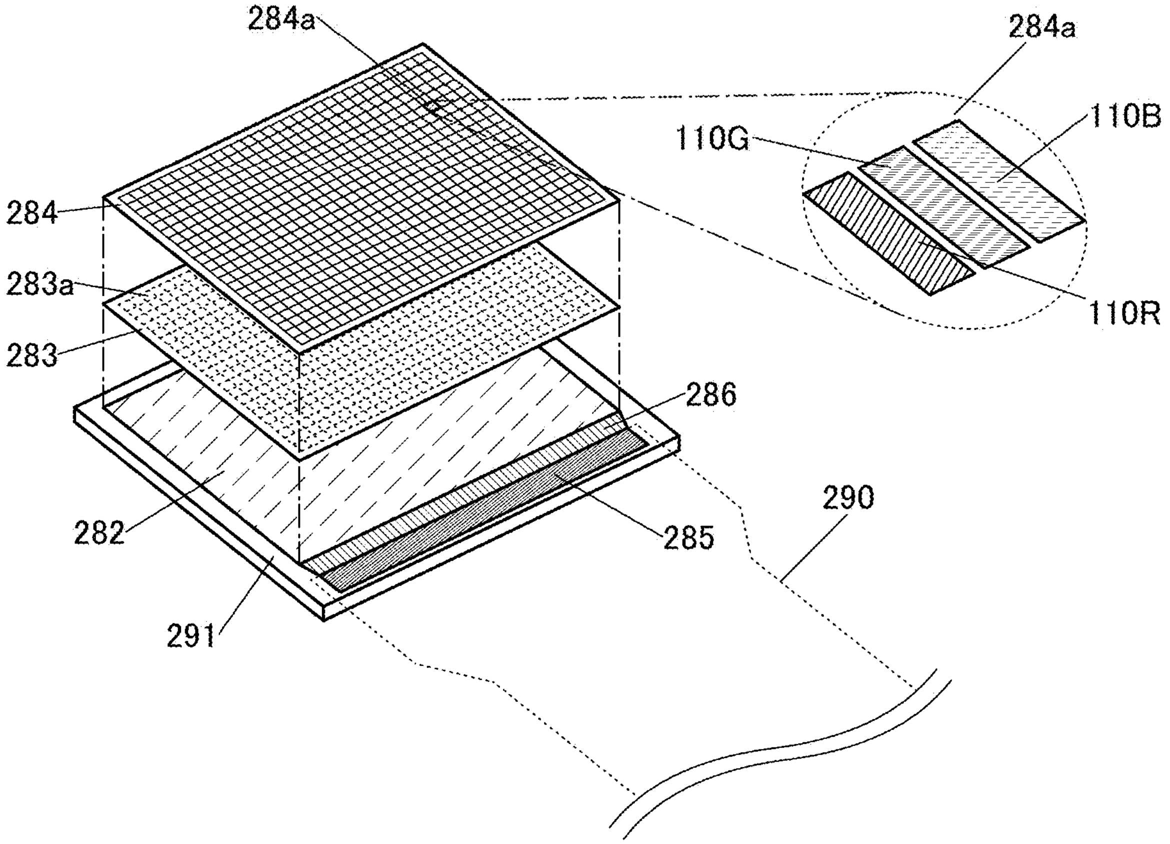

FIG. 11B is a perspective view schematically illustrating the structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 11B. The pixels 284*a* can employ any of the structures described in the above embodiments. FIG. 11B illustrates an example where the pixel 284*a* has a structure similar to that of the pixel 178 illustrated in FIGS. 4A and 4B.

The pixel circuit portion 283 includes a plurality of pixel circuits 283*a* arranged periodically.

One pixel circuit 283*a* is a circuit that controls driving of a plurality of elements included in one pixel 284*a*.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high.

Such a display module 280 has extremely high resolution, and thus can be suitably used for a VR device such as an HMD or a glasses-type AR device. For example, even in the case of a structure in which the display portion of the display module 280 is seen through a lens, pixels of the extremely-high-resolution display portion 281 included in the display module 280 are prevented from being recognized when the display portion is enlarged by the lens, so that display providing a high sense of immersion can be performed. Without being limited thereto, the display module 280 can be suitably used for electronic devices including a relatively small display portion.

[Display Apparatus 100A]

Figure 12A:
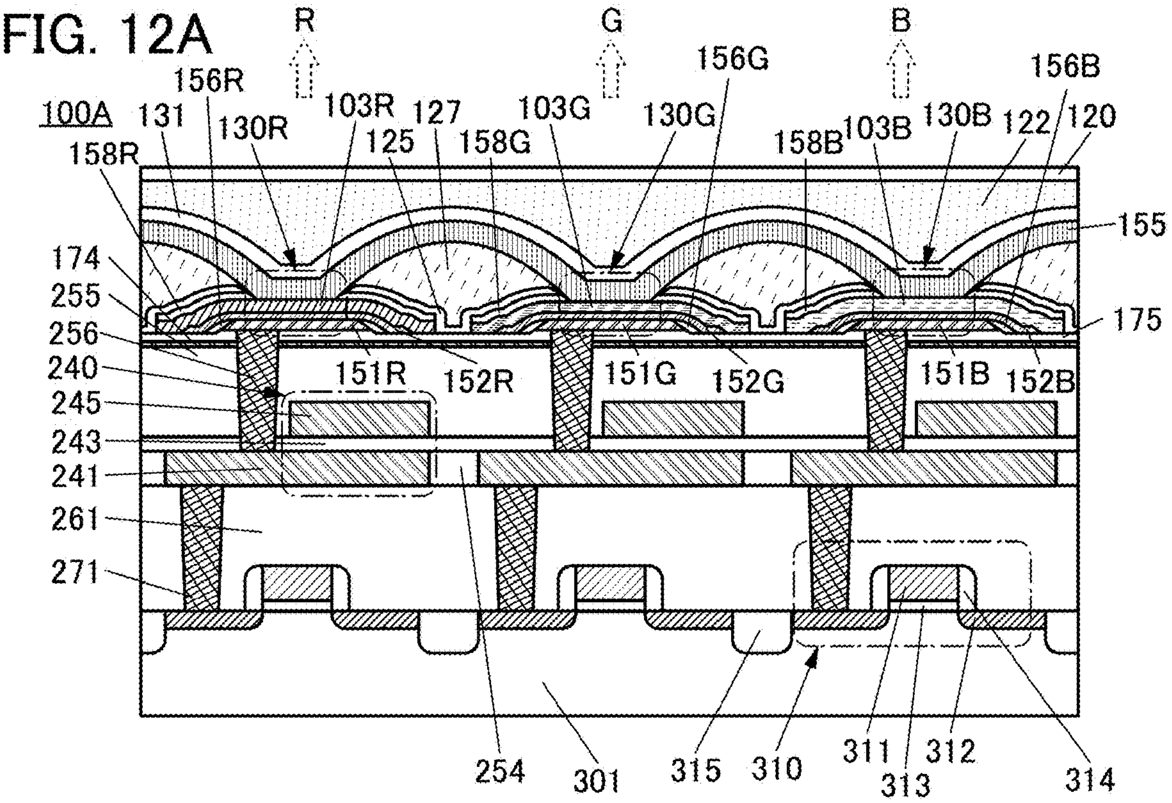
FIGS. 12A and 12B are cross-sectional views illustrating structure examples of a display apparatus.

The display apparatus 100A illustrated in FIG. 12A includes a substrate 301, the light-emitting devices 130R, 130G, and 130B, a capacitor 240, and a transistor 310.

The substrate 301 corresponds to the substrate 291 in FIGS. 11A and 11B. The transistor 310 includes a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as a source or a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 240. The insulating layer 174 is provided over the insulating layer 255. The insulating layer 175 is provided over the insulating layer 174. The light-emitting devices 130R, 130G, and 130B are provided over the insulating layer 175. An insulator is provided in regions between adjacent light-emitting devices.

The insulating layer 156R is provided to include a region overlapping with the side surface of the conductive layer 151R. The insulating layer 156G is provided to include a region overlapping with the side surface of the conductive layer 151G. The insulating layer 156B is provided to include a region overlapping with the side surface of the conductive layer 151B. The conductive layer 152R is provided to cover the conductive layer 151R and the insulating layer 156R. The conductive layer 152G is provided to cover the conductive layer 151G and the insulating layer 156G. The conductive layer 152B is provided to cover the conductive layer 151B and the insulating layer 156B. The sacrificial layer 158R is positioned over the organic compound layer 103R. The sacrificial layer 158G is positioned over the organic compound layer 103G. The sacrificial layer 158B is positioned over the organic compound layer 103B.

Each of the conductive layers 151R, 151G, and 151B is electrically connected to one of the source and the drain of the corresponding transistor 310 through a plug 256 embedded in the insulating layers 243, 255, 174, and 175, the conductive layer 241 embedded in the insulating layer 254, and the plug 271 embedded in the insulating layer 261. Any of a variety of conductive materials can be used for the plugs.

The protective layer 131 is provided over the light-emitting devices 130R, 130G, and 130B. The substrate 120 is bonded to the protective layer 131 with the resin layer 122. Embodiment 3 can be referred to for the details of the light-emitting device 130 and the components thereover up to the substrate 120. The substrate 120 corresponds to the substrate 292 in FIG. 11A.

Figure 12B:
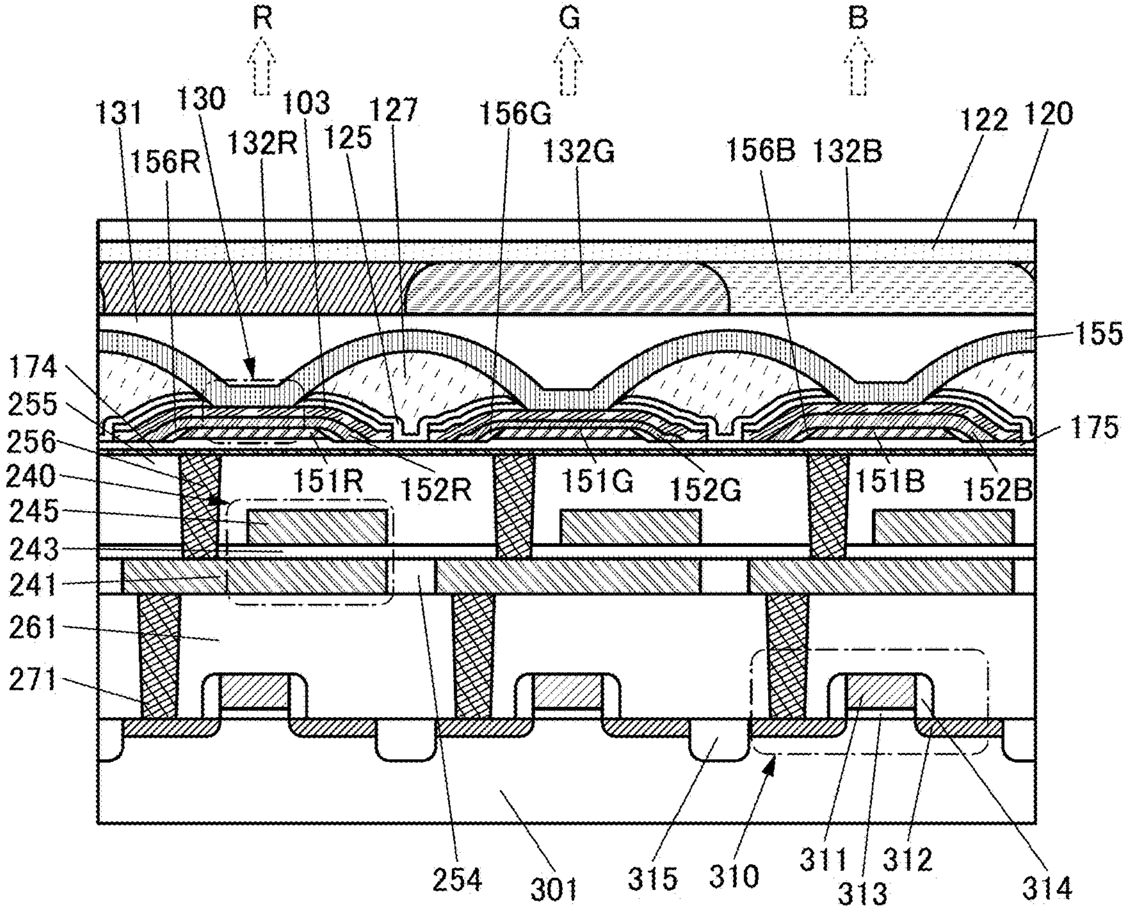

FIG. 12B illustrates a variation example of the display apparatus 100A illustrated in FIG. 12A. The display apparatus illustrated in FIG. 12B includes the coloring layers 132R, 132G, and 132B, and each of the light-emitting devices 130 includes a region overlapping with one of the coloring layers 132R, 132G, and 132B. In the display apparatus illustrated in FIG. 12B, the light-emitting device 130 can emit white light, for example. The coloring layer 132R, the coloring layer 132G, and the coloring layer 132B can transmit red light, green light, and blue light, respectively, for example.

[Display Apparatus 100B]

Figure 13:
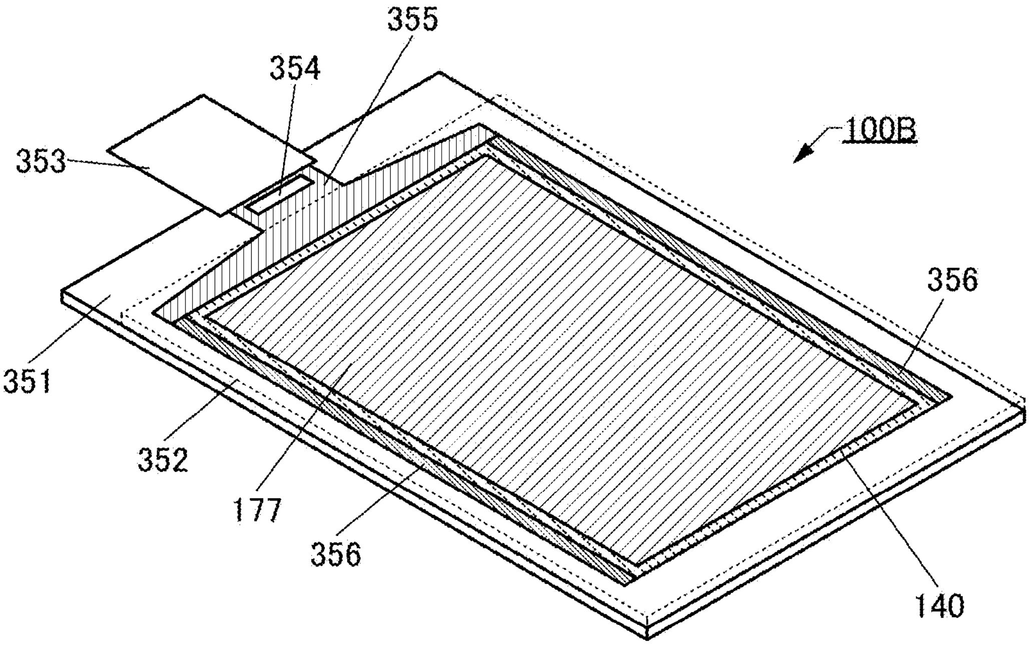
FIG. 13 is a perspective view illustrating a structure example of a display apparatus.
Figure 14:
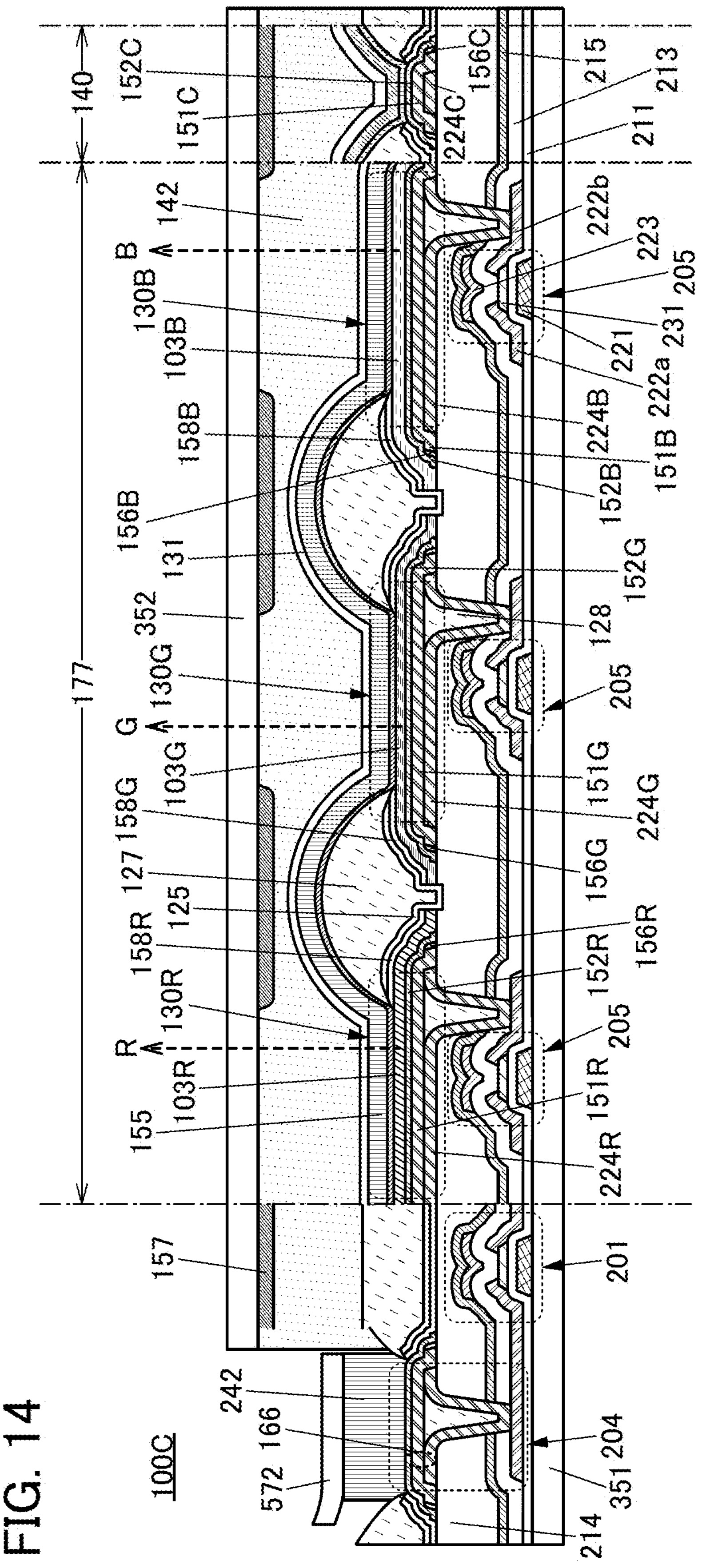
FIG. 14 is a cross-sectional view illustrating a structure example of a display apparatus.

FIG. 13 is a perspective view of the display apparatus 100B, and FIG. 14 is a cross-sectional view of the display apparatus 100B.

In the display apparatus 100B, a substrate 352 and a substrate 351 are bonded to each other. In FIG. 13, the substrate 352 is denoted by a dashed line.

The display apparatus 100B includes the pixel portion 177, the connection portion 140, a circuit 356, a wiring 355, and the like. FIG. 13 illustrates an example in which an IC 354 and an FPC 353 are mounted on the display apparatus 100B. Thus, the structure illustrated in FIG. 13 can be regarded as a display module including the display apparatus 100B, the integrated circuit (IC), and the FPC. Here, a display apparatus in which a substrate is equipped with a connector such as an FPC or mounted with an IC is referred to as a display module.

The connection portion 140 is provided outside the pixel portion 177. The number of connection portions 140 may be one or more. In the connection portion 140, a common electrode of a light-emitting device is electrically connected to a conductive layer, so that a potential can be supplied to the common electrode.

As the circuit 356, a scan line driver circuit can be used, for example.

The wiring 355 has a function of supplying a signal and power to the pixel portion 177 and the circuit 356. The signal and power are input to the wiring 355 from the outside through the FPC 353 or from the IC 354.

FIG. 13 illustrates an example in which the IC 354 is provided over the substrate 351 by a chip on glass (COG) method, a chip on film (COF) method, or the like. An IC including a scan line driver circuit, a signal line driver circuit, or the like can be used as the IC 354, for example. Note that the display apparatus 100B and the display module are not necessarily provided with an IC. Alternatively, the IC may be mounted on the FPC by a COF method, for example.

FIG. 14 illustrates an example of cross sections of part of a region including the FPC 353, part of the circuit 356, part of the pixel portion 177, part of the connection portion 140, and part of a region including an end portion of the display apparatus 100B.

[Display Apparatus 100C]

The display apparatus 100C illustrated in FIG. 14 includes a transistor 201, a transistor 205, the light-emitting device 130R that emits red light, the light-emitting device 130G that emits green light, the light-emitting device 130B that emits blue light, and the like between the substrate 351 and the substrate 352.

Embodiment 1 to Embodiment 3 can be referred to for the details of the light-emitting devices 130R, 130G, and 130B.

The light-emitting device 130R includes a conductive layer 224R, the conductive layer 151R over the conductive layer 224R, and the conductive layer 152R over the conductive layer 151R. The light-emitting device 130G includes a conductive layer 224G, the conductive layer 151G over the conductive layer 224G, and the conductive layer 152G over the conductive layer 151G. The light-emitting device 130B includes a conductive layer 224B, the conductive layer 151B over the conductive layer 224B, and the conductive layer 152B over the conductive layer 151B.

The conductive layer 224R is connected to a conductive layer 222*b* included in the transistor 205 through an opening provided in an insulating layer 214. An end portion of the conductive layer 151R is positioned outward from an end portion of the conductive layer 224R. The insulating layer 156R is provided to include a region that is in contact with the side surface of the conductive layer 151R, and the conductive layer 152R is provided to cover the conductive layer 151R and the insulating layer 156R.

The conductive layers 224G, 151G, and 152G and the insulating layer 156G in the light-emitting device 130G are not described in detail because they are respectively similar to the conductive layers 224R, 151R, and 152R and the insulating layer 156R in the light-emitting device 130R; the same applies to the conductive layers 224B, 151B, and 152B and the insulating layer 156B in the light-emitting device 130B.

The conductive layers 224R, 224G, and 224B each have a depression portion covering the opening provided in the insulating layer 214. A layer 128 is embedded in the depression portion.

The layer 128 has a function of filling the depression portions of the conductive layers 224R, 224G, and 224B to obtain planarity. Over the conductive layers 224R, 224G, and 224B and the layer 128, the conductive layers 151R, 151G, and 151B that are respectively electrically connected to the conductive layers 224R, 224G, and 224B are provided. Thus, the regions overlapping with the depression portions of the conductive layers 224R, 224G, and 224B can also be used as light-emitting regions, whereby the aperture ratio of the pixel can be increased.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. The layer 128 can be formed using an organic insulating material usable for the insulating layer 127, for example.

The protective layer 131 is provided over the light-emitting devices 130R, 130G, and 130B. The protective layer 131 and the substrate 352 are bonded to each other with an adhesive layer 142. The substrate 352 is provided with a light-block layer 157. A solid sealing structure, a hollow sealing structure, or the like can be employed to seal the light-emitting device 130. In FIG. 14, a solid sealing structure is employed, in which a space between the substrate 352 and the substrate 351 is filled with the adhesive layer 142. Alternatively, the space may be filled with an inert gas (e.g., nitrogen or argon), i.e., a hollow sealing structure may be employed. In that case, the adhesive layer 142 may be provided not to overlap with the light-emitting device. Alternatively, the space may be filled with a resin other than the frame-like adhesive layer 142.

FIG. 14 illustrates an example in which the connection portion 140 includes a conductive layer 224C obtained by processing the same conductive film as the conductive layers 224R, 224G, and 224B; the conductive layer 151C obtained by processing the same conductive film as the conductive layers 151R, 151G, and 151B; and the conductive layer 152C obtained by processing the same conductive film as the conductive layers 152R, 152G, and 152B. In the example illustrated in FIG. 14, the insulating layer 156C is provided to include a region overlapping with the side surface of the conductive layer 151C.

The display apparatus 100B has atop-emission structure. Light from the light-emitting device is emitted toward the substrate 352. For the substrate 352, a material having a high visible-light-transmitting property is preferably used. In the case where the light-emitting device emits infrared or near-infrared light, a material having a high transmitting property with respect to infrared or near-infrared light is preferably used. The pixel electrode contains a material that reflects visible light, and the counter electrode (the common electrode 155) contains a material that transmits visible light.

An insulating layer 211, an insulating layer 213, an insulating layer 215, and the insulating layer 214 are provided in this order over the substrate 351. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or more.

An inorganic insulating film is preferably used as each of the insulating layers 211, 213, and 215.

An organic insulating layer is suitable for the insulating layer 214 functioning as a planarization layer.

Each of the transistors 201 and 205 includes a conductive layer 221 functioning as a gate, the insulating layer 211 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate.

A connection portion 204 is provided in a region of the substrate 351 not overlapping with the substrate 352. In the connection portion 204, the source electrode or the drain electrode of the transistor 201 is electrically connected to the FPC 353 through a conductive layer 166 and a connection layer 242. As an example, the conductive layer 166 has a stacked-layer structure of a conductive film obtained by processing the same conductive film as the conductive layers 224R, 224G, and 224B; a conductive film obtained by processing the same conductive film as the conductive layers 151R, 151G, and 151B; and a conductive film obtained by processing the same conductive film as the conductive layers 152R, 152G, and 152B. On the top surface of the connection portion 204, the conductive layer 166 is exposed. Thus, the connection portion 204 and the FPC 353 can be electrically connected to each other through the connection layer 242.

A light-block layer 157 is preferably provided on the surface of the substrate 352 on the substrate 351 side. The light-block layer 157 can be provided over a region between adjacent light-emitting devices, in the connection portion 140, in the circuit 356, and the like. A variety of optical members can be arranged on the outer surface of the substrate 352.

A material that can be used for the substrate 120 can be used for each of the substrates 351 and 352.

A material that can be used for the resin layer 122 can be used for the adhesive layer 142.

As the connection layer 242, an anisotropic conductive film (ACF), an anisotropic conductive paste (ACP), or the like can be used.

[Display Apparatus 100D]

Figure 15:
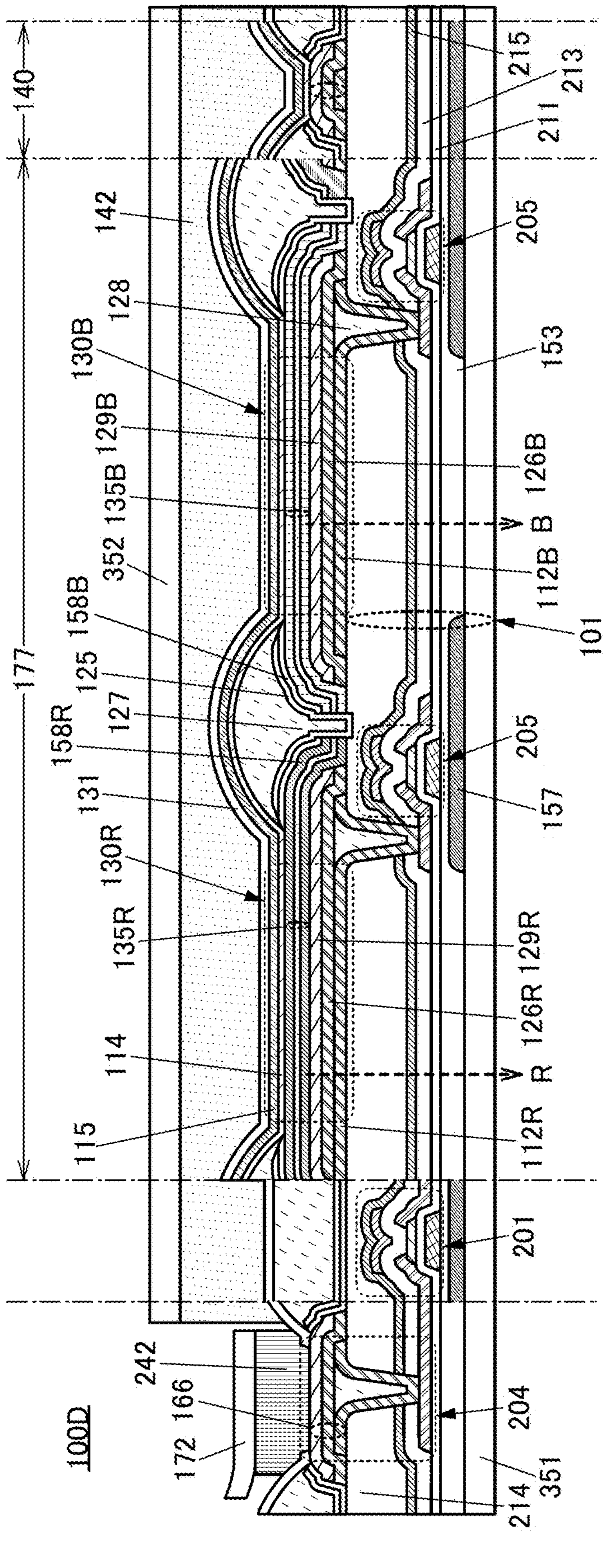
FIG. 15 is a cross-sectional view illustrating a structure example of a display apparatus.

The display apparatus 100D in FIG. 15 differs from the display apparatus 100C in FIG. 14 mainly in having a bottom-emission structure.

Light from the light-emitting device is emitted toward the substrate 351. For the substrate 351, a material having a high visible-light-transmitting property is preferably used. By contrast, there is no limitation on the light-transmitting property of a material used for the substrate 352.

The light-block layer is preferably formed between the substrate 351 and the transistor 201 and between the substrate 351 and the transistor 205. FIG. 15 illustrates an example in which the light-block layer 157 is provided over the substrate 351, an insulating layer 153 is provided over the light-block layer 157, and the transistors 201 and 205 and the like are provided over the insulating layer 153.

The light-emitting device 130R includes a conductive layer 112R, a conductive layer 126R over the conductive layer 112R, and a conductive layer 129R over the conductive layer 126R.

The light-emitting device 130B includes a conductive layer 112B, a conductive layer 126B over the conductive layer 112B, and a conductive layer 129B over the conductive layer 126B.

A material having a high visible-light-transmitting property is used for each of the conductive layers 112R, 112B, 126R, 126B, 129R, and 129B. A material that reflects visible light is preferably used for the common electrode 155.

Although not illustrated in FIG. 15, the light-emitting device 130G is also provided.

Although FIG. 15 and the like illustrate an example in which the top surface of the layer 128 includes a flat portion, the shape of the layer 128 is not particularly limited.

[Display Apparatus 100E]

Figure 16:
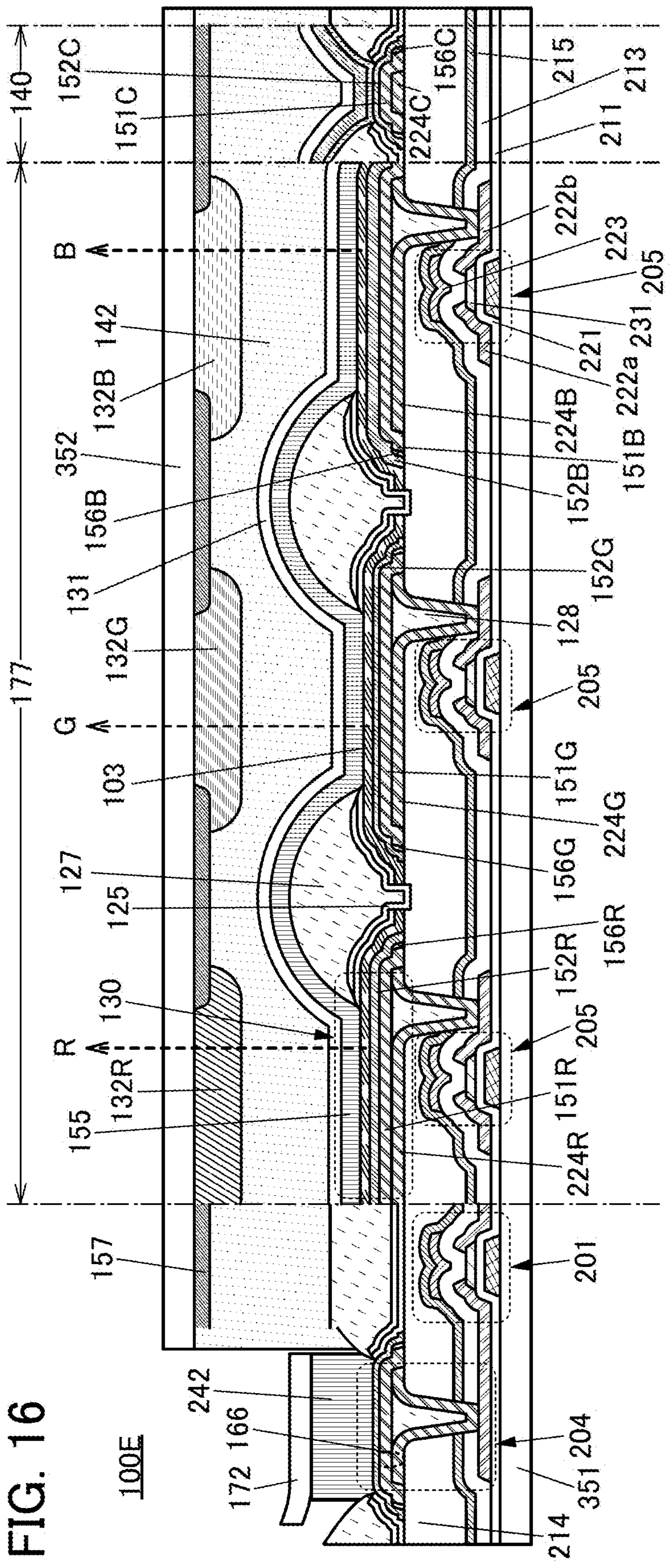
FIG. 16 is a cross-sectional view illustrating a structure example of a display apparatus.

The display apparatus 100E illustrated in FIG. 16 is a variation example of the display apparatus 100C illustrated in FIG. 14 and differs from the display apparatus 100C mainly in including the coloring layers 132R, 132G, and 132B.

In the display apparatus 100E, the light-emitting device 130 includes a region overlapping with one of the coloring layers 132R, 132G, and 132B. The coloring layers 132R, 132G, and 132B can be provided on a surface of the substrate 352 on the substrate 351 side. End portions of the coloring layers 132R, 132G, and 132B can overlap with the light-block layer 157.

In the display apparatus 100E, the light-emitting device 130 can emit white light, for example. The coloring layer 132R, the coloring layer 132G, and the coloring layer 132B can transmit red light, green light, and blue light, respectively, for example. Note that in the display apparatus 100E, the coloring layers 132R, 132G, and 132B may be provided between the protective layer 131 and the adhesive layer 142.

Although FIGS. 14 to 16 illustrate an example in which the top surface of the layer 128 includes a flat portion, the shape of the layer 128 is not particularly limited.

This embodiment can be combined as appropriate with the other embodiments or the examples. In this specification, in the case where a plurality of structure examples are shown in one embodiment, the structure examples can be combined as appropriate.

Embodiment 5

In this embodiment, electronic devices of embodiments of the present invention will be described.

Electronic devices of this embodiment include the display apparatus of one embodiment of the present invention in their display portions. The display apparatus of one embodiment of the present invention has high display performance and can be easily increased in resolution and definition. Thus, the display apparatus of one embodiment of the present invention can be used for display portions of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and notebook personal computers, a monitor of a computer and the like, digital signage, and a large game machine such as a pachinko machine.

In particular, the display apparatus of one embodiment of the present invention can have high resolution, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

Examples of head-mounted wearable devices are described with reference to FIGS. 17A to 17D.

Figure 17A:
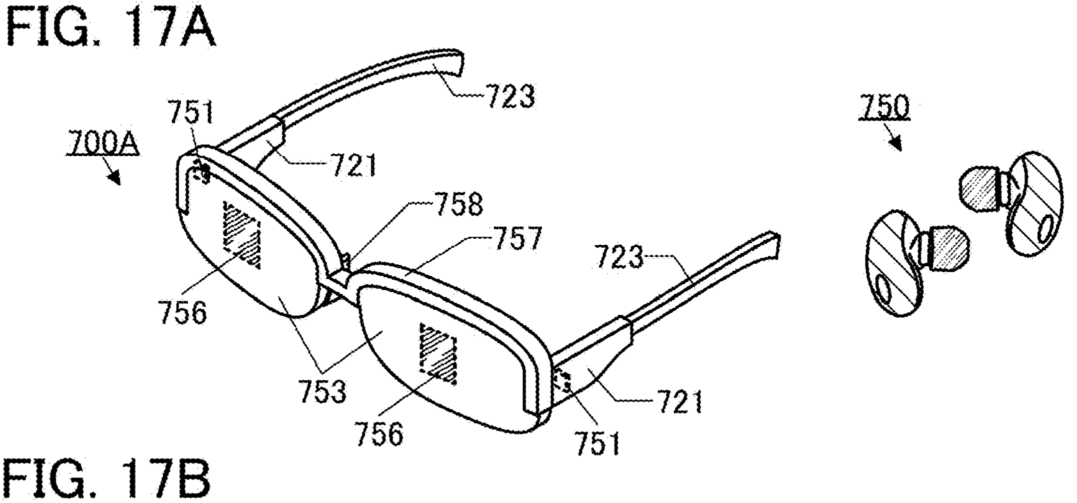
FIGS. 17A to 17D each illustrate an example of an electronic device.
Figure 17B:
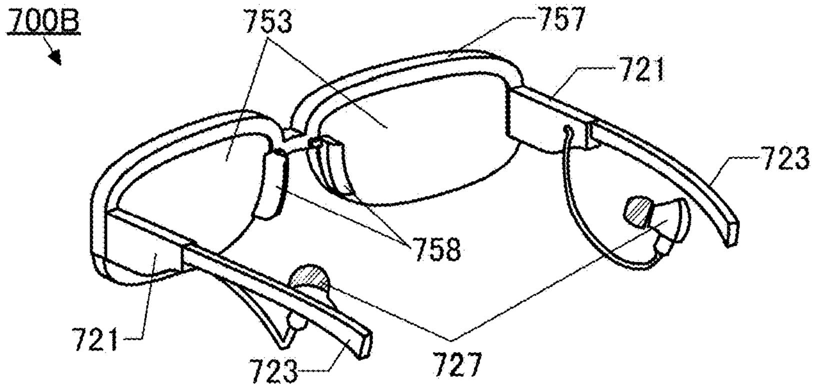

An electronic device 700A illustrated in FIG. 17A and an electronic device 700B illustrated in FIG. 17B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be used for the display panels 751. Thus, the electronic devices can be highly reliable.

The electronic devices 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal, for example, can be supplied by the wireless communication device. Instead of or in addition to the wireless communication device, a connector that can be connected to a cable for supplying a video signal and a power supply potential may be provided.

The electronic devices 700A and 700B are provided with a battery, so that they can be charged wirelessly and/or by wire.

A touch sensor module may be provided in the housing 721.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

Figure 17C:
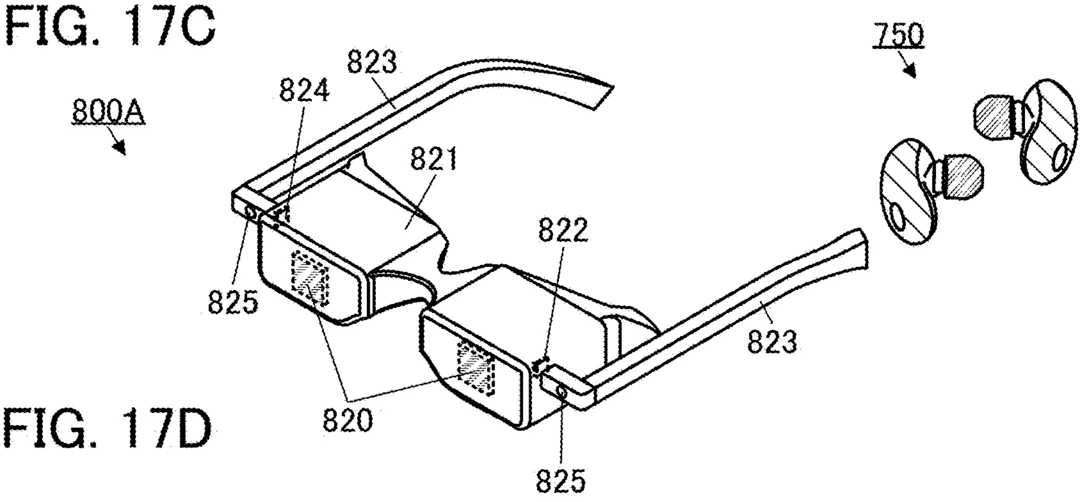
Figure 17D:
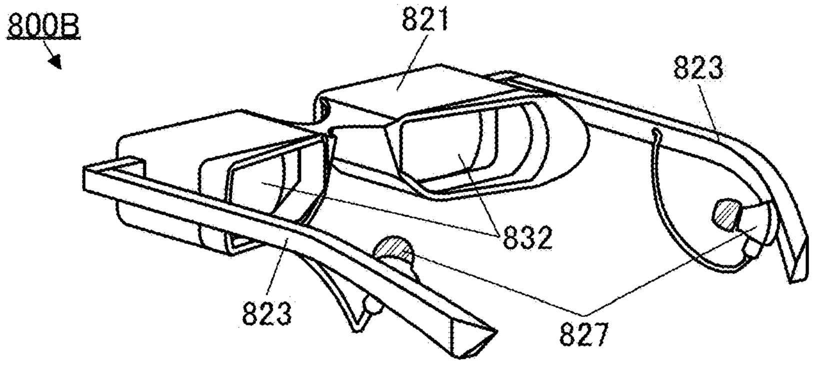

An electronic device 800A illustrated in FIG. 17C and an electronic device 800B illustrated in FIG. 17D each include a pair of display portions 820, a housing 821, a communication portion 822, a pair of wearing portions 823, a control portion 824, a pair of image capturing portions 825, and a pair of lenses 832.

The display apparatus of one embodiment of the present invention can be used in the display portions 820. Thus, the electronic devices can be highly reliable.

The display portions 820 are positioned inside the housing 821 so as to be seen through the lenses 832. When the pair of display portions 820 display different images, three-dimensional display using parallax can be performed.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes.

The electronic device 800A or the electronic device 800B can be mounted on the user's head with the wearing portions 823.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to cover a plurality of fields of view, such as a telescope field of view and a wide field of view.

The electronic device 800A may include a vibration mechanism that functions as bone-conduction earphones.

The electronic devices 800A and 800B may each include an input terminal. To the input terminal, a cable for supplying a video signal from a video output device or the like, power for charging a battery provided in the electronic apparatus, and the like can be connected.

The electronic device of one embodiment of the present invention may have a function of performing wireless communication with earphones 750.

The electronic device may include an earphone portion. The electronic device 700B in FIG. 17B includes earphone portions 727. Part of a wiring that connects the earphone portion 727 and the control portion may be positioned inside the housing 721 or the mounting portion 723.

Similarly, the electronic device 800B in FIG. 17D includes earphone portions 827. For example, the earphone portion 827 can be connected to the control portion 824 by wire.

As described above, both the glasses-type device (e.g., the electronic devices 700A and 700B) and the goggles-type device (e.g., the electronic devices 800A and 800B) are preferable as the electronic device of one embodiment of the present invention.

Figure 18A:
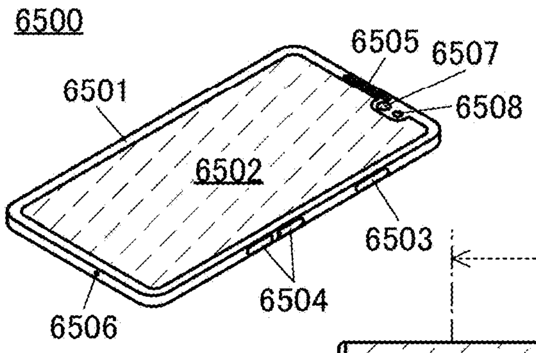
FIGS. 18A to 18F each illustrate an example of an electronic device.

An electronic device 6500 illustrated in FIG. 18A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502. Thus, the electronic device can be highly reliable.

Figure 18B:
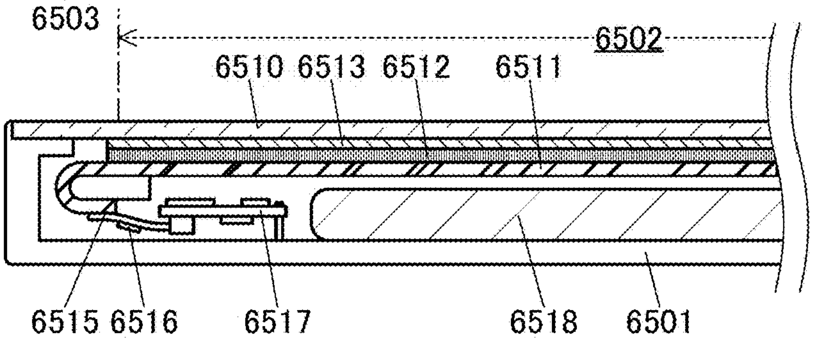

FIG. 18B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

The display apparatus of one embodiment of the present invention can be used in the display panel 6511. Thus, the electronic device can be extremely lightweight. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby the electronic device can have a narrow bezel.

Figure 18C:
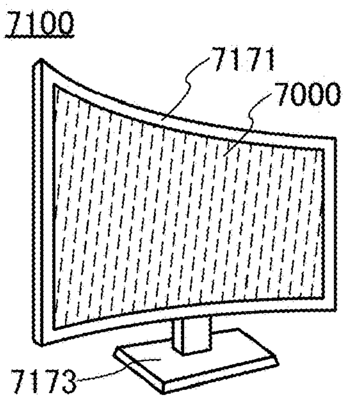

FIG. 18C illustrates an example of a television device. In a television device 7100, a display portion 7000 is incorporated in a housing 7171. Here, the housing 7171 is supported by a stand 7173.

The display apparatus of one embodiment of the present invention can be used in the display portion 7000. Thus, a highly reliable electronic device is obtained.

Operation of the television device 7100 illustrated in FIG. 18C can be performed with an operation switch provided in the housing 7171 and a separate remote controller 7151.

Figure 18D:
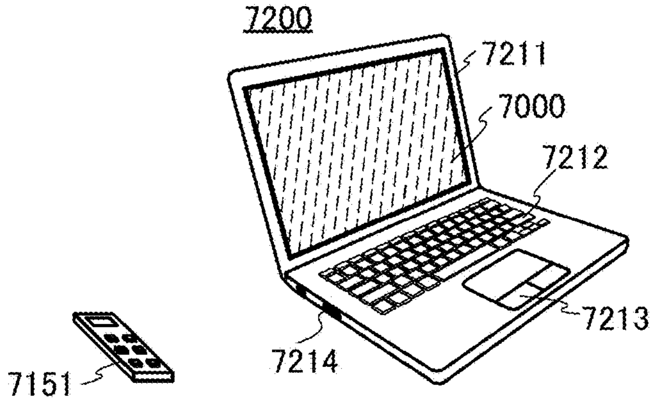

FIG. 18D illustrates an example of a notebook personal computer. A notebook personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000. Thus, a highly reliable electronic device is obtained.

Figure 18E:
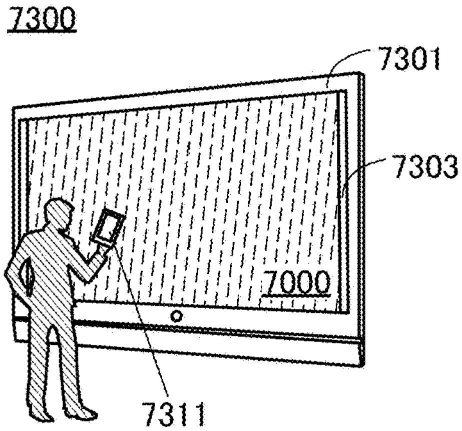
Figure 18F:
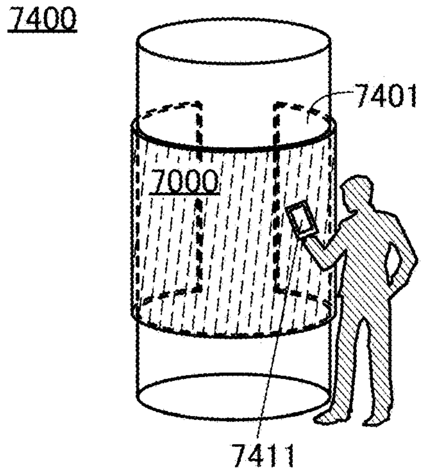

FIGS. 18E and 18F illustrate examples of digital signage.

Digital signage 7300 illustrated in FIG. 18E includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

FIG. 18F shows digital signage 7400 attached to a cylindrical pillar 7401. The digital signage 7400 includes the display portion 7000 provided along a curved surface of the pillar 7401.

In FIGS. 18E and 18F, the display apparatus of one embodiment of the present invention can be used in the display portion 7000. Thus, the electronic apparatuses can be highly reliable.

A larger area of the display portion 7000 can increase the amount of information that can be provided at a time. The display portion 7000 having a larger area attracts more attention, so that the effectiveness of the advertisement can be increased, for example.

As illustrated in FIGS. 18E and 18F, it is preferable that the digital signage 7300 or the digital signage 7400 can work with an information terminal 7311 or an information terminal 7411, such as a smartphone that a user has, through wireless communication.

Electronic devices illustrated in FIGS. 19A to 19G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like.

The electronic devices illustrated in FIGS. 19A to 19G have a variety of functions. For example, the electronic devices can have a function of displaying a variety of information (e.g., a still image, a moving image, and a text image) on the display portion, a touch panel function, a function of displaying a calendar, date, time, and the like, a function of controlling processing with the use of a variety of software (programs), a wireless communication function, and a function of reading out and processing a program or data stored in a recording medium.

The electronic devices in FIGS. 19A to 19G are described in detail below.

Figure 19A:
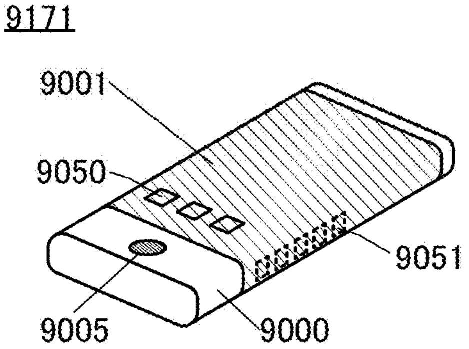
FIGS. 19A to 19G each illustrate an example of an electronic device.

FIG. 19A is a perspective view of a portable information terminal 9171. The portable information terminal 9171 can be used as a smartphone, for example. The portable information terminal 9171 may include the speaker 9003, the connection terminal 9006, the sensor 9007, or the like. The portable information terminal 9171 can display text and image information on its plurality of surfaces. FIG. 19A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050 or the like may be displayed at the position where the information 9051 is displayed.

Figure 19B:
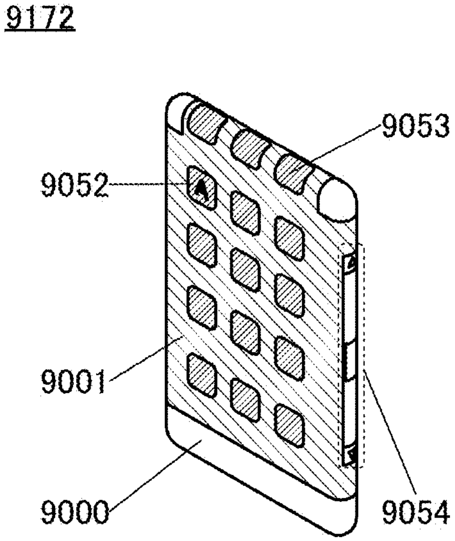

FIG. 19B is a perspective view of a portable information terminal 9172. The portable information terminal 9172 has a function of displaying information on three or more surfaces of the display portion 9001. Here, information 9052, information 9053, and information 9054 are displayed on the respective surfaces. For example, the user of the portable information terminal 9172 can check the information 9053 displayed such that it can be seen from above the portable information terminal 9172, with the portable information terminal 9172 put in a breast pocket of his/her clothes.

Figure 19C:
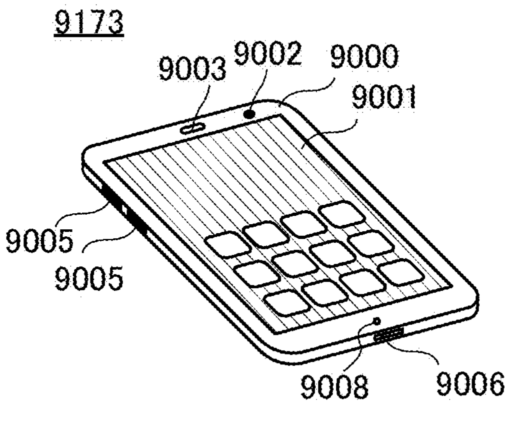

FIG. 19C is a perspective view of a tablet terminal 9173. The tablet terminal 9173 is capable of executing a variety of applications such as mobile phone calls, e-mailing, viewing and editing texts, music reproduction, Internet communication, and a computer game, for example. The tablet terminal 9173 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 19D:
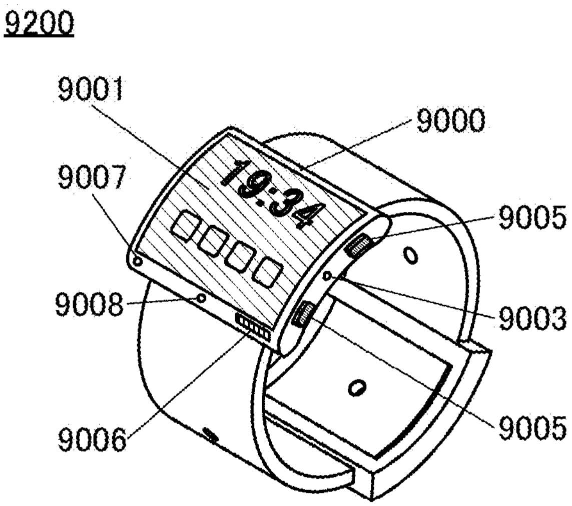

FIG. 19D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 19E:
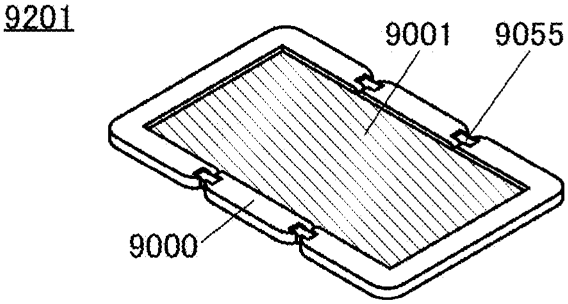
Figure 19F:
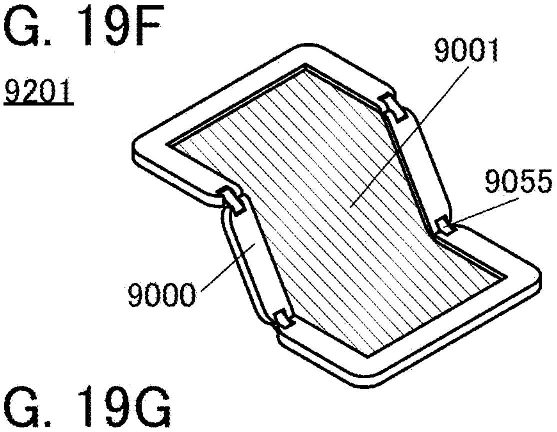
Figure 19G:
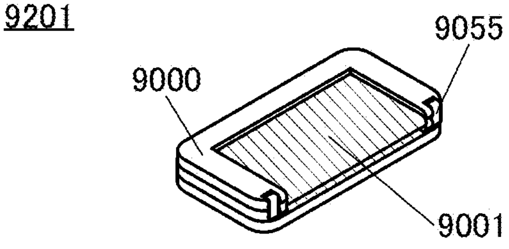

FIGS. 19E to 19G are perspective views of a foldable portable information terminal 9201. FIG. 19E is a perspective view showing the portable information terminal 9201 that is opened. FIG. 19G is a perspective view showing the portable information terminal 9201 that is folded. FIG. 19F is a perspective view showing the portable information terminal 9201 that is shifted from one of the states in FIGS. 19E and 19G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined as appropriate with the other embodiments or the examples. In this specification, in the case where a plurality of structure examples are shown in one embodiment, the structure examples can be combined as appropriate.

Example 1

Described in this example are specific methods for fabricating light-emitting devices 1 to 3 of embodiments of the present invention and comparative light-emitting devices 1 and 2, and characteristics of the light-emitting devices. Structural formulae of main compounds used in this example are shown below.

[Chemical Formula 9]

(i)

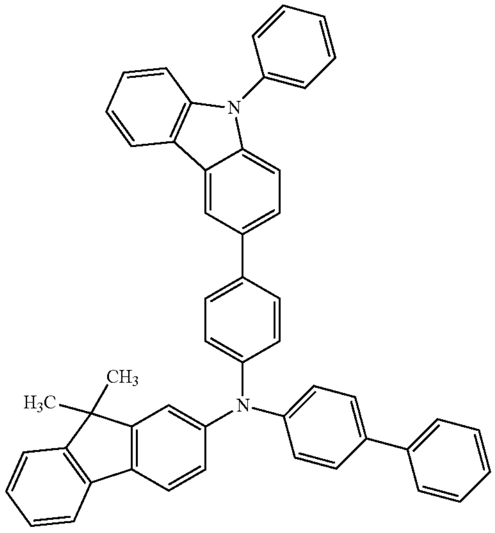

PCBBiF

-continued
(ii)
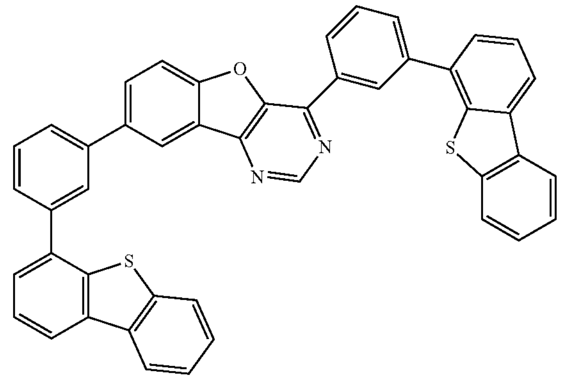
4,8mDBtP2Bfpm
(iii)
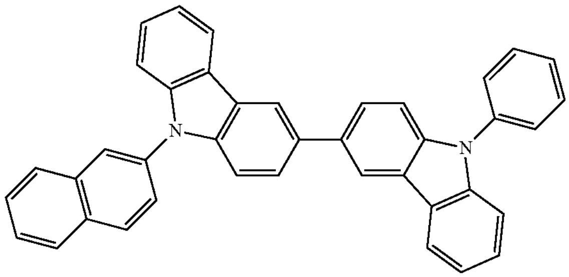
β NCCP
(iv)
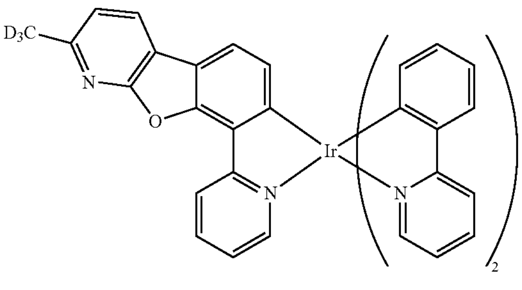
Ir(ppy)2(mbfpypy-d3)
-continued
(v)
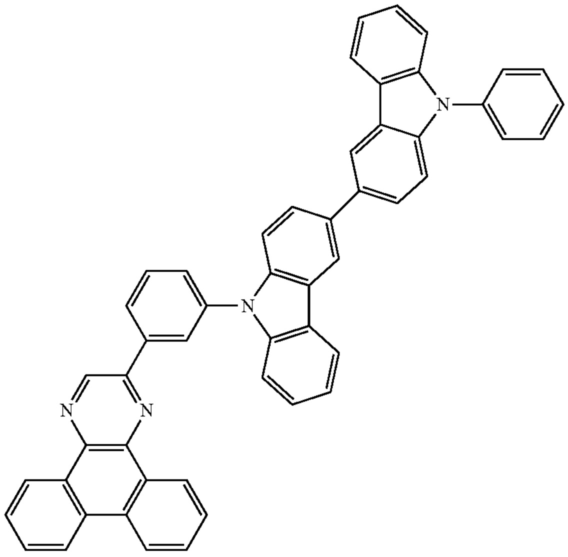
2mPCCzPDBq
(vi)
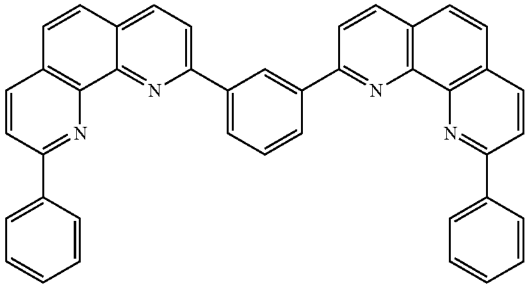
mPPhen2P
(vii)
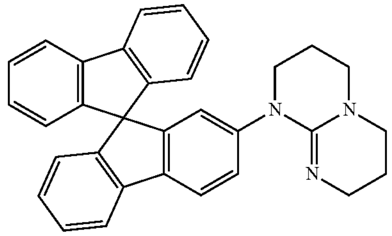
2hppSF -continued (viii)

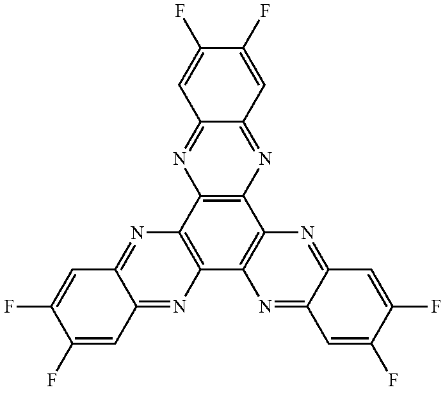

HATNA-F6

(ix)

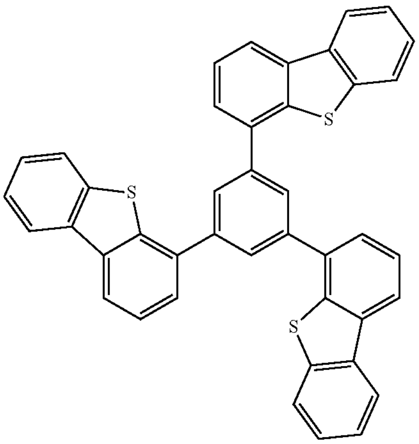

DBT3P-II

[Chemical Formula 10]

(x)

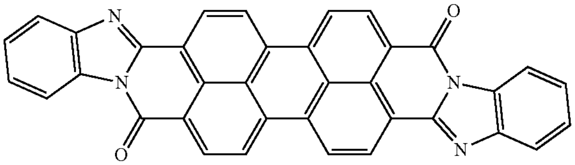

PTCBI (xi)

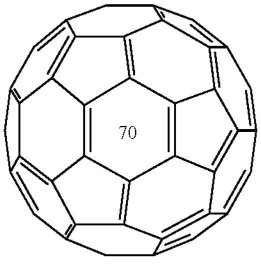

C70

(Method for Fabricating Light-Emitting Device 1)

First, 100-nm-thick silver (Ag) and 10 nm-thick indium tin oxide containing silicon oxide (ITSO) were stacked sequentially from the substrate side by a sputtering method as a reflective electrode and a transparent electrode, respectively, over a glass substrate, whereby the first electrode 101 with a size of 2 mm×2 mm was formed. Note that the transparent electrode functions as an anode, and the transparent electrode and the reflective electrode are collectively regarded as the first electrode 101.

Next, in pretreatment for forming the light-emitting device over a substrate, the surface of the substrate was washed with water, baking was performed at 200° C. for one hour, and then UV ozone treatment was performed for 370 seconds.

After that, the substrate was transferred into a vacuum evaporation apparatus where the pressure was reduced to approximately $1\times10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus such that the surface on which the first electrode 101 was formed faced downward. Over the first electrode 101, N-(biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (i) above and a fluorine-containing material having an electron-acceptor property and a molecular weight of 672 (OCHD-003) were deposited by co-evaporation to a thickness of 10 nm such that the weight ratio of PCBBiF to OCHD-003 was 1:0.03, whereby the hole-injection layer 111 was formed.

Over the hole-injection layer 111, PCBBiF was deposited by evaporation to a thickness of 20 nm, whereby a first hole-transport layer was formed.

Then, over the first hole-transport layer, 4,8-bis[3-(dibenzothiophen-4-yl)phenyl]-[1]benzofuro[3,2-d]pyrimidine (abbreviation: 4,8mDBtP2Bfpm) represented by Structural Formula (ii) above, 9-(2-naphthyl)-9'-phenyl-9H,9'H-3,3'-bicarbazole (abbreviation: βNCCP) represented by Structural Formula (iii) above, and [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2(mbfpypy-d_3)$) represented by Structural Formula (iv) above were deposited by co-evaporation to a thickness of 40 nm such that the weight ratio of 4,8mDBtP2Bfpm to βNCCP and $Ir(ppy)_2(mbfpypy-d_3)$ was 0.5:0.5:0.1, whereby a first light-emitting layer was formed.

Next, 2-{3-[3-(N-phenyl-9H-carbazol-3-yl)-9H-carbazol-9-yl]phenyl}dibenzo[f,h]quinoxaline (abbreviation: 2mPCCzPDBq) represented by Structural Formula (v) above was deposited by evaporation to a thickness of 20 nm to form a first electron-transport layer.

After the first electron-transport layer was formed, 2,2'-(1,3-phenylene)bis(9-phenyl-1,10-phenanthroline) (abbreviation: mPPhen2P) represented by Structural Formula (vi) above and 1-(9,9'-spirobi[9H-fluoren]-2-yl)-1,3,4,6,7,8-hexahydro-2H-pyrimido[1,2-a]pyrimidine (abbreviation: 2hppSF) represented by Structural Formula (vii) above were deposited by co-evaporation to a thickness of 10 nm such that the weight ratio of mPPhen2P to 2hppSF was 1:1 to form a first layer, 2,3,8,9,14,15-hexafluorodiquinoxalino[2,3-a:2',3'-c]phenazine (abbreviation: HATNA-F6) represented by Structural Formula (viii) above was deposited by evaporation to a thickness of 5 nm to form a second layer, and PCBBiF and OCHD-003 were deposited by co-evaporation to a thickness of 10 nm such that the weight ratio of PCBBiF to OCHD-003 was 1:0.15 to form a third layer. Thus, an intermediate layer was formed.

Over the intermediate layer, PCBBiF was deposited by evaporation to a thickness of 40 nm, whereby a second hole-transport layer was formed.

Over the second hole-transport layer, 4,8mDBtP2Bfpm, βNCCP, and $Ir(ppy)_2(mbfpypy\text{-}d_3)$ were deposited by co-evaporation to a thickness of 40 nm such that the weight ratio of 4,8mDBtP2Bfpm to βNCCP and $Ir(ppy)_2(mbfpypy\text{-}d_3)$ was 0.5:0.5:0.1, whereby a second light-emitting layer was formed.

Then, 2mPCCzPDBq was deposited by evaporation to a thickness of 20 nm, and mPPhen2P was further deposited by evaporation to a thickness of 20 nm, whereby a second electron-transport layer was formed.

Then, lithium fluoride (LiF) was deposited by evaporation to a thickness of 2 nm under a vacuum (approximately $1\times10^{-4}$ Pa), and then silver (Ag) and magnesium (Mg) were deposited by co-evaporation to a thickness of 15 nm such that the volume ratio of Ag to Mg was 1:0.1, whereby the second electrode 102 was formed. In this manner, the light-emitting device of one embodiment of the present invention was fabricated. Over the second electrode 102, 4,4',4"-(benzene-1,3,5-triyl)tri(dibenzothiophene) (abbreviation: DBT3P-II) represented by Structural Formula (ix) above was deposited to a thickness of 70 nm as a cap layer to improve light extraction efficiency.

Then, the light-emitting device was sealed using a glass substrate in a glove box containing a nitrogen atmosphere so as not to be exposed to the atmosphere. Specifically, a UV curable sealing material was applied to surround the device, only the sealing material was irradiated with UV while the light-emitting device was not irradiated with the UV, and heat treatment was performed at 80° C. under an atmospheric pressure for one hour. In this manner, the light-emitting device 1 was fabricated.

(Method for Fabricating Light-Emitting Device 2)

The light-emitting device 2 was fabricated in a manner similar to that of the light-emitting device 1 except that HATNA-F6 in the light-emitting device 1 was replaced by 3,4,9,10-perylenetetracarboxyl-bis-benzimidazole (abbreviation: PTCBI) represented by Structural Formula (x) above.

(Method for Fabricating Light-Emitting Device 3) The light-emitting device 3 was fabricated in a manner similar to that of the light-emitting device 1 except that HATNA-F6 in the light-emitting device 1 was replaced by (C70-D5h)[5,6] fullerene (abbreviation: C70) represented by Structural Formula (xi) above.

(Method for Fabricating Comparative Light-Emitting Device 1)

The comparative light-emitting device 1 was fabricated in a manner similar to that of the light-emitting device 1 except that the layer of HATNA-F6 in the intermediate layer of the light-emitting device 1 was not formed.

(Method for Fabricating Comparative Light-Emitting Device 2)

The comparative light-emitting device 2 was fabricated in a manner similar to that of the light-emitting device 1 except that HATNA-F6 in the light-emitting device 1 was replaced by mPPhen2P.

Device structures of the light-emitting devices 1 to 3 and the comparative light-emitting devices 1 and 2 and the LUMO levels of the organic compounds used in the second layers of the intermediate layers in the light-emitting devices are shown below.

Note that the HOMO level and the LUMO level were obtained through cyclic voltammetry (CV) measurement.

In the cyclic voltammetry (CV) measurement, the values (E) of HOMO and LUMO levels were calculated on the basis of an oxidation peak potential ($E_{pa}$) and a reduction peak potential ($E_{pc}$), which were obtained by changing the potential of a working electrode with respect to a reference electrode. In the measurement, the HOMO level and the LUMO level were obtained by potential scanning in positive direction and potential scanning in negative direction, respectively. The scanning speed in the measurement was 0.1 V/s.

Specifically, a standard oxidation-reduction potential ($E_o$) ($=E_{pa}+E_{pc})/2$) was calculated from an oxidation peak potential ($E_{pa}$) and a reduction peak potential ($E_{pc}$), which were obtained by the cyclic voltammogram of a material. Then, the standard oxidation-reduction potential ($E_o$) was subtracted from the potential energy ($E_x$) of the reference electrode with respect to a vacuum level, whereby each of the values (E) ($=E_x-E_o$) of HOMO and LUMO levels were obtained.

Note that the reversible oxidation-reduction wave was obtained in the above case; in the case where an irreversible oxidation-reduction wave is obtained, the HOMO level is calculated as follows: a value obtained by subtracting a predetermined value (0.1 eV) from an oxidation peak potential ($E_{pa}$) is assumed to be a reduction peak potential ($E_{pc}$), and a standard oxidation-reduction potential ($E_o$) is calculated to one decimal place. To calculate the LUMO level, a value obtained by adding a predetermined value (0.1 eV) to a reduction peak potential ($E_{pc}$) was assumed to be an oxidation peak potential ($E_{pa}$), and a standard oxidation-reduction potential ($E_o$) was calculated to one decimal place.

TABLE 2

| | | Film thickness (nm) | Light-emitting device 1 | 2 | 3 | Comparative light-emitting device 1 | 2 |
|---|---|---|---|---|---|---|---|
| Cap layer | | 70 | DBT3P-II | | | | |
| Second electrode | | 15 | Ag:Mg (1:0.1) | | | | |
| | | 2 | LiF | | | | |
| Second electron-transport layer | 2 | 20 | mPPhen2P | | | | |
| | 1 | 20 | 2mPCCzPDBq | | | | |
| Second light-emitting layer | | 40 | 4,8mDBtP2Bfpm:βNCCP:$Ir(ppy)_2(mbfpypy\text{-}d_3)$ (0.5:0.5:0.1) | | | | |
| Second hole-transport layer | | 40 | PCBBiF | | | | |
| Intermediate layer | Third layer | 10 | PCBBiF:OCHD-003 (1:0.15) | | | | |
| | Second layer | 5 | *1 | | | | |
| | First layer | 10 | mPPhen2P:2hppSF (1:1) | | | | |
| First electron-transport layer | | 20 | 2mPCCzPDBq | | | | |
| First light-emitting layer | | 40 | 4,8mDBtP2Bfpm:βNCCP:$Ir(ppy)_2(mbfpypy\text{-}d_3)$ (0.5:0.5:0.1) | | | | |
| First hole-transport layer | | 20 | PCBBiF | | | | |
| Hole-injection layer | | 10 | PCBBiF:OCHD-003 (1:0.03) | | | | |
| First electrode | Transparent electrode | 10 | ITSO | | | | |
| | Reflective electrode | 100 | Ag | | | | |

TABLE 3

| | *1 | LUMO level (eV) |
|---|---|---|
| Light-emitting device 1 | HATNA-F6 | −3.49 |
| Light-emitting device 2 | PTCBI | −4.02 |
| Light-emitting device 3 | C70 | −4.23 |

TABLE 3-continued

| | *1 | LUMO level (eV) |
|---|---|---|
| Comparative light-emitting device 1 | — | — |
| Comparative light-emitting device 2 | mPPhen2P | −2.71 |

The layer of mPPhen2P:2hppSF=1:1 formed as the first layer in each of the light-emitting devices 1 to 3 and the comparative light-emitting devices 1 and 2 is a film blocking holes as described in Embodiment 1 with reference to FIG. 20. Furthermore, 2hppSF has an acid dissociation constant $pK_a$ of 13.95 and is an organic compound having strong basicity with a $pK_a$ of 8 or more.

Here, an electron spin resonance spectrum of a thin film of mPPhen2P and 2hppSF that was deposited by co-evaporation to a thickness of 50 nm over a quartz substrate such that the weight ratio of mPPhen2P to 2hppSF was 1:1 was measured at room temperature, revealing that no signal was observed at g-factors of approximately 2.00 and the spin density was lower than $8\times10^{16}$ spins/cm$^3$, which is the detection limit. Note that the measurement of electron spin resonance spectrum using ESR spectroscopy was performed with an electron spin resonance spectrometer E500 (manufactured by Bruker Corporation). The measurement was performed at room temperature under the conditions where the resonance frequency was 9.56 GHz, the output power was 1 mW, the modulated magnetic field was 50 mT, the modulation width was 0.5 mT, the time constant was 0.04 s, and the sweep time was 1 min. This means that 2hppSF does not exhibit an electron-donating property with respect to mPPhen2P. In other words, the first layer in the intermediate layer in each of the light-emitting devices 1 to 3 and the comparative light-emitting devices 1 and 2 is a layer that has a spin density lower than or equal to $1\times10^{17}$ spins/cm$^3$ and does not generate carriers.

The third layer is a layer including PCBBiF, which is an organic compound having a hole-transport property, and OCHD-003 exhibiting an electron-acceptor property and is a carrier-generation layer in which charge separation occurs by voltage application.

Here, an electron spin resonance spectrum of a thin film of PCBBiF and OCHD-003 that was deposited by co-evaporation to a thickness of 100 nm over a quartz substrate such that the weight ratio of PCBBiF to OCHD-003 was 1:0.1 was measured at room temperature, revealing that a signal was observed at a g-factor of approximately 2.00 and the spin density was $5\times10^{19}$ spins/cm$^3$. Note that the measurement of electron spin resonance spectrum using ESR spectroscopy was performed with an electron spin resonance spectrometer E500 (manufactured by Bruker Corporation). The measurement was performed at room temperature under the conditions where the resonance frequency was 9.56 GHz, the output power was 1 mW, the modulated magnetic field was 50 mT, the modulation width was 0.5 mT, the time constant was 0.04 s, and the sweep time was 1 min. This means that OCHD-003 exhibits an electron-accepting property with respect to PCBBiF and the layer including PCBBiF and OCHD-003 functions as a carrier-generation layer.

The light-emitting devices have different structures of the second layers from each other. The materials used for the second layers in the light-emitting devices 1 to 3 have LUMO levels greater than or equal to −4.30 eV and less than or equal to −3.00 eV, and the material used for the comparative light-emitting device 2 has a LUMO level of −2.71 eV. The second layer was not formed in the comparative light-emitting element 1.

Figure 21:
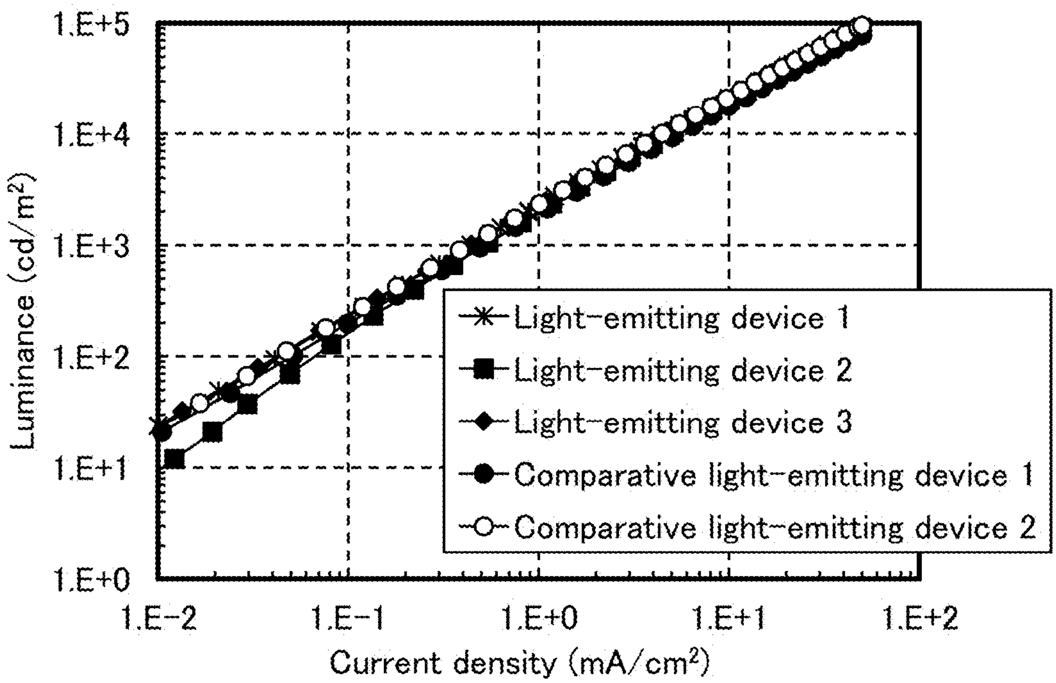
FIG. 21 shows luminance-current density characteristics of a light-emitting device 1 to a light-emitting device 3 and a comparative light-emitting device 1 and a comparative light-emitting device 2.
Figure 22:
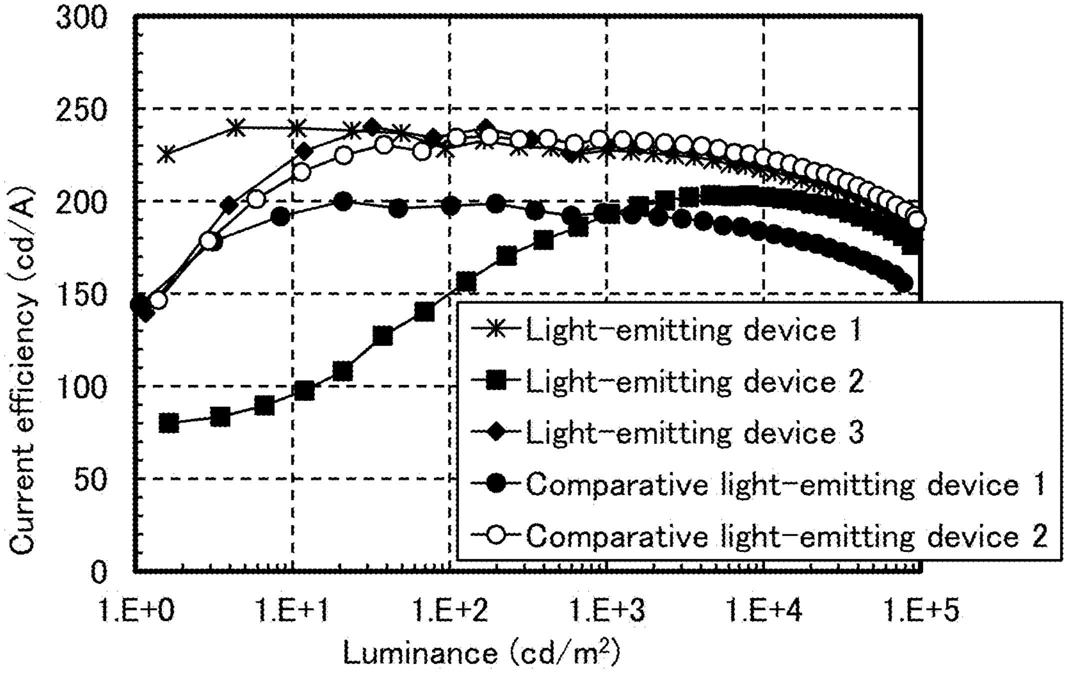
FIG. 22 shows current efficiency-luminance characteristics of the light-emitting device 1 to the light-emitting device 3 and the comparative light-emitting device 1 and the comparative light-emitting device 2.
Figure 23:
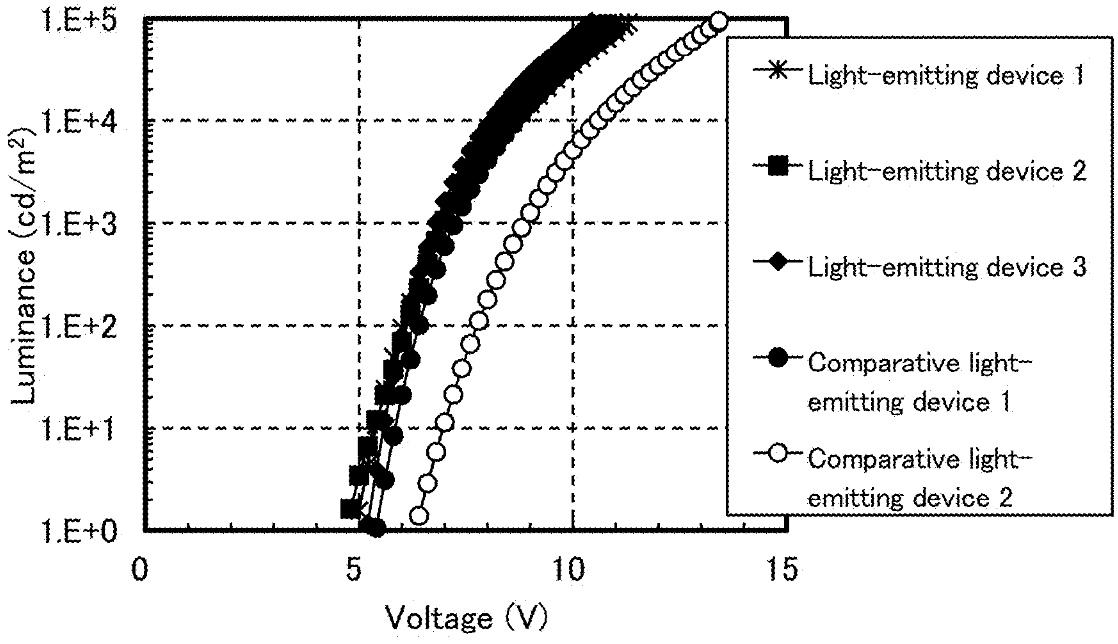
FIG. 23 shows luminance-voltage characteristics of the light-emitting device 1 to the light-emitting device 3 and the comparative light-emitting device 1 and the comparative light-emitting device 2.
Figure 24:
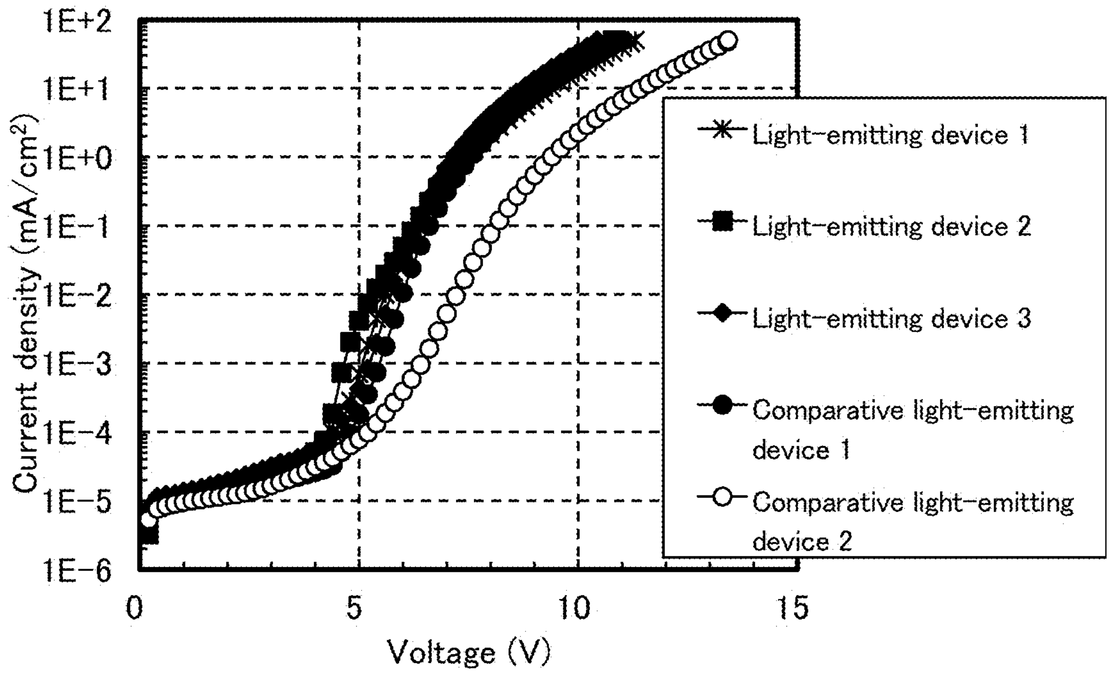
FIG. 24 shows current density—voltage characteristics of the light-emitting device 1 to the light-emitting device 3 and the comparative light-emitting device 1 and the comparative light-emitting device 2.
Figure 25:
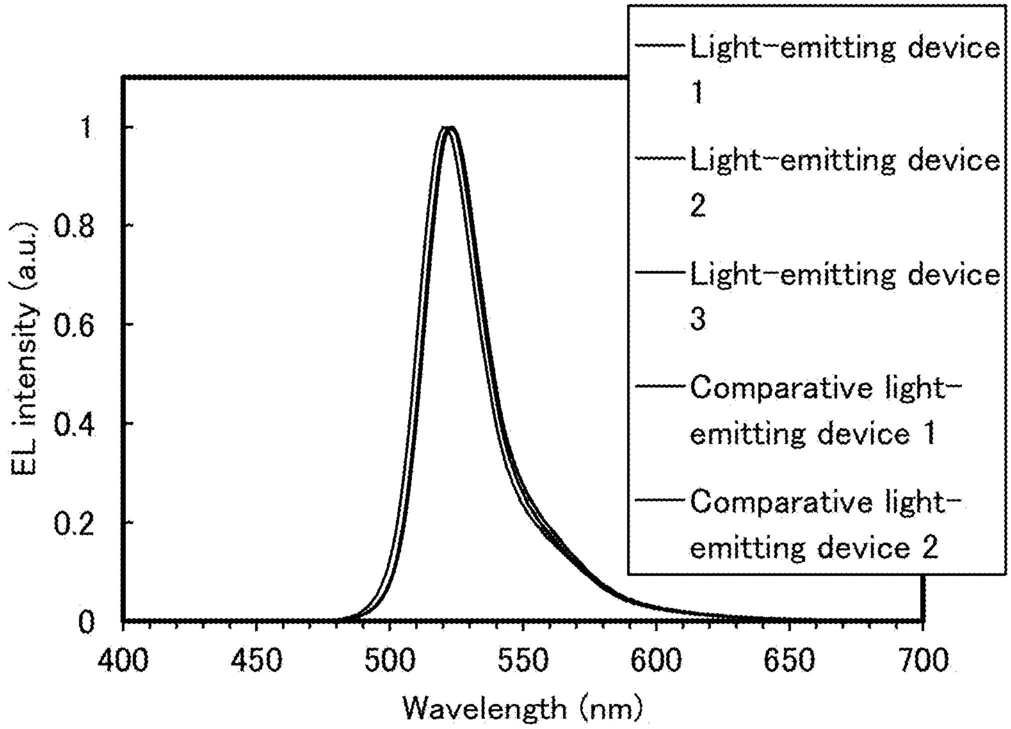
FIG. 25 shows emission spectra of the light-emitting device 1 to the light-emitting device 3 and the comparative light-emitting device 1 and the comparative light-emitting device 2.

FIG. 21 shows luminance-current density characteristics of the light-emitting devices 1 to 3 and the comparative light-emitting devices 1 and 2. FIG. 22 shows current efficiency-luminance characteristics thereof. FIG. 23 shows luminance-voltage characteristics thereof. FIG. 24 shows current density—voltage characteristics thereof. FIG. 25 shows emission spectra thereof. Table 4 shows main characteristics of the light-emitting devices at approximately 1000 cd/m$^2$. The luminance, CIE chromaticity, and emission spectra were measured at normal temperature with a spectroradiometer (SR-UL1R manufactured by TOPCON TECHNOHOUSE CORPORATION).

TABLE 4

| | Voltage (V) | Current (mA) | Current density (mA/cm$^2$) | Chromaticity x | Chromaticity y | Current efficiency (cd/A) |
|---|---|---|---|---|---|---|
| Light-emitting device 1 | 7.0 | 0.02 | 0.4 | 0.22 | 0.73 | 227.5 |
| Light-emitting device 2 | 7.0 | 0.02 | 0.5 | 0.21 | 0.73 | 193.1 |
| Light-emitting device 3 | 6.8 | 0.02 | 0.4 | 0.22 | 0.72 | 229.7 |
| Comparative light-emitting device 1 | 7.2 | 0.02 | 0.5 | 0.21 | 0.72 | 193.7 |
| Comparative light-emitting device 2 | 8.8 | 0.02 | 0.4 | 0.22 | 0.72 | 233.4 |

FIG. 25 (spectra) shows that the light-emitting devices 1 to 3 and the comparative light-emitting devices 1 and 2 each exhibit green light emission derived from $Ir(ppy)_2(mbfpypy-d_3)$. Furthermore, FIG. 22 (current efficiency) indicates that the light-emitting devices 1 to 3 and the comparative light-emitting devices 1 and 2 each exhibit favorable efficiency in a practical luminance region and function as a tandem light-emitting device.

In contrast, FIG. 23 (luminance-voltage characteristics) and FIG. 24 (current density—voltage characteristics) show that the comparative light-emitting device 2, which uses mPPhen2P having a LUMO level of −2.71 eV in the second layer, had a significantly increased drive voltage.

Figure 26:
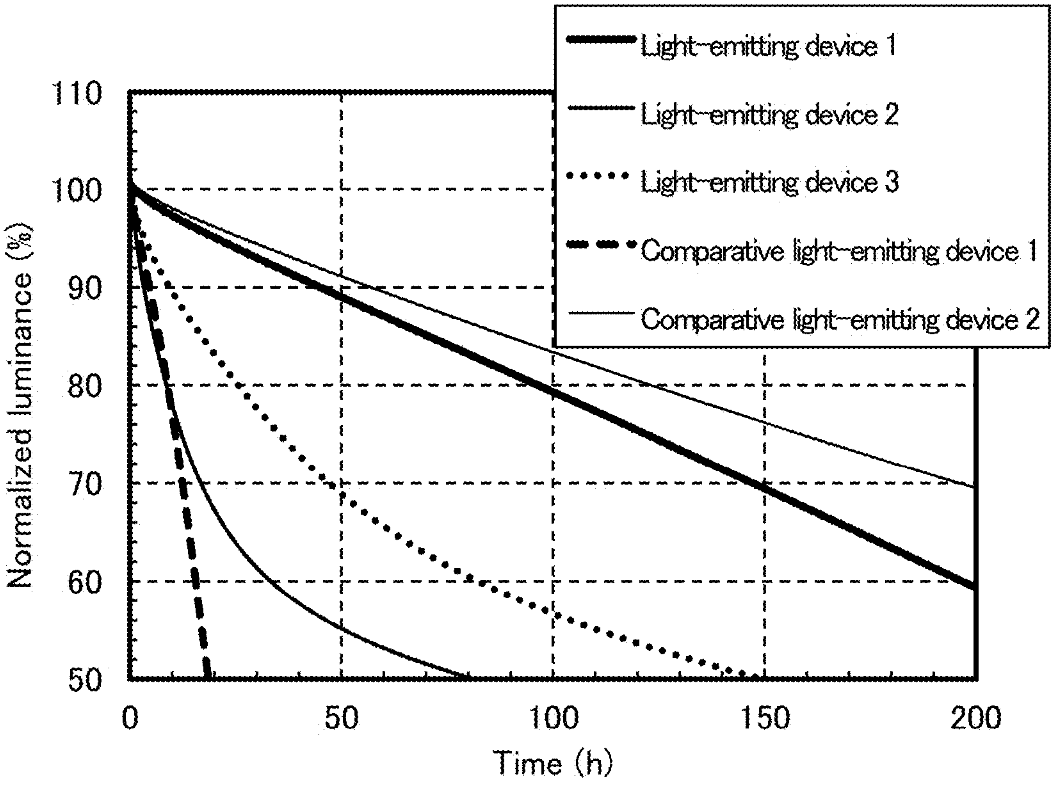
FIG. 26 shows the time dependence of normalized luminance of the light-emitting device 1 to the light-emitting device 3 and the comparative light-emitting device 1 and the comparative light-emitting device 2.

FIG. 26 shows the changes in luminance of the light-emitting devices 1 to 3 and the comparative light-emitting devices 1 and 2 over driving time in constant-current driving at a current density of 50 mA/cm$^2$. It was found from FIG. 26 that the luminance of the comparative light-emitting device 1 without the second layer changed significantly and the second layer formed in the intermediate layer improved reliability of the light-emitting device.

Thus, the use of the structure of one embodiment of the present invention was able to provide the tandem light-emitting devices having low drive voltage, high reliability, and favorable characteristics.

Example 2

Described in this example are specific methods for fabricating light-emitting devices 10 to 12 of embodiments of the present invention and a comparative light-emitting device 10, and characteristics of the light-emitting devices.

Structural formulae of main compounds used in this example are shown below.

[Chemical Formula 11]
(i)
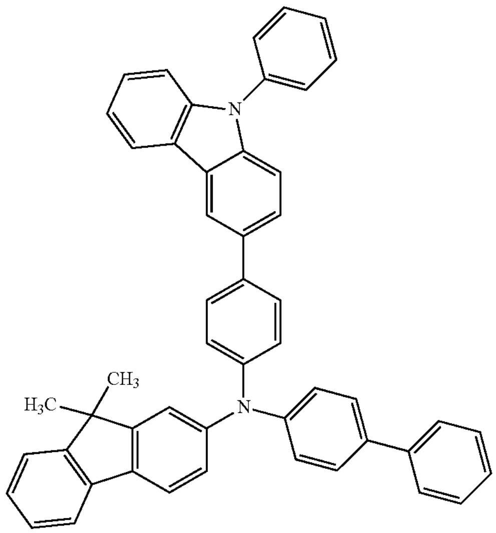
PCBBiF
(ii)
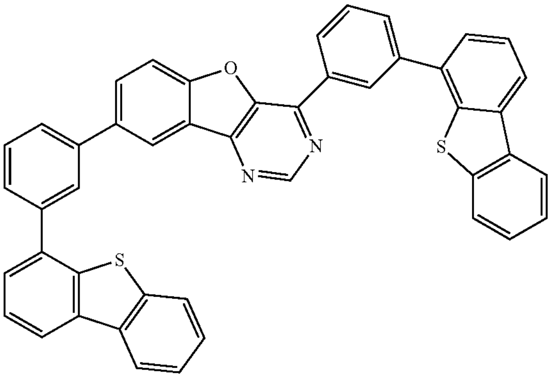
4,8mDBtP2Bfpm
(iii)
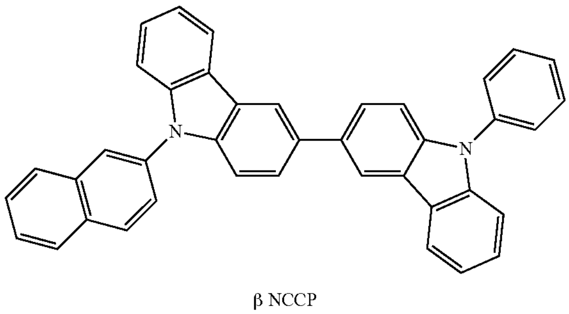
β NCCP
-continued
(iv)
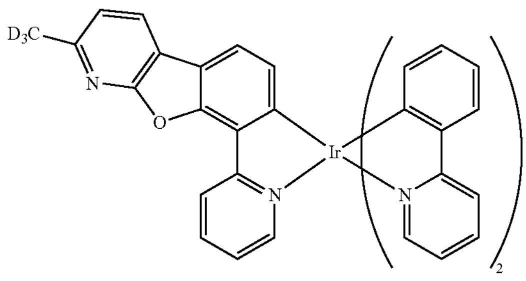
Ir(ppy)2(mbfpypy-d3)
(v)
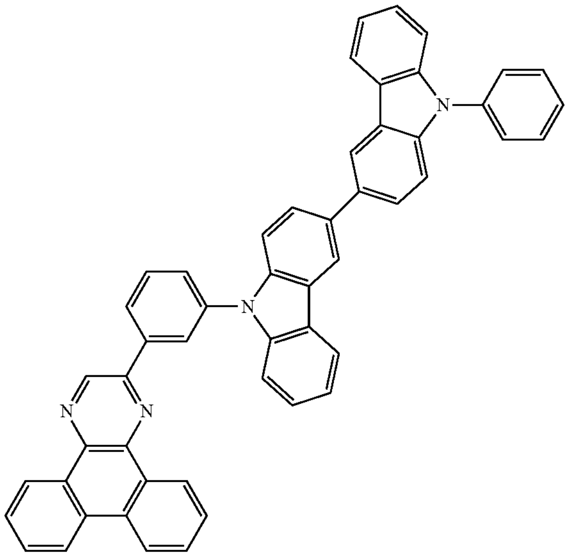
2mPCCzPDBq
(vi)
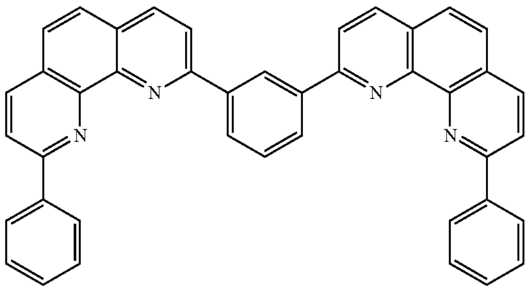
mPPhen2P
(vii)
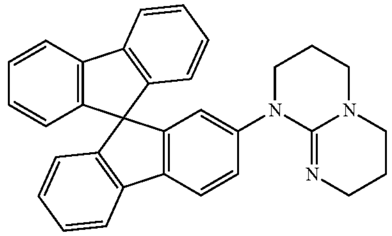
2hppSF -continued (ix)

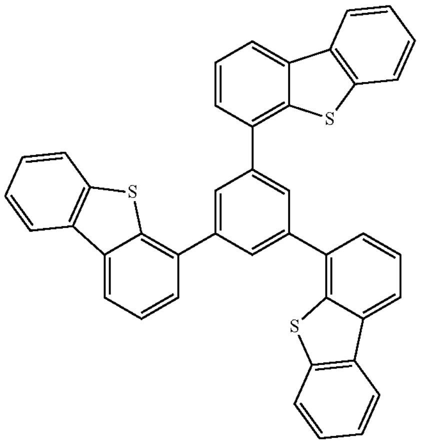

DBT3P-II (xii)

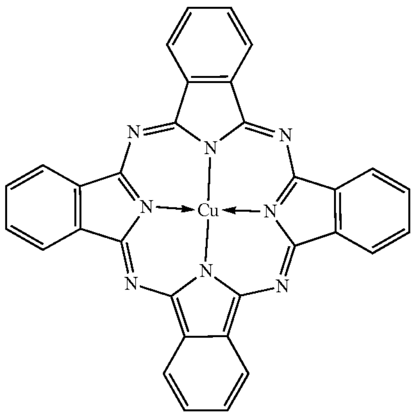

CuPc (xiii)

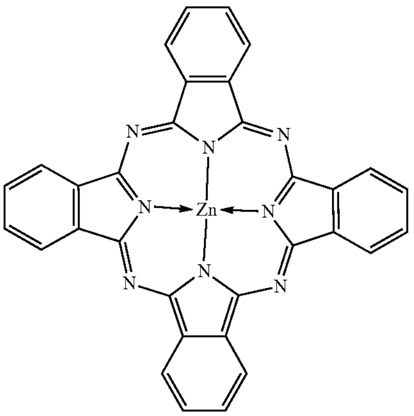

ZnPc

-continued (viii)

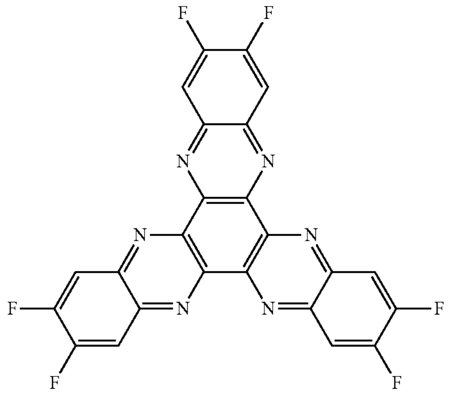

HATNA-F6

(Method for Fabricating Light-Emitting Device 10)

First, 100-nm-thick silver (Ag) and 10 nm-thick indium tin oxide containing silicon oxide (ITSO) were stacked sequentially from the substrate side by a sputtering method as a reflective electrode and a transparent electrode, respectively, over a glass substrate, whereby the first electrode 101 with a size of 2 mm×2 mm was formed. Note that the transparent electrode functions as an anode, and the transparent electrode and the reflective electrode are collectively regarded as the first electrode 101.

Next, in pretreatment for forming the light-emitting device over a substrate, the surface of the substrate was washed with water, baking was performed at 200° C. for one hour, and then UV ozone treatment was performed for 370 seconds.

After that, the substrate was transferred into a vacuum evaporation apparatus where the pressure was reduced to approximately $1\times10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus such that the surface on which the first electrode 101 was formed faced downward. Over the first electrode 101, N-(biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (i) above and a fluorine-containing electron-acceptor material with a molecular weight of 672 (OCHD-003) were deposited by co-evaporation to a thickness of 10 nm such that the weight ratio of PCBBiF to OCHD-003 was 1:0.03, whereby the hole-injection layer 111 was formed.

Over the hole-injection layer 111, PCBBiF was deposited by evaporation to a thickness of 20 nm, whereby a first hole-transport layer was formed.

Then, over the first hole-transport layer, 4,8-bis[3-(dibenzothiophen-4-yl)phenyl]-[1]benzofuro[3,2-d]pyrimidine (abbreviation: 4,8mDBtP2Bfpm) represented by Structural Formula (ii) above, 9-(2-naphthyl)-9'-phenyl-9H,9'H-3,3'-bicarbazole (abbreviation: βNCCP) represented by Structural Formula (iii) above, and [2-$d_3$-methyl-(2-pyridinyl-κN)benzofuro[2,3-b]pyridine-κC]bis[2-(2-pyridinyl-κN)phenyl-κC]iridium(III) (abbreviation: $Ir(ppy)_2(mbfpypy-d_3)$) represented by Structural Formula (iv) above were deposited by co-evaporation to a thickness of 40 nm such that the weight ratio of 4,8mDBtP2Bfpm to βNCCP and $Ir(ppy)_2(mbfpypy-d_3)$ was 0.5:0.5:0.1, whereby a first light-emitting layer was formed.

Next, 2-{3-[3-(N-phenyl-9H-carbazol-3-yl)-9H-carbazol-9-yl]phenyl}dibenzo[f,h]quinoxaline (abbreviation: 2mPCCzPDBq) represented by Structural Formula (v) above was deposited by evaporation to a thickness of 10 nm to form a first electron-transport layer.

After the first electron-transport layer was formed, 2,2'-(1,3-phenylene)bis(9-phenyl-1,10-phenanthroline) (abbreviation: mPPhen2P) represented by Structural Formula (vi) above and 1-(9,9'-spirobi[9H-fluoren]-2-yl)-1,3,4,6,7,8-hexahydro-2H-pyrimido[1,2-a]pyrimidine (abbreviation: 2hppSF) represented by Structural Formula (vii) above were deposited by co-evaporation to a thickness of 10 nm such that the weight ratio of mPPhen2P to 2hppSF was 1:1 to form a first layer, copper phthalocyanine (abbreviation: CuPc) represented by Structural Formula (xii) above was deposited by evaporation to a thickness of 2 nm to form a second layer, and PCBBiF and OCHD-003 were deposited by co-evaporation to a thickness of 10 nm such that the weight ratio of PCBBiF to OCHD-003 was 1:0.15 to form a third layer. Thus, an intermediate layer was formed.

Over the intermediate layer, PCBBiF was deposited by evaporation to a thickness of 50 nm, whereby a second hole-transport layer was formed.

Over the second hole-transport layer, 4,8mDBtP2Bfpm, βNCCP, and $Ir(ppy)_2(mbfpypy-d_3)$ were deposited by co-evaporation to a thickness of 40 nm such that the weight ratio of 4,8mDBtP2Bfpm to βNCCP and $Ir(ppy)_2(mbfpypy-d_3)$ was 0.5:0.5:0.1, whereby a second light-emitting layer was formed.

Then, 2mPCCzPDBq was deposited by evaporation to a thickness of 20 nm, and mPPhen2P was further deposited by evaporation to a thickness of 20 nm, whereby a second electron-transport layer was formed.

Lithium fluoride (LiF) and ytterbium (Yb) were deposited by co-evaporation to a thickness of 1.5 nm under a vacuum (approximately $1\times10^{-4}$ Pa) such that the volume ratio of LiF to Yb was 1:0.5, and then silver (Ag) and magnesium (Mg) were deposited by co-evaporation to a thickness of 15 nm such that the volume ratio of Ag to Mg was 1:0.1, whereby the second electrode 102 was formed. In this manner, the light-emitting device of one embodiment of the present invention was fabricated. Over the second electrode 102, 4,4',4''-(benzene-1,3,5-triyl)tri(dibenzothiophene) (abbreviation: DBT3P-II) represented by Structural Formula (ix) above was deposited to a thickness of 70 nm as a cap layer to improve light extraction efficiency.

Then, the light-emitting device was sealed using a glass substrate in a glove box containing a nitrogen atmosphere so as not to be exposed to the atmosphere. Specifically, a UV curable sealing material was applied to surround the device, only the sealing material was irradiated with UV while the light-emitting device was not irradiated with the UV, and heat treatment was performed at 80° C. under an atmospheric pressure for one hour. In this manner, the light-emitting device 10 was fabricated.

(Method for Fabricating Light-Emitting Device 11)

The light-emitting device 11 was fabricated in a manner similar to that of the light-emitting device 10 except that the material of the second layer in the intermediate layer in the light-emitting device 10 was replaced by zinc phthalocyanine (abbreviation: ZnPc) represented by Structural Formula (xiii) above.

(Method for Fabricating Light-Emitting Device 12)

The light-emitting device 12 was fabricated in a manner similar to that of the light-emitting device 10 except that the material of the second layer in the intermediate layer in the light-emitting device 10 was replaced by 2,3,8,9,14,15-hexafluorodiquinoxalino[2,3-a:2',3'-c]phenazine (abbreviation: HATNA-F6) represented by Structural Formula (viii) above.

(Method for Fabricating Comparative Light-Emitting Device 10)

The comparative light-emitting device 10 was fabricated in a manner similar to that of the light-emitting device 10 except that the second layer in the intermediate layer in the light-emitting device 10 was not formed.

Device structures of the light-emitting devices 10 to 12 and the comparative light-emitting device 10 and the LUMO levels of the main organic compounds used in the light-emitting devices are shown below.

Note that the HOMO level and the LUMO level of HATNA-F6 were obtained through cyclic voltammetry (CV) measurement.

In the cyclic voltammetry (CV) measurement, the values (E) of HOMO and LUMO levels were calculated on the basis of an oxidation peak potential ($E_{pa}$) and a reduction peak potential ($E_{pc}$), which were obtained by changing the potential of a working electrode with respect to a reference electrode. In the measurement, the HOMO level and the LUMO level were obtained by potential scanning in positive direction and potential scanning in negative direction, respectively. The scanning speed in the measurement was 0.1 V/s.

Specifically, a standard oxidation-reduction potential ($E_o$) ($=E_{pa}+E_{pc})/2$) was calculated from an oxidation peak potential ($E_{pa}$) and a reduction peak potential ($E_{pc}$), which were obtained by the cyclic voltammogram of a material. Then, the standard oxidation-reduction potential ($E_o$) was subtracted from the potential energy ($E_x$) of the reference electrode with respect to a vacuum level, whereby each of the values (E) ($=E_x-E_o$) of HOMO and LUMO levels were obtained.

Note that the reversible oxidation-reduction wave was obtained in the above case; in the case where an irreversible oxidation-reduction wave is obtained, the HOMO level is calculated as follows: a value obtained by subtracting a predetermined value (0.1 eV) from an oxidation peak potential ($E_{pa}$) is assumed to be a reduction peak potential ($E_{pc}$), and a standard oxidation-reduction potential ($E_o$) is calculated to one decimal place. To calculate the LUMO level, a value obtained by adding a predetermined value (0.1 eV) to a reduction peak potential ($E_{pc}$) was assumed to be an oxidation peak potential ($E_{pa}$), and a standard oxidation-reduction potential ($E_o$) was calculated to one decimal place.

The HOMO levels and the LUMO levels of CuPc and ZnPc were obtained through ionization potential measurement (IP measurement) and optical bandgap measurement.

The ionization potential measurement (IP measurement) was performed with a photoemission yield spectroscopic instrument (AC-3 produced by RIKEN KEIKI Co., Ltd.) under atmospheric conditions. The LUMO level was calculated using the HOMO level and the optical bandgap (energy (eV) calculated from an absorption edge on the long wavelength side of the absorption spectrum of the thin film), specifically by adding the energy (eV) calculated from the band gap to the HOMO level.

TABLE 5

| | | Film thickness (nm) | Light-emitting device 10 | 11 | 12 | Comparative light-emitting device 10 |
|---|---|---|---|---|---|---|
| Cap layer | | 70 | DBT3P-II | | | |
| Second electrode | | 15 | Ag:Mg (1:0.1) | | | |
| | | 1.5 | LiF:Yb (1:0.5) | | | |
| Second electron-transport layer | 2 | 20 | mPPhen2P | | | |
| | 1 | 20 | 2mPCCzPDBq | | | |
| Second light-emitting layer | | 40 | 4,8mDBtP2Bfpm:βNCCP:$Ir(ppy)_2(mbfpypy\text{-}d_3)$ (0.5:0.5:0.1) | | | |
| Second hole-transport layer | | 50 | PCBBiF | | | |
| Intermediate layer | Third layer | 10 | PCBBiF:OCHD-003 (1:0.15) | | | |
| | Second layer | 2 | *2 | | | |
| | First layer | 10 | mPPhen2P:2hppSF (1:1) | | | |
| First electron-transport layer | | 10 | 2mPCCzPDBq | | | |
| First light-emitting layer | | 40 | 4,8mDBtP2Bfpm:βNCCP:$Ir(ppy)_2(mbfpypy\text{-}d_3)$ (0.5:0.5:0.1) | | | |
| First hole-transport layer | | 20 | PCBBiF | | | |
| Hole-injection layer | | 10 | PCBBiF:OCHD-003 (1:0.03) | | | |
| First electrode | Transparent electrode | 10 | ITSO | | | |
| | Reflective electrode | 100 | Ag | | | |

TABLE 6

| | *2 | LUMO level (eV) |
|---|---|---|
| Light-emitting device 10 | CuPc | −3.31 |
| Light-emitting device 11 | ZnPc | −3.47 |
| Light-emitting device 12 | HATNA-F6 | −3.49 |
| Comparative light-emitting device 10 | — | — |

The layer of mPPhen2P 2hppSF=1:1 formed as the first layer of the intermediate layer in each of the light-emitting devices 10 to 12 and the comparative light-emitting device 10 is a film blocking holes as described in Embodiment 1 with reference to FIG. 20. Furthermore, 2hppSF has an acid dissociation constant $pK_a$ of 13.95 and is an organic compound having strong basicity with a $pK_a$ of 8 or more.

Here, an electron spin resonance spectrum of a thin film of mPPhen2P and 2hppSF that was deposited by co-evaporation to a thickness of 50 nm over a quartz substrate such that the weight ratio of mPPhen2P to 2hppSF was 1:1 was measured at room temperature, revealing that no signal was observed at g-factors of approximately 2.00 and the spin density was lower than $8\times10^{16}$ spins/$cm^3$, which is the detection limit. Note that the measurement of electron spin resonance spectrum using ESR spectroscopy was performed with an electron spin resonance spectrometer E500 (manufactured by Bruker Corporation). The measurement was performed at room temperature under the conditions where the resonance frequency was 9.56 GHz, the output power was 1 mW, the modulated magnetic field was 50 mT, the modulation width was 0.5 mT, the time constant was 0.04 s, and the sweep time was 1 min. This means that 2hppSF does not exhibit an electron-donating property with respect to mPPhen2P. In other words, the first layer in the intermediate layer in each of the light-emitting devices 10 to 12 and the comparative light-emitting device 10 is a layer that has a spin density lower than or equal to $1\times10^{17}$ spins/$cm^3$ and does not generate carriers.

The third layer in the intermediate layer is a layer including PCBBiF, which is an organic compound having a hole-transport property, and OCHD-003 exhibiting an electron-acceptor property and is a carrier-generation layer in which charge separation occurs by voltage application.

Here, an electron spin resonance spectrum of a thin film of PCBBiF and OCHD-003 that was deposited by co-evaporation to a thickness of 100 nm over a quartz substrate such that the weight ratio of PCBBiF to OCHD-003 was 1:0.1 was measured at room temperature, revealing that a signal was observed at a g-factor of approximately 2.00 and the spin density was $5\times10^{19}$ spins/$cm^3$. Note that the measurement of electron spin resonance spectrum using ESR spectroscopy was performed with an electron spin resonance spectrometer E500 (manufactured by Bruker Corporation). The measurement was performed at room temperature under the conditions where the resonance frequency was 9.56 GHz, the output power was 1 mW, the modulated magnetic field was 50 mT, the modulation width was 0.5 mT, the time constant was 0.04 s, and the sweep time was 1 min. This means that OCHD-003 exhibits an electron-accepting property with respect to PCBBiF and the layer including PCBBiF and OCHD-003 functions as a carrier-generation layer.

The light-emitting devices have different structures of the second layers of the intermediate layers from each other. The materials used for the second layer in the light-emitting devices 10 to 12 have LUMO levels greater than or equal to −4.30 eV and less than or equal to −3.00 eV, and the second layer was not formed in the comparative light-emitting element 10.

Figure 27:
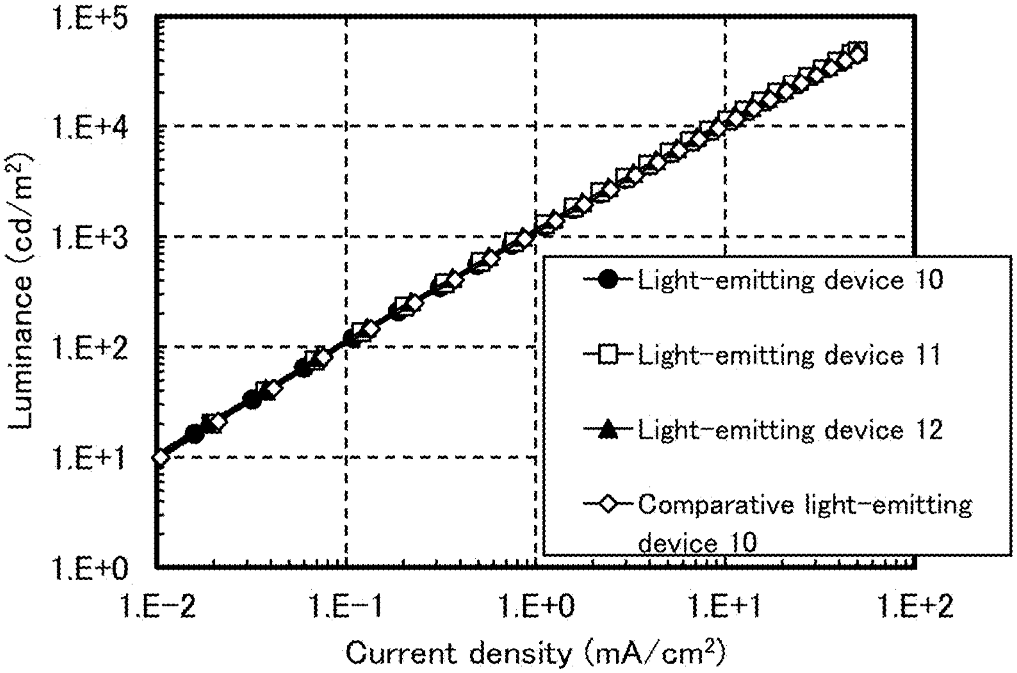
FIG. 27 shows luminance-current density characteristics of a light-emitting device 10 to a light-emitting device 12 and a comparative light-emitting device 10.
Figure 28:
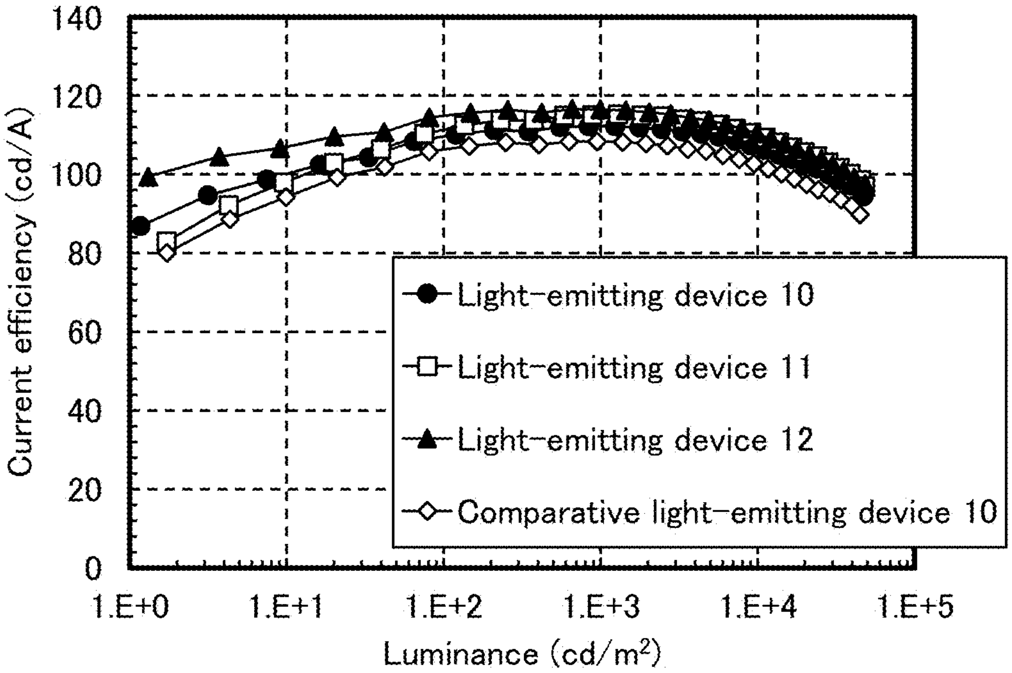
FIG. 28 shows current efficiency-luminance characteristics of the light-emitting device 10 to the light-emitting device 12 and the comparative light-emitting device 10.
Figure 29:
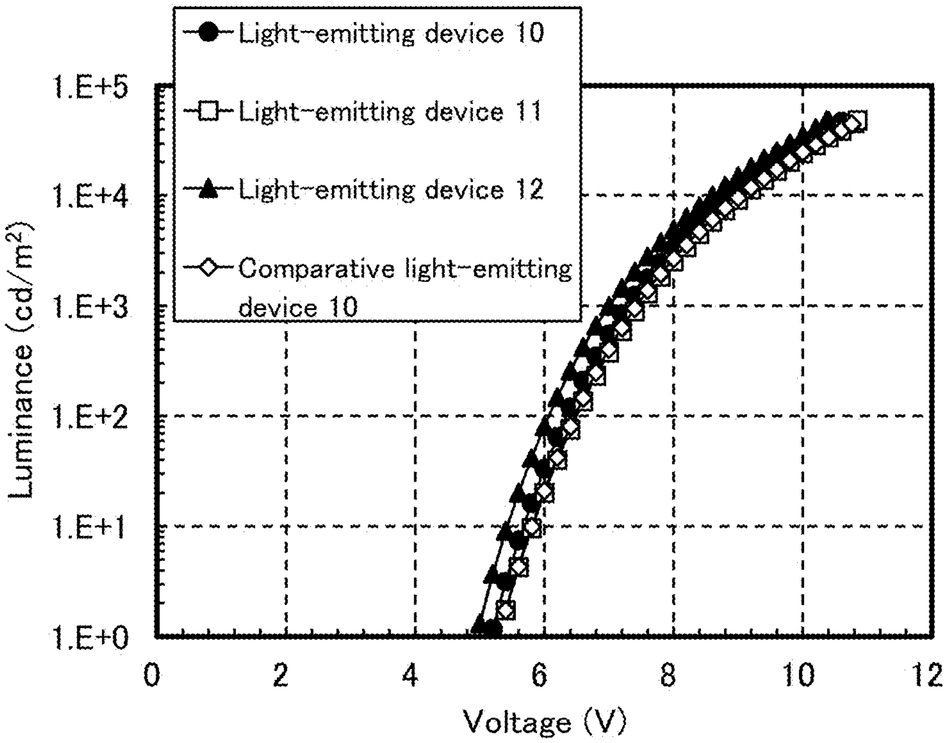
FIG. 29 shows luminance-voltage characteristics of the light-emitting device 10 to the light-emitting device 12 and the comparative light-emitting device 10.
Figure 30:
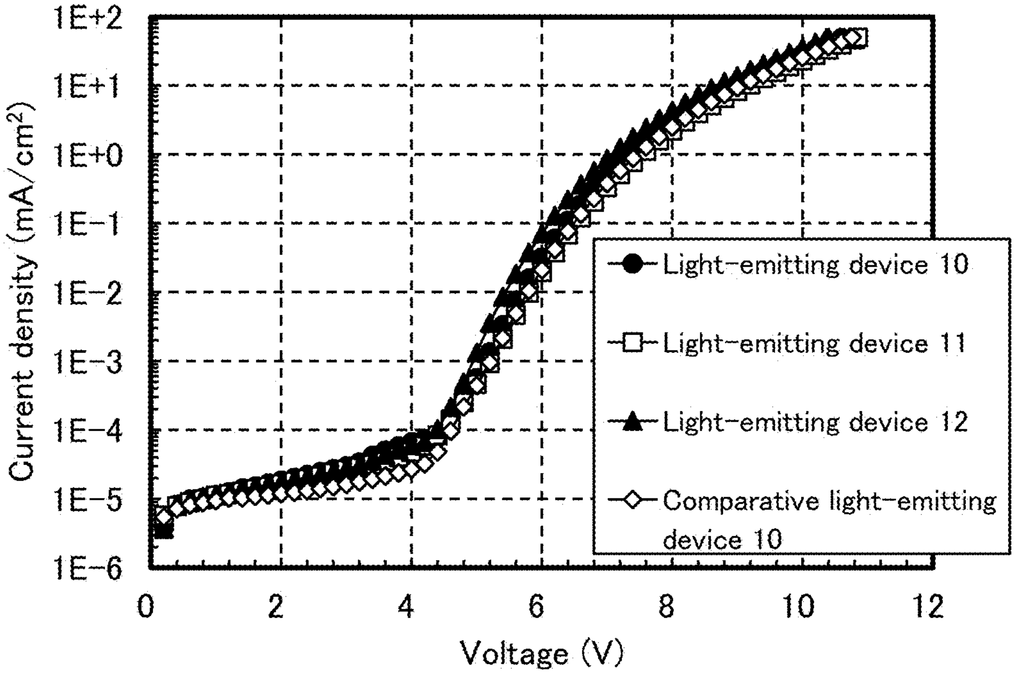
FIG. 30 shows current density—voltage characteristics of the light-emitting device 10 to the light-emitting device 12 and the comparative light-emitting device 10.
Figure 31:
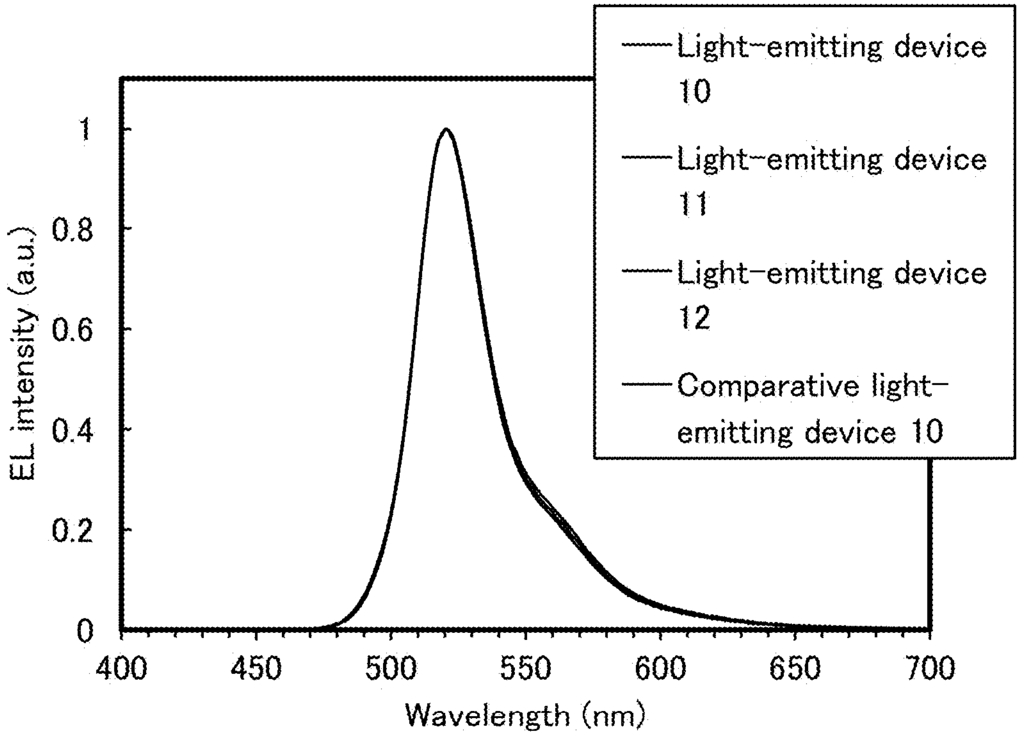
FIG. 31 shows emission spectra of the light-emitting device 10 to the light-emitting device 12 and the comparative light-emitting device 10.

FIG. 27 shows luminance-current density characteristics of the light-emitting devices 10 to 12 and the comparative light-emitting device 10. FIG. 28 shows current efficiency-luminance characteristics thereof. FIG. 29 shows luminance-voltage characteristics thereof. FIG. 30 shows current density—voltage characteristics thereof. FIG. 31 shows emission spectra thereof. Table 7 shows main characteristics of the light-emitting devices at approximately 1000 cd/$m^2$. The luminance, CIE chromaticity, and emission spectra were measured at normal temperature with a spectroradiometer (SR-UL1R manufactured by TOPCON TECHNOHOUSE CORPORATION).

TABLE 7

| | Voltage (V) | Current (mA) | Current density (mA/cm²) | Chromaticity x | Chromaticity y | Current efficiency (cd/A) |
|---|---|---|---|---|---|---|
| Light-emitting device 10 | 7.2 | 0.03 | 0.7 | 0.22 | 0.70 | 112.2 |
| Light-emitting device 11 | 7.4 | 0.03 | 0.8 | 0.22 | 0.70 | 115.0 |
| Light-emitting device 12 | 7.0 | 0.03 | 0.9 | 0.23 | 0.70 | 116.5 |
| Comparative light-emitting device 10 | 7.4 | 0.04 | 0.9 | 0.23 | 0.69 | 108.3 |

FIG. 31 (spectra) shows that the light-emitting devices 10 to 12 and the comparative light-emitting device 10 each exhibit green light emission derived from $Ir(ppy)_2(mbfpypy-d_3)$. Furthermore, FIG. 28 (current efficiency) indicates that the light-emitting devices 10 to 12 and the comparative light-emitting device 10 each exhibit favorable efficiency and function as a tandem light-emitting device.

Also in FIG. 29 (luminance-voltage characteristics) and FIG. 30 (current density—voltage characteristics), the light-emitting devices 10 to 12 and the comparative light-emitting device 10 exhibit favorable characteristics.

Figure 32:
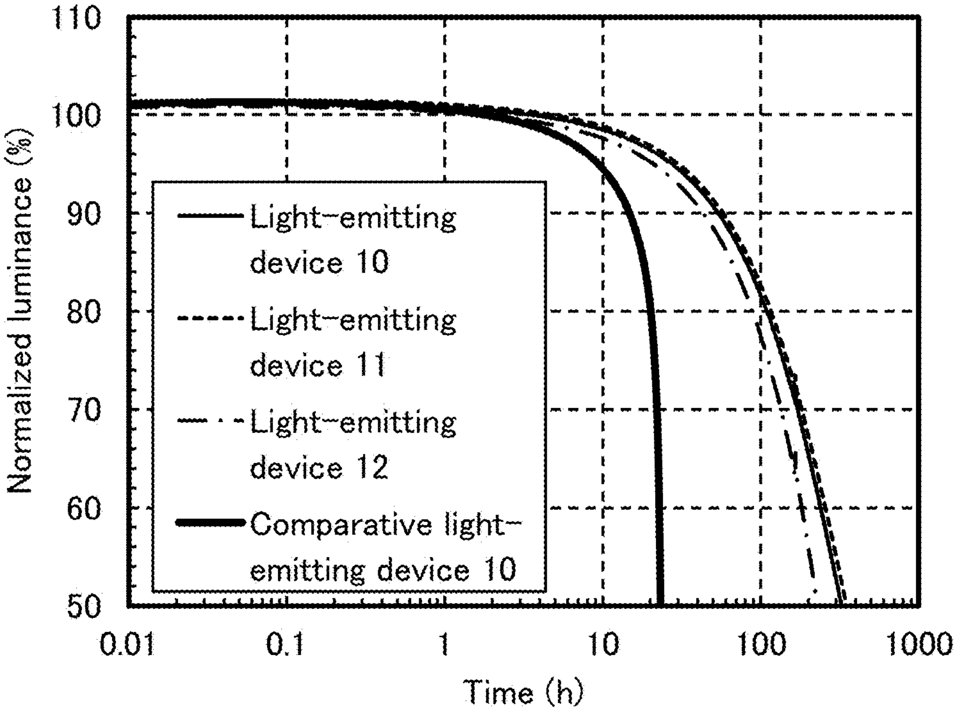
FIG. 32 shows the time dependence of normalized luminance of the light-emitting device 10 to the light-emitting device 12 and the comparative light-emitting device 10.

FIG. 32 shows the changes in luminance of the light-emitting devices 10 to 12 and the comparative light-emitting device 10 over driving time in constant-current driving at a current density of 50 mA/cm$^2$. It was found from FIG. 32 that the luminance of the comparative light-emitting device 10 without the second layer changed significantly and the second layer formed in the intermediate layer significantly improved reliability.

Thus, the use of the structure of the present invention was able to provide the tandem light-emitting devices having low drive voltage, high reliability, and favorable characteristics.

Example 3

Described in this example are specific methods for fabricating light-emitting devices 20 to 22 of embodiments of the present invention and characteristics of the light-emitting devices.

Structural formulae of main compounds used in this example are shown below.

[Chemical Formula 12]

(i)

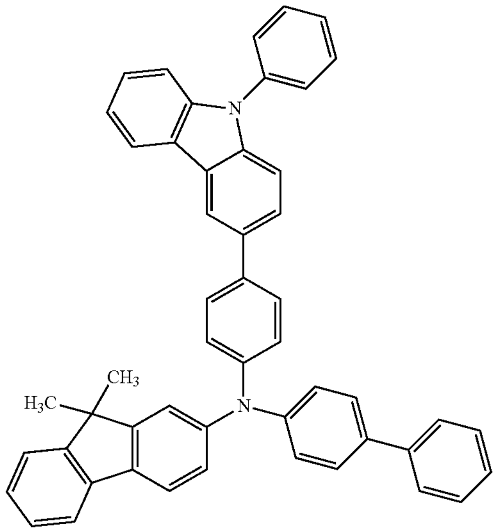

PCBBiF

-continued (xiv)

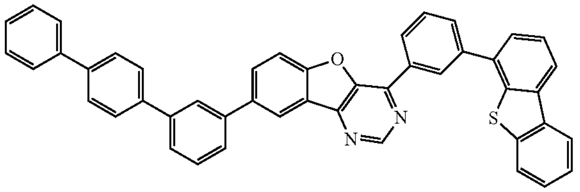

8mpTP-4mDBtPBfpm (iii)

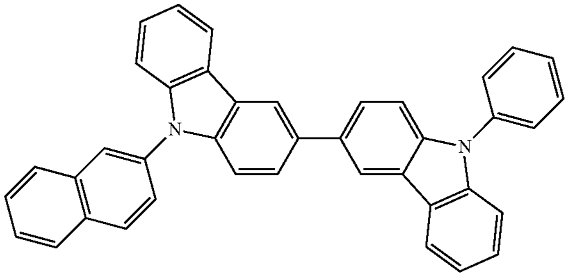

β NCCP (xv)

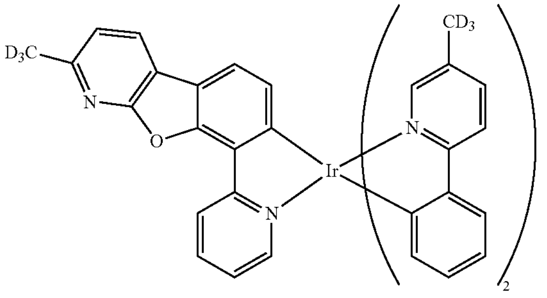

$Ir(5mppy-d_3)_2(mbfpypy-d_3)$ (xvi)

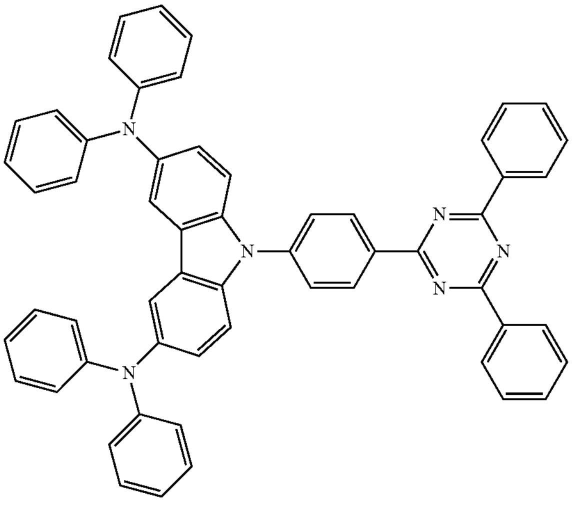

DACT-II

-continued
(vi)
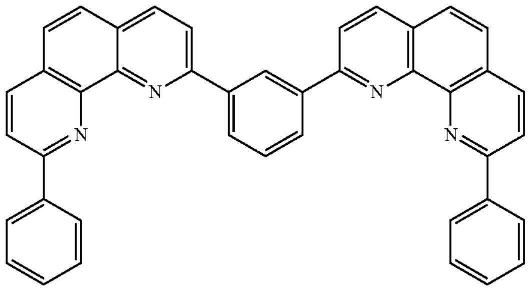
mPPhen2P
(xvii)
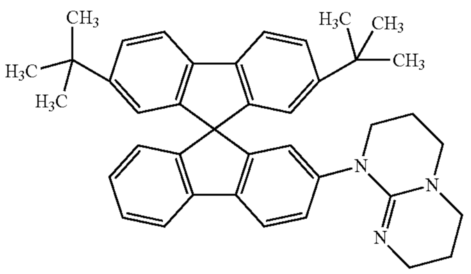
2′,7′tBu-2hppSF
(v)
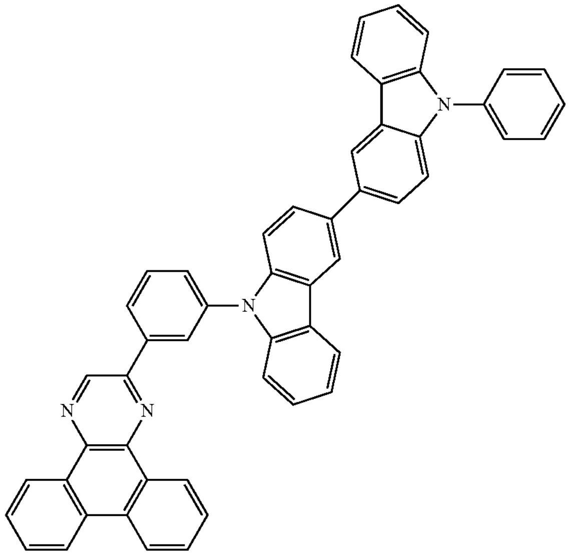
2mPCCzPDBq
-continued
(xviii)
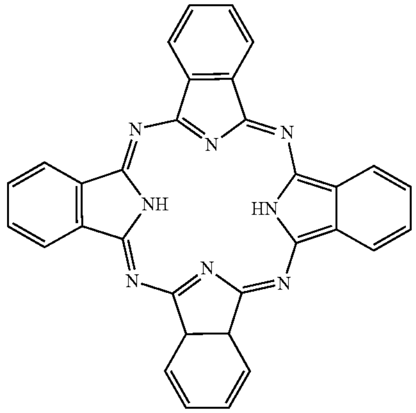
$H_2Pc$
(ix)
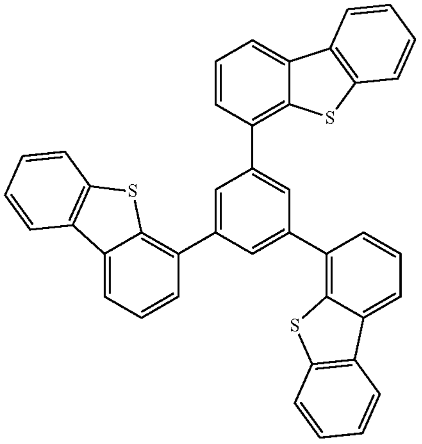
DBT3P-II
(xix)
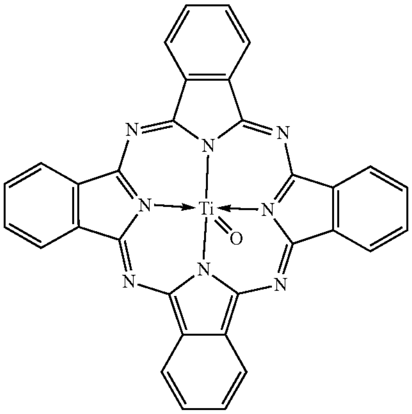
TiOPc -continued (xii)

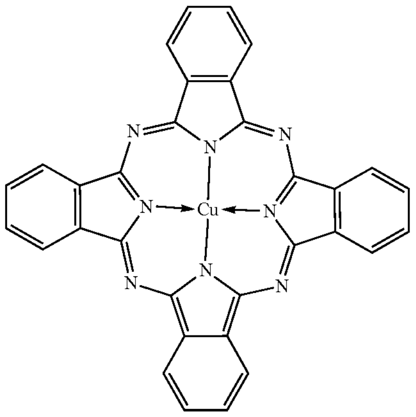

CuPc (Method for Fabricating Light-Emitting Device 20-1)

First, a 100-nm-thick alloy of silver, palladium, and copper (Ag—Pd—Cu, also referred to as APC) and 50 nm-thick indium tin oxide containing silicon oxide (ITSO) were stacked sequentially from the substrate side by a sputtering method as a reflective electrode and a transparent electrode, respectively, over a glass substrate, whereby the first electrode 101 with a size of 2 mm×2 mm was formed. Note that the transparent electrode functions as an anode, and the transparent electrode and the reflective electrode are collectively regarded as the first electrode 101.

Next, in pretreatment for forming the light-emitting device over a substrate, the surface of the substrate was washed with water, baking was performed at 200° C. for one hour, and then UV ozone treatment was performed for 370 seconds.

After that, the substrate was transferred into a vacuum evaporation apparatus where the pressure was reduced to approximately $1\times10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus such that the surface on which the first electrode 101 was formed faced downward. Over the first electrode 101, N-(biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (i) above and a fluorine-containing electron-acceptor material with a molecular weight of 672 (OCHD-003) were deposited by co-evaporation to a thickness of 10 nm such that the weight ratio of PCBBiF to OCHD-003 was 1:0.03, whereby the hole-injection layer 111 was formed.

Over the hole-injection layer 111, PCBBiF was deposited by evaporation to a thickness of 120 nm, whereby a first hole-transport layer was formed.

Then, over the first hole-transport layer, 8-(1,1':4',1"-terphenyl-3-yl)-4-[3-(dibenzothiophen-4-yl)phenyl]-[1]benzofuro[3,2-d]pyrimidine (abbreviation: 8mpTP-4mDBtPBfpm) represented by Structural Formula (xiv), 9-(2-naphthyl)-9'-phenyl-9H,9'H-3,3'-bicarbazole (abbreviation: βNCCP) represented by Structural Formula (iii), and [2-$d_3$-methyl-8-(2-pyridinyl-κN)benzofuro[2,3-b]pyridine-κC]bis[2-(5-$d_3$-methyl-2-pyridinyl-κN2)phenyl-κC]iridium(III) (abbreviation: Ir(5mppy-$d_3$)$_2$(mbfpypy-$d_3$)) represented by Structural Formula (xv) were deposited by co-evaporation to a thickness of 40 nm such that the weight ratio of 8mpTP-4mDBtPBfpm to βNCCP and Ir(5mppy-$d_3$)$_2$(mbfpypy-$d_3$) was 0.5:0.5:0.1, whereby a first light-emitting layer was formed.

Next, 3,6-bis(diphenylamino)-9-[4-(4,6-diphenyl-1,3,5-triazin-2-yl)phenyl]-9H-carbazole (abbreviation: DACT-II) represented by Structural Formula (xvi) above was deposited by evaporation to a thickness of 10 nm to form a first electron-transport layer.

After the first electron-transport layer was formed, 2,2'-(1,3-phenylene)bis(9-phenyl-1,10-phenanthroline) (abbreviation: mPPhen2P) represented by Structural Formula (vi) above and 1-(2',7'-di-tert-butyl-9,9'-spirobi[9H-fluoren]-2-yl)-1,3,4,6,7,8-hexahydro-2H-pyrimido[1,2-a]pyrimidine (abbreviation: 2',7'tBu-2hppSF) represented by Structural Formula (xvii) above were deposited by co-evaporation to a thickness of 5 nm such that the weight ratio of mPPhen2P to 2',7'tBu-2hppSF was 1:1 to form a first layer, phthalocyanine (abbreviation: $H_2Pc$) represented by Structural Formula (xviii) above was deposited by evaporation to a thickness of 2 nm to form a second layer, and PCBBiF and OCHD-003 were deposited by co-evaporation to a thickness of 10 nm such that the weight ratio of PCBBiF to OCHD-003 was 1:0.15 to form a third layer. Thus, an intermediate layer was formed.

Over the intermediate layer, PCBBiF was deposited by evaporation to a thickness of 55 nm, whereby a second hole-transport layer was formed.

Over the second hole-transport layer, 8mpTP-4mDBtPBfpm, βNCCP, and Ir(5mppy-$d_3$)$_2$(mbfpypy-$d_3$) were deposited by co-evaporation to a thickness of 40 nm such that the weight ratio of 8mpTP-4mDBtPBfpm to βNCCP and Ir(5mppy-$d_3$)$_2$(mbfpypy-$d_3$) was 0.5:0.5:0.1, whereby a second light-emitting layer was formed.

Next, 2-{3-[3-(N-phenyl-9H-carbazol-3-yl)-9H-carbazol-9-yl]phenyl}dibenzo[f,h]quinoxaline (abbreviation: 2mPCCzPDBq) represented by Structural Formula (v) above was deposited by evaporation to a thickness of 20 nm and mPPhen2P was further deposited by evaporation to a thickness of 20 nm, whereby a second electron-transport layer was formed.

Next, lithium fluoride (LiF) and ytterbium (Yb) were deposited by co-evaporation to a thickness of 1.5 nm such that the volume ratio of LiF to Yb was 1:0.5, and then silver (Ag) and magnesium (Mg) were deposited by co-evaporation to a thickness of 15 nm such that the volume ratio of Ag to Mg was 1:0.1, whereby the second electrode 102 was formed. In this manner, the light-emitting device of one embodiment of the present invention was fabricated. Over the second electrode 102, 4,4',4"-(benzene-1,3,5-triyl)tri(dibenzothiophene) (abbreviation: DBT3P-II) represented by Structural Formula (ix) above was deposited to a thickness of 70 nm as a cap layer to improve light extraction efficiency.

Then, the light-emitting device was sealed using a glass substrate in a glove box containing a nitrogen atmosphere so as not to be exposed to the atmosphere. Specifically, a UV curable sealing material was applied to surround the device, only the sealing material was irradiated with UV while the light-emitting device was not irradiated with the UV, and heat treatment was performed at 80° C. under an atmospheric pressure for one hour. In this manner, the light-emitting device 20-1 was fabricated.

(Method for Fabricating Light-Emitting Device 20-2)

The light-emitting device 20-2 was fabricated in a manner similar to that of the light-emitting device 20-1 except that the EL layer in the light-emitting device 20-1 was processed by a photolithography technique after the formation of the second electron-transport layer and before formation of the second electrode and the cap layer.

The processing by a photolithography technique is described. The sample in which the layers up to the second electron-transport layer were formed in a manner similar to that of the light-emitting device 20-1 was taken out from the vacuum evaporation apparatus and exposed to the atmosphere, and then aluminum oxide was deposited to a thickness of 30 nm by an ALD method using trimethylaluminum (abbreviation: TMA) as a precursor and water vapor as an oxidizer, whereby a first sacrificial layer was formed.

Over the first sacrificial layer, molybdenum was deposited to a thickness of 50 nm by a sputtering method, whereby a second sacrificial layer was formed.

A photoresist was formed over the second sacrificial layer, and a slit having a width of 3 μm was formed by a lithography technique in a position 3.5 μm away from an end portion of the first electrode.

Specifically, the second sacrificial layer was processed using the resist as a mask and using an etching gas including $CF_4$, $O_2$, and He and then an etching gas including oxygen, and then the resist was removed using a solution including tetramethylammonium hydroxide (abbreviation: TMAH). Next, the first sacrificial layer was processed using the second sacrificial layer as a hard mask and an etching gas including fluoroform ($CHF_3$) and helium (He) at a flow rate ratio of $CHF_3$:He=1:49. Then, the second electron-transport layer, the second light-emitting layer, the second hole-transport layer, the intermediate layer, the first electron-transport layer, the first light-emitting layer, the first hole-transport layer, and the hole-injection layer were processed using an etching gas containing oxygen ($O_2$).

After the processing, the second sacrificial layer was removed using an etching gas including $CF_4$, $O_2$, and He, and then the first sacrificial layer was removed using a solution including tetramethylammonium hydroxide (abbreviation: TMAH), so that the second electron-transport layer was exposed.

The sample with the exposed second electron-transport layer was transferred into a vacuum evaporation apparatus where the pressure was reduced to approximately $1\times10^{-4}$ Pa, and vacuum baking was performed at 110° C. for 1 hour in a heating chamber of the vacuum evaporation apparatus. After the vacuum baking, the sample was cooled down for approximately 30 minutes, and then the formation of the second electrode and the subsequent steps were performed in a manner similar to that of the light-emitting device 20-1. Thus, the light-emitting device 20-2 was fabricated.

(Method for Fabricating Light-Emitting Device 21-1)

The light-emitting device 21-1 was fabricated in a manner similar to that of the light-emitting device 20-1 except that $H_2Pc$ in the light-emitting device 20-1 was replaced by titanium oxide phthalocyanine (abbreviation: TiOPc) represented by Structural Formula (xix) above.

(Method for Fabricating Light-Emitting Device 21-2)

The light-emitting device 21-2 was fabricated in a manner similar to that of the light-emitting device 20-2 except that $H_2Pc$ in the light-emitting device 20-2 was replaced by TiOPc.

(Method for Fabricating Light-Emitting Device 22-1)

The light-emitting device 22-1 was fabricated in a manner similar to that of the light-emitting device 20-1 except that $H_2Pc$ in the light-emitting device 20-1 was replaced by copper phthalocyanine (abbreviation: CuPc) represented by Structural Formula (xii) above.

(Method for Fabricating Light-Emitting Device 22-2)

The light-emitting device 22-2 was fabricated in a manner similar to that of the light-emitting device 20-2 except that $H_2Pc$ in the light-emitting device 20-2 was replaced by CuPc.

Device structures of the light-emitting devices 20-1 to 22-2 are shown below.

TABLE 8

| | | Film thickness (nm) | Light-emitting device 20-1 | 20-2 | 21-1 | 21-2 | 22-1 | 22-2 |
|---|---|---|---|---|---|---|---|---|
| Cap layer | | 70 | DBT3P-II | | | | | |
| Second electrode | | 15 | Ag:Mg (1:0.1) | | | | | |
| | | 1.5 | LiF:Yb (1:0.5) | | | | | |
| Second electron-transport layer | 2 | 20 | mPPhen2P | | | | | |
| | 1 | 20 | 2mPCCzPDBq | | | | | |
| Second light-emitting layer | | 40 | 8mpTP-4mDBtPBfpm:βNCCP:Ir(5mppy-$d_3$)$_2$(mbfpypy-$d_3$) (0.5:0.5:0.1) | | | | | |
| Second hole-transport layer | | 55 | PCBBiF | | | | | |
| Intermediate layer | Third layer | 10 | PCBBiF:OCHD-003 (1:0.15) | | | | | |
| | Second layer | 2 | $H_2Pc$ | | TiOPc | | CuPc | |
| | First layer | 5 | mPPhen2P:2',7'tBu-2hppSF (1:1) | | | | | |
| First electron-transport layer | | 10 | DACT-II | | | | | |
| First light-emitting layer | | 40 | 8mpTP-4mDBtPBfpm:βNCCP:Ir(5mppy-$d_3$)$_2$(mbfpypy-$d_3$) (0.5:0.5:0.1) | | | | | |
| First hole-transport layer | | 120 | PCBBiF | | | | | |
| Hole-injection layer | | 10 | PCBBiF:OCHD-003 (1:0.03) | | | | | |
| First electrode | Transparent electrode | 50 | ITSO | | | | | |
| | Reflective electrode | 100 | APC | | | | | |

The LUMO level of $H_2Pc$ is −3.48 eV, the LUMO level of TiOPc is −3.68 eV, and the LUMO level of CuPc is −3.31 eV. The LUMO levels were obtained through ionization potential measurement (TP measurement) and optical bandgap measurement.

The ionization potential measurement (TP measurement) was performed with a photoemission yield spectroscopic instrument (AC-3 produced by RTKEN KETKJ Co., Ltd.) under atmospheric conditions. The LUMO level was calculated using the HOMO level and the optical bandgap (energy (eV) calculated from an absorption edge that was obtained from Tauc plot, which was obtained from the absorption spectrum of the thin film, with an assumption of direct transition), specifically by adding the energy (eV) calculated from the band gap to the HOMO level. Note that the absorption spectrum was measured with a UV-visible spectrophotometer (U-4100 manufactured by Hitachi High-Tech Corporation). The absorption spectrum of the thin film was calculated using an absorbance ($-\log_{10}$ (0% T/(100-% R))) obtained from the transmittance (% T) and reflectance (% R) of the thin film including the substrate.

The layer of mPPhen2P: 2',7'tBu-2hppSF=1:1 formed as the first layer of the intermediate layer in each of the light-emitting devices 20-1 to 22-2 is a film blocking holes as described in Embodiment 1 with reference to FIG. 20. Furthermore, 2',7'tBu-2hppSF has an acid dissociation constant $pK_a$ of 14.18 and is an organic compound having strong basicity with a $pK_a$ of 8 or more.

Here, an electron spin resonance spectrum of a thin film of mPPhen2P and 2',7'tBu-2hppSF that was deposited by co-evaporation to a thickness of 100 nm over a quartz substrate such that the weight ratio of mPPhen2P to 2',7'tBu-2hppSF was 1:1 was measured at room temperature, revealing that no signal was observed at g-factors of approximately 2.00 and the spin density was lower than $1\times10^{16}$ spins/$cm^3$, which is the detection limit. Note that the measurement of electron spin resonance spectrum using ESR spectroscopy was performed with an electron spin resonance spectrometer E500 (manufactured by Bruker Corporation). The measurement was performed at room temperature under the conditions where the resonance frequency was 9.56 GHz, the output power was 1 mW, the modulated magnetic field was 50 mT, the modulation width was 0.5 mT, the time constant was 0.04 s, and the sweep time was 1 min. This means that 2',7'tBu-2hppSF does not exhibit an electron-donating property with respect to mPPhen2P. In other words, the first layer in the intermediate layer in each of the light-emitting devices 20-1 to 22-2 is a layer having a spin density lower than $1\times10^{16}$ spins/$cm^3$.

The third layer in the intermediate layer is a layer including PCBBiF, which is an organic compound having a hole-transport property, and OCHD-003 exhibiting an electron-acceptor property and is a carrier-generation layer in which charge separation occurs by voltage application. An electron spin resonance spectrum of a thin film of PCBBiF and OCHD-003 that was deposited by co-evaporation to a thickness of 100 nm over a quartz substrate such that the weight ratio of PCBBiF to OCHD-003 was 1:0.1 was measured at room temperature, revealing that a signal was observed at a g-factor of approximately 2.00 and the spin density was $5\times10^{19}$ spins/$cm^3$. Note that the measurement of electron spin resonance spectrum using ESR spectroscopy was performed with an electron spin resonance spectrometer JES FA300 (manufactured by JEOL Ltd.). The measurement was performed at room temperature under the conditions where the resonance frequency was 9.18 GHz, the output power was 1 mW, the modulated magnetic field was 50 mT, the modulation width was 0.5 mT, the time constant was 0.03 s, and the sweep time was 1 min. This means that OCHD-003 exhibits an electron-accepting property with respect to PCBBiF and the layer including PCBBiF and OCHD-003 functions as a carrier-generation layer.

The light-emitting devices have different structures of the second layers of the intermediate layers from each other. The materials used for the second layer in the light-emitting devices 20-1 to 22-2 have LUMO levels greater than or equal to −4.30 eV and less than or equal to −3.00 eV.

Figure 33:
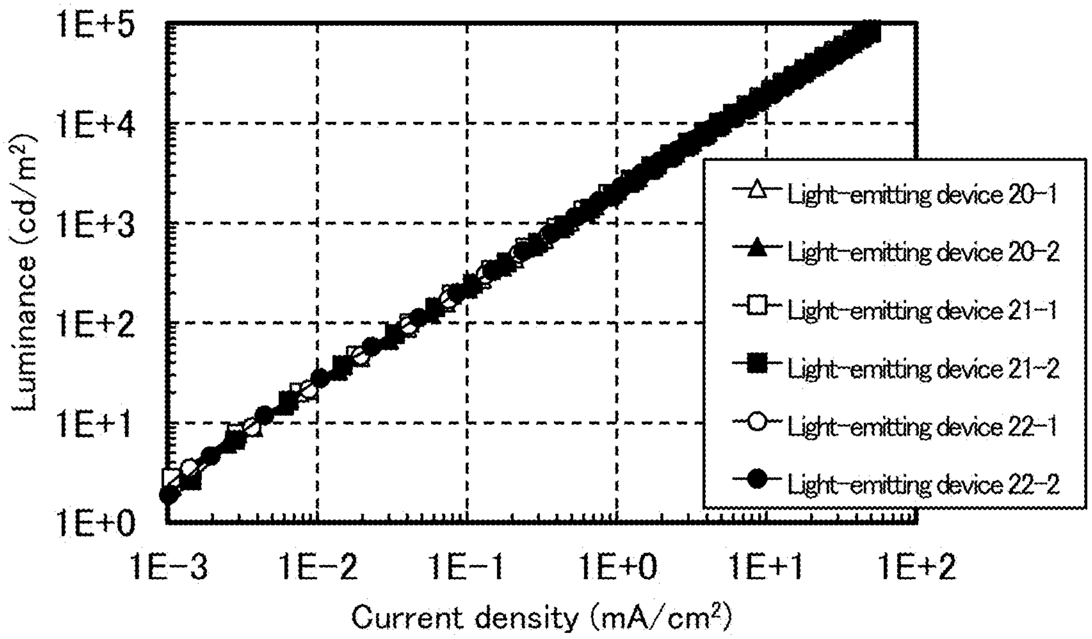
FIG. 33 shows luminance-current density characteristics of a light-emitting device 20-1 to a light-emitting device 22-2.
Figure 34:
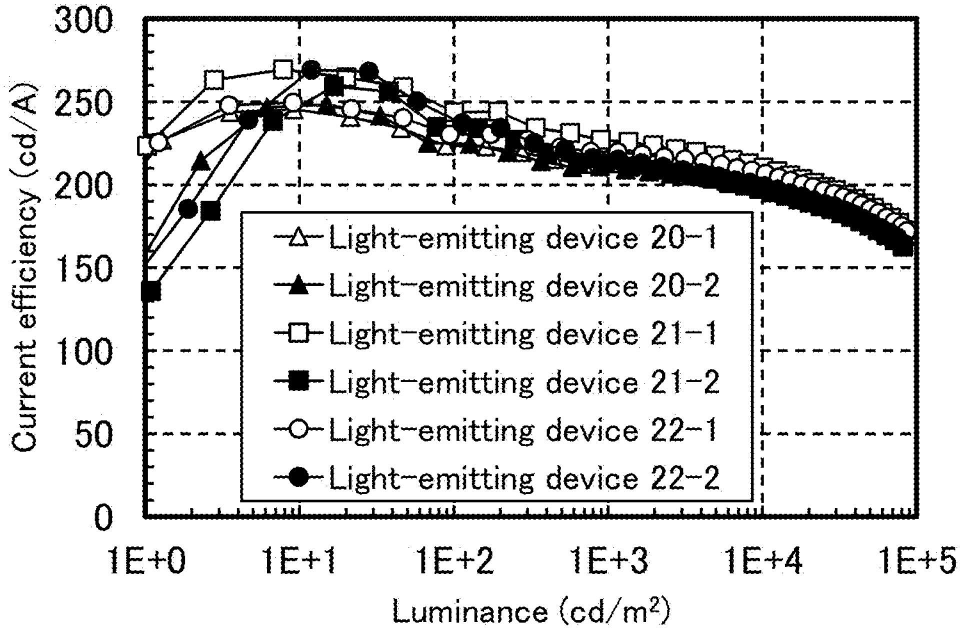
FIG. 34 shows current efficiency-luminance characteristics of the light-emitting device 20-1 to the light-emitting device 22-2.
Figure 35:
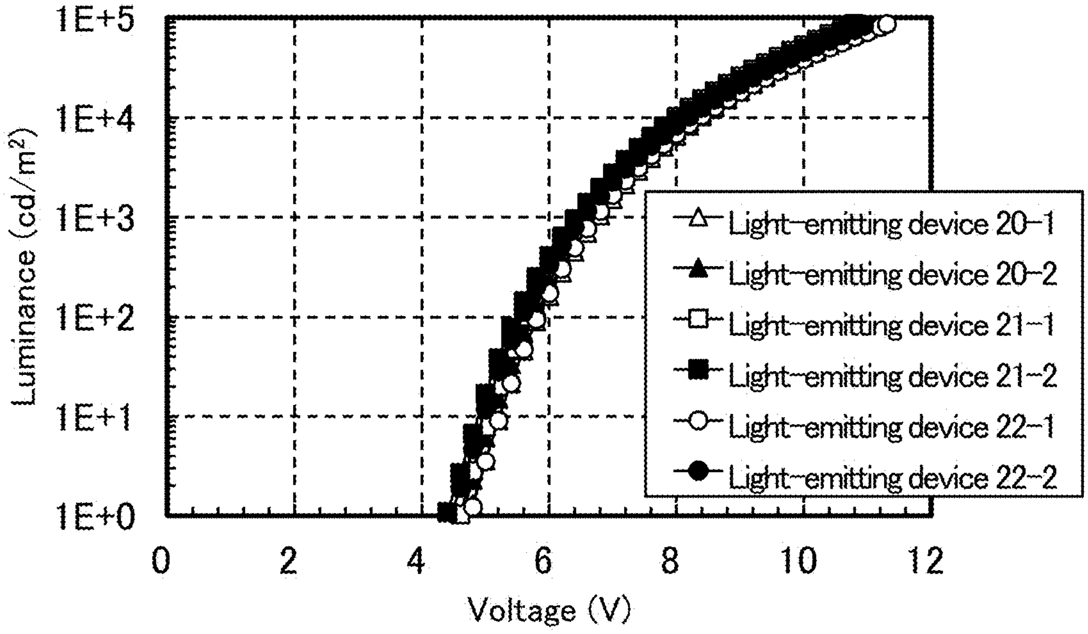
FIG. 35 shows luminance-voltage characteristics of the light-emitting device 20-1 to the light-emitting device 22-2.
Figure 36:
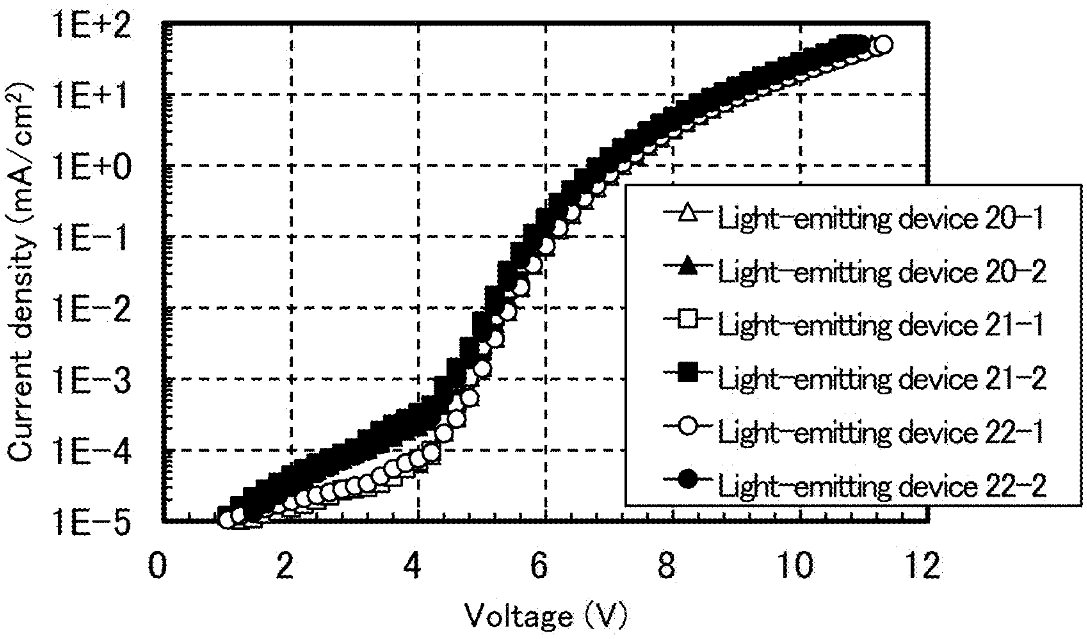
FIG. 36 shows current density—voltage characteristics of the light-emitting device 20-1 to the light-emitting device 22-2.
Figure 37:
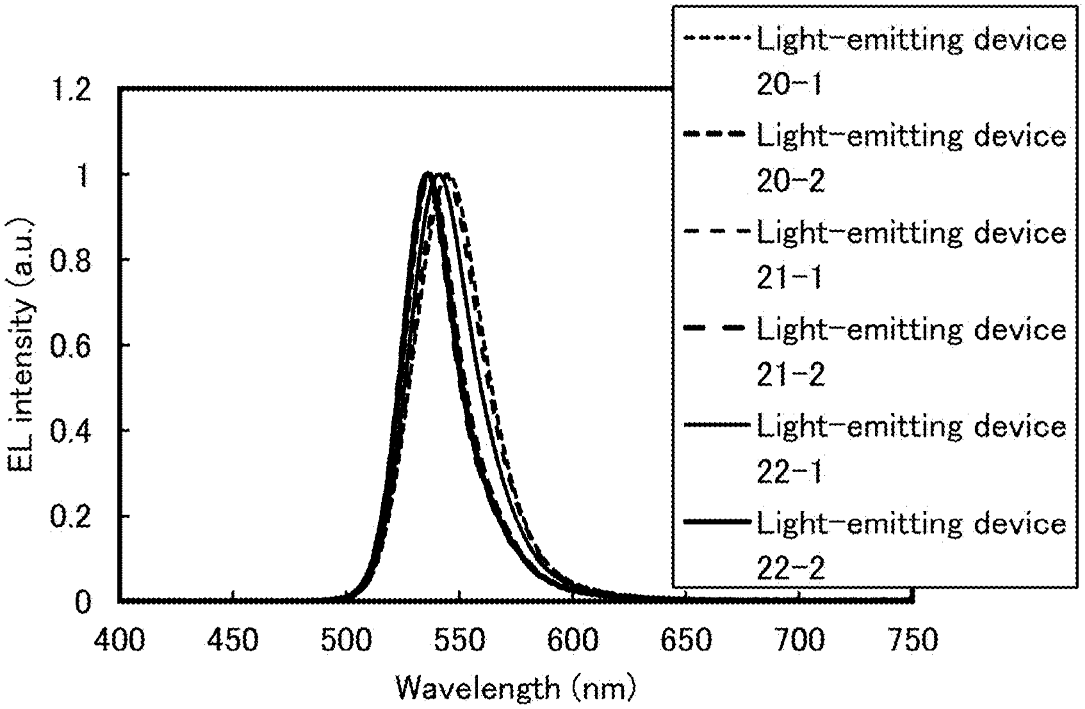
FIG. 37 shows emission spectra of the light-emitting device 20-1 to the light-emitting device 22-2.

FIG. 33 shows luminance-current density characteristics of the light-emitting devices 20-1 to 22-2. FIG. 34 shows current efficiency-luminance characteristics thereof. FIG. 35 shows luminance-voltage characteristics thereof. FIG. 36 shows current density—voltage characteristics thereof. FIG. 37 shows electroluminescence spectra thereof. Table 9 shows main characteristics of the light-emitting devices at approximately 1000 cd/$m^2$. The luminance, CIE chromaticity, and electroluminescence spectra were measured at normal temperature with a spectroradiometer (SR-UL1R manufactured by TOPCON TECHNOHOUSE CORPORATION).

TABLE 9

| | Voltage (V) | Current (mA) | Current density (mA/$cm^2$) | Chromaticity x | Chromaticity y | Current efficiency (cd/A) |
|---|---|---|---|---|---|---|
| Light-emitting device 20-1 | 6.8 | 0.02 | 0.5 | 0.32 | 0.67 | 212.8 |
| Light-emitting device 20-2 | 6.6 | 0.02 | 0.4 | 0.27 | 0.70 | 211.0 |
| Light-emitting device 21-1 | 6.4 | 0.02 | 0.4 | 0.31 | 0.67 | 226.9 |
| Light-emitting device 21-2 | 6.4 | 0.02 | 0.4 | 0.27 | 0.71 | 212.9 |
| Light-emitting device 22-1 | 6.8 | 0.02 | 0.5 | 0.30 | 0.68 | 219.8 |
| Light-emitting device 22-2 | 6.6 | 0.02 | 0.5 | 0.27 | 0.71 | 215.3 |

FIG. 37 (spectra) shows that the light-emitting devices 20-1 to 22-2 each exhibit green light emission derived from $Ir(5mppy-d_3)_2(mbfpypy-d_3)$. Furthermore, FIG. 34 (current efficiency) indicates that the light-emitting devices 20-1 to 22-2 each exhibit favorable efficiency and function as a tandem light-emitting device.

Also in FIG. 35 (luminance-voltage characteristics) and FIG. 36 (current density—voltage characteristics), the light-emitting devices 20-1 to 22-2 exhibit favorable characteristics.

Figure 38:
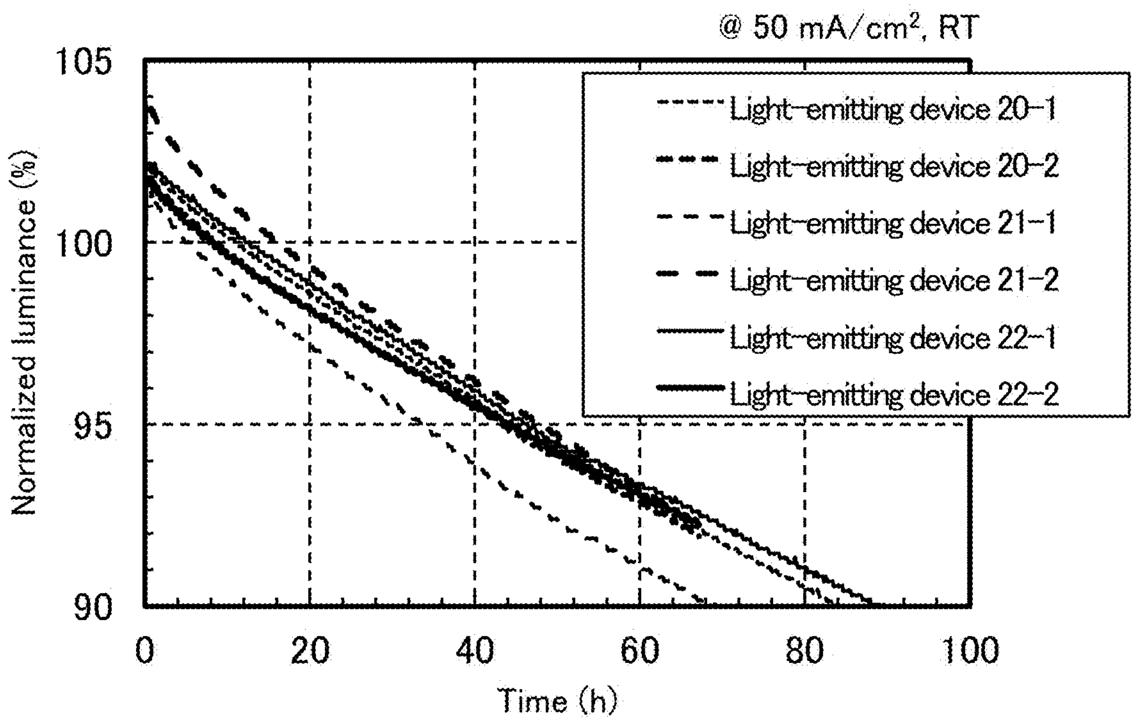
FIG. 38 shows the time dependence of normalized luminance of the light-emitting device 20-1 to the light-emitting device 22-2.

FIG. 38 shows the changes in luminance of the light-emitting devices 20-1 to 22-2 over driving time in constant-current driving at a current density of 50 mA/$cm^2$. It was found from FIG. 38 that each of the light-emitting devices exhibited favorable characteristics.

Thus, the use of the structure of the present invention was able to provide the tandem light-emitting devices having low drive voltage, high reliability, and favorable characteristics. In addition, the light-emitting devices of embodiments of the present invention maintained the favorable characteristics even when formed through a photolithography process.

Example 4

In this example, characteristics of a light-emitting device of one embodiment of the present invention are described. Structural formulae of main compounds used in this example are shown below.

[Chemical Formula 13]

(i)

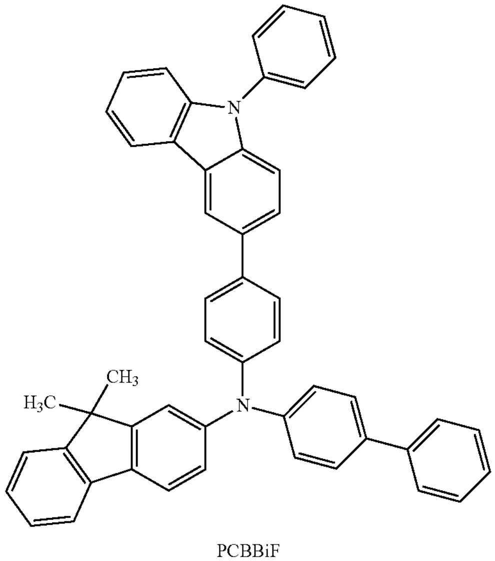

PCBBiF

-continued (xiv)

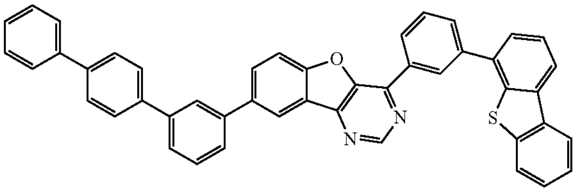

8mpTP-4mDBtPBfpm (iii)

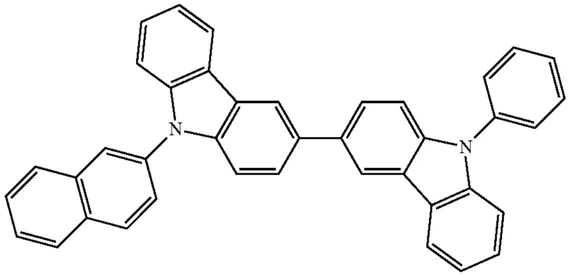

β NCCP (xv)

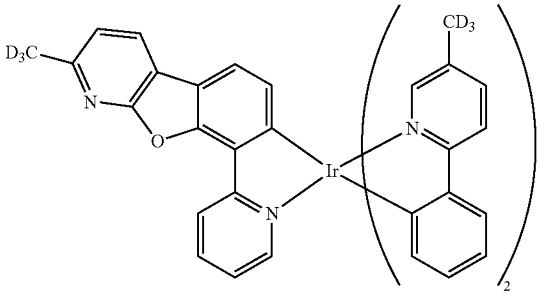

Ir(5mppy-d3)2(mbfpypy-d3)

(v)

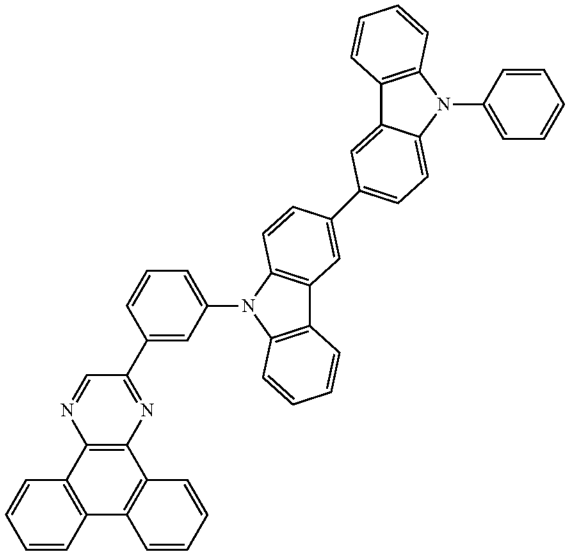

2mPCCzPDBq

-continued (xvii)

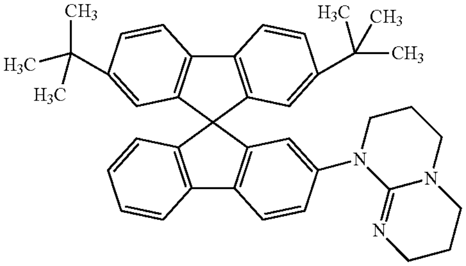

2′,7′tBu-2hppSF (vi)

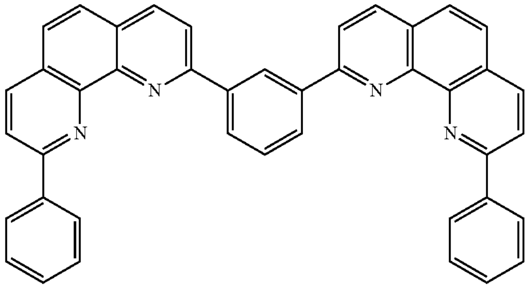

mPPhen2P (xiii)

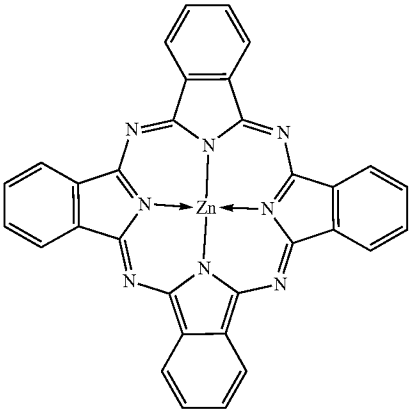

ZnPc (Method for Fabricating Light-Emitting Device 30)

First, over a silicon substrate provided with a wiring, 50-nm-thick titanium (Ti), 70-nm-thick aluminum (Al), and 6-nm-thick Ti were sequentially stacked by a sputtering method. This was heated at 300° C. in an air atmosphere for 1 hour. After the heat treatment, washing was performed and then indium tin oxide containing silicon oxide (ITSO) was deposited by a sputtering method to a thickness of 10 nm. This stacked-layer film was patterned by a photolithography technique, whereby a first electrode was formed. Note that the transparent electrode functions as an anode, and the transparent electrode and the reflective electrode are collectively regarded as a first electrode.

Note that the first electrodes were formed on the assumption of stripe arrangement in which 63001 pixels (251×251) are arranged in a matrix in a 2-mm square. This arrangement corresponds to a pixel density of 3207 ppi. An end surface of the first electrode has an angle of less than or equal to 90° with respect to a substrate surface, forming a taper shape. The taper portion was formed in a region that extends about 0.2 μm from the rim of the first electrode.

Next, in pretreatment for forming the light-emitting device over the substrate, the substrate was subjected to heat treatment at 120° C. for 120 seconds, 1,1,1,3,3,3-hexamethyldisilazane (abbreviation: HMDS) was then vaporized, and a spray thereof was given, for 120 seconds, to the substrate heated to 60° C. This can make it difficult for the stacked-layer film formed over the first electrode to be separated from the first electrode in the fabrication process.

After that, the substrate was transferred into a vacuum evaporation apparatus where the pressure was reduced to approximately $1\times10^{-4}$ Pa, and was subjected to vacuum baking at 170° C. for 60 minutes in a heating chamber of the vacuum evaporation apparatus, and then the substrate was cooled down for approximately 60 minutes.

Then, the substrate provided with the first electrode was fixed to a substrate holder provided in the vacuum evaporation apparatus such that the surface on which the first electrode was formed faced downward. Over the first electrode, N-(biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (i) above and a fluorine-containing electron-acceptor material with a molecular weight of 672 (OCHD-003) were deposited by co-evaporation to a thickness of 10 nm such that the weight ratio of PCBBiF to OCHD-003 was 1:0.03, whereby the hole-injection layer was formed.

Over the hole-injection layer, PCBBiF was deposited by evaporation to a thickness of 35 nm, whereby a first hole-transport layer was formed.

Then, over the first hole-transport layer, 8-(1,1':4',1"-terphenyl-3-yl)-4-[3-(dibenzothiophen-4-yl)phenyl]-[1]benzofuro[3,2-d]pyrimidine (abbreviation: 8mpTP-4mDBtPBfpm) represented by Structural Formula (xiv), 9-(2-naphthyl)-9'-phenyl-9H,9'H-3,3'-bicarbazole (abbreviation: βNCCP) represented by Structural Formula (iii), and [2-$d_3$-methyl-8-(2-pyridinyl-κN)benzofuro[2,3-b]pyridine-κC]bis[2-(5-$d_3$-methyl-2-pyridinyl-κN2)phenyl-κC]iridium(III) (abbreviation: Ir(5mppy-$d_3$)$_2$(mbfpypy-$d_3$)) represented by Structural Formula (xv) were deposited by co-evaporation to a thickness of 40 nm such that the weight ratio of 8mpTP-4mDBtPBfpm to βNCCP and Ir(5mppy-$d_3$)$_2$(mbfpypy-$d_3$) was 0.6:0.4:0.1, whereby a first light-emitting layer was formed.

Next, 2-{3-[3-(N-phenyl-9H-carbazol-3-yl)-9H-carbazol-9-yl]phenyl}dibenzo[f,h]quinoxaline (abbreviation: 2mPCCzPDBq) represented by Structural Formula (v) above was deposited by evaporation to a thickness of 10 nm to form a first electron-transport layer.

After the first electron-transport layer was formed, 2,2'-(1,3-phenylene)bis(9-phenyl-1,10-phenanthroline) (abbreviation: mPPhen2P) represented by Structural Formula (vi) above and 1-(2',7'-di-tert-butyl-9,9'-spirobi[9H-fluoren]-2-yl)-1,3,4,6,7,8-hexahydro-2H-pyrimido[1,2-a]pyrimidine (abbreviation: 2',7'tBu-2hppSF) represented by Structural Formula (xvii) above were deposited by co-evaporation to a thickness of 5 nm such that the weight ratio of mPPhen2P to 2',7'tBu-2hppSF was 1:1 to form a first layer, zinc phthalocyanine (abbreviation: ZnPc) represented by Structural Formula (xiii) above was deposited by evaporation to a thickness of 2 nm to form a second layer, and PCBBiF and OCHD-003 were deposited by co-evaporation to a thickness of 10 nm such that the weight ratio of PCBBiF to OCHD-003 was 1:0.15 to form a third layer. Thus, an intermediate layer was formed.

Over the intermediate layer, PCBBiF was deposited by evaporation to a thickness of 55 nm, whereby a second hole-transport layer was formed.

Over the second hole-transport layer, 8mpTP-4mDBtPBfpm, βNCCP, and Ir(5mppy-$d_3$)$_2$(mbfpypy-$d_3$) were deposited by co-evaporation to a thickness of 40 nm such that the weight ratio of 8mpTP-4mDBtPBfpm to βNCCP and Ir(5mppy-$d_3$)$_2$(mbfpypy-$d_3$) was 0.6:0.4:0.1, whereby a second light-emitting layer was formed.

Next, 2mPCCzPDBq was deposited by evaporation to a thickness of 10 nm and mPPhen2P was further deposited by evaporation to a thickness of 15 nm, whereby a second electron-transport layer was formed.

Then, processing by a photolithography technique was performed. The substrate provided with the components up to the second electron-transport layer was taken out from the vacuum evaporation apparatus and exposed to the atmosphere, and then aluminum oxide was deposited to a thickness of 30 nm by an ALD method, whereby a first sacrificial layer was formed. For the deposition of aluminum oxide by an ALD method, trimethylaluminum (abbreviation: TMA) and water vapor were used as a precursor and an oxidizer, respectively.

Over the first sacrificial layer, tungsten (W) was deposited to a thickness of 54 nm by a sputtering method, whereby a second sacrificial layer was formed.

A photoresist was applied over the second sacrificial layer, and exposure to light and development were performed so that an end portion of the second sacrificial layer was positioned on the inner side than the tapered end surface of the first electrode. In this manner, the EL layer of the light-emitting device 30 can be processed into a shape having an end portion on the inner side than the tapered end surface of the first electrode.

The second sacrificial layer was processed using an etching gas containing $SF_6$ with the use of the photoresist as a mask, and then the first sacrificial layer was processed using the second sacrificial layer as a hard mask with the use of an etching gas containing fluoroform ($CHF_3$), helium (He), and methane ($CH_4$) at a flow rate ratio of $CHF_3$:He:$CH_4$=16.5:118.5:15. Then, the EL layer (the hole-injection layer, the first hole-transport layer, the first light-emitting layer, the first electron-transport layer, the intermediate layer, the second hole-transport layer, the second light-emitting layer, and the second electron-transport layer) was processed with the use of an etching gas containing oxygen ($O_2$).

After the EL layer was processed, the second sacrificial layer was removed using an etching gas containing $SF_6$, while the first sacrificial layer remained. Then, aluminum oxide was deposited to a thickness of 15 nm by an ALD method, whereby a protective film was formed.

Next, a layer of a photosensitive high molecular material was formed over the protective film over the first electrode by a photolithography method. After heating was performed at 100° C. for one hour under the air atmosphere, unnecessary portions of the first sacrificial layer and the protective film were removed using an aqueous solution including hydrofluoric acid (HF), whereby the second electron-transport layer was exposed. At this time, the layer of the photosensitive high molecular material functions as a resist.

The substrate with the exposed second electron-transport layer was transferred into a vacuum evaporation apparatus where the pressure was reduced to approximately $1\times10^{-4}$ Pa, and vacuum baking was performed at 70° C. for 90 minutes in a heating chamber of the vacuum evaporation apparatus.

Next, lithium fluoride and ytterbium were deposited by evaporation to a thickness of 1.5 nm at a volume ratio of LiF:Yb=1:0.5, whereby an electron-injection layer was formed. Then, silver (Ag) and magnesium (Mg) were deposited by co-evaporation to a thickness of 25 nm at a volume ratio of Ag:Mg=1:0.1, whereby a second electrode was formed. Over the second electrode, indium tin oxide (ITO) was deposited to a thickness of 70 nm by a sputtering method as a cap layer.

Then, the light-emitting device was sealed using a glass substrate in a glove box containing a nitrogen atmosphere so as not to be exposed to the atmosphere. Specifically, a UV curable sealing material was applied to surround the device, only the sealing material was irradiated with UV while the light-emitting device was not irradiated with the UV, and heat treatment was performed at 80° C. under an atmospheric pressure for one hour. In this manner, the light-emitting device 30 was fabricated.

(Method for Fabricating Light-Emitting Device 31)

A light-emitting device 31 was fabricated in a manner similar to that of the light-emitting device 30 except that the first layer was formed after the formation of the first electron-transport layer by deposition of mPPhen2P and lithium oxide (abbreviation: $Li_2O$) by co-evaporation to a thickness of 5 nm such that the weight ratio of mPPhen2P to $Li_2O$ was 1:0.05 and except that the photoresist formed over the second sacrificial layer was processed so that the end portion of the photoresist was positioned over the tapered end surface of the first electrode. Thus, the light-emitting device 31 is a light-emitting device in which the end portion of the EL layer is positioned over the tapered end surface of the first electrode.

Figure 39A:
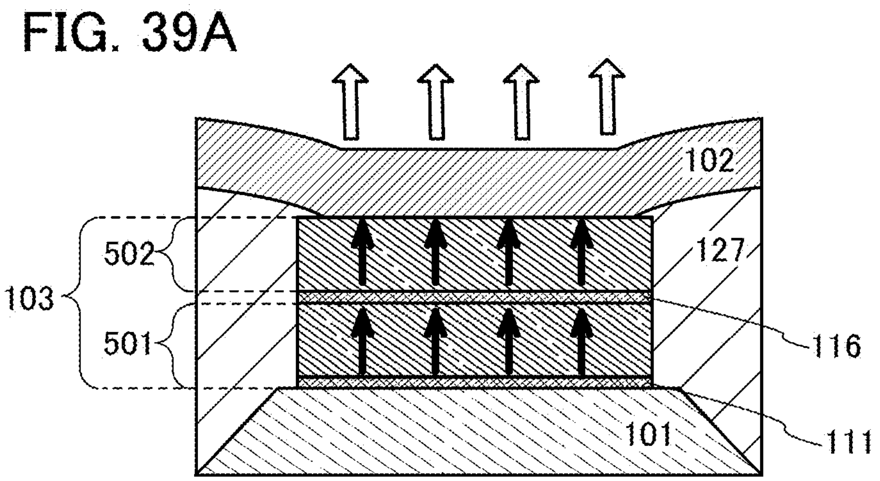
FIGS. 39A and 39B show the positional relationship between an end portion and end surface of a first electrode and an end portion of an EL layer in a light-emitting device 30 and a light-emitting device 31.
Figure 39B:
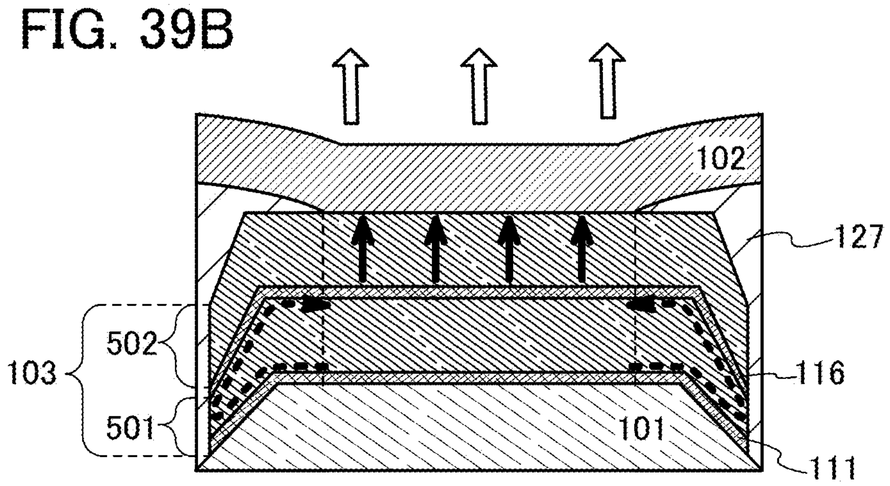
Figure 45A:
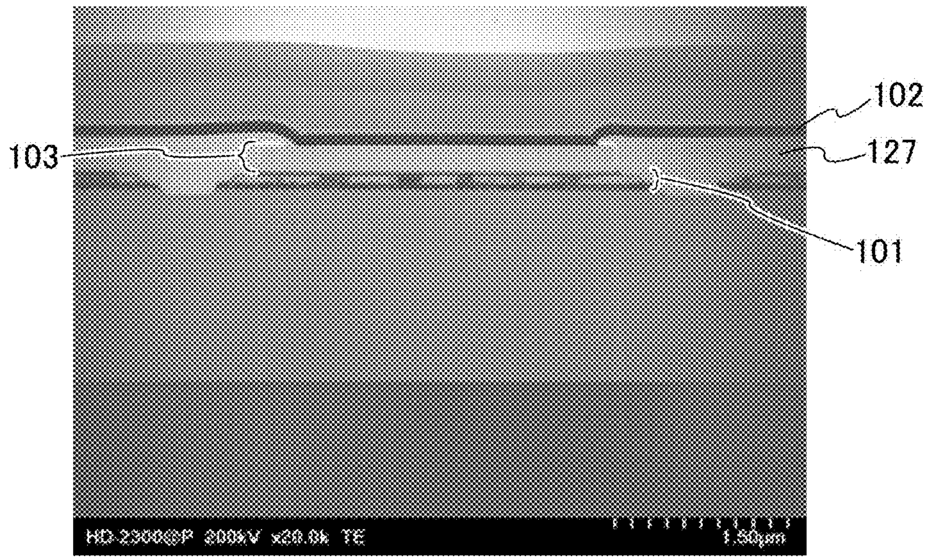
FIG. 45A is a cross-sectional STEM image of a light-emitting device having a structure similar to that of the light-emitting device 30 and FIG. 45B illustrates the positional relation between an end portion and end surface of a first electrode and an end portion of an EL layer in the light-emitting device 30.
Figure 45B:
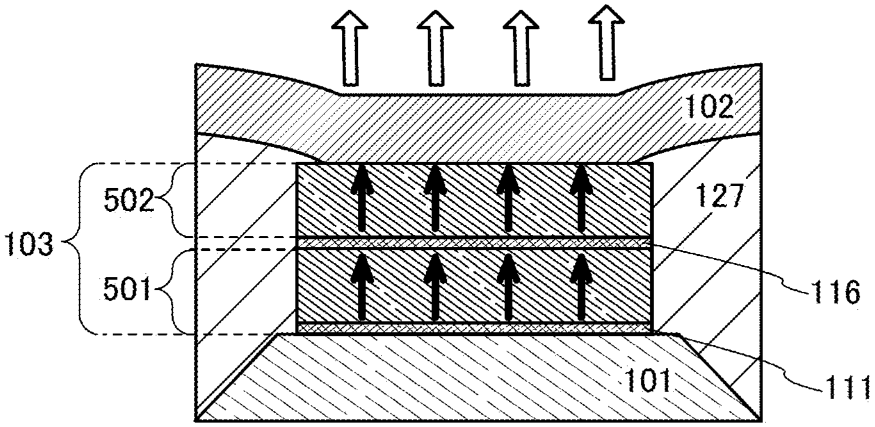
Figure 46A:
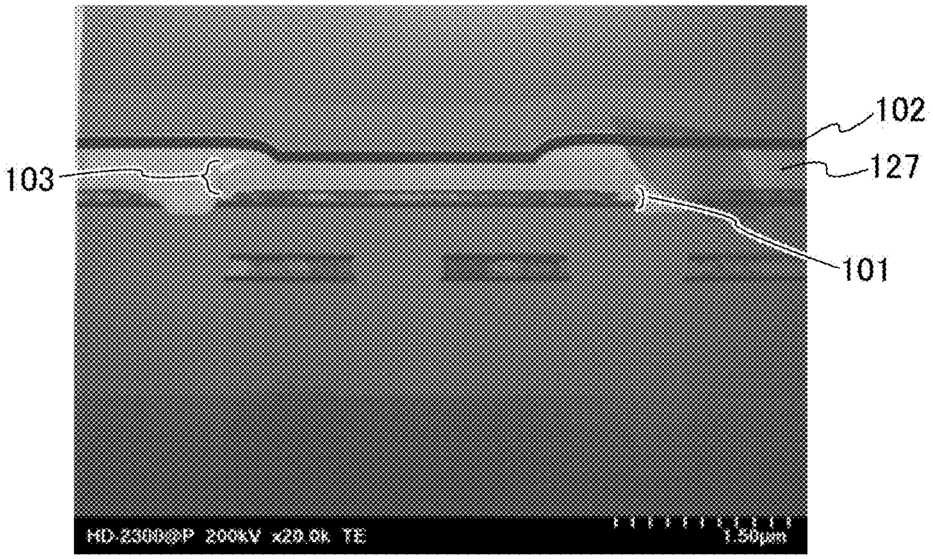
FIG. 46A is a cross-sectional STEM image of a light-emitting device having a structure similar to that of the light-emitting device 31 and FIG. 46B illustrates the positional relation between an end portion and end surface of a first electrode and an end portion of an EL layer in the light-emitting device 31.
Figure 46B:
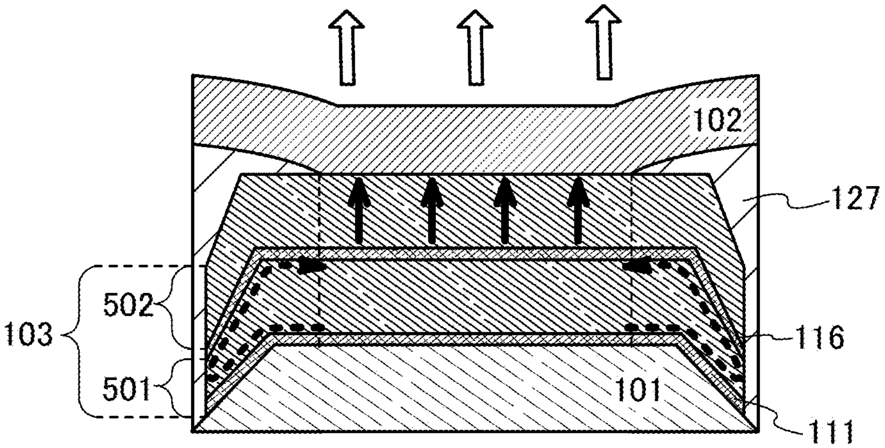

FIGS. 39A and 39B illustrate the positional relation between the end portion and end surface of the first electrode and the end portion of the EL layer in the light-emitting device 30 and the light-emitting device 31, respectively. Furthermore, FIG. 45A shows a scanning transmission electron microscope (STEM) image of a light-emitting device having a structure similar to that of the light-emitting device 30, and FIG. 46A shows a STEM image of a light-emitting device having a structure similar to that of the light-emitting device 31. FIG. 45B and FIG. 46B illustrate the positional relation between the end portion and end surface of the first electrode and the end portion of the EL layer in the light-emitting device 30 and the light-emitting device 31, respectively.

Device structures of the light-emitting devices 30 and 31 are shown in Table 10.

TABLE 10

| | | Film thickness (nm) | Light-emitting device 30 | Light-emitting device 31 |
|---|---|---|---|---|
| Cap layer | | 70 | ITO | |
| Second electrode | | 25 | Ag:Mg (1:0.1) | |
| | | 1.5 | LiF:Yb (1:0.5) | |
| | | MML process | | |
| Second electron-transport layer | 2 | 15 | mPPhen2P | |
| | 1 | 10 | 2mPCCzPDBq | |
| Second light-emitting layer | | 40 | 8mpTP-4mDBtPBfpm:βNCCP: $Ir(5mppy\text{-}d_3)_2(mbfpypy\text{-}d_3)$ (0.6:0.4:0.1) | |
| Second hole-transport layer | | 55 | PCBBiF | |
| Intermediate layer | Third layer | 10 | PCBBiF:OCHD-003 (1:0.15) | |
| | Second layer | 2 | ZnPc | |
| | First layer | 5 | mPPhen2P:2',7'tBu-2hppSF (1:1) | mPPhen2P: $Li_2O$(1:0.05) |
| First electron-transport layer | | 10 | 2mPCCzPDBq | |
| First light-emitting layer | | 40 | 8mpTP-4mDBtPBfpm:βNCCP: $Ir(5mppy\text{-}d_3)_2(mbfpypy\text{-}d_3)$ (0.6:0.4:0.1) | |
| First hole-transport layer | | 35 | PCBBiF | |
| Hole-injection layer | | 10 | PCBBiF:OCHD-003 (1:0.03) | |
| First electrode | Transparent electrode | 10 | ITSO | |
| | | 6 | Ti | |
| | Reflective electrode | 70 | Al | |
| | | 50 | Ti | |

Figure 40:
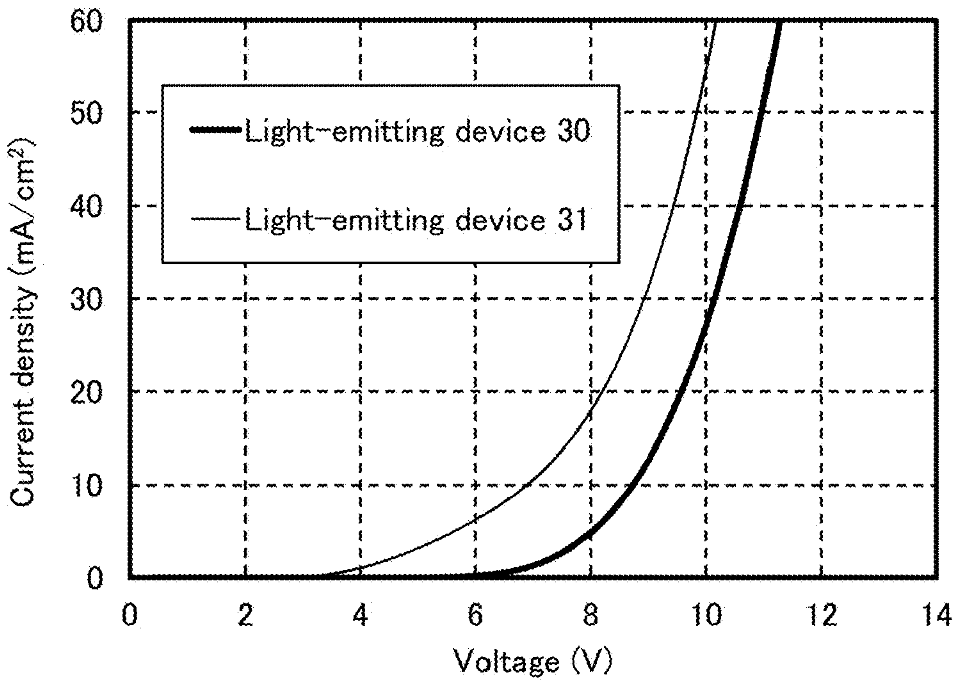
FIG. 40 shows current density—voltage characteristics of the light-emitting device 30 and the light-emitting device 31.
Figure 41:
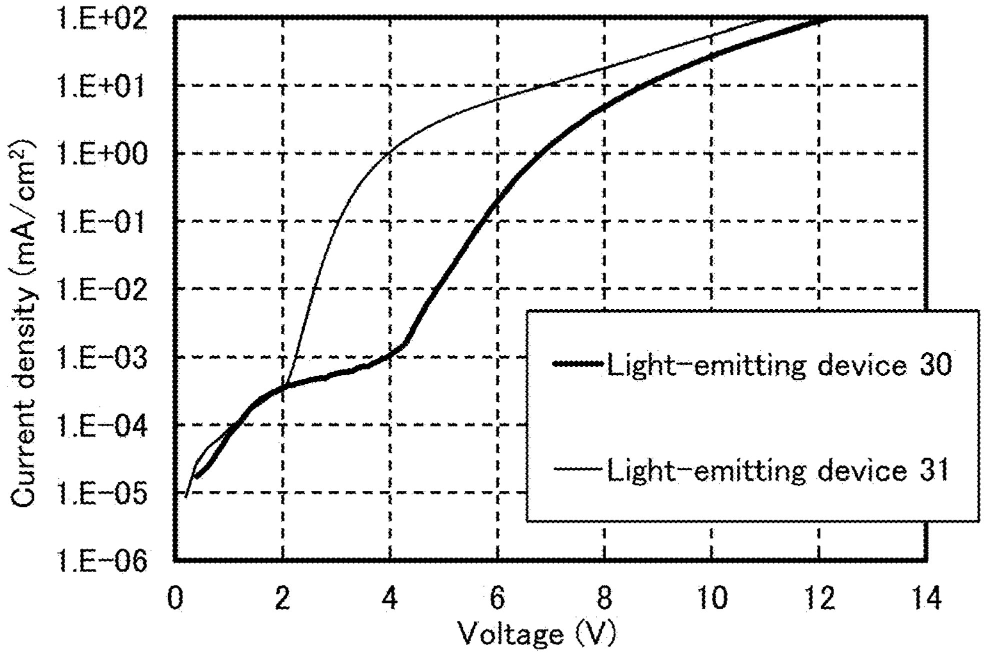
FIG. 41 shows current density—voltage characteristics of the light-emitting device 30 and the light-emitting device 31.
Figure 42:
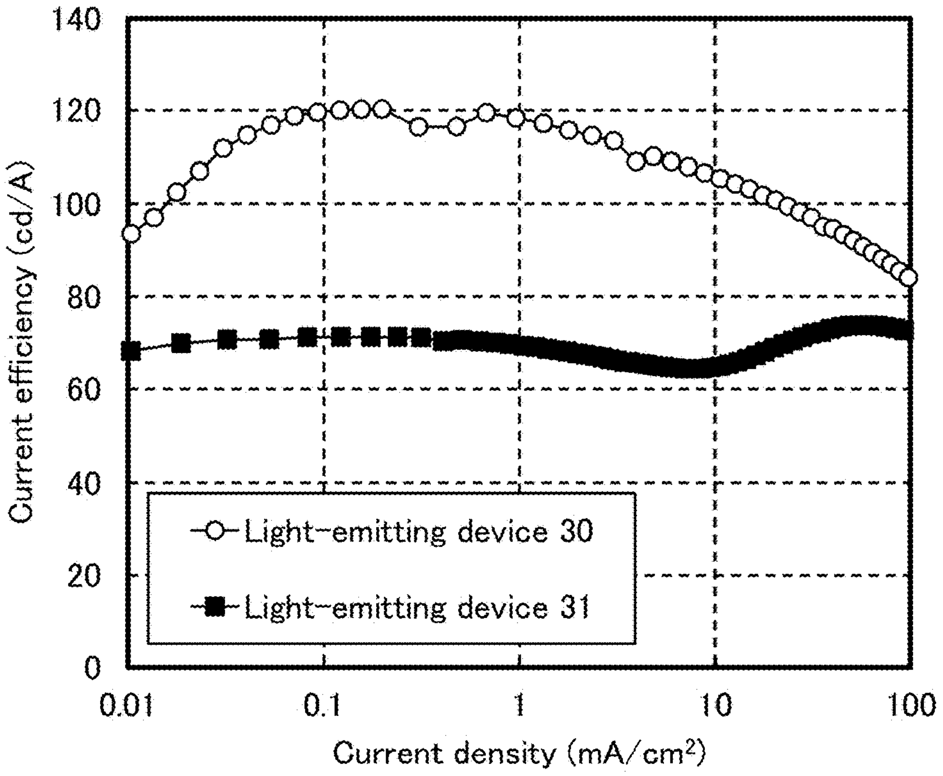
FIG. 42 shows current efficiency-current density characteristics of the light-emitting device 30 and the light-emitting device 31.
Figure 43:
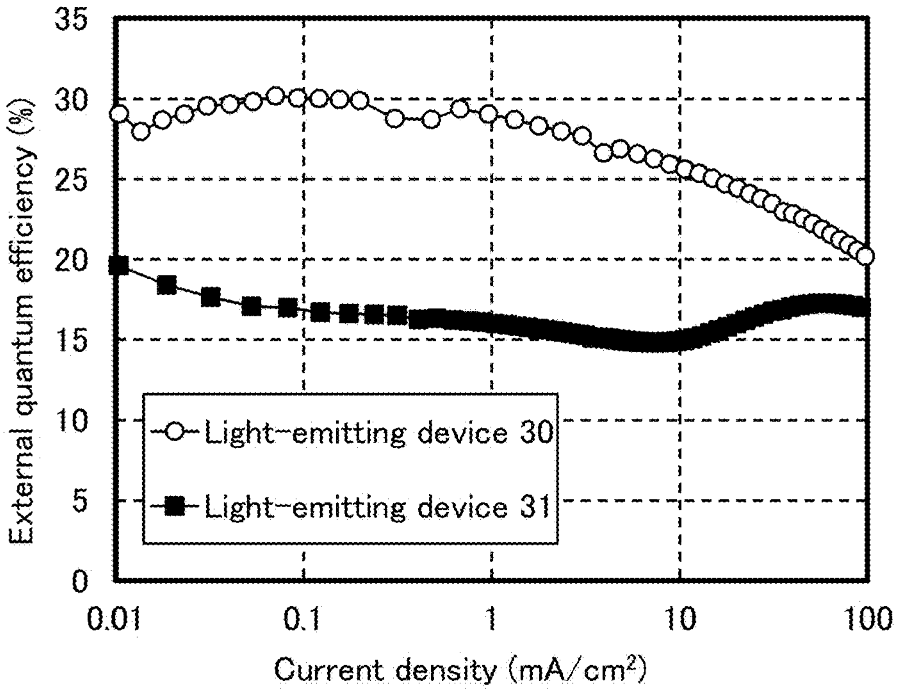
FIG. 43 shows external quantum efficiency-current density characteristics of the light-emitting device 30 and the light-emitting device 31.
Figure 44:
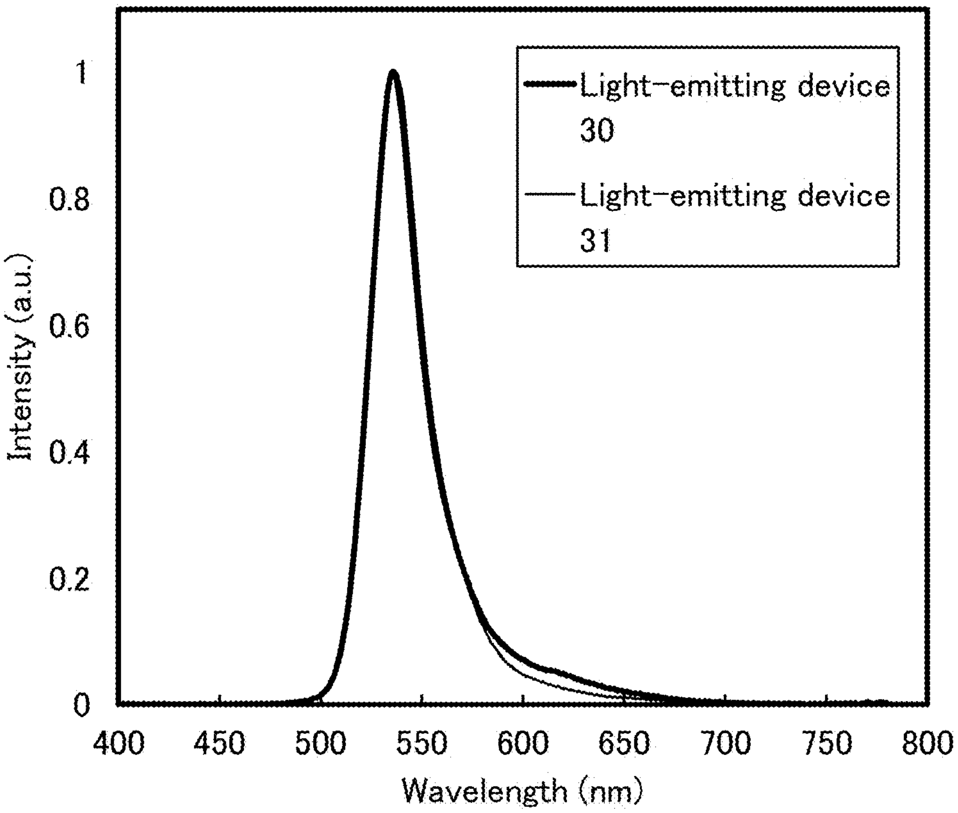
FIG. 44 shows electroluminescence spectra of the light-emitting device 30 and the light-emitting device 31.

FIGS. 40 and 41 show current density—voltage characteristics of the light-emitting devices 30 and 31. FIG. 42 shows current efficiency-current density characteristics thereof. FIG. 43 shows external quantum efficiency-current density characteristics thereof. FIG. 44 shows electroluminescence spectra thereof. Table 11 shows main characteristics of the light-emitting devices at approximately 1000 cd/in$^2$. The luminance, CIE chromaticity, and electroluminescence spectra were measured at normal temperature with a spectroradiometer (SR-UL1R manufactured by TOPCON TECHNOHOUSE CORPORATION).

TABLE 11

| | Voltage (V) | Current (mA) | Current density (mA/cm$^2$) | Chromaticity x | Chromaticity y | Current efficiency (cd/A) |
|---|---|---|---|---|---|---|
| Light-emitting device 30 | 9.0 | 0.04 | 1.0 | 0.31 | 0.67 | 104.3 |
| Light-emitting device 31 | 8.0 | 0.06 | 1.5 | 0.28 | 0.69 | 68.1 |

FIG. 44 (spectra) shows that the light-emitting devices 30 and 31 each exhibit green light emission derived from $Ir(5mppy\text{-}d_3)_2(mbfpypy\text{-}d_3)$.

FIG. 42 (current efficiency) and FIG. 43 (external quantum efficiency) show that the light-emitting device 30 exhibits high efficiency and functions as a tandem light-emitting device. However, the current efficiency of the light-emitting device 31 is approximately half that of the light-emitting device 30, suggesting that the light-emitting device 31 does not function as a tandem light-emitting device and light emission is obtained from only one of the light-emitting layers.

According to FIG. 40 and FIG. 41, a current seems to start flowing at a low voltage in the light-emitting device 31, showing a probability of leakage current generation. The light-emitting device 30 was found to be a light-emitting device in which the leakage current was suppressed.

As illustrated in FIG. 39B, in the light-emitting device 31, the end portion of the organic compound layer 103 is positioned over the tapered end surface of the first electrode 101, and the organic compound layer 103 is partly thinned. Since the hole-injection layer 111 and the intermediate layer 116 in the organic compound layer 103 have high conductivity, a current does not flow through the first light-emitting unit 501 and a current flows through the thinned portion of the EL layer via the hole-injection layer 111 and the intermediate layer 116 in some cases. In this case, light emission from the light-emitting layer in the first light-emitting unit 501 cannot be obtained and light emission from only the second light-emitting unit 502 is obtained from the light-emitting device 31.

It seems that the leakage current of the light-emitting device 31 observed in FIG. 40 and FIG. 41 is the indication of the current flowing through the thinned portion of the EL layer via the hole-injection layer 111 and the intermediate layer 116. The emission efficiency of the light-emitting device 31 being approximately half the light-emitting device 30 in FIGS. 42 and 43 results from no emission from the first light-emitting unit 501.

Thus, the light-emitting device 30 is the tandem light-emitting device having high emission efficiency and favorable characteristics. In addition, the light-emitting device of one embodiment of the present invention maintained the favorable characteristics though formed through a photolithography process.

This application is based on Japanese Patent Application Serial No. 2022-192078 filed with Japan Patent Office on Nov. 30, 2022, Japanese Patent Application Serial No. 2022-209462 filed with Japan Patent Office on Dec. 27, 2022, Japanese Patent Application Serial No. 2023-073498 filed with Japan Patent Office on Apr. 27, 2023, and Japanese Patent Application Serial No. 2023-095323 filed with Japan Patent Office on Jun. 9, 2023, the entire contents of which are hereby incorporated by reference.

What is claimed is:

1. A light-emitting device comprising:

a first electrode;

a second electrode; and an organic compound layer between the first electrode and the second electrode, wherein the organic compound layer comprises a first light-emitting unit, an intermediate layer, and a second light-emitting unit in this order from the first electrode side, wherein the first light-emitting unit comprises a first light-emitting layer, wherein the second light-emitting unit comprises a second light-emitting layer, wherein the intermediate layer comprises a first layer, a second layer, and a third layer in this order from the first electrode side, wherein the first layer and the second layer are in contact with each other and the second layer and the third layer are in contact with each other, wherein a spin density of the first layer is lower than or equal to $1\times10^{17}$ spins/$cm^3$, and wherein a LUMO level of a material included in the second layer is greater than or equal to −4.30 eV and less than or equal to −3.00 eV.

2. The light-emitting device according to claim 1, wherein the material included in the second layer, a material included in the first layer, and a material included in the third layer are different from one another.

3. The light-emitting device according to claim 1, wherein a thickness of the second layer is greater than or equal to 1 nm and less than or equal to 10 nm.

4. The light-emitting device according to claim 1, wherein the first layer comprises a first substance and a second substance, and wherein the first substance has an acid dissociation constant $pK_a$ of 8 or more.

5. The light-emitting device according to claim 1, wherein the first layer comprises a first substance and a second substance, and wherein the first substance is an organic compound having any one of a pyrrolidine skeleton, a piperidine skeleton, and a hexahydropyrimidopyrimidine skeleton.

6. The light-emitting device according to claim 1, wherein the first layer comprises a first substance and a second substance, and wherein the first substance is an organic compound having a 1,3,4,6,7,8-hexahydro-2H-pyrimido[1,2-a]pyrimidine skeleton.

7. The light-emitting device according to claim 1, wherein the first layer comprises a first substance and a second substance, and wherein the second substance is an organic compound having an electron-transport property.

8. The light-emitting device according to claim 1, wherein the material included in the second layer is a metal complex.

9. The light-emitting device according to claim 1, wherein the material included in the second layer is a phthalocyanine-based metal complex.

10. The light-emitting device according to claim 1, wherein the material included in the second layer is 2,3,8,9,14,15-hexafluorodiquinoxalino[2,3-a:2',3'-c]phenazine.

11. A light-emitting device comprising:

a first electrode;

a second electrode; and an organic compound layer between the first electrode and the second electrode, wherein the organic compound layer comprises a first light-emitting unit, an intermediate layer, and a second light-emitting unit in this order from the first electrode side, wherein the first light-emitting unit comprises a first light-emitting layer, wherein the second light-emitting unit comprises a second light-emitting layer, wherein the intermediate layer comprises a first layer, a second layer, and a third layer in this order from the first electrode side, wherein the first layer and the second layer are in contact with each other and the second layer and the third layer are in contact with each other, wherein a spin density of the first layer is lower than or equal to $1\times10^{17}$ spins/$cm^3$, wherein a LUMO level of a material included in the second layer is greater than or equal to −4.30 eV and less than or equal to −3.00 eV, and wherein the third layer comprises an organic compound having a hole-transport property and a material having an acceptor property.

12. The light-emitting device according to claim 11, wherein the material included in the second layer, a material included in the first layer, and a material included in the third layer are different from one another.

13. The light-emitting device according to claim 11, wherein a thickness of the second layer is greater than or equal to 1 nm and less than or equal to 10 nm.

14. The light-emitting device according to claim 11, wherein the first layer comprises a first substance and a second substance, and wherein the first substance has an acid dissociation constant $pK_a$ of 8 or more.

15. The light-emitting device according to claim 11, wherein the first layer comprises a first substance and a second substance, and wherein the first substance is an organic compound having any one of a pyrrolidine skeleton, a piperidine skeleton, and a hexahydropyrimidopyrimidine skeleton.

16. The light-emitting device according to claim 11, wherein the first layer comprises a first substance and a second substance, and wherein the first substance is an organic compound having a 1,3,4,6,7,8-hexahydro-2H-pyrimido[1,2-a]pyrimidine skeleton.

17. The light-emitting device according to claim 11, wherein the first layer comprises a first substance and a second substance, and wherein the second substance is an organic compound having an electron-transport property.

18. The light-emitting device according to claim 11, wherein the material included in the second layer is a metal complex.

19. The light-emitting device according to claim 11, wherein the material included in the second layer is a phthalocyanine-based metal complex.

20. The light-emitting device according to claim 11, wherein the material included in the second layer is 2,3,8,9,14,15-hexafluorodiquinoxalino[2,3-a:2',3'-c]phenazine.

* * * * *